United States Patent [19]
Takeuchi et al.

[11] Patent Number: 5,903,495
[45] Date of Patent: May 11, 1999

[54] SEMICONDUCTOR DEVICE AND MEMORY SYSTEM

[75] Inventors: Ken Takeuchi, Tokyo; Tomoharu Tanaka, Yokohama, both of Japan

[73] Assignee: Kabushiki Kaisha Toshiba, Japan

[21] Appl. No.: 08/819,484

[22] Filed: Mar. 17, 1997

[30] Foreign Application Priority Data

| Mar. 18, 1996 | [JP] | Japan | 8-061445 |
| Apr. 19, 1996 | [JP] | Japan | 8-098627 |
| Oct. 29, 1996 | [JP] | Japan | 8-302335 |

[51] Int. Cl.[6] ........................... G11C 16/04
[52] U.S. Cl. ............... 365/185.03; 365/185.22; 365/185.24
[58] Field of Search ............ 365/185.03, 185.21, 365/185.22, 185.24, 185.28

[56] References Cited

U.S. PATENT DOCUMENTS

| 5,163,021 | 11/1992 | Mehrotra | 365/185.03 |
| 5,521,865 | 5/1996 | Ohuchi | 365/185.22 |
| 5,602,789 | 2/1997 | Endoh | 365/185.03 |
| 5,677,869 | 10/1997 | Fazio | 365/185.03 |

*Primary Examiner*—Son Mai
*Attorney, Agent, or Firm*—Banner & Witcoff, Ltd.

[57] ABSTRACT

A semiconductor memory device comprises a memory cell array having electrically erasable and programmable memory cells arranged in rows and columns, each memory cell capable of storing n-value data (n is 3 or a greater natural number), and a data circuit having m latch circuits for holding data items read from said memory cells, wherein data items read from said memory cells and held in k latch circuits (k<m) are output from the memory device before data items read from said memory cells are held in the remaining (m−k) latch circuits, during data-reading operation.

44 Claims, 100 Drawing Sheets

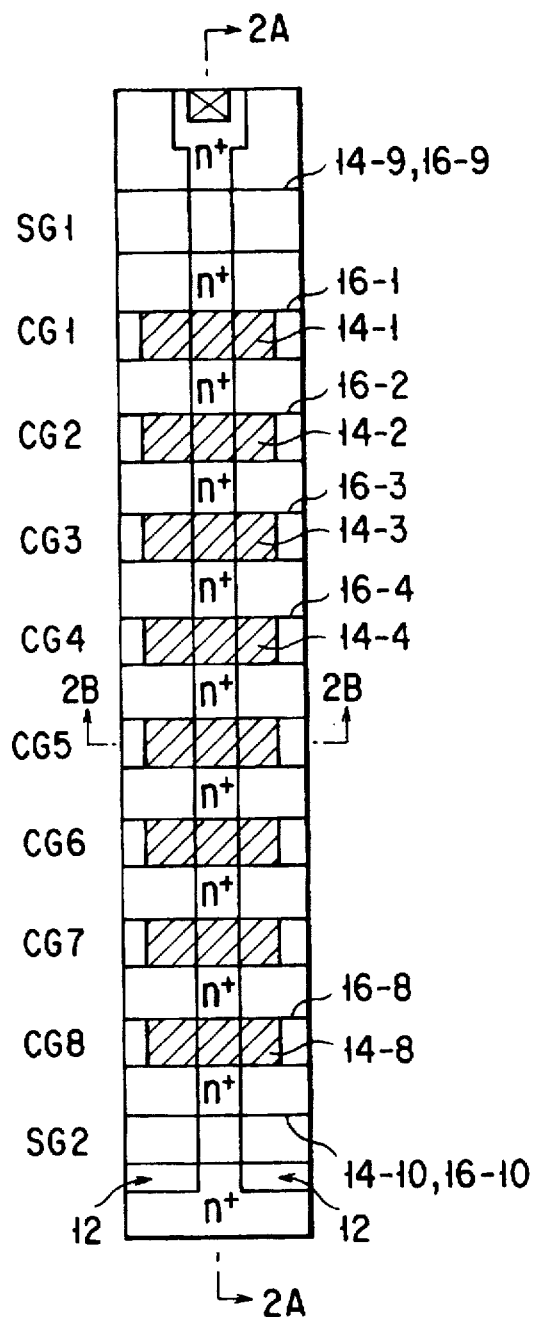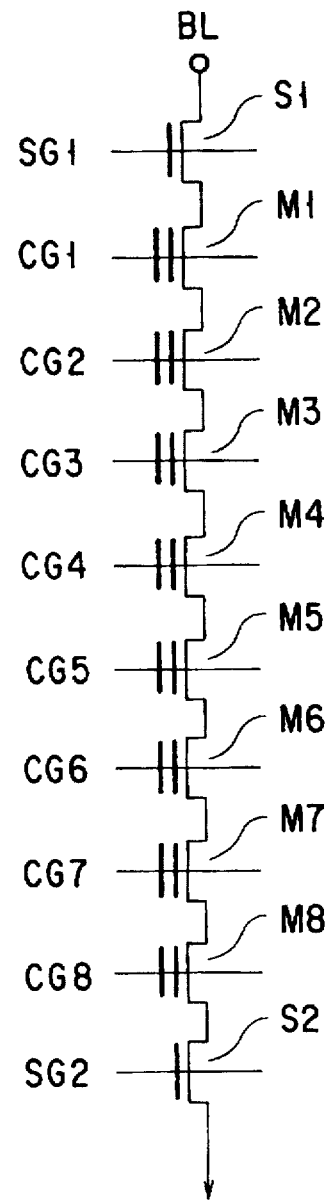
FIG. 1A
(PRIOR ART)
FIG. 1B
(PRIOR ART)

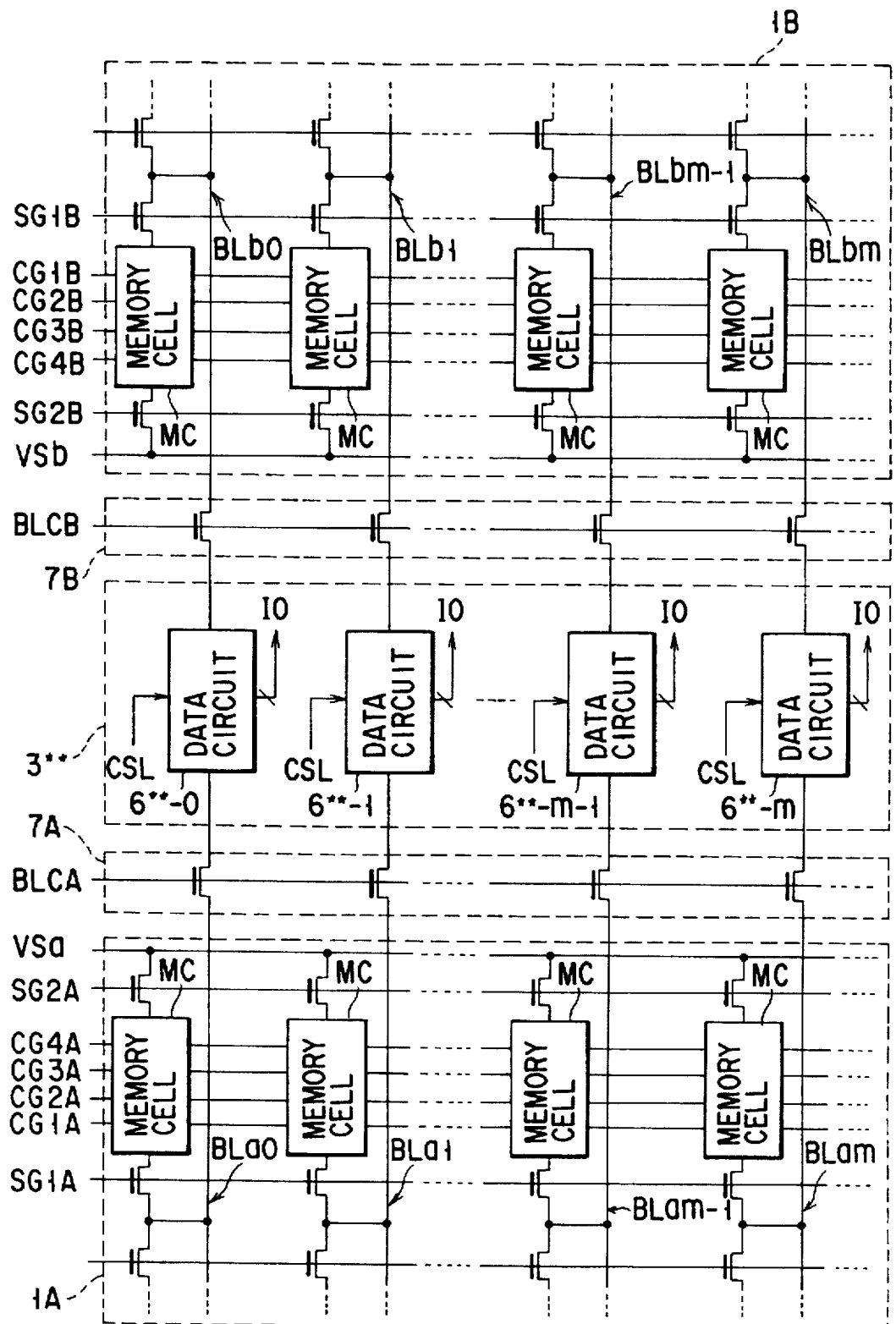
F I G. 10

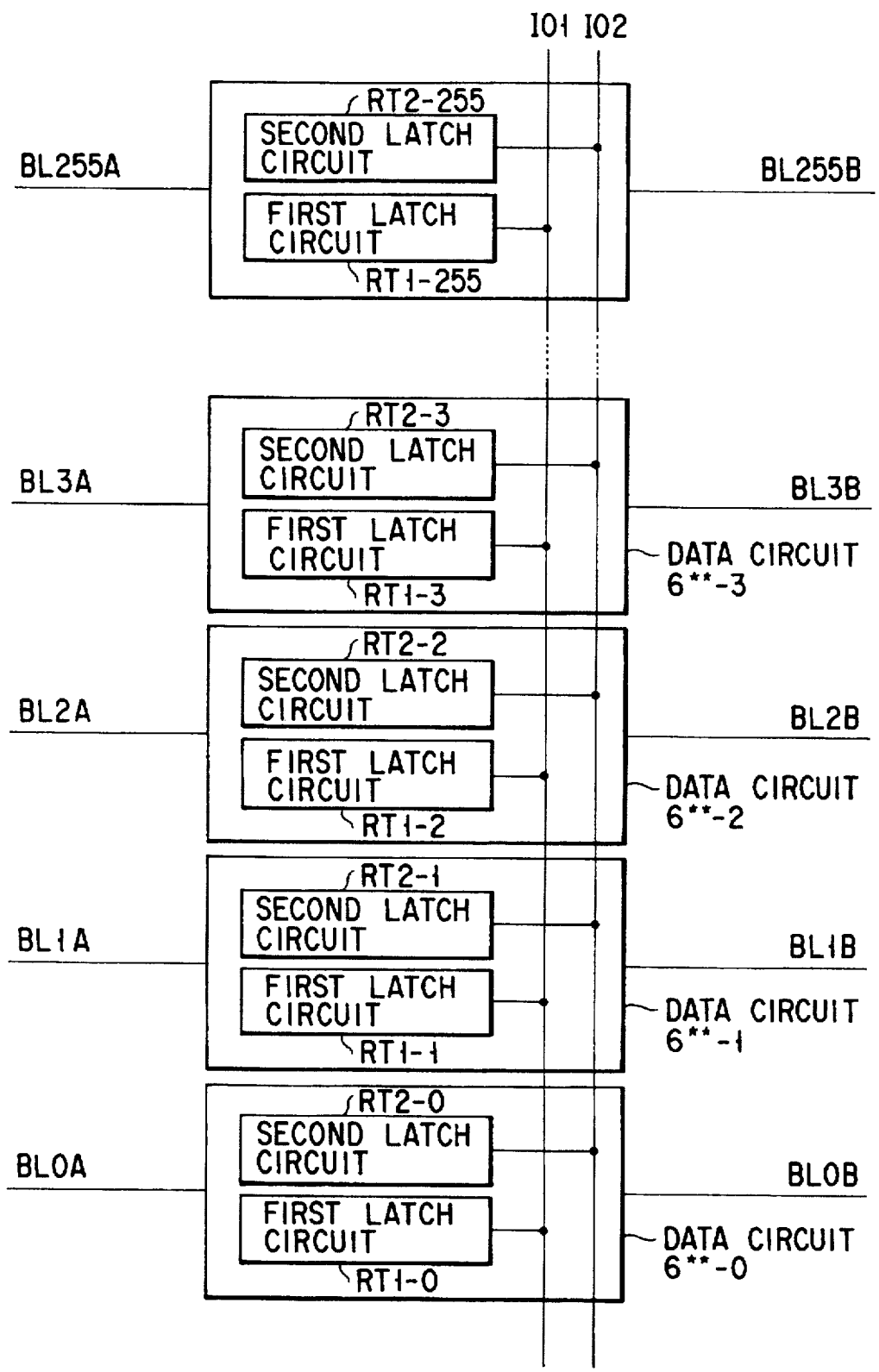
F I G. 12

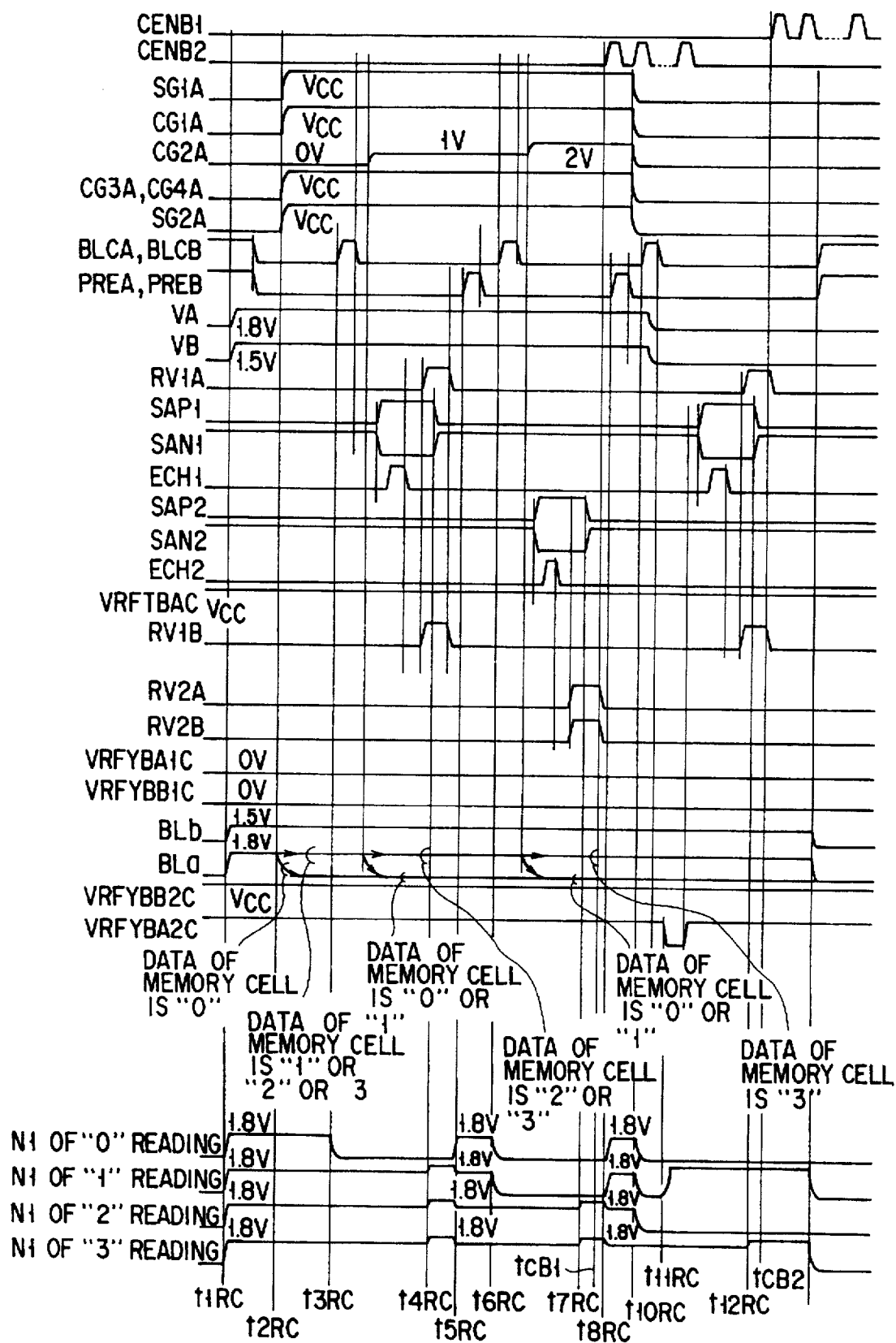
F I G. 16

FIG. 17

|  | "0" | "1" | "2" | "3" |
|---|---|---|---|---|
| N3C | L | H | H | H |
| N5C | L | L | H | H |

NODE POTENTIAL OF FLIP-FLOPS
FF1, FF2 DURING READ OPERATION

FIG. 18

|  | "0" | "1" | "2" | "3" |
|---|---|---|---|---|
| IOA(N3C) | L | H | L | H |
| IOB(N4C) | H | L | H | L |
| IOC(N5C) | L | L | H | H |
| IOD(N6C) | H | H | L | L |

READ DATA

FIG. 19

|  | "0" | "1" | "2" | "3" |
|---|---|---|---|---|
| IOA(N3C) | H | H | L | L |
| IOB(N4C) | L | L | H | H |
| IOC(N5C) | H | L | H | L |
| IOD(N6C) | L | H | L | H |

WRITE DATA

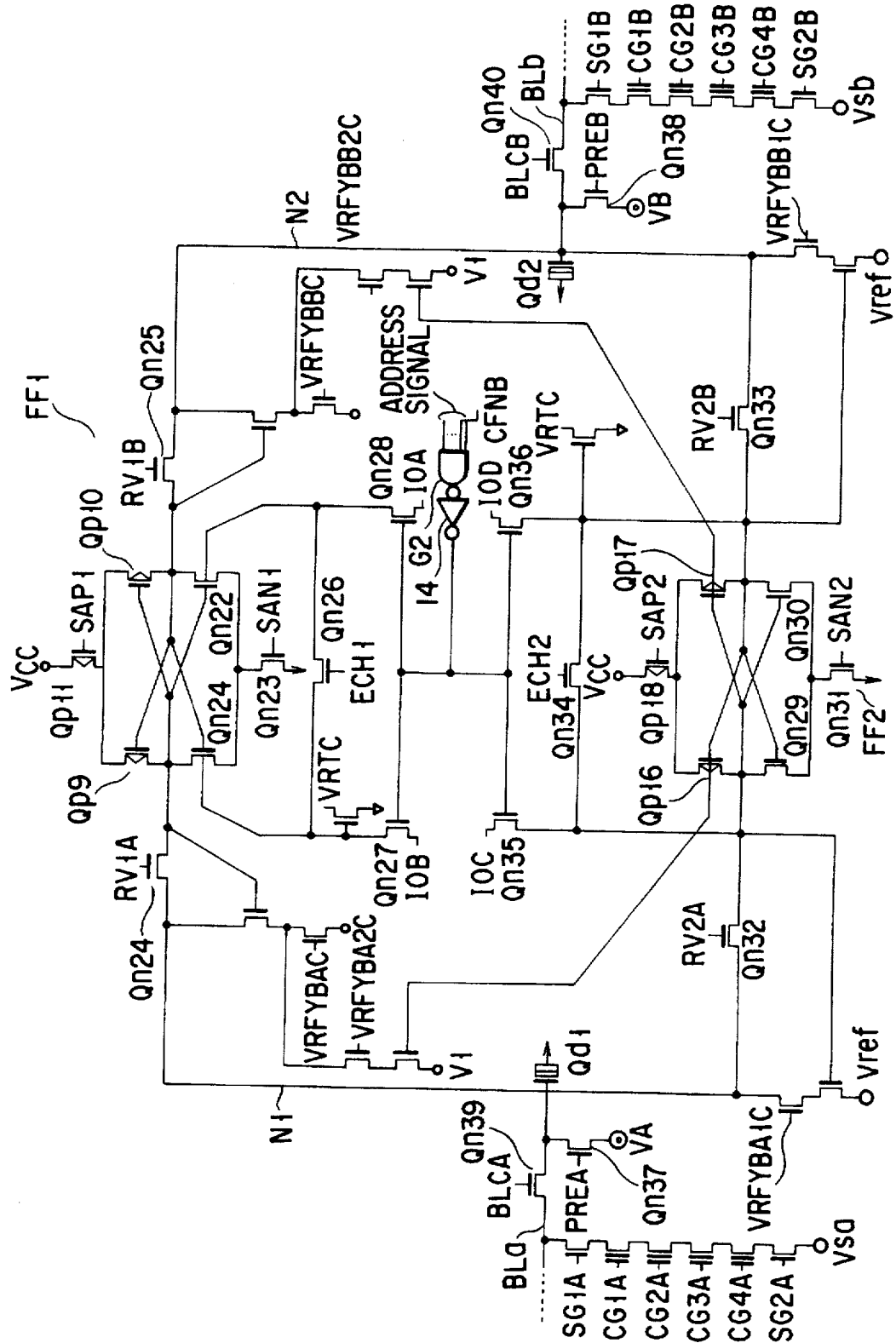
F I G. 25

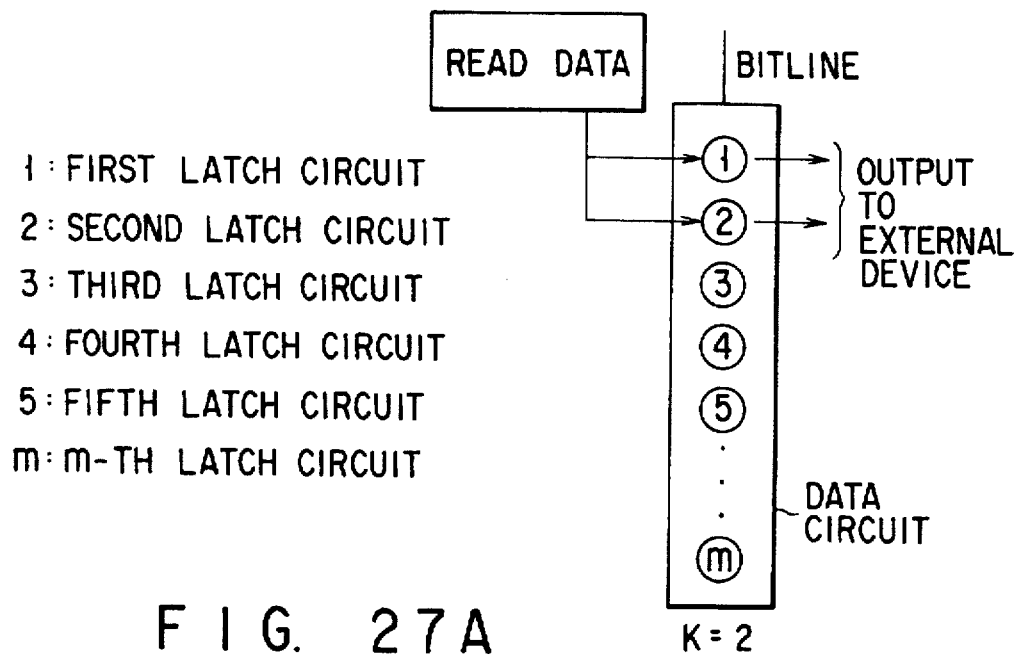
F I G. 27A
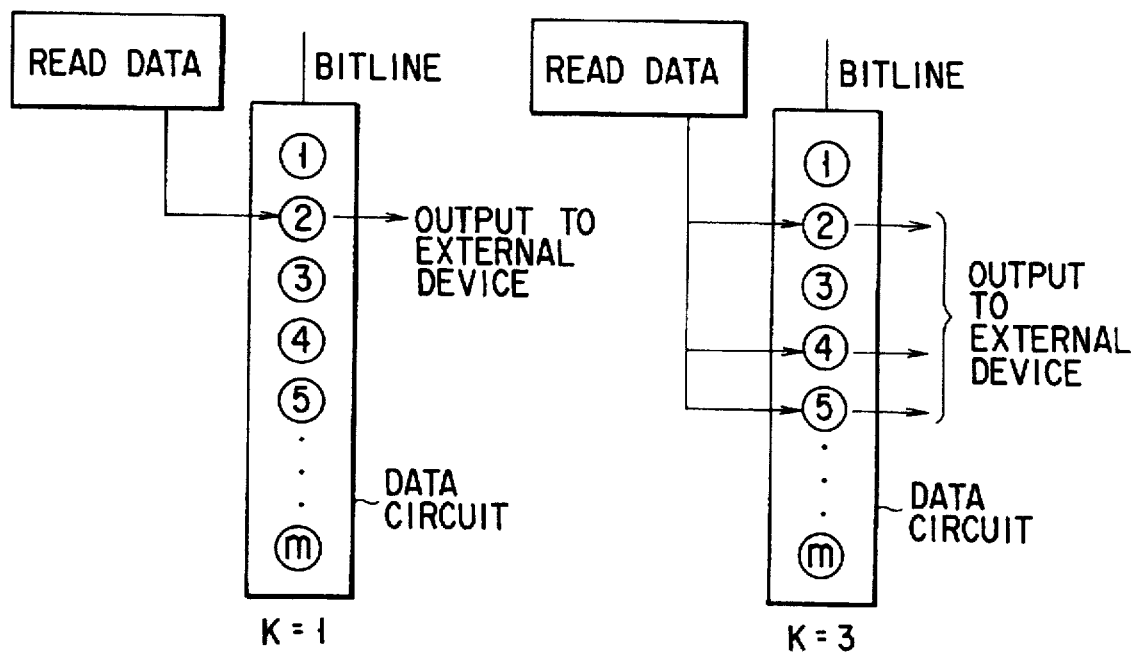
F I G. 27B     F I G. 27C

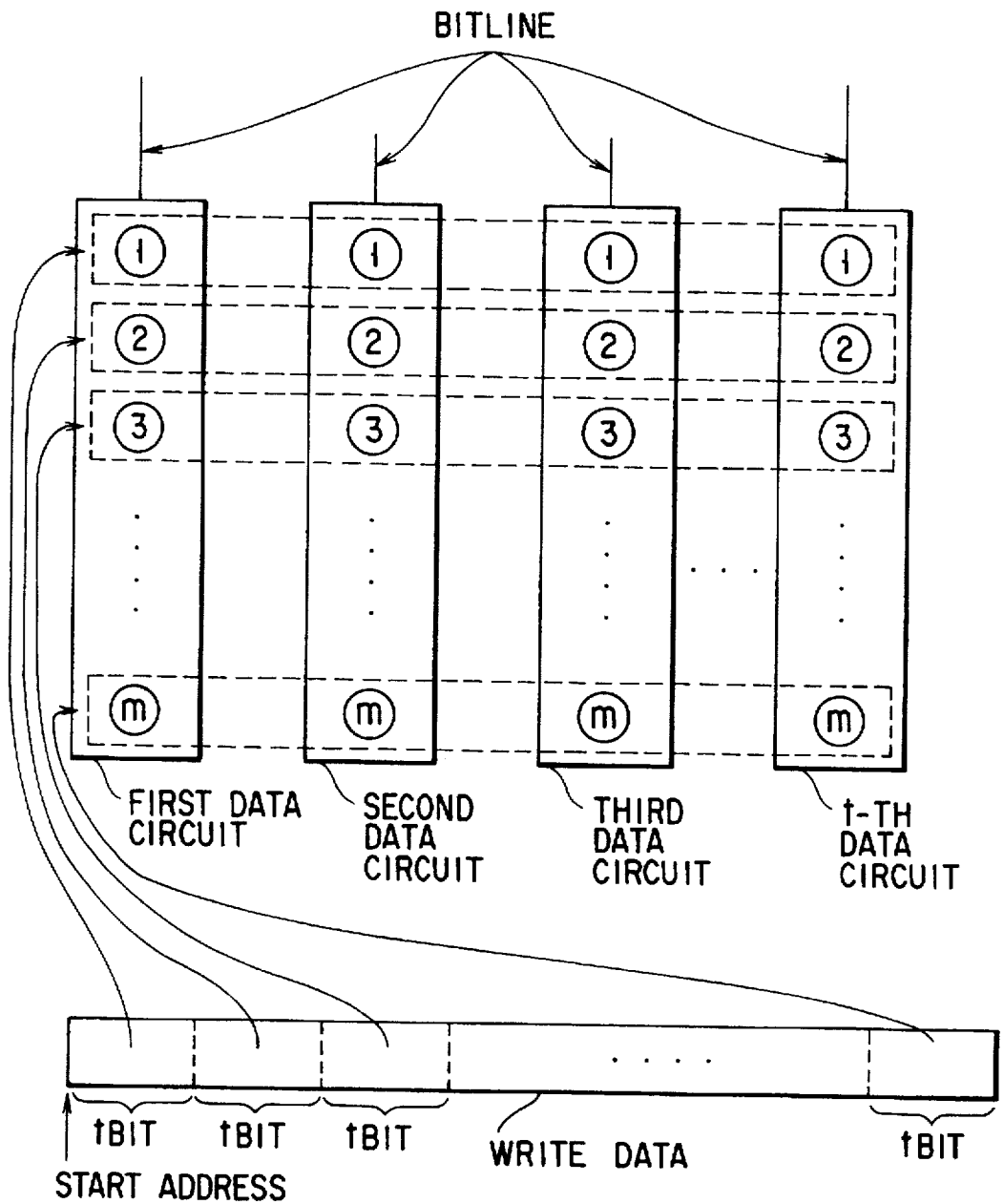
F I G. 29

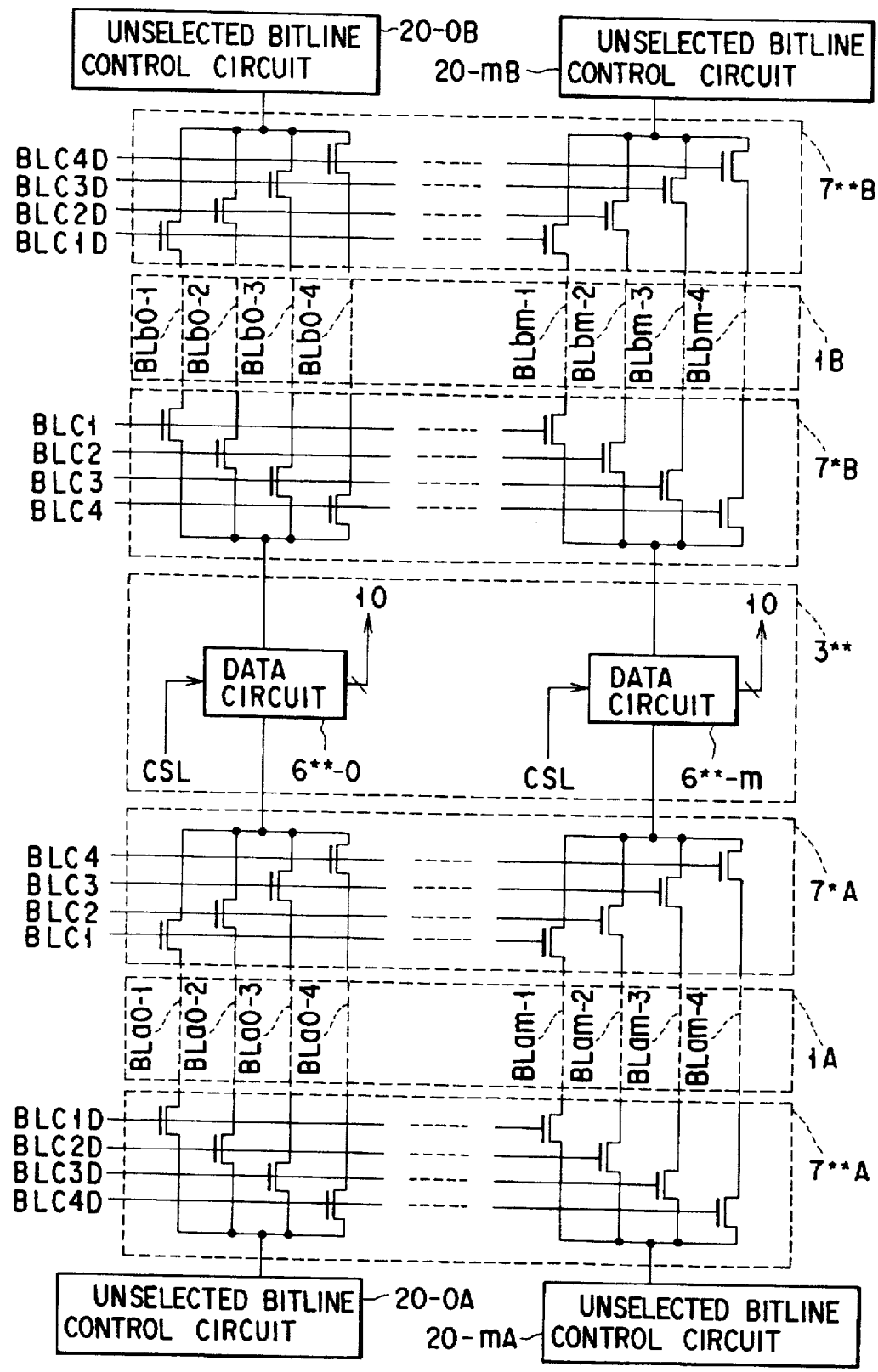
F I G. 33

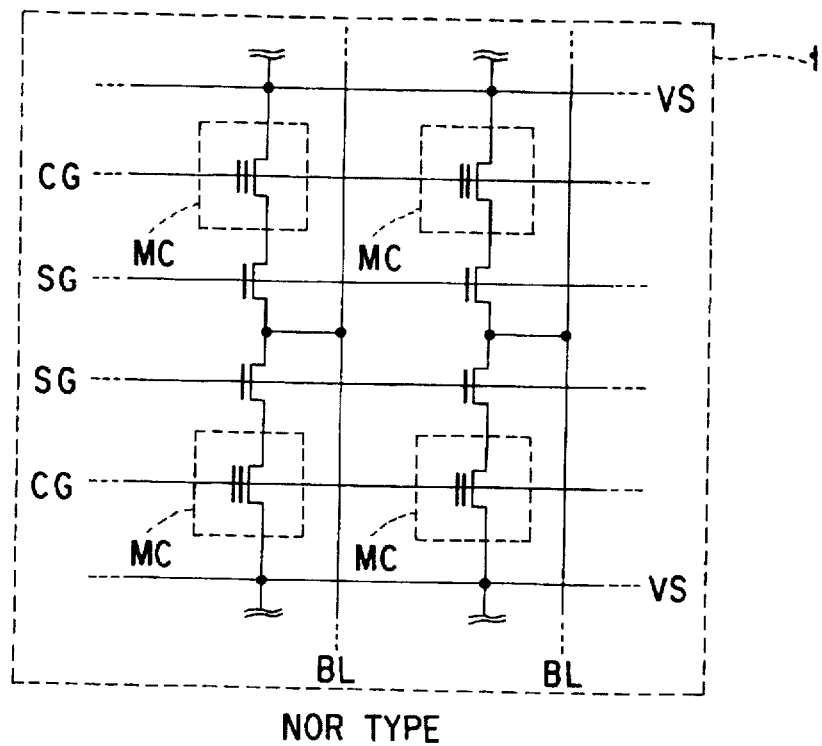
F I G. 34
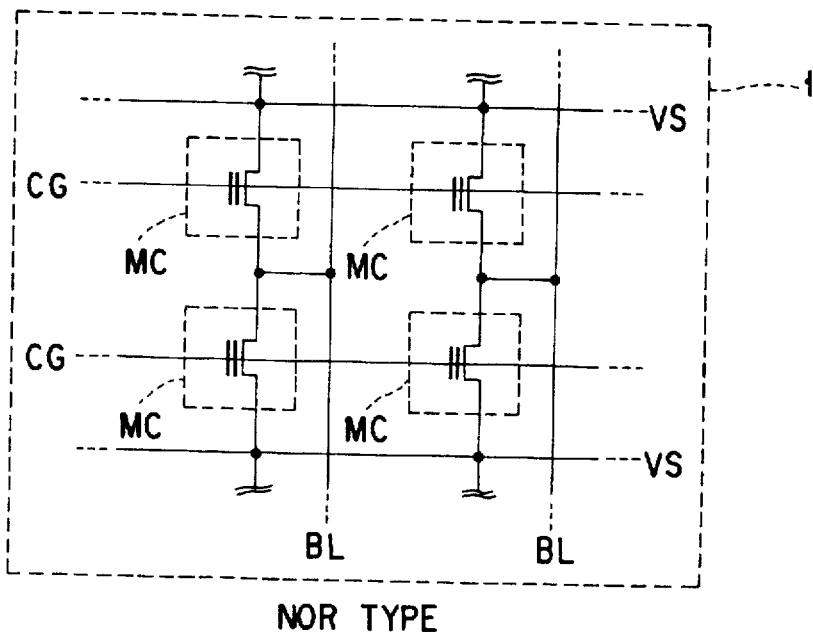
F I G. 35

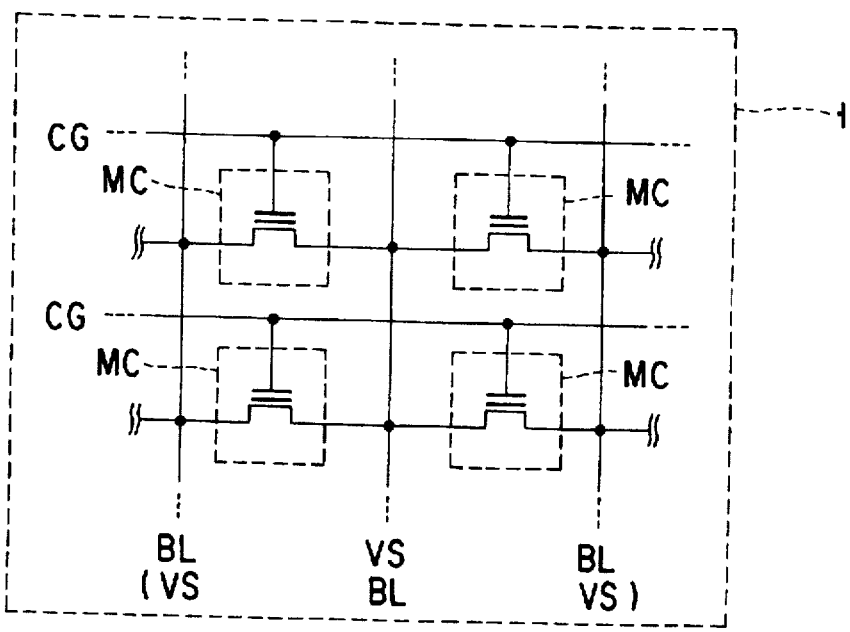
ALTERNATE GROUND ARRAY TYPE (NOR TYPE)
F I G. 38
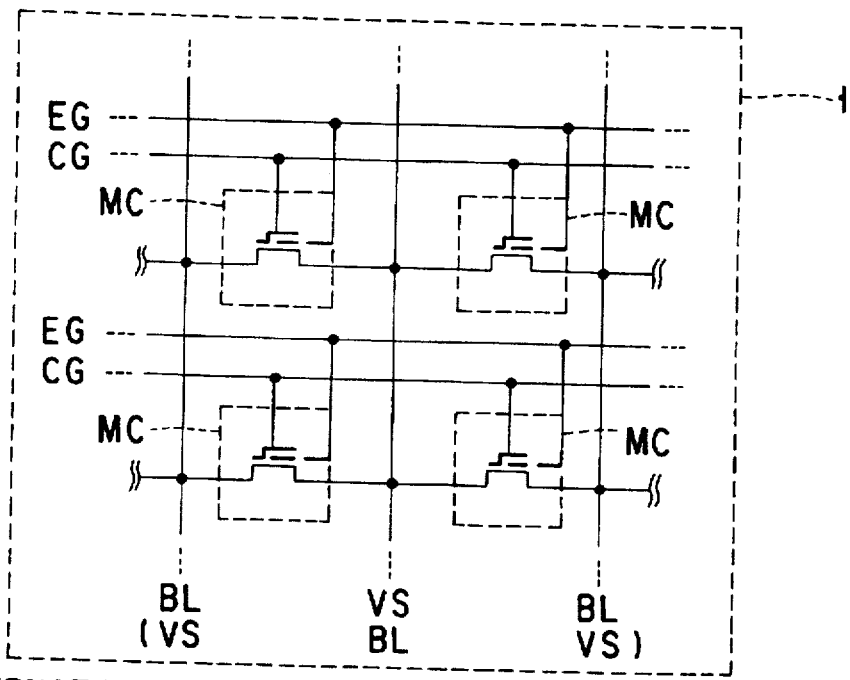
ALTERNATE GROUND ARRAY TYPE (NOR TYPE)
F I G. 39

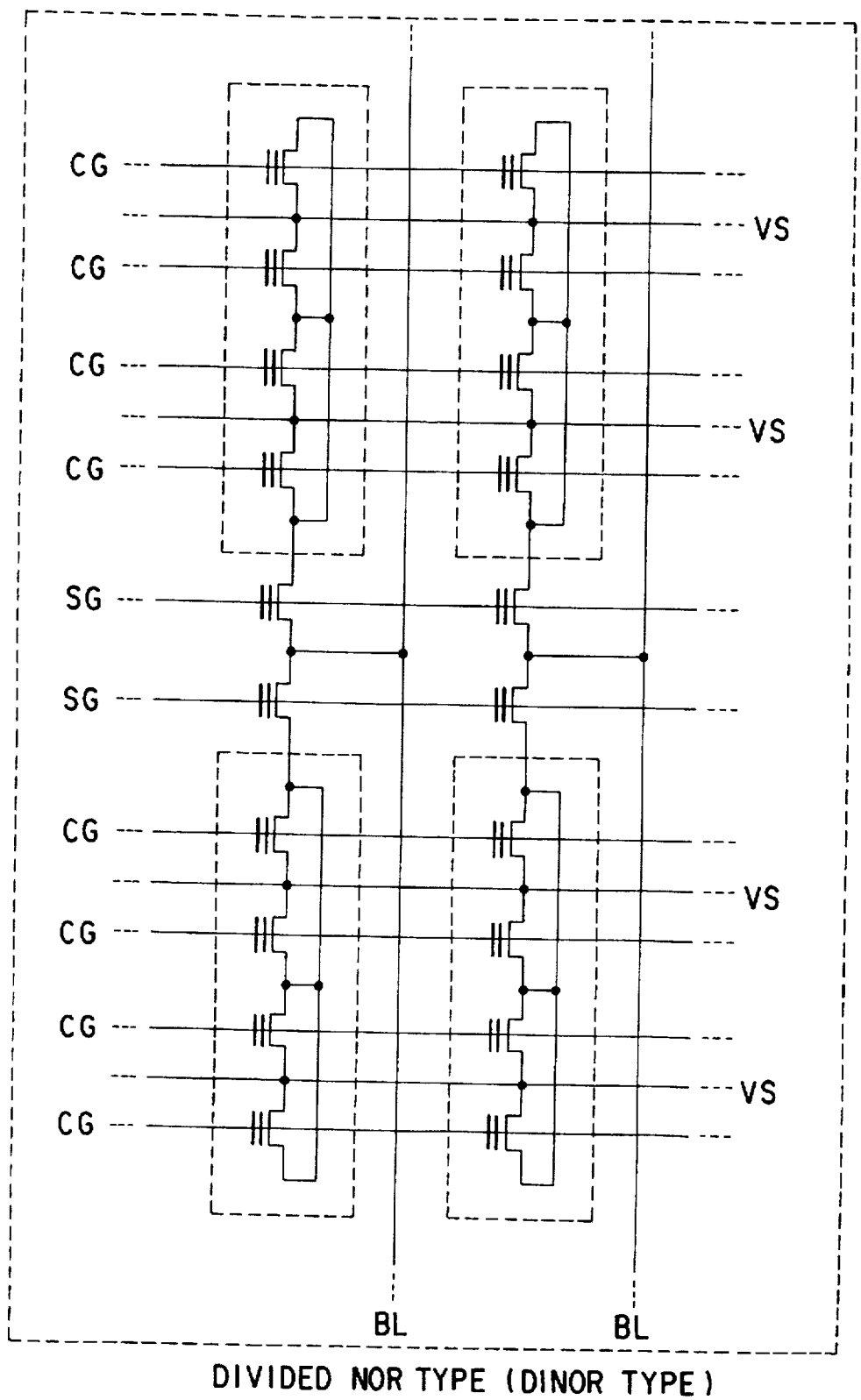
F I G. 40

<PROGRAMMING OF UPPER PAGE (ADDRESS A0)>

<PROGRAMMING OF LOWER PAGE (ADDRESS A128)>

<READING OF UPPER PAGE (ADDRESS A0)>

<READING OF LOWER PAGE (ADDRESS A128)>

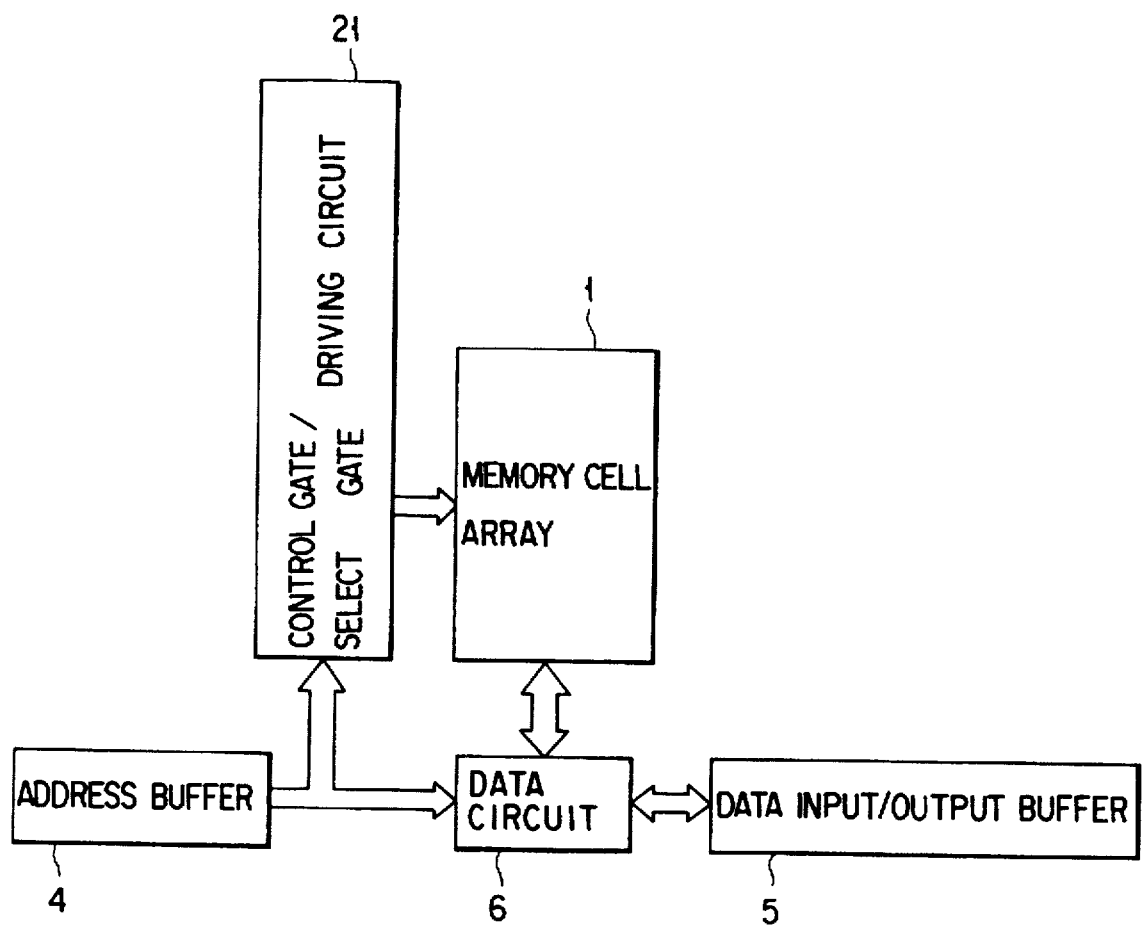
F I G. 48

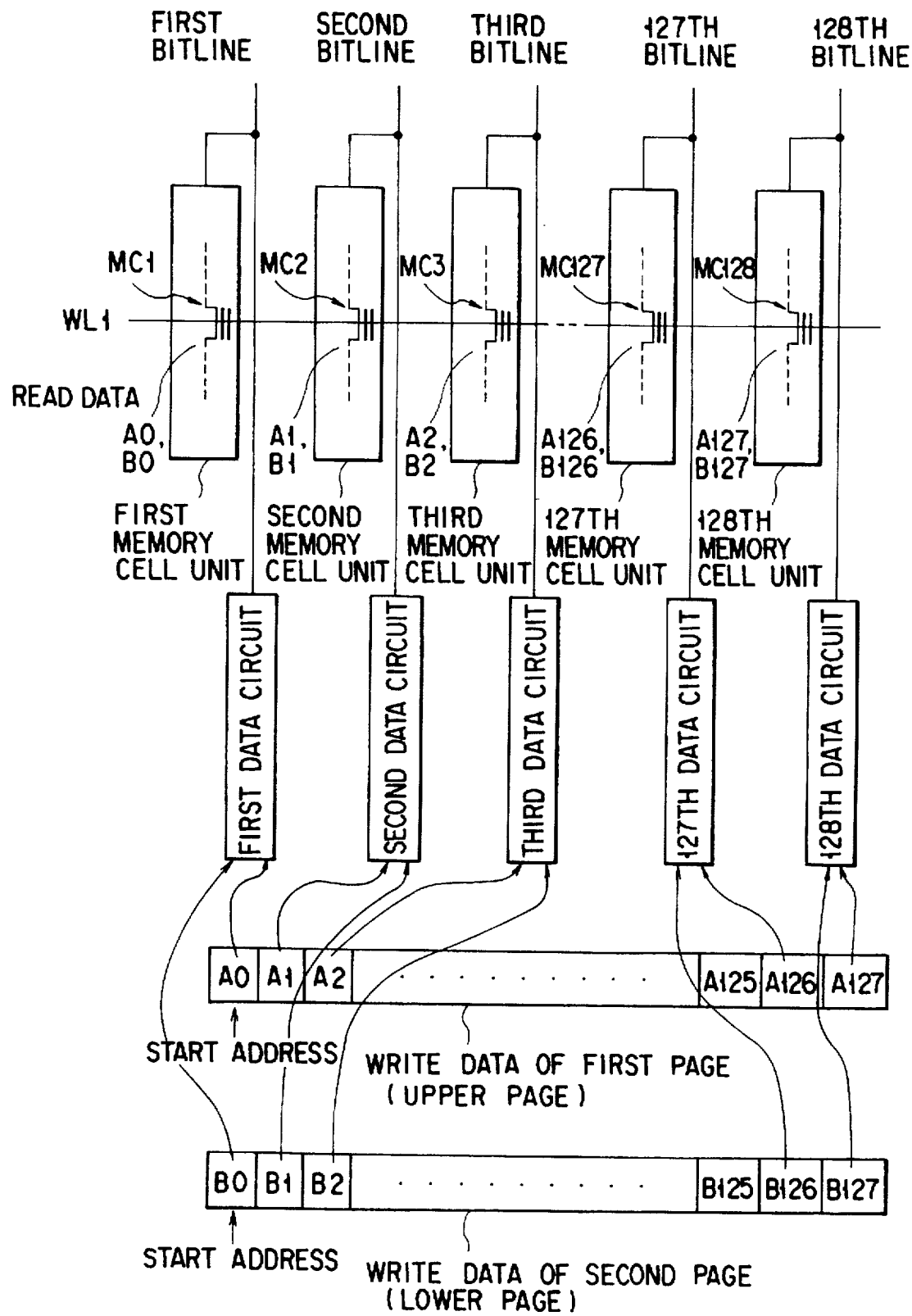
F I G. 49

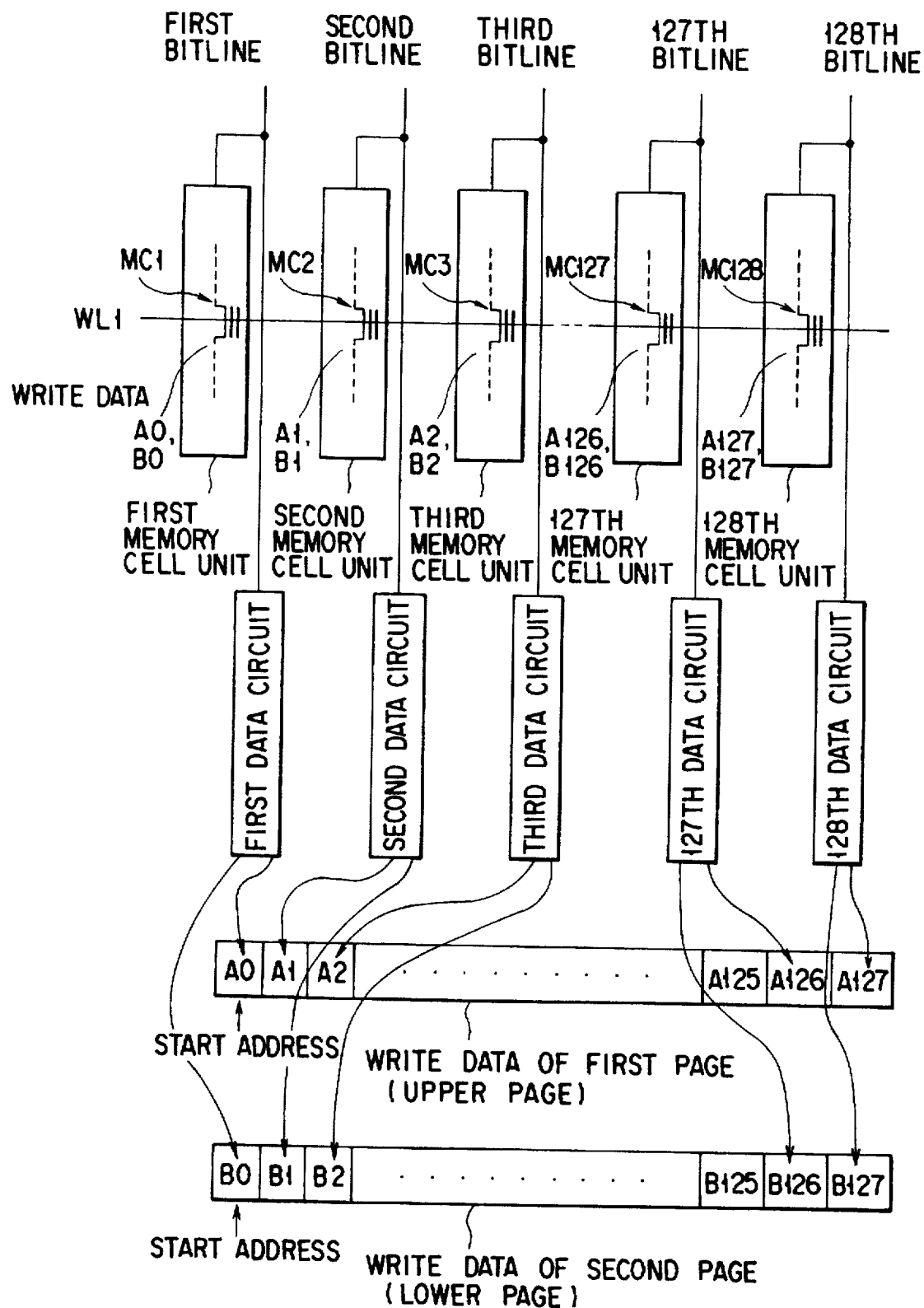
F I G. 50

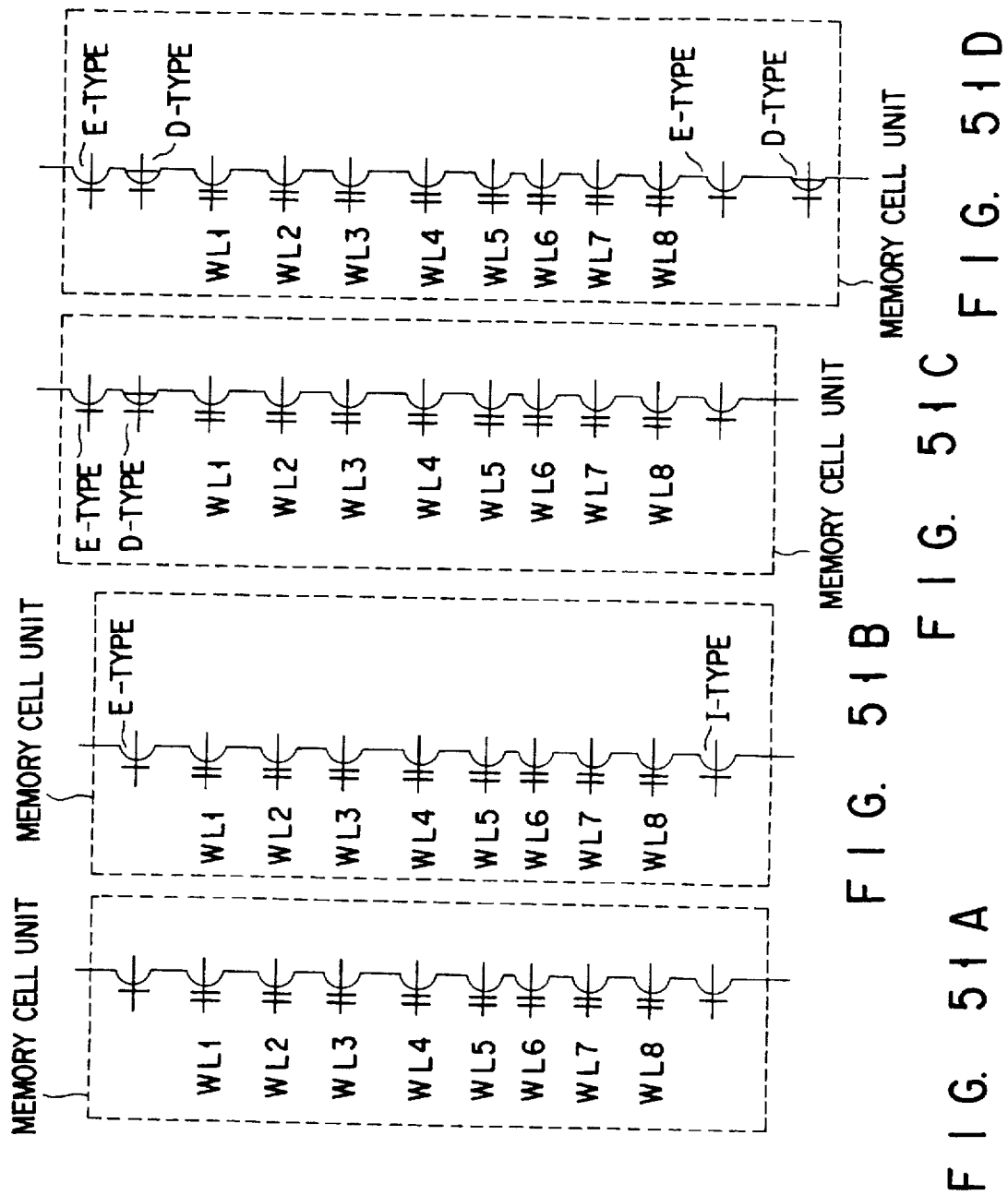

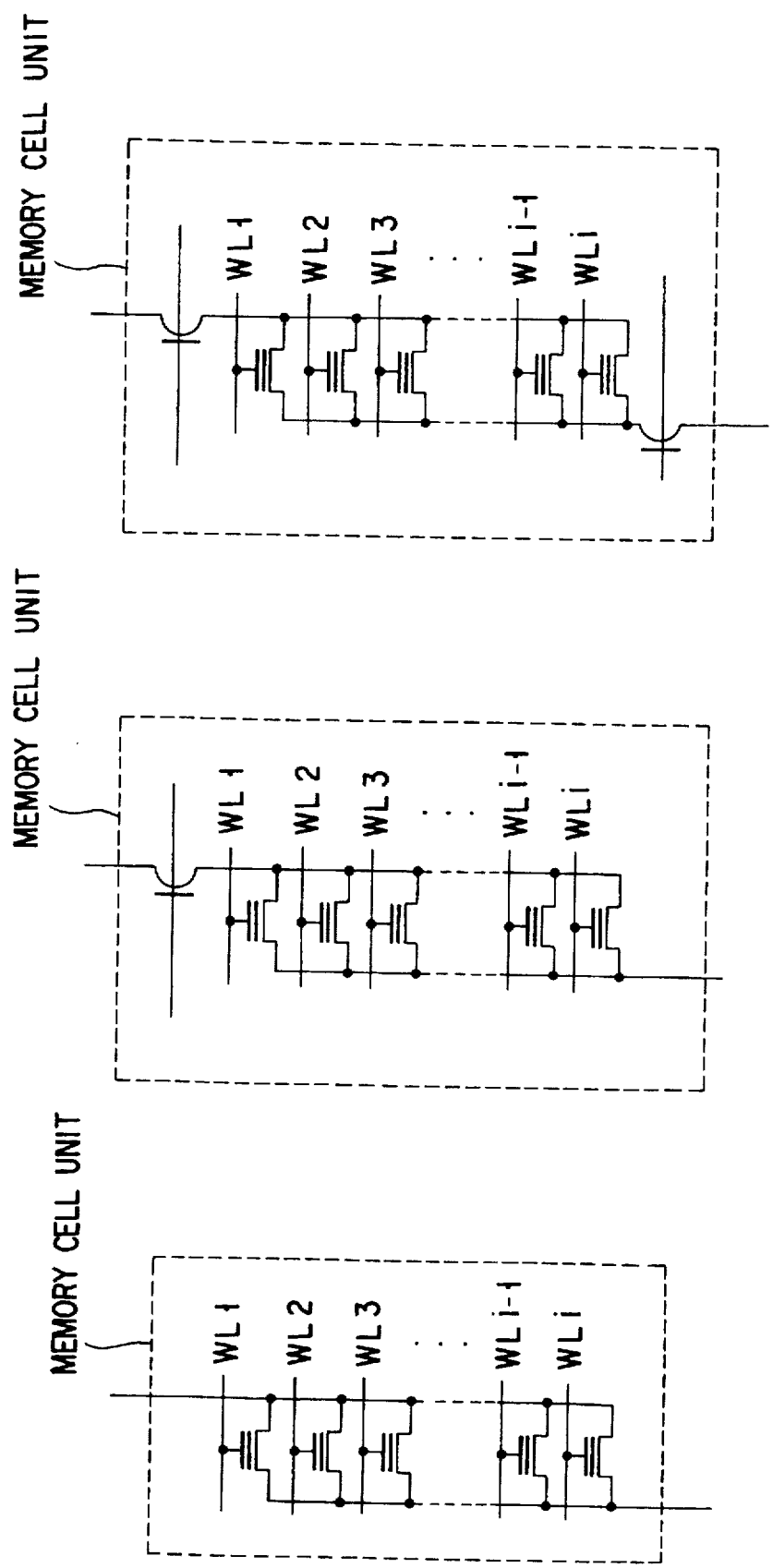

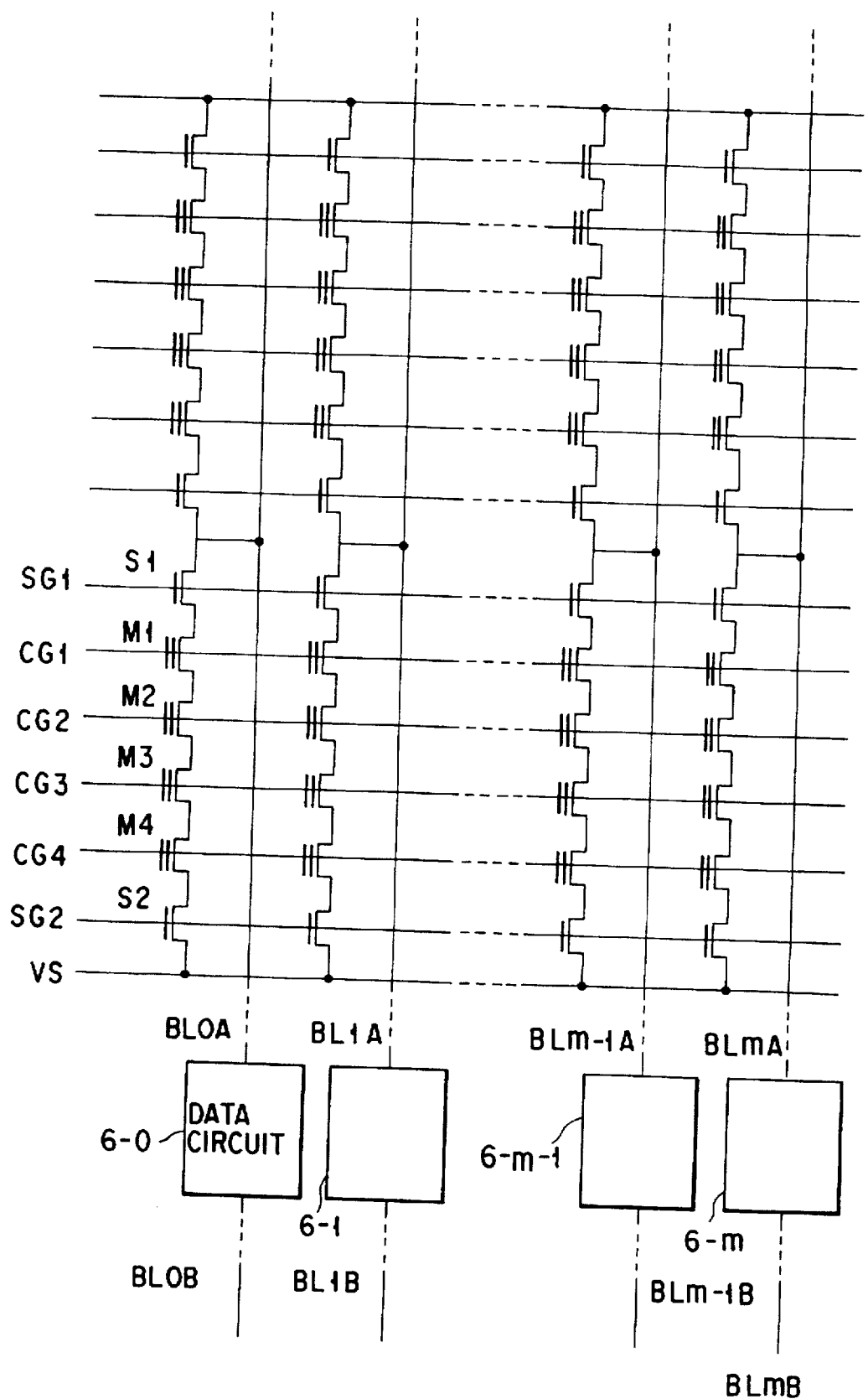
F I G. 53

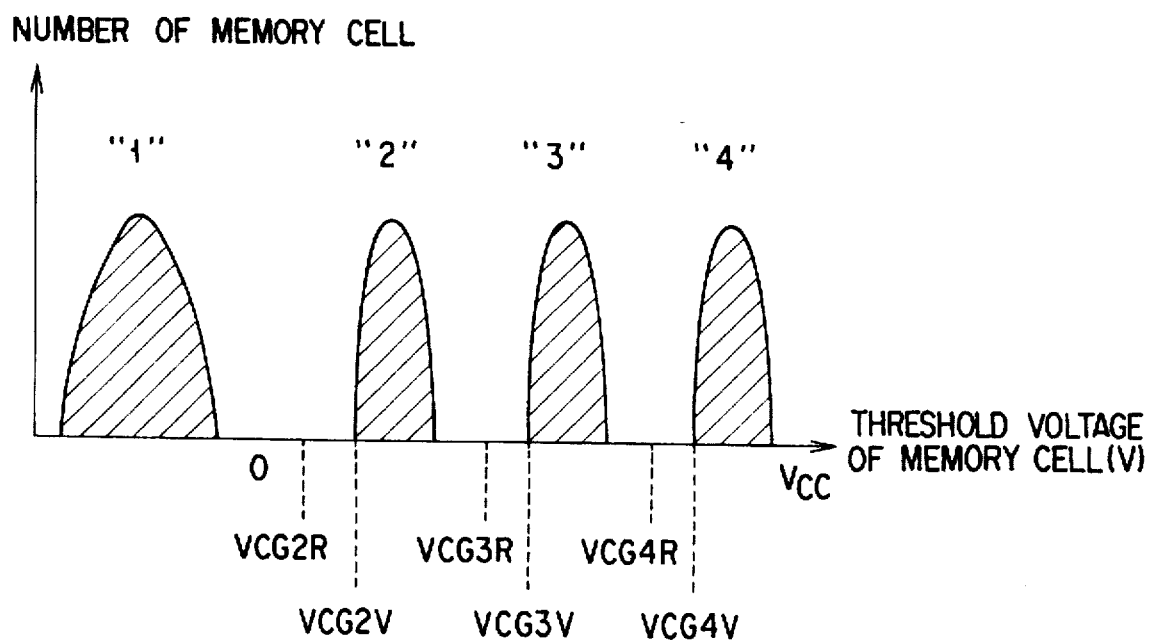
F I G. 54

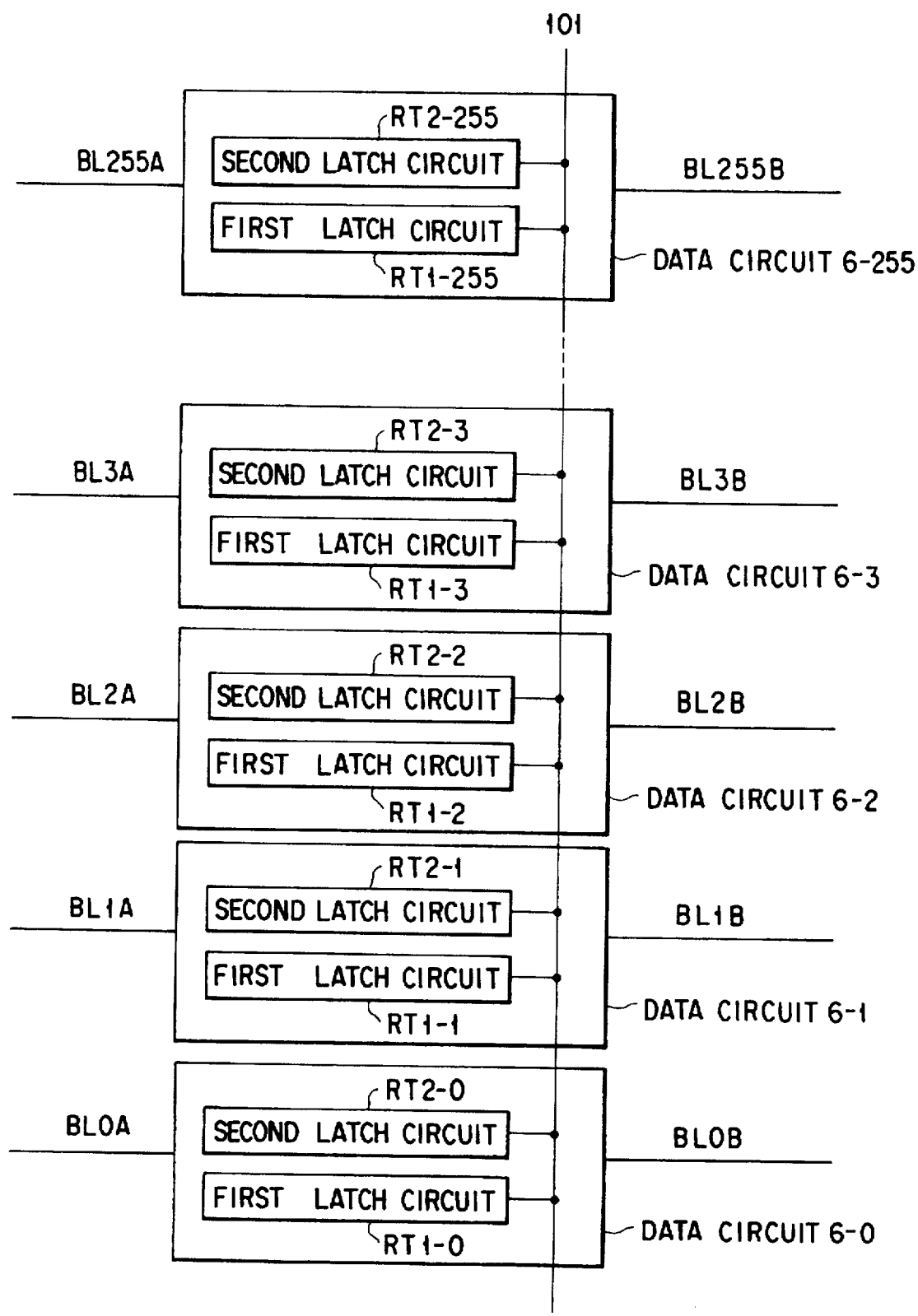
F I G. 55

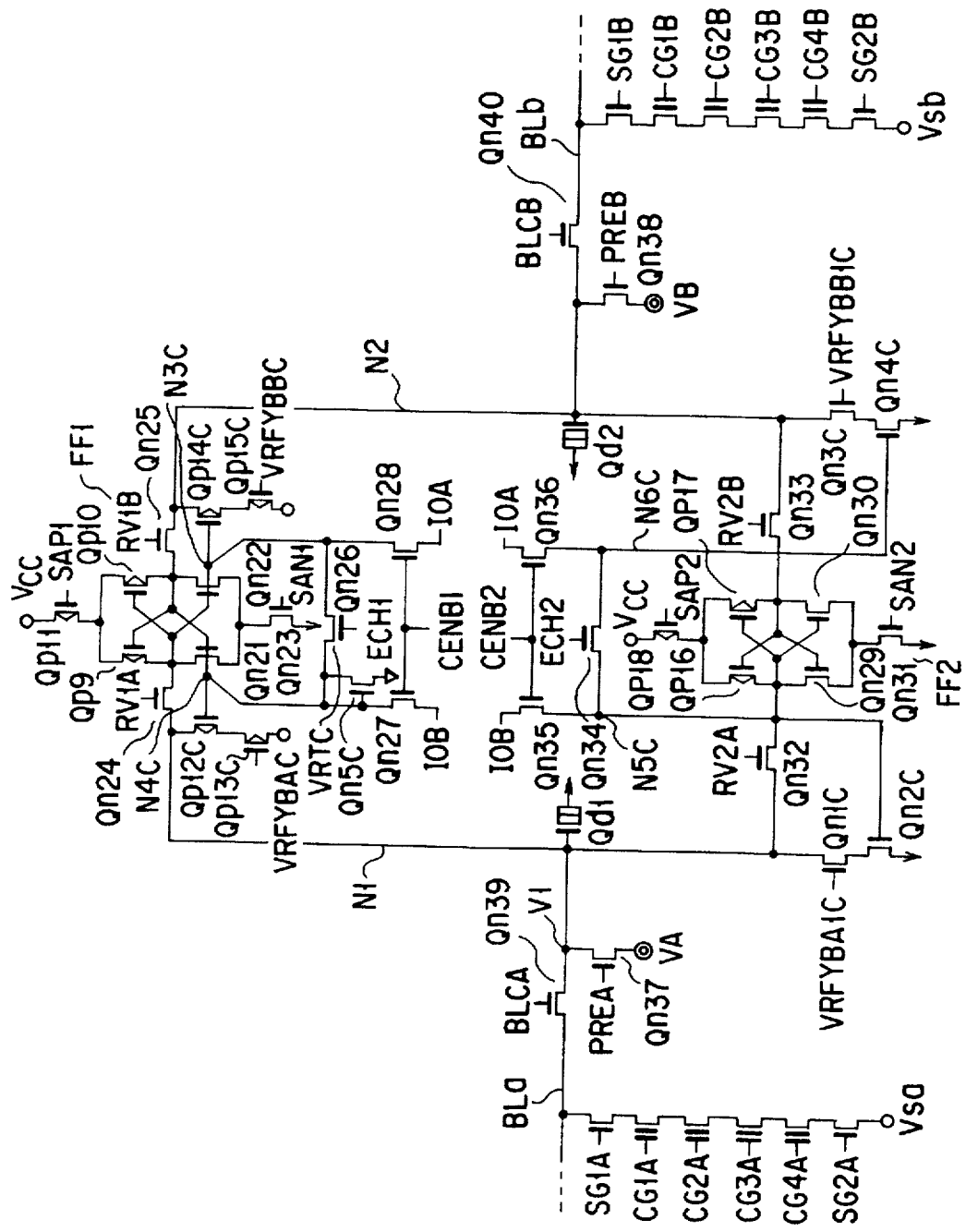
F I G. 57

| | INPUT DATA IS LOW | INPUT DATA IS HIGH |
|---|---|---|
| N3C | L | H |
| N4C | H | L |

WRITE DATA OF UPPER PAGE

PROGRAMMING OF UPPER PAGE

VERIFY READ OF UPPER PAGE

| | DATA OF UPPER PAGE IS HIGH "1" | DATA OF UPPER PAGE IS LOW "2" |
|---|---|---|
| N5C | L | H |
| N6C | H | L |

UPPER PAGE DATA READ BEFORE LOWER PAGE IS PROGRAMMED

| | DATA OF UPPER PAGE IS HIGH "1" | DATA OF UPPER PAGE IS LOW "2" |
|---|---|---|
| N5C | H | L |
| N6C | L | H |

DATA OF DATA CIRCUIT AFTER DATA IS INVERTED

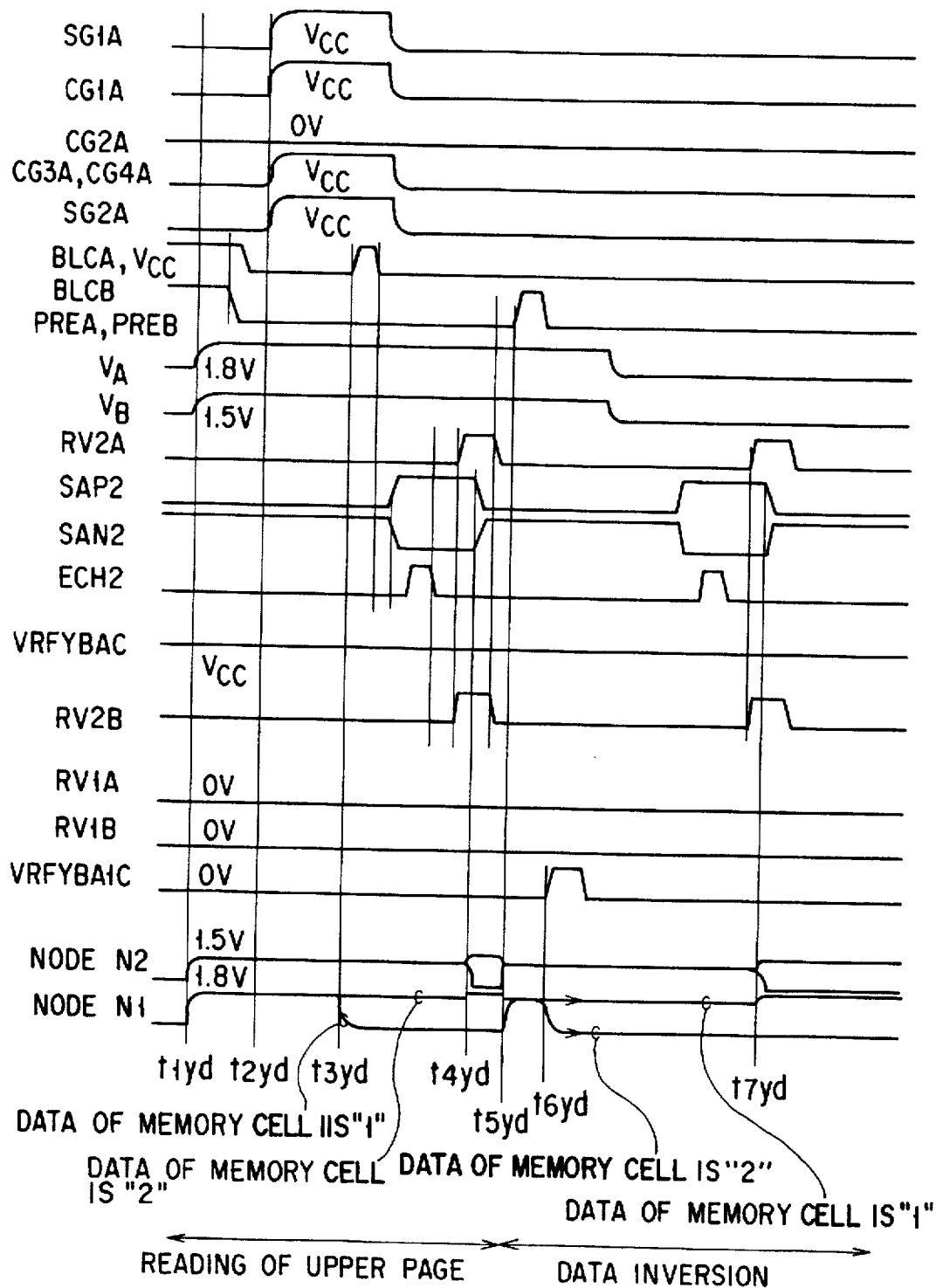
F I G. 62

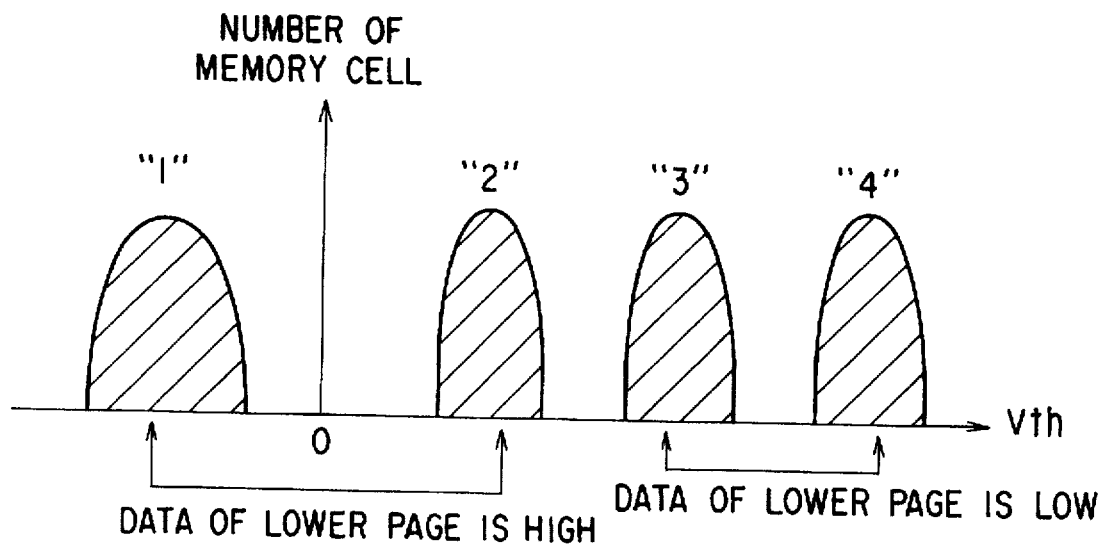
F I G. 63A
| | INPUT DATA OF LOWER PAGE IS LOW | INPUT DATA OF LOWER PAGE IS HIGH |
|---|---|---|
| N3C | L | H |
| N4C | H | L |
WRITE DATA OF LOWER PAGE
F I G. 63B

| | "1" DATA OF UPPER PAGE IS HIGH DATA OF LOWER PAGE IS HIGH | "2" DATA OF UPPER PAGE IS LOW DATA OF LOWER PAGE IS HIGH | "3" DATA OF UPPER PAGE IS HIGH DATA OF LOWER PAGE IS LOW | "4" DATA OF UPPER PAGE IS LOW DATA OF LOWER PAGE IS LOW |
|---|---|---|---|---|
| N3C | H | H | L | L |
| N4C | L | L | H | H |
| N5C | H | L | H | L |
| N6C | L | H | L | H |

NODE OF DATA CIRCUIT DURING PROGRAMMING OPERATION OF LOWER PAGE

PROGRAMMING OF LOWER PAGE

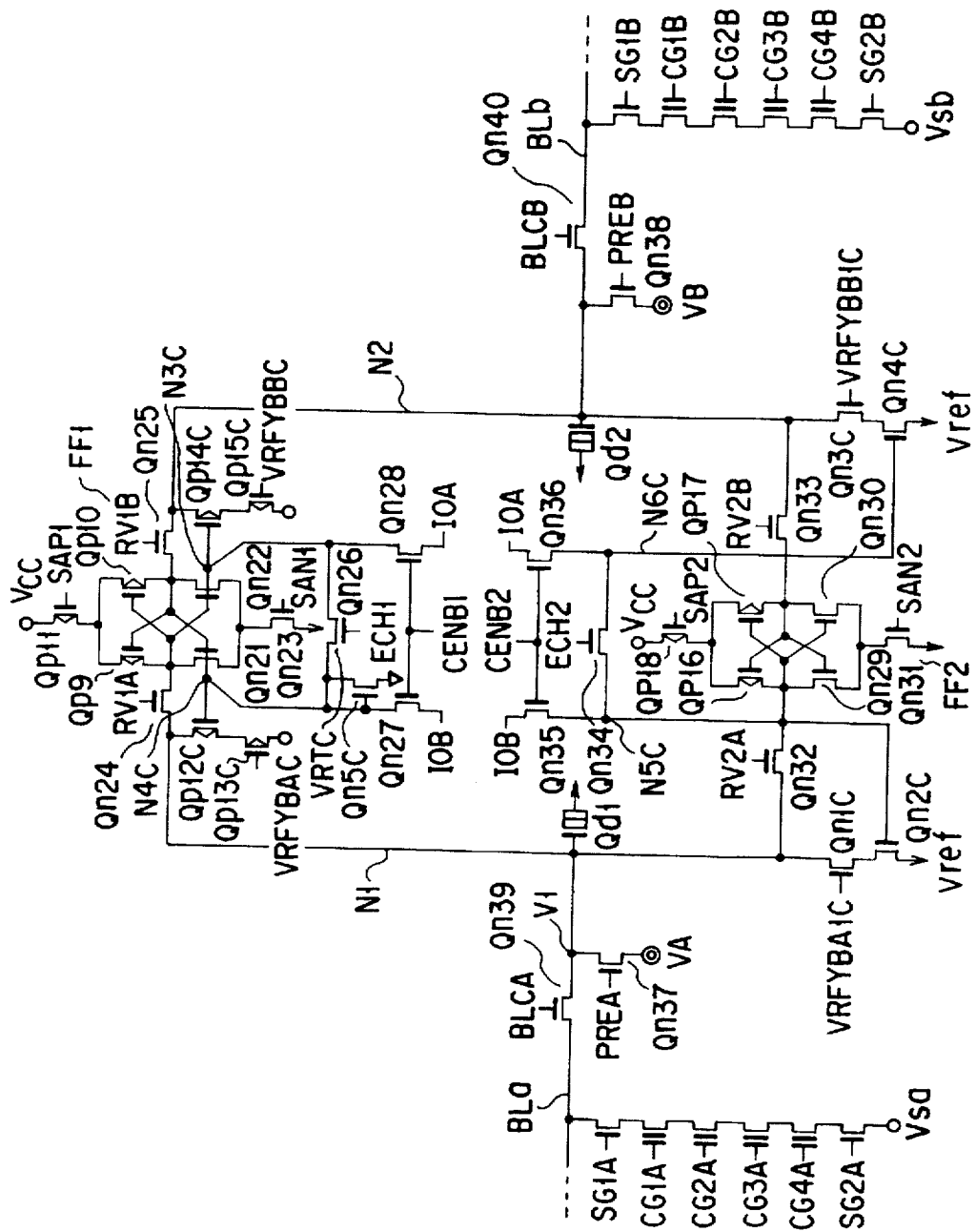
F I G. 66

ANOTHER PROGRAMMING METHOD OF LOWER PAGE

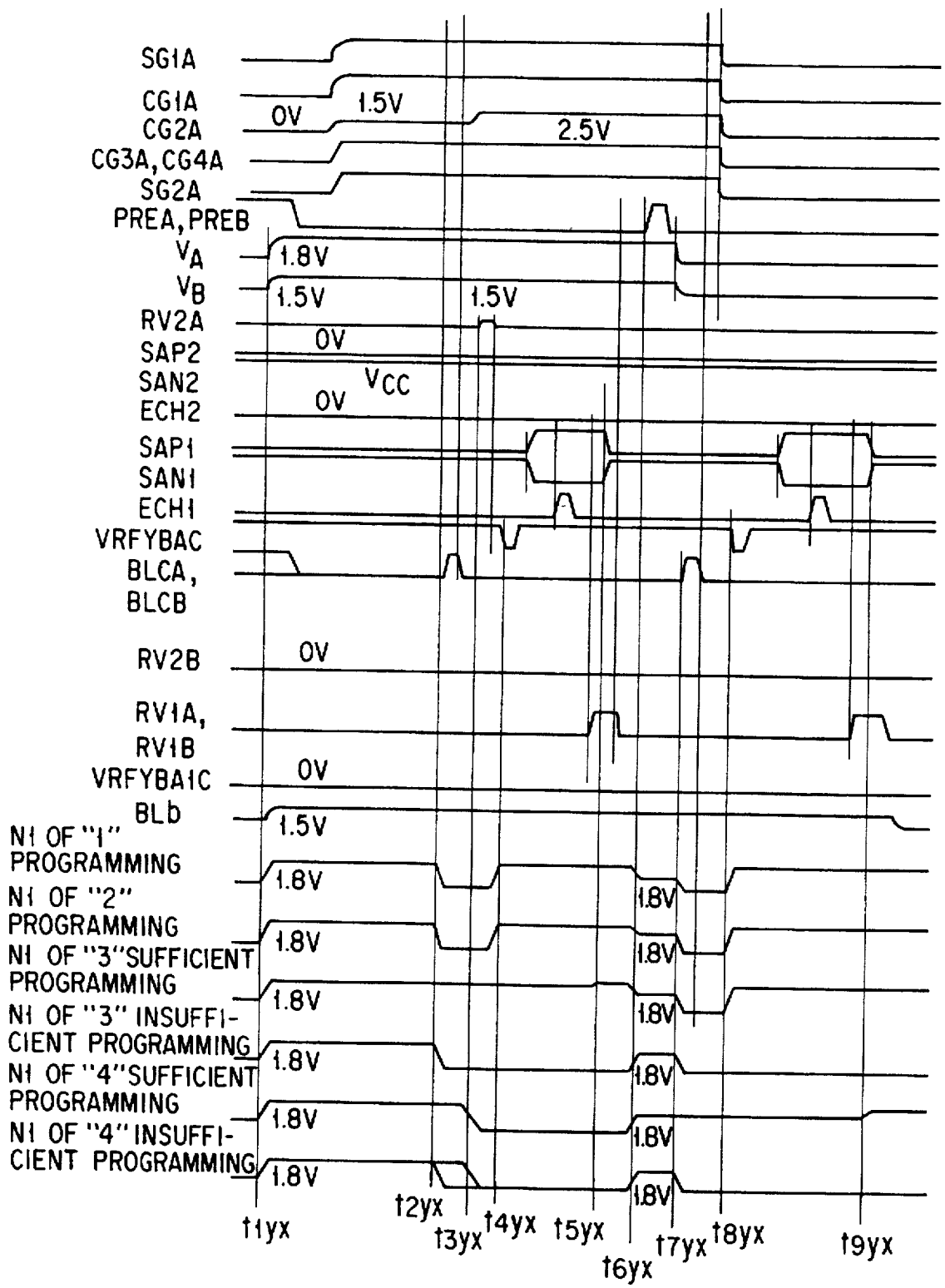
ANOTHER VERIFY READ OF LOWER PAGE
F I G. 68

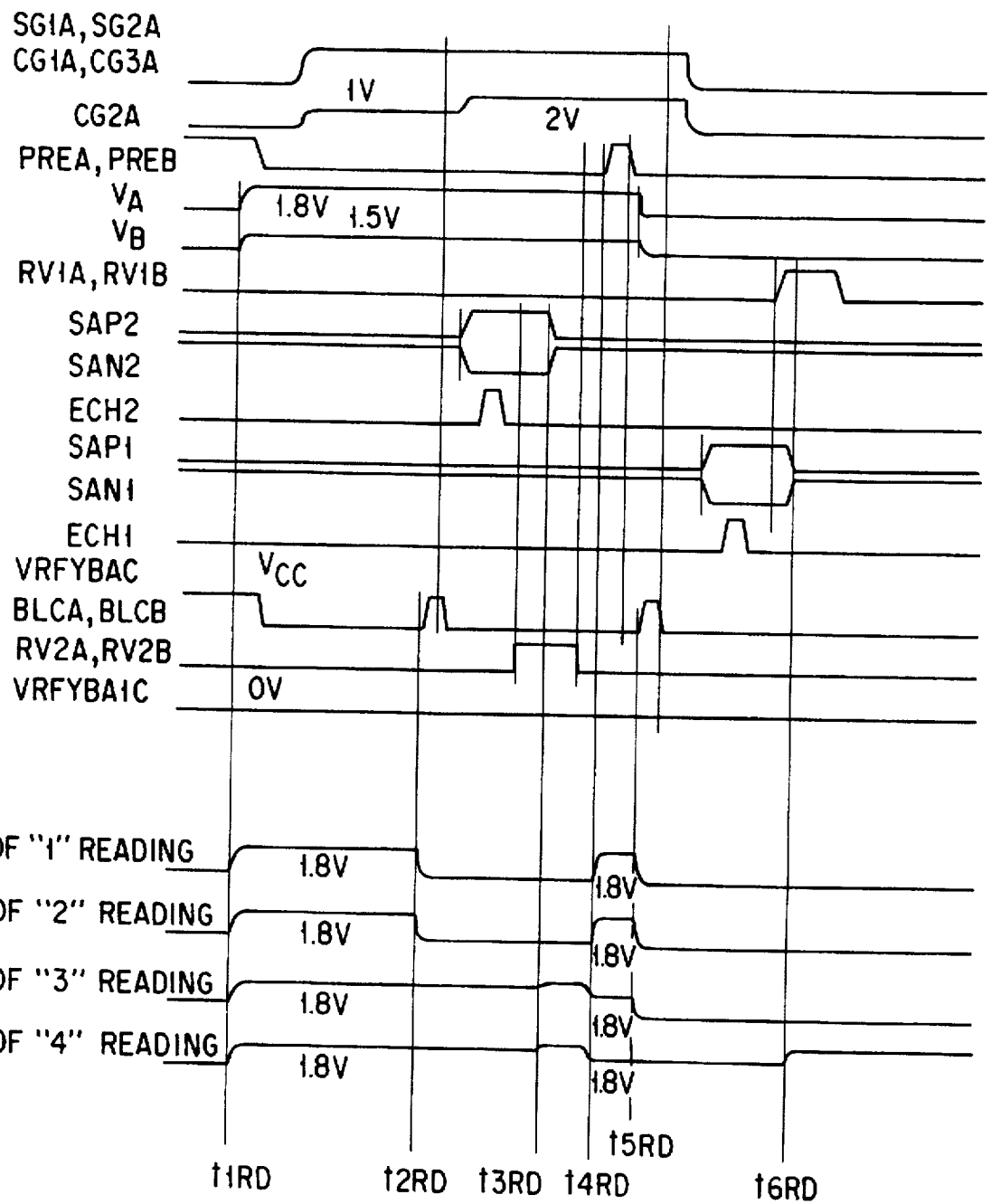
F I G. 69A

FIG. 70

| | "1" | "2" | "3" | "4" |
|---|---|---|---|---|
| N5C | L | L | H | H |
| N6C | H | H | L | L |

FIG. 71

| | "1" | "2" | "3" | "4" |
|---|---|---|---|---|
| N3C | L | L | L | H |
| N5C | L | L | H | H |

FIG. 72

| | "1" | "2" | "3" | "4" |
|---|---|---|---|---|
| N3C | L | H | L | H |
| N4C | H | L | H | L |
| N5C | L | L | H | H |
| N6C | H | H | L | L |

READ DATA

| | "1" DATA OF UPPER PAGE IS HIGH DATA OF LOWER PAGE IS HIGH | "2" DATA OF UPPER PAGE IS LOW DATA OF LOWER PAGE IS HIGH | "3" DATA OF UPPER PAGE IS HIGH DATA OF LOWER PAGE IS LOW | "4" DATA OF UPPER PAGE IS LOW DATA OF LOWER PAGE IS LOW |
|---|---|---|---|---|
| N3C | H | H | L | L |
| N4C | L | L | H | H |
| N5C | L | H | L | H |
| N6C | H | L | H | L |

NODE OF DATA CIRCUIT DURING PROGRAMMING OPERATION OF LOWER PAGE

ANOTHER VERIFY READ OF LOWER PAGE

| | INPUT DATA IS LOW | INPUT DATA IS HIGH |
|---|---|---|
| N3C | L | H |
| N4C | H | L |

WRITE DATA OF UPPER PAGE

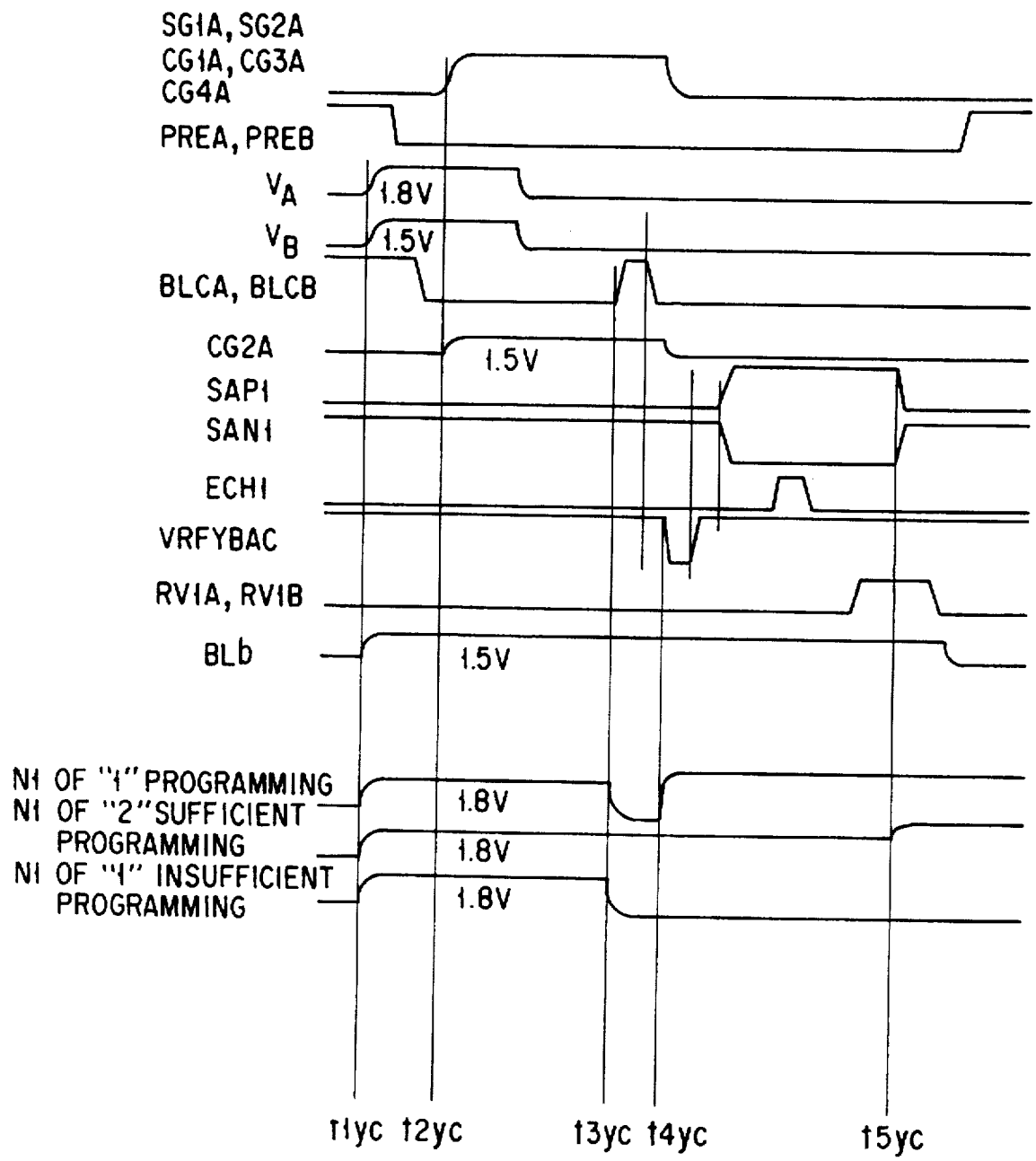
VERIFY READ OF UPPER PAGE
F I G. 77

| | "1" DATA OF UPPER PAGE IS HIGH DATA OF LOWER PAGE IS HIGH | "2" DATA OF UPPER PAGE IS LOW DATA OF LOWER PAGE IS HIGH | "3" DATA OF UPPER PAGE IS HIGH DATA OF LOWER PAGE IS LOW | "4" DATA OF UPPER PAGE IS LOW DATA OF LOWER PAGE IS LOW |
|---|---|---|---|---|
| N3C | H | L | H | L |
| N4C | L | H | L | H |
| N5C | H | H | L | L |
| N6C | L | L | H | H |

NODE OF DATA CIRCUIT DURING PROGRAMMING OPERATION OF LOWER PAGE

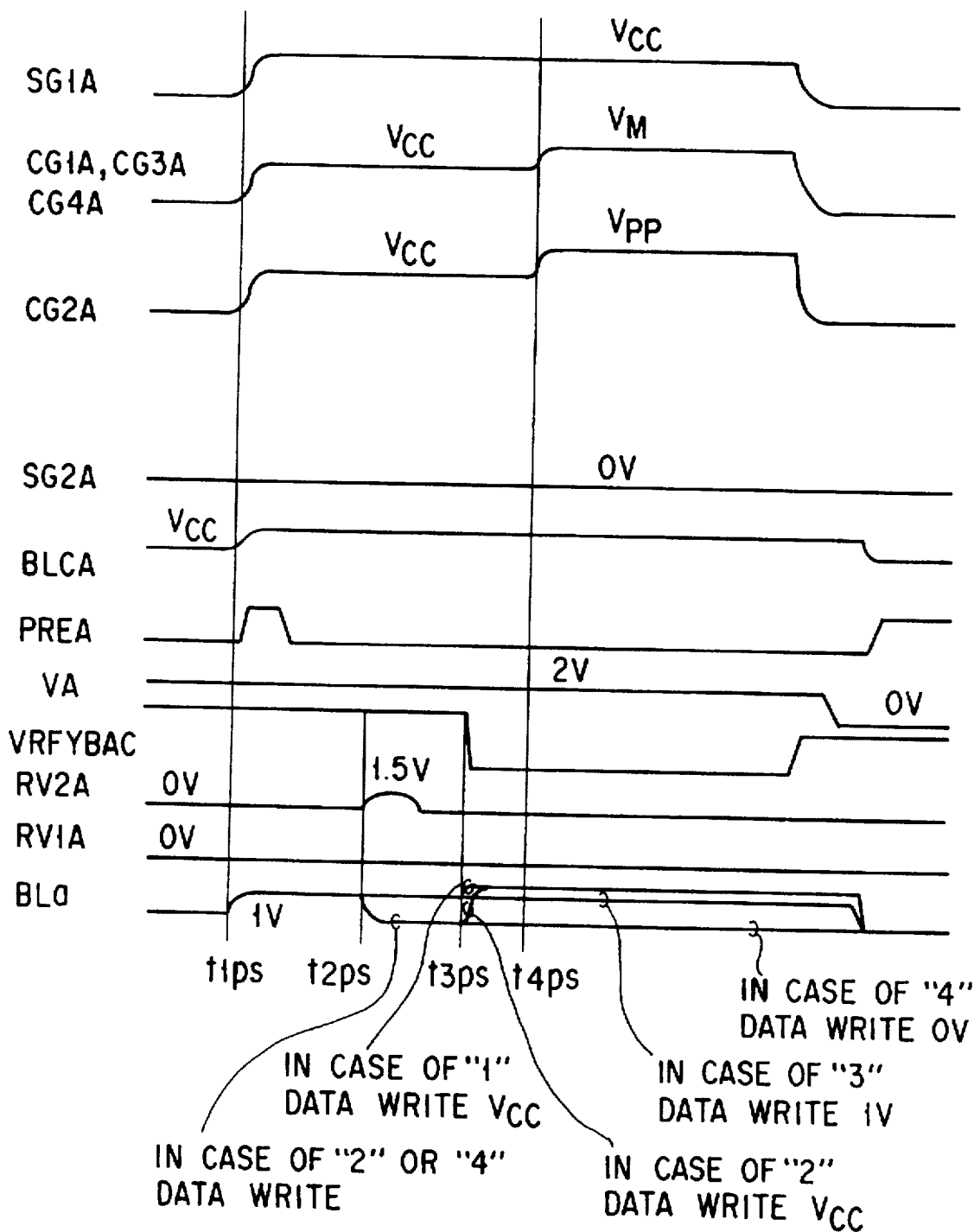
PROGRAMMING OF LOWER PAGE
F I G. 80

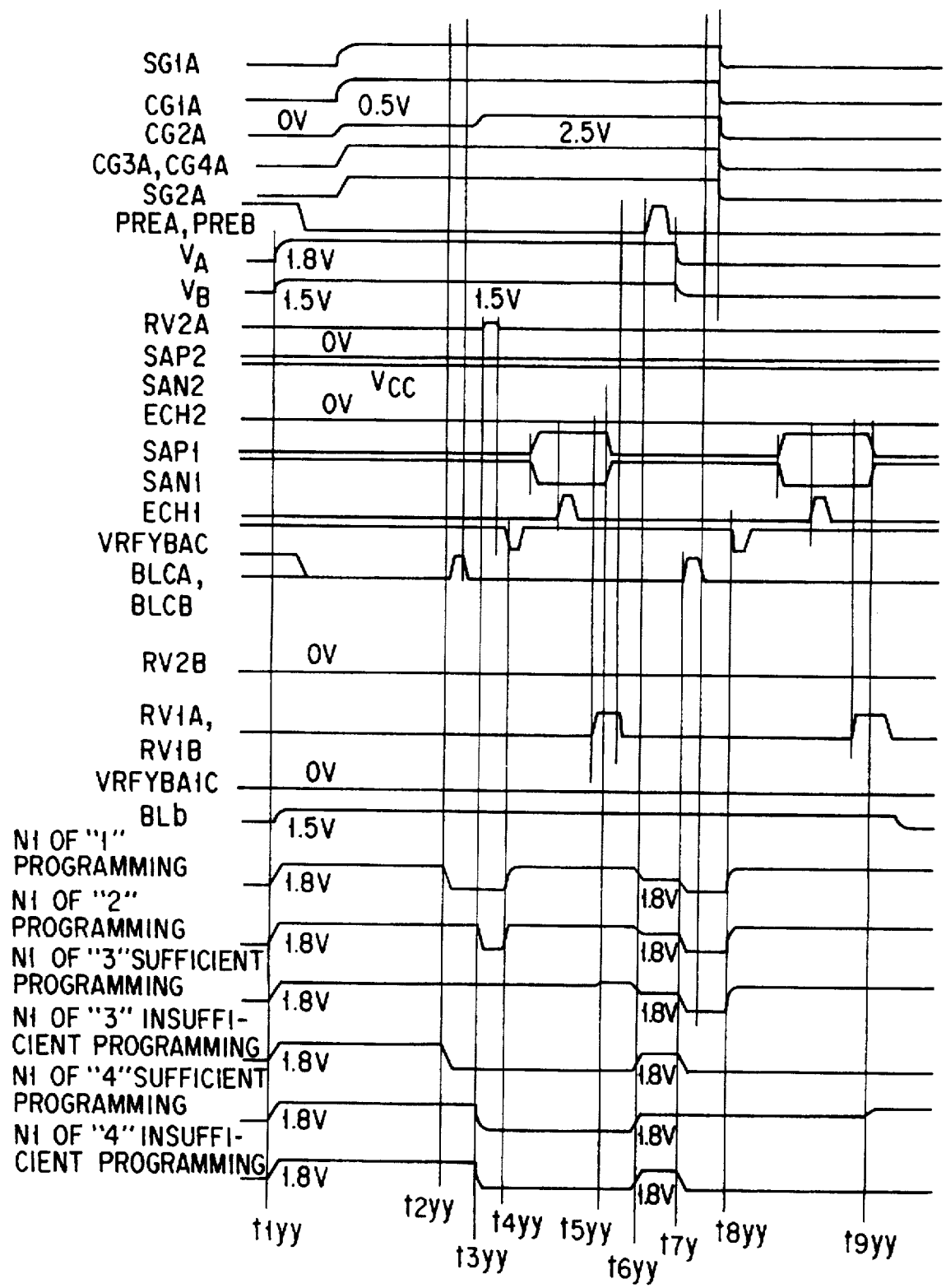
ANOTHER VERIFY READ OF LOWER PAGE
F I G. 8 1

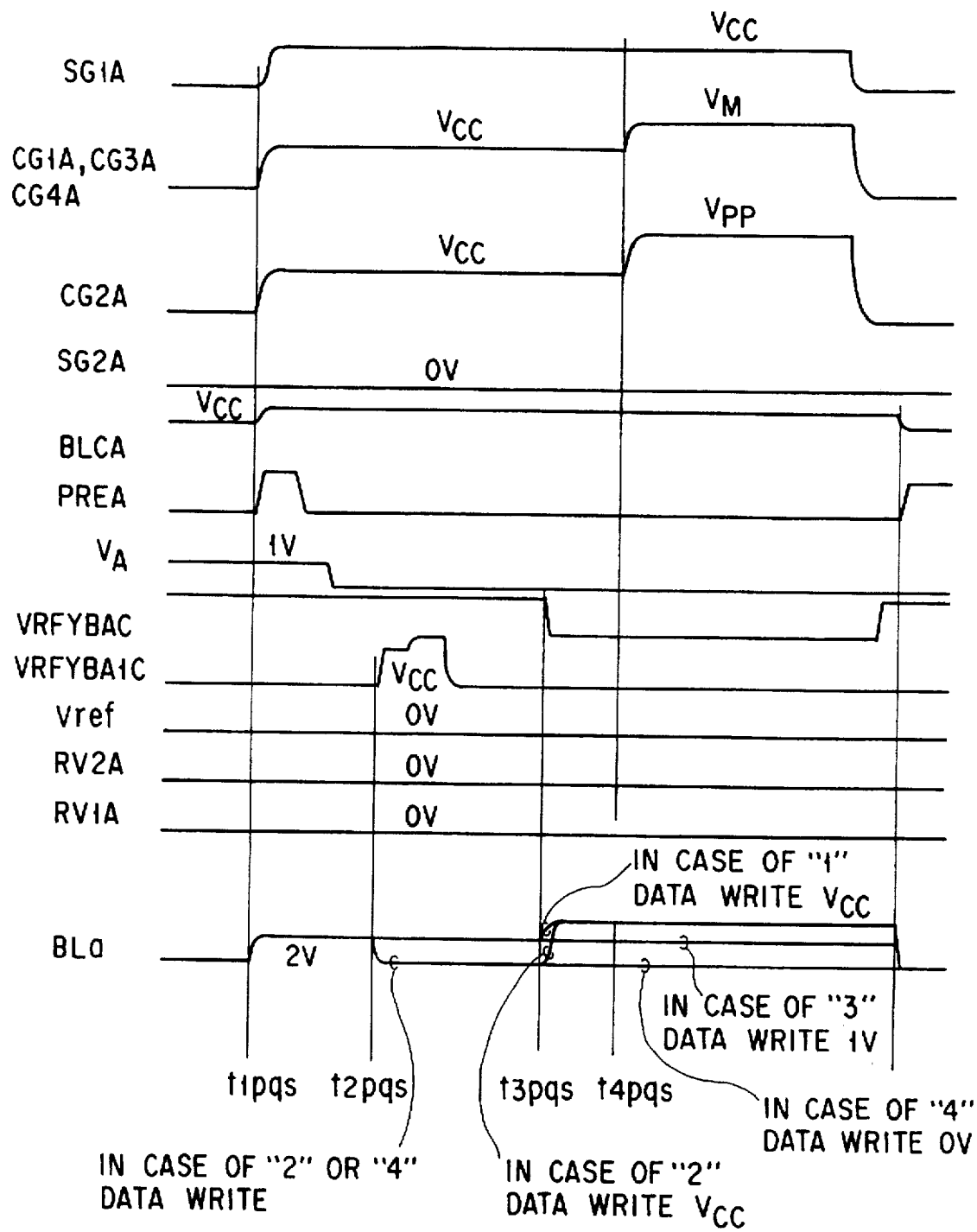
ANOTHER PROGRAMMING METHOD OF LOWER PAGE
F I G. 82

ANOTHER VERIFY READ OF LOWER PAGE

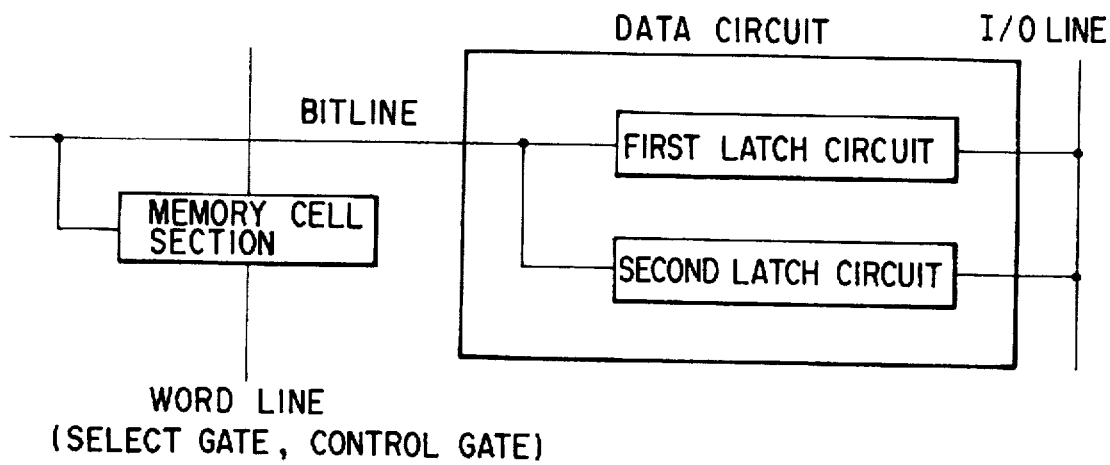
(a) FIRST PROGRAMMING OPERATION
   INPUT WRITE DATA FROM I/O LINE TO FIRST LATCH CIRCUIT
(b) SECOND PROGRAMMING OPERATION
   READ AND LATCH DATA OF MEMORY CELL TO SECOND LATCH CIRCUIT, INPUT WRITE DATA FROM I/O LINE TO FIRST LATCH CIRCUIT
F I G. 85

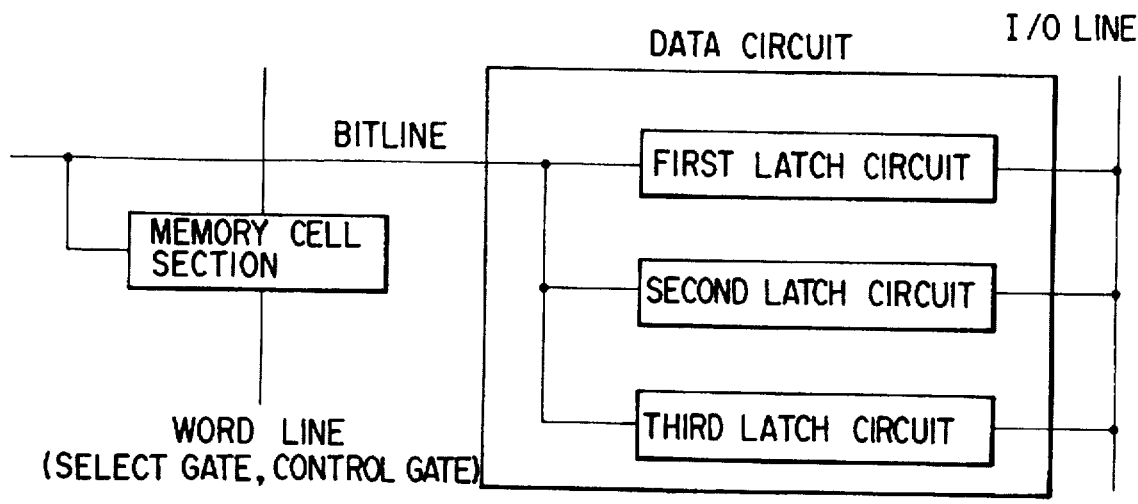

(a) FIRST PROGRAMMING OPERATION
   INPUT WRITE DATA FROM I/O LINE TO FIRST LATCH CIRCUIT
(b) SECOND PROGRAMMING OPERATION
   READ AND LATCH DATA OF MEMORY CELL TO SECOND LATCH CIRCUIT, INPUT WRITE DATA FROM I/O LINE TO FIRST LATCH CIRCUIT
(c) THIRD PROGRAMMING OPERATION
   READ AND LATCH DATA OF MEMORY CELL TO SECOND AND THIRD LATCH CIRCUITS, INPUT WRITE DATA FROM I/O LINE TO FIRST LATCH CIRCUIT

F I G. 87

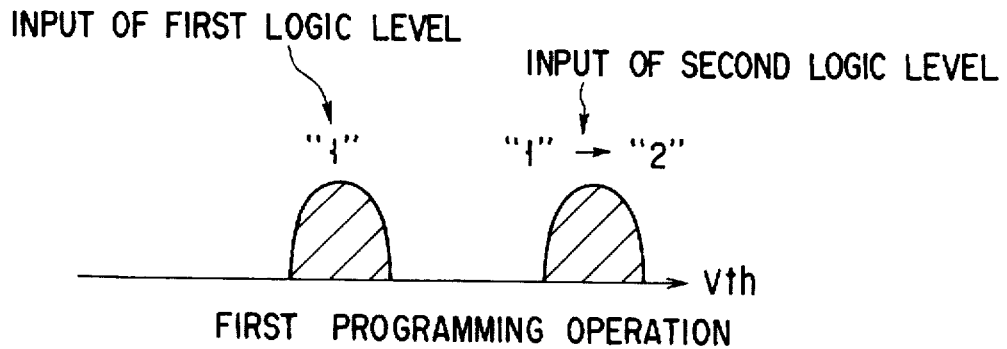
F I G. 88A
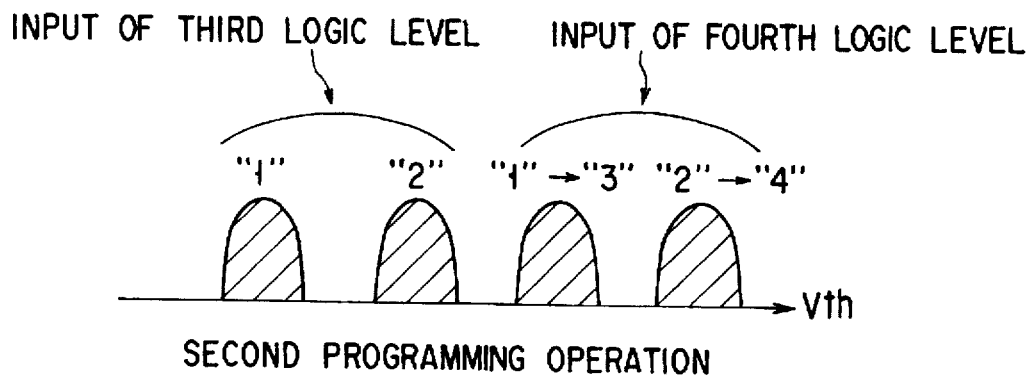
F I G. 88B
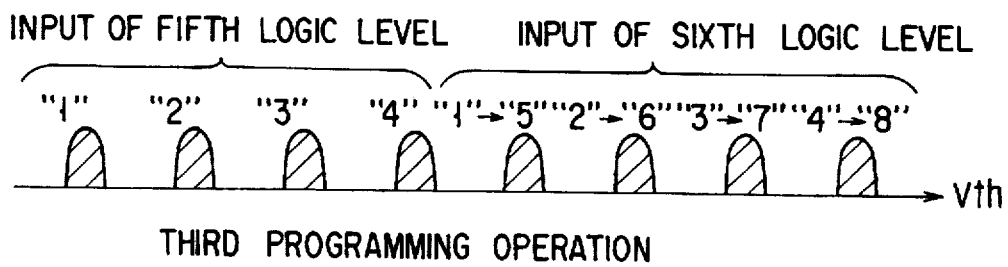
F I G. 88C
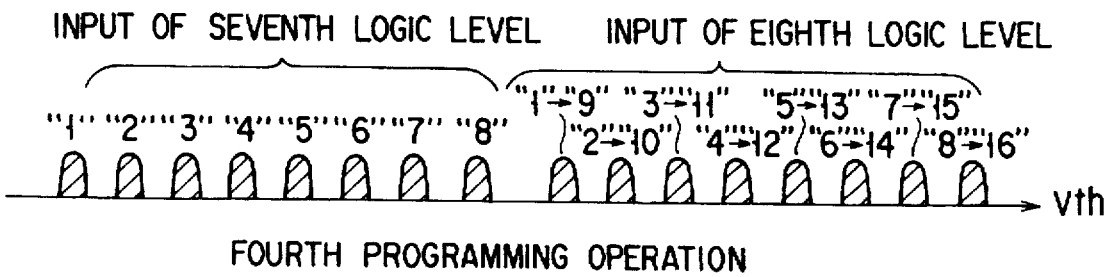
F I G. 88D

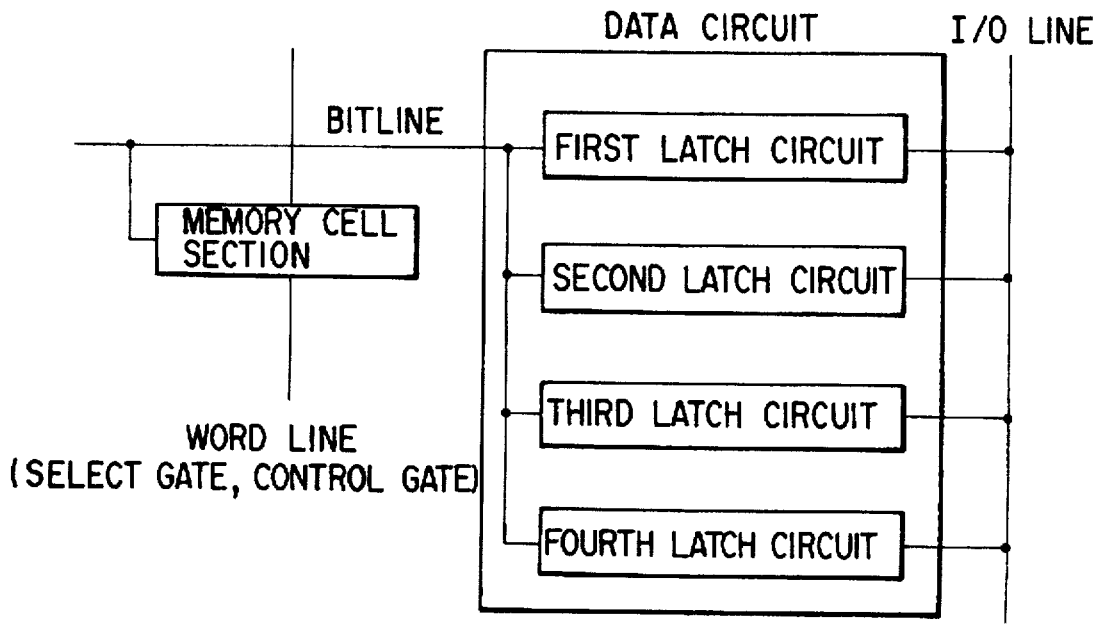

(a) FIRST PROGRAMMING OPERATION
   INPUT WRITE DATA FROM I/O LINE TO FIRST LATCH CIRCUIT
(b) SECOND PROGRAMMING OPERATION
   READ AND LATCH DATA OF MEMORY CELL TO SECOND LATCH CIRCUIT, INPUT WRITE DATA FROM I/O LINE TO FIRST LATCH CIRCUIT
(c) THIRD PROGRAMMING OPERATION
   READ AND LATCH DATA OF MEMORY CELL TO SECOND AND THIRD LATCH CIRCUITS, INPUT WRITE DATA FROM I/O LINE TO FIRST LATCH CIRCUIT
(d) FOURTH PROGRAMMING OPERATION
   READ AND LATCH DATA OF MEMORY CELL TO SECOND TO FOURTH LATCH CIRCUITS, INPUT WRITE DATA FROM I/O LINE TO FIRST LATCH CIRCUIT

FIG. 89

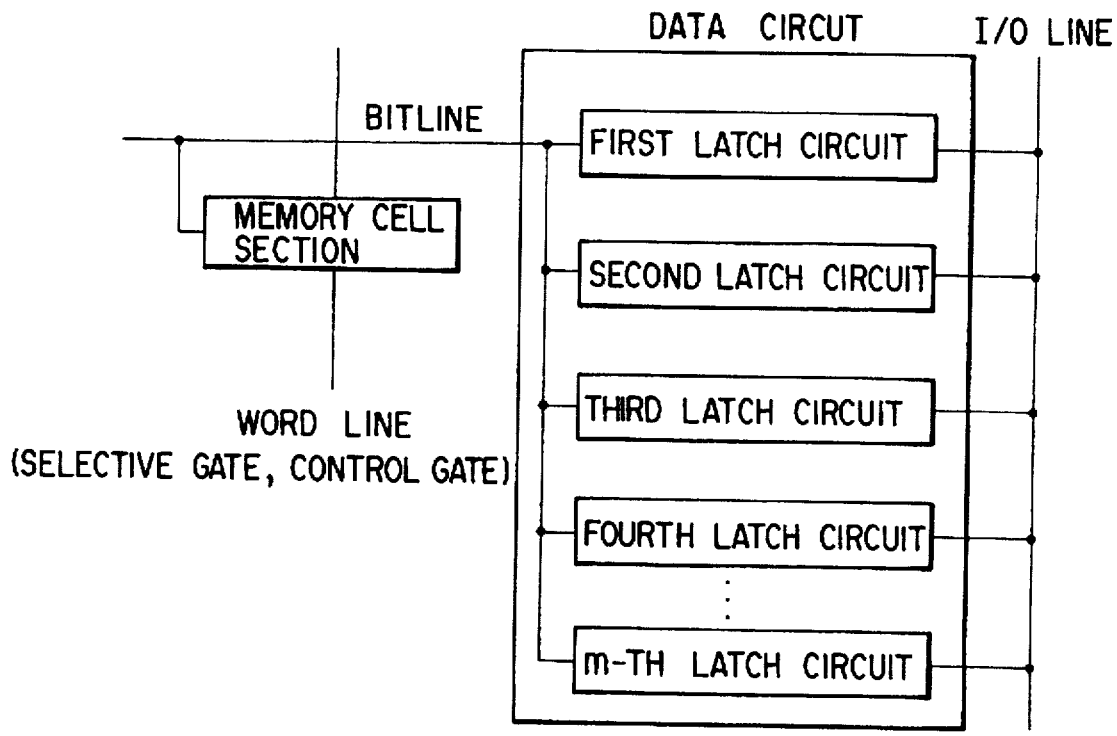

(a) FIRST PROGRAMMING OPERATION
INPUT WRITE DATA FROM I/O LINE TO FIRST LATCH CIRCUIT (b) SECOND PROGRAMMING OPERATION
READ AND LATCH DATA OF MEMORY CELL TO SECOND LATCH CIRCUIT, INPUT WRITE DATA FROM I/O LINE TO FIRST LATCH CIRCUIT (c) THIRD PROGRAMMING OPERATION
READ AND LATCH DATA OF MEMORY CELL TO SECOND AND THIRD LATCH CIRCUITS, INPUT WRITE DATA FROM I/O LINE TO FIRST LATCH CIRCUIT (d) FOURTH PROGRAMMING OPERATION
READ AND LATCH DATA OF MEMORY CELL TO SECOND TO FOURTH LATCH CIRCUITS, INPUT WRITE DATA FROM I/O LINE TO FIRST LATCH CIRCUIT (e) m-TH PROGRMMING OPERATION
READ AND LATCH DATA OF MOMORY CELL TO SECOND TO m-TH LATCH CIRCUITS, INPUT WRITE DATA FROM I/O LINE TO FIRST LATCH CIRCUIT

F I G. 91

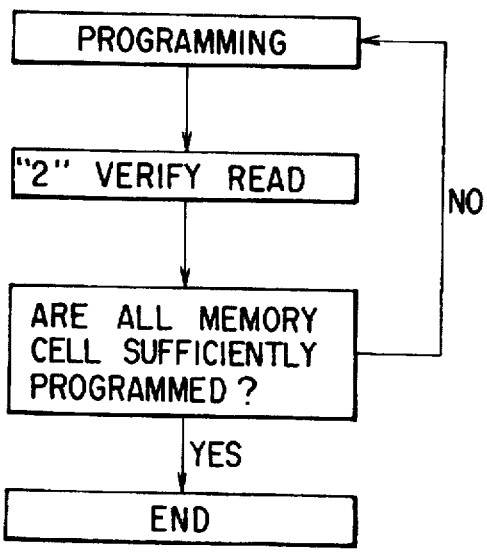
PROGRAMMING OF UPPER PAGE
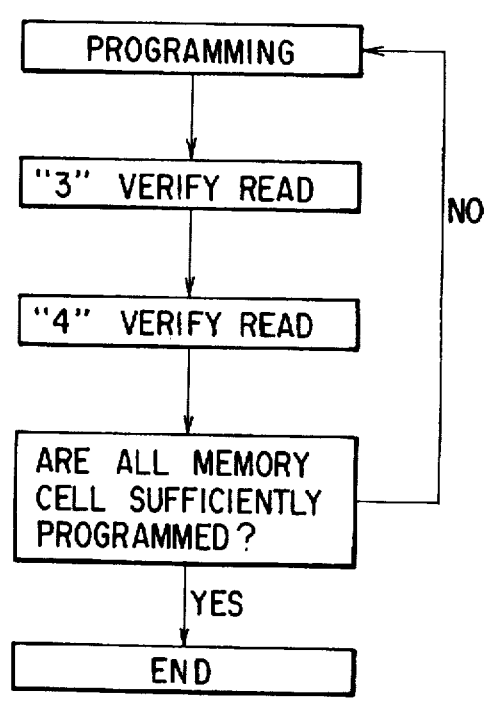
PROGRAMMING OF LOWER PAGE
F I G. 92A
F I G. 92B

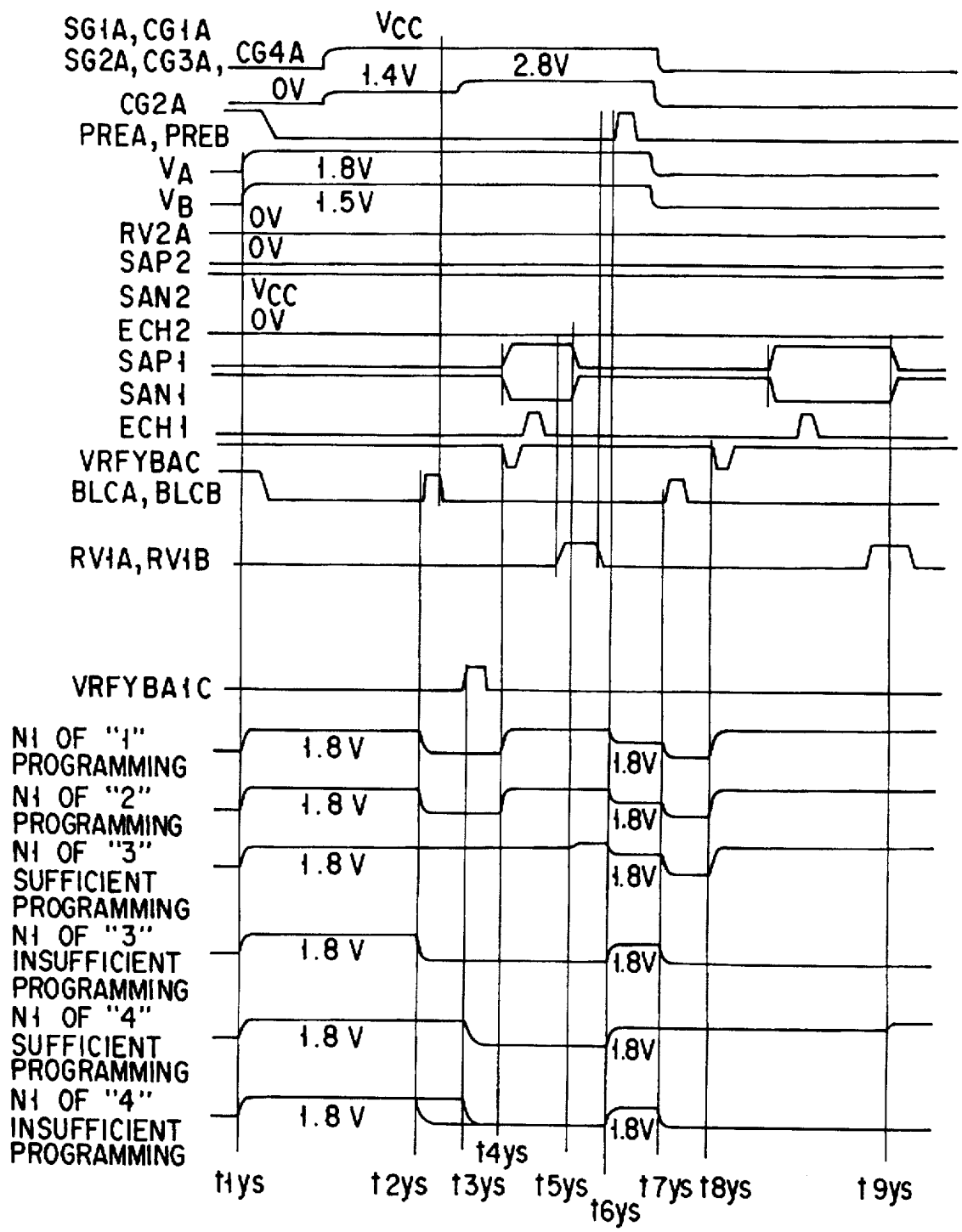
ANOTHER VERIFY READ OF LOWER PAGE
F I G. 102

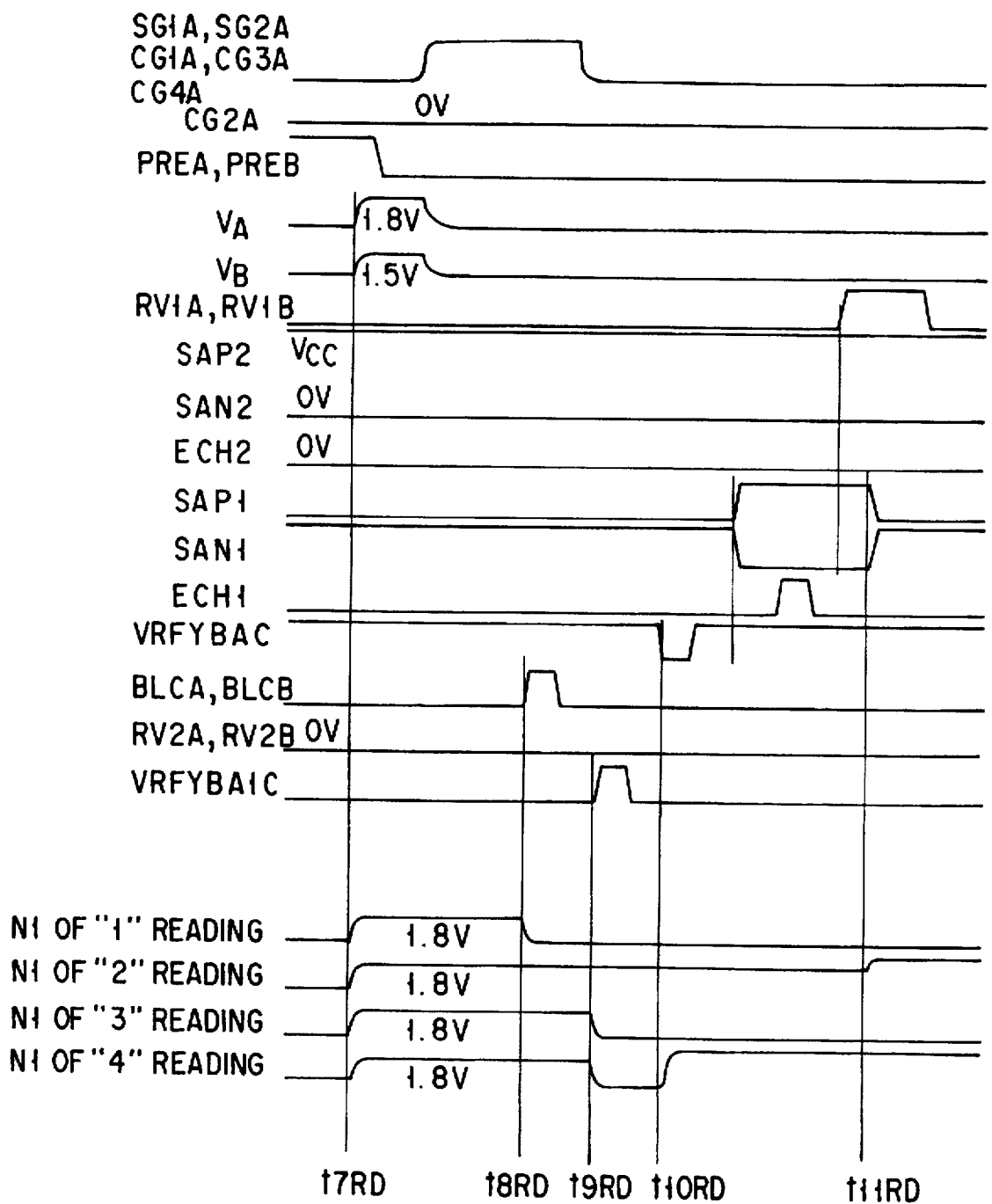
F I G. 103B

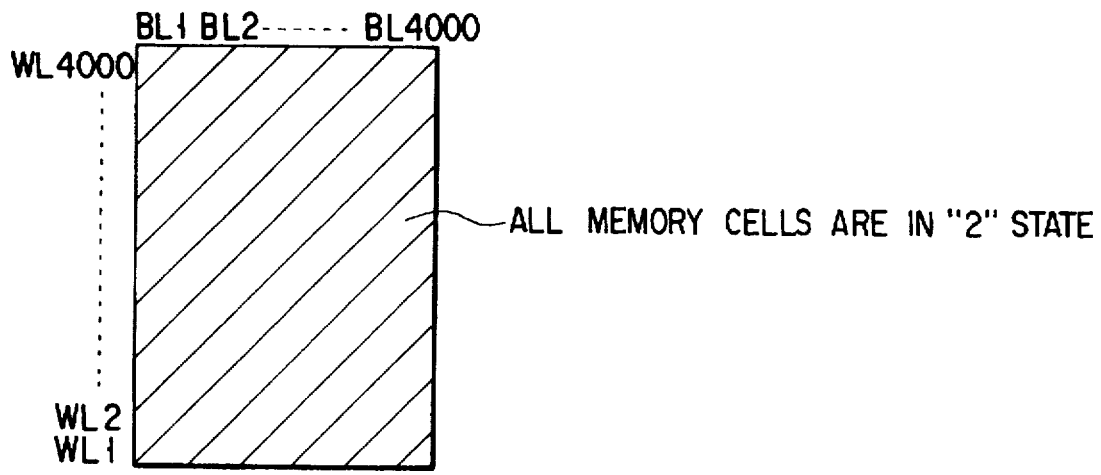
IN CASE THAT 16 MBIT DATA IS PROGRAMMED IN MEMORY CELL ARRAY OF THE EMBODIMENT
F I G. 106A
IN CASE THAT 16 MBIT DATA IS PROGRAMMED IN CONVENTIONAL MEMORY CELL ARRAY

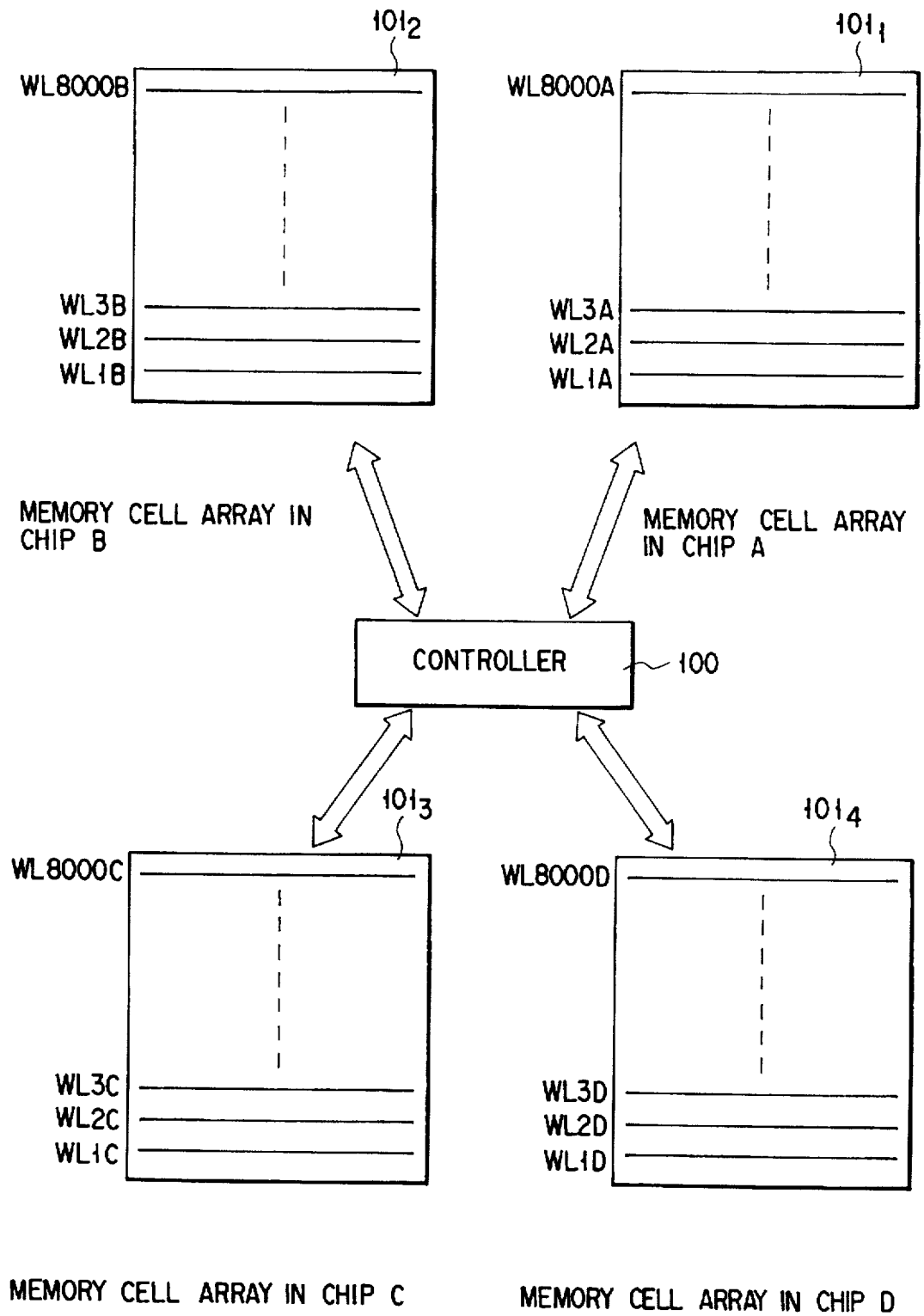
F I G. 108

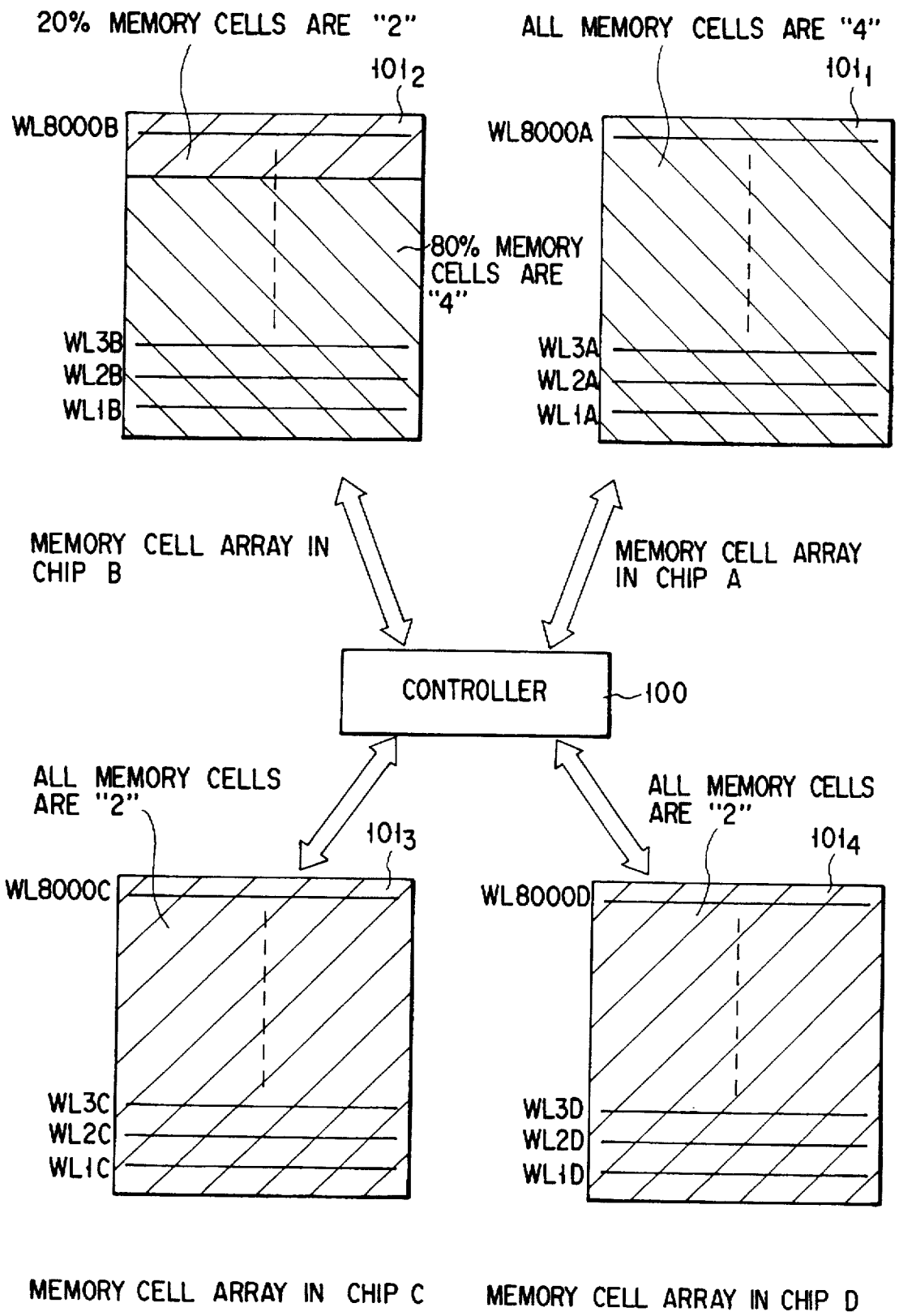
F I G. 110

SEMICONDUCTOR DEVICE AND MEMORY SYSTEM

BACKGROUND OF THE INVENTION

The present invention relates to an electrically erasable and programmable semiconductor memory device and a memory system, and more particularly a semiconductor memory device which stores multi-value data and a memory system which incorporates this semiconductor memory device.

Known as one type of an electrically erasable and programmable read-only memory (EEPROM) which can store a great amount of data is a multi-value data memory EEPROM. In the multi-value data memory EEPROM, each memory cell stores a data item having one of n values (n≧3).

Recently, the demand for EEPROMs has been increasing, because EEPROMs hold data even after they are switched off. A flash memory is a nonvolatile semiconductor memory from which data can be erased at once. Each memory cell of the flash memory suffices to have only one transistors, unlike byte-type nonvolatile semiconductor memory in which each memory cell has the two-transistor. The cells of the flash memory can therefore be small. It follows that a flash memory can have a memory capacity and can therefore be used in replace of a magnetic disk which has a great memory capacity.

Of various types of flash memories, the NAND-type EEPROM is considered most advantageous in terms of integration density. A NAND-type EEPROM comprises a plurality of memory cells arranged in, for example, columns. Each memory cell is of n-channel FETMOS structure, having a floating gate (i.e., charge-storage layer) and a control gate. The memory cells forming a one column are connected, each with its source connected to the drain of the next memory cell. The memory cells thus connected in series constitute a unit cell-group, or a NAND cell. Hence, the NAND-type EEPROM has a plurality of NAND cells. The NAND cells are connected to bit lines.

FIG. 1A is a plan view of a NAND cell, and FIG. 1B is a circuit diagram thereof. FIGS. 2A and 2B are sectional view of NAND cell shown in FIGS. 1A and 1B. FIG. 2A is a sectional view, taken along line 2A—2A in FIG. 1A. FIG. 2B is a sectional view, taken along line 2B—2B in FIG. 1A.

An element region is provided in a p-type substrate 11 (or in a p-type well formed in an n-type substrate). An element isolation oxide film 12 surrounds the element region. Provided in the element region is a NAND cell which is constituted by eight memory cells M1 to M8 connected in series. The cells M1 to M8 have an n-channel FETMOS structure. As best shown in FIG. 2B, each cell comprises a first gate insulating film 13, floating gates 14 (14-1, 14-2, . . . , 14-8), a second gate insulting film 15, and control gates 16 (16-1, 16-2, . . . , 16-8). The first gate insulating film 13 is provided on the p-type silicon substrate 11. The floating gate 14 is mounted on the insulating film 13. The second gate insulating film 15 is provided in the floating gate 14. The control gate 16 is provided on the insulating film 15. Each of n-type diffusion layers 19 in an n-channel FETMOS structure serves as the source of one memory cell and also as the drain of the adjacent memory cell. The memory cells M1 to M8 are thereby connected in series, constituting the NAND cell.

The NAND gate thus constituted has select gates 14-9 and 16-9 at the drain side and select gates 14-10 and 16-10 at the source side. The select gates 14-9, 16-9, 14-10 and 16-10 have been formed by the same process as the floating gates 14-1 to 14-8 and control gates 16-1 to 16-8 of the memory cells M1 to M8. The select gates 14-9 and 16-9 are electrically connected at desired portions. Similarly, the select gates 14-10 and 16-10 are electrically connected at desired portions. An interlayer-insulating film 17 covers the top of the p-type silicon substrate 11 in which the NAND cell is provided. Formed on the interlayer-insulating film 17 is a bit line 18. The bit line 18 contacts the n-type diffusion layer 19 which is located at the drain side of the NAND cell. Thus, the NAND cell has its drain connected to the bit line 18 by the select gates 14-10 and 16-10.

An NAND-type EEPROM comprises many identical NAND cells of the type shown in FIGS. 1A and 1B, arranged side by side. Those memory cells of the NAND cells which form a row have their control gates 14 commonly connected, forming control gate lines. The control gate lines CG1 to CG8 are so-called "word lines" which extend in the row direction. That is, the control gate 14 of each memory cell is connected to one word line. In each NAND cell, the select gates 14-9 and 16-9 form a select gate line SG1, and the select gates 14-10 and 16-10 form a select gate line SG2. The select gate lines SG1 and SG2 extend in the row direction.

FIG. 3 is a circuit diagram illustrating a NAND-cell array. As FIG. 3 shows, control gate lines CG1 to CG8 and select gate lines SG1 and SG2 extend in the row direction. As in most NAND-type EEPROMs, the memory cells M which are connected by one control gate line (i.e., word line) form one page, and the pages located between a drain-side select gate line (i.e., select gates 14-9 and 16-9) and a source-side select gate (i.e., select gates 14-10 and 16-10) form what is generally known as "NAND block" or "block." One page contains, for example, 256 bytes having (256×8) memory cells. The memory cells of each page are programmed, almost at the same time. One block contains, for example, 2048 bytes, having (2048×8) memory cells. Data is erased from the memory cells of each block, almost at the same time.

An operation of a NAND-type EEPROM having the NAND-cell array shown in FIG. 3 will be explained. In each NAND cell, data is written first into the memory cell which is the furthest from a bit line, then into the memory cell which is the second furthest therefrom, and so forth. More precisely, a write voltage Vpp (=about 20V) is applied to the control gate of any memory cell selected, while an intermediate potential (=about 10V) is applied to the control gates of the memory cells not selected and also to the first select gate. 0V (i.e., "0" programming voltage) or the intermediate potential (i.e., "1" programming voltage) is applied to the bit line. The potential of the bit line is thereby applied to the selected memory cell. Thus, when write data is "0," a high voltage is applied between the p-type substrate and the floating gate of the selected memory cell. In this case, electrons are injected from the p-type substrate into the floating gate by virtue of tunnel effect, and the threshold voltage of the transistor of the cell increases. The threshold voltage of the transistor does not change at all when the write data is "1."

As indicated above, data is erased from the memory cells of each block, almost at the same time. All control gates and all select gates provided in the block from which to erase data are set at 0V, and a voltage VppE (=about 20V) is applied to the p-type substrate and the p-type well provided in an n-type substrate. At the same time, the voltage VppE is also applied to the control gates and select gates provided in the blocks from which to erase no data. In each memory cell incorporated in the block from which to erase data, electrons are released from the floating gate. These electrons are injected into the p-type substrate or the p-type well provided in the n-type substrate. The threshold voltage of the transistor of the memory cells therefore decreases.

At data read operation from a memory cell, the bit line is precharged, thereafter floating the bit line. Then, the control gate of the memory cell is programmed to 0V, the control gate and select gate of any other memory cell are set at the power-supply voltage Vcc (e.g., 3V), and the source line is programmed to 0V. The data in the memory cell is read by detecting the potential of the bit line by means of a sense amplifier (not shown) to determine whether a current flows in the memory cell. More specifically, if the cell stores data "0" (that is, if the memory-cell transistor has a threshold voltage Vth less than 0V), the transistor is turned off and the bit line maintains the precharge potential. If the cell stores data "1" (that is, if the memory-cell transistor has a threshold voltage Vth more than 0V), the transistor is turned on and the bit-line potential falls from the precharge potential by value ΔV. Hence, the sense amplifier can detect whichever potential the bit line has, thereby to read the data from the memory cell.

The NAND-type EEPROM described above is still inferior to a magnetic disk in view of cost effectiveness. It is much desired that the NAND-type EEPROM acquire a large memory capacity to have its per-bit cost reduced. Recently, technology of storing multi-value data has been proposed which may be applied to an electrically erasable and programmable, nonvolatile memory such as the NAND-type EEPROM. Various multi-value memory cells are known, each capable of storing a data item having one of n values (n≧3).

How a four-value cell, for example, which can store a data item having one of four different values, operate will be explained. FIG. 4 is a diagram which represents the relation between the threshold voltage of the transistor of the four-value cell and the four data items of different values the cell can store. As can be understood from FIG. 4, the memory-cell transistor has, for example, a negative threshold voltage while the cell is storing data "1," as in the case data has been read from the cell. The memory-cell transistor has a threshold voltage of, for example, 0.5 to 0.8V while the cell is storing data "2," a threshold voltage of, for example, 1.5 to 1.8V while the cell is storing data "3," and a threshold voltage of, for example, 2.5 to 2.8V while the cell is storing data "4."

When a read voltage VCG3R is applied to the control gate of the four-value cell, the transistor of the cell is turned on or off. If the transistor is turned on, data "1" or data "2" is detected. If the transistor is turned off, data "3" or "4" is detected. Then, read voltages VCG4R and VCG2R are applied to the control gate, whereby data "1," "2," "3," or "4" is detected. The read voltages VCG2R, VCG3R and VCG4R are 0V, 1V and 2V, respectively.

In FIG. 4, VGC2V, VGC3V and VGC4V represent verify voltages, which are applied to the control gate of each memory cell in order to determine whether or not the memory cell has been sufficiently programmed. The verify voltages VGC2V, VGC3V and VGC4V are 0.5V, 1.5V and 2.5V, respectively.

FIG. 5 is a diagram explaining how a four-value cell is programmed. FIG. 6 is a diagram showing which data items are written into which memory cells constituting one page. As shown in FIG. 6, a two-bit address is assigned to each memory cell MC. More precisely, address bits A0 and A1 are assigned to the memory cell MC1, address bits A2 and A3 to the first memory cell MC2, address bits A4 and A5 to the second memory cell MC3, and so forth. In accordance with two addresses, write data supplied externally is written into each memory cell MC.

To write data into, for example, the first memory cell MC1, the address bits A0 and A1 are temporarily stored in the data circuit associated with the memory cell MC1. In accordance with these bits A0 and A1, data "1", "2", "3" or "4" is written into the memory cell MC1 as is illustrated in FIG. 5. In a similar way, data "1", "2", "3" or "4" is written into any other memory cell MC2, MC3, . . . , or MC128 in accordance with two address bits A2 and A3, A4 and A5, . . . , or A254 and A255. To write data "1" into one memory cell is to maintain the memory cell in an erased (unwritten) state.

In the data-programming described above, it takes longer to write "3" into a four-value cell than to write "2" thereinto. (Writing "2" into a four-value cell is equivalent to writing "0" into a binary cell.) It takes still longer to write "4" into a four-value cell than to write "3" thereinto. Whether a four-value cell has been sufficiently programmed to each data item "2", "3" or "4" must be checked in verify mode. Much time is required to determine whether the memory cell has been sufficiently programmed. Hence, to program the memory cells of one page almost at the same time, a considerably long time will be required to write the data, in its entirety, into all the memory cells. In short, the programming time of the NAND-type EEPROM, defined as the time required to write data into the cells of one page, is inevitably long.

How to read data from a four-value cell will be explained, with reference to FIGS. 7A and 7B.

FIG. 7A is a diagram representing the distribution of threshold voltages of a four-value cell. FIG. 7B is a flow-chart for explaining the conventional method of reading data from a four-value cell.

First, a voltage Vt1 intermediate between two voltages corresponding to data values "1" and "2" is applied to the word line to which the memory cell is connected (Step A1). If the memory cell is turned on, it is known that the cell stores value "0" or "1."If the memory cell is turned off, it is determined that the cell stores value "2" or "3." Next, a voltage Vt2 is applied to the word line, thereby detecting that the memory cell stores "3" or any other value "0", "1" or "2" (Step A2). Then, a voltage Vt3 is applied to the word line, determining that the memory cell stores "0" or any other value "1", "2" or "3" (Step A3). As a result, the two-bit data (a four-value data) is read from the memory cell (Step A4) and ultimately from the NAND-type EEPROM chip.

Another conventional method of reading data from a four-value cell will be explained, with reference to FIGS. 8A and 8B. FIG. 8A is a diagram representing the distribution of threshold voltages of a four-value cell. FIG. 8B is a flowchart for explaining this conventional data-reading method.

At first, a voltage Vts1 intermediate between two voltages corresponding to data values "0" and "1" is applied to the word line to which the memory cell is connected (Step B1). If the memory cell is turned on, it is known that the cell stores value "0." If the memory cell is turned off, it is determined that the cell stores value "1", "2" or "3." Next, a voltage Vts2 is applied to the word line, thereby detecting that the memory cell stores "0" or "1", "2" or "3" (Step B2). Then, a voltage Vts3 is applied to the word line, determining that the memory cell stores "3" or any other value "0", "1" or "2" (Step B3). As a result, the two-bit data (a four-value data) is read from the memory cell (Step B4) and is ultimately output to an-external device from the NAND-type EEPROM chip.

As described above, more steps must be performed to determine the threshold voltage of each memory cell in a multi-value data storing memory than in a binary storing memory. This means that the multi-value data storing memory has a lower read speed than a binary data storing memory.

In a four-value data storing memory, for example, the voltage of a word line must be changed three times to detect the threshold voltage of any memory cell connected to the word line. The read time of the four-value data storing memory is about three times as long as that of a binary data storing memory.

In an electrically erasable and programmable, nonvolatile memory such as the NAND-type EEPROM, data may be lost as electrons leak from the floating gate (i.e., a charge-storage layer) of each memory cell. Lost of data is likely to occur, particularly in multi-value data storing semiconductor memories. When data corresponding to a high threshold level is written into a memory cell, the charge in the floating gate of the cell most likely leaks, in an increasing amount, into the substrate because a strong electric field is generated between the substrate and the floating gate. The charge thus leading from the floating gate changes the threshold voltage of the memory cell. No matter how small is the change in the threshold voltage, the data is lost in the memory cell.

Therefore, multi-value data storing semiconductor memories cannot be put to practical use unless they acquire reliability against data destruction.

As mentioned above, the conventional multi-value data storing semiconductor memories are inferior to the binary data storing memories in terms of not only read time but also programming time. Further, the memories cannot be programmed sufficiently or reliably. Consequently, the conventional multi-value data storing semiconductor memories have not ever been put to practical use.

BRIEF SUMMARY OF THE INVENTION

An object of the present invention is to provide a multi-value data storing semiconductor memory device which operate reliably and which has a short read time and a short programming time.

Another object of the invention is to provide a memory system incorporating this semiconductor memory device.

According to a first aspect of the invention, there is provided a semiconductor memory device comprising: a memory cell array having electrically erasable and programmable memory cells arranged in rows and columns, each memory cell capable of storing n-value data (n is 3 or a greater natural number); and a data circuit having m latch circuits for holding data items read from the memory cells, wherein data items read from the memory cells and held in k latch circuits (k<m) are output from the memory device before data items read from the memory cells are held in the remaining (m–k) latch circuits, during data-reading operation. In the semiconductor memory device, the data circuit holds data items to be written into the memory cells. The data circuit is provided in plurality.

According to the first aspect of the invention, there is provided another semiconductor memory device comprising: a memory cell array having electrically erasable and programmable memory cells arranged in rows and columns, each memory cell capable of storing 2n-value data (n is 1 or a greater natural number) and having a first threshold voltage to store "1," a second threshold voltage higher than the first threshold voltage to store "2," and so forth, and having a 2nth threshold voltage higher than the (2n–1)th threshold voltage to store "2n"; and a data circuit having m latch circuits for holding data items read from the memory cells, wherein during data-reading operation, it is determined whether the threshold voltage of each memory cell is substantially equal to or lower than a voltage corresponding to "n," and whether the threshold voltage of each memory cell is substantially equal to or higher than a voltage corresponding to "n+1," and data items read from the memory cells and held in k latch circuits (k<m) are output from the memory device before data items read from the memory cells are held in the remaining (m–k) latch circuits.

According to the first aspect of the invention, there is provided still another semiconductor memory device comprising: a memory cell array having electrically erasable and programmable memory cells arranged in rows and columns, each memory cell capable of storing n-value data (n is 3 or a greater natural number); and t data circuits, each having m latch circuits (m is 2 or a greater natural number) for holding data items to be written into the memory cells and data items read from the memory cells, wherein, of the data items to be written into the memory cells, the first t data items are loaded into the first latch circuits of the data circuits, the next t data items are loaded into the second latch circuits of the data circuits, and so forth, and the last t data items, the first of which is the (i×t+1)th data item, are loaded into the (i+1)th latch circuits of the data circuits (1≦i≦m–1, i is a natural number). In this semiconductor memory device, during data-reading operation, a read data item held in the first latch circuit of each data circuit is output before the other m–1 latch circuits hold read data items, a read data item held in the second latch circuit of each data circuit is output before the other (m–2) latch circuits hold read data items, and a read data item held in the j-th latch circuit (1≦j≦m; j is a natural number) of each data circuit is output before the other m–j latch circuits hold read data items, during data-reading operation, a read data item held in the m-th latch circuit of each data circuit is output before the other m–1 latch circuits hold read data items, a read data item held in the (m–1)th latch circuit of each data circuit is output before the other m–2 latch circuits hold read data items, and a read data item held in the p-th latch circuit (1≦p≦m; p is a natural number) of each data circuit is output before the other p–1 latch circuits hold read data items, during data-reading operation, data items read from the memory cells and held in k latch circuits of each data circuit (k<m) are output before the other m–k latch circuits hold data items read from the memory cells, or during data-reading operation, data items read from the memory cells and held in d latch circuits of each data circuit (d<m–k) are output before the other m–k–d latch circuits hold data items read from the memory cells.

According to the first aspect of the invention, there is provided a further semiconductor memory device comprising: a memory cell array having electrically erasable and programmable memory cells arranged in rows and columns, each memory cell capable of storing n-value data (n is 3 or a greater natural number); and t data circuits, each having m latch circuits (m is 2 or a greater natural number) for holding data items to be written into the memory cells and data items read from the memory cells, wherein, of the data items to be written into the memory cells, the first t data items are loaded into the first latch circuits of the data circuits, the next t data items are loaded into the second latch circuits of the data circuits, and so forth, and the last t data items, the first of which is the (i×t+1)th data item, are loaded into the (i+1)th latch circuits of the data circuits (1≦i≦m−1, i is a natural number); and no write data items are input to f latch circuits of each data circuit (f<m), thereby to program the memory cells, in which f latch circuits hold write data, within the shortest possible time.

Any semiconductor memory device according to the first aspect of the invention can have a short read time, though it has multi-value data storing memory cells.

According to a second aspect of the present invention, there is provided a semiconductor memory device comprising: n-value memory cells (n is 3 or a greater natural number), each having a first threshold voltage to store "1," a second threshold voltage to store "2," a third threshold voltage to store "3," and an i-th threshold voltage to store "i" (i is a natural number equal to or less than n), wherein the memory cells are programmed "1," "2," . . . , "k−1," "k," (k>m) according to write data items input from an external device and data items held in the memory cells when the memory cells hold "1," "2," . . . , "m−1" and "m" (m is 2 or a greater natural number).

According to a second aspect of the present invention, there is provided another semiconductor memory device comprising: n-value memory cells (n is 3 or a greater natural number), each having a first threshold voltage to store "1," a second threshold voltage to store "2," a third threshold voltage to store "3," and an i-th threshold voltage to store "i" (i is a natural number equal to or less than n); programming means for applying a bias to each of the memory cells, thereby to change the threshold voltage of the memory cell over a desired range; and verify means for detecting whether the programming means has changed the threshold voltage of each memory to a desired, every time the bias is applied to the memory cell for a predetermined time, and for causing the programming means to repeatedly applying the bias to the memory cell until the threshold voltage of the memory cell is changed to the desired value, the bias increasing stepwise each time the bias is applied to the memory cell, wherein when each memory cell is programmed to a threshold voltage corresponding to "1," the threshold voltage is changed to a threshold voltage corresponding to "1," "2," . . . , "m−1" or "m" (m is 2 or a greater natural number) in a first programming operation according to a write data item input from an external device, and when each memory cell is programmed to a threshold voltage corresponding to "1," "2," . . . "m−1," or "m," the threshold voltage is changed to a threshold voltage corresponding to "1," "2," . . . , "k−1" or "k" (k is a natural number greater than m) in a second programming operation according to a write data item input from an external device and the threshold voltage of the memory cell; and a step-up value $\Delta Vpp1$ by which the bias increases in the first programming operation is less than a step-up value $\Delta Vpp2$ by which the bias increases in the second programming operation ($\Delta Vpp1 < \Delta Vpp2$). In the semiconductor memory device, each memory cell stores "1" while assuming an erased state, and the threshold voltage distribution width of "2," "3," . . . . "m−1" or "m" in the memory cell is narrower than the threshold voltage distribution width of "m+1," "m+2".

According to the second aspect of the invention, there is provided still another semiconductor memory device comprising: n-value memory cells (n is 4 or a greater natural number), each having a first threshold voltage to store "1," a second threshold voltage to store "2," a third threshold voltage to store "3," and an i-th threshold voltage to store "i" (i is a natural number equal to or less than n), wherein each memory cell holds "1," "2," . . . , "$2^{m-1}-1$" or "$2^{m-1}$" (m is a natural number satisfying n=$2^m$), the memory cell comes to store "1," "2," . . . , "$2^m-1$" or "$2^m$" according to a write data item input from an external device and a data item held in the memory cell, or another semiconductor memory device comprising: n-value memory cells (n is 4 or a greater natural number), each having a first threshold voltage to store "1," a second threshold voltage to store "2," a third threshold voltage to store "3," and an i-th threshold voltage to store "i" (i is a natural number equal to or less than n); programming means for applying a bias to each of the memory cells, thereby to change the threshold voltage of the memory cell over a desired range; and verify means for detecting whether the programming means has changed the threshold voltage of each memory to a desired value, every time the bias is applied to the memory cell for a predetermined time, and for causing the programming means to repeatedly applying the bias to the memory cell until the threshold voltage of the memory cell is changed to the desired value, the bias increasing stepwise each time the bias is applied to the memory cell, wherein each memory cell has a threshold voltage changed to store "1" or "2" in a first programming operation according to a write data item input from an external device and the threshold voltage of the memory cell when the memory cell has a threshold voltage corresponding to "1", and has a threshold voltage changed to "1," "2," . . . , "$2^m-1$" or "$2^m$" (m is a natural number satisfying n=$2^m$) in the m-th programming operation according to a write data item input from an external device and the threshold voltage of the memory cell when the memory cell has a threshold voltage corresponding to "1," "2," . . . . "$2^m-1$" or "$2^{m-1}$."; and a step-up value $\Delta Vpp1$ by which the bias increases in the first programming operation is less than a step-up value $\Delta Vppm$ by which the bias increases in the m-th programming operation ($\Delta Vpp1 < \Delta Vppm$). In this memory device, the threshold voltage distribution width of "2" in the memory cell is narrower than the threshold voltage distribution width of the of "$2^{m-1}+1$," "$2^{m-1}+2$" . . . . "$2^{m-1}$" or "$2^m$" in the memory cell, and each memory cell stores "1" while assuming an erased state, and the threshold voltage distribution width of "2," "3," . . . . "$2^{m-1}-1$" or "$2^{m-1}$" in the memory cell is narrower than the threshold voltage distribution width of "$2^{m-1}+1$," $2^{m-1}+2$" . . . , "$2^{m-1}$" or "$2^m$" in the memory cell.

According to the second aspect, there is provided still another semiconductor memory device comprising: n-value memory cells (n is 4 or a greater natural number), each having a first threshold voltage to store "1," a second threshold voltage to store "2," a third threshold voltage to store "3," and an i-th threshold voltage to store "i" (i is a natural number equal to or greater than n), wherein when each memory cell holds "1" or "2," the memory cell comes to store "1," "2," "3," or "4" according to a write data item input from an external device and a data item held in the memory cell, or a semiconductor memory device comprising: n-value memory cells (n is 3 or a greater natural number), each having a first threshold voltage to store "1," a second threshold voltage to store "2," a third threshold voltage to store "3," and an i-th threshold voltage to store "i" (i is a natural number equal to or less than n); programming means for applying a bias to each of the memory cells, thereby to change the threshold voltage of the memory cell over a desired range; and verify means for detecting whether the programming means has changed the threshold voltage of each memory to a desired value, every time the bias is applied to the memory cell for a predetermined time, and for causing the programming means to repeatedly applying the bias to the memory cell until the threshold voltage of the memory cell is changed to the desired value, the bias increasing stepwise each time the bias is applied to the memory cell, wherein when each memory cell is programmed to a threshold voltage corresponding to "1," the threshold voltage is changed to a threshold voltage corresponding to "1" or "2" in a first programming operation according to a write data item input from an external device; when each memory cell is programmed to a threshold voltage corresponding to "1" or "2," the threshold voltage is changed to a threshold voltage corresponding to "1," "2," "3," or "4" in the second programming operation according to a write data item input from an external device and the threshold voltage of the memory cell; and a step-up value $\Delta Vpp1$ by which the bias increases in the first programming operation is less than a step-up value $\Delta Vpp2$ by which the bias increases in the second programming operation ($\Delta Vpp1 < \Delta Vpp2$). In the semiconductor memory device, each memory cell stores "1" while assuming an erased state, and the threshold voltage distribution width of "2" in the memory cell narrower than the threshold voltage distribution width of "3" or "4".

According to the second aspect of the invention, there is provided another semiconductor memory device comprising: n-value memory cells (n is 4 or a greater natural number), each having a first threshold voltage to store "1," a second threshold voltage to store "2," a third threshold voltage to store "3," and an i-th threshold voltage to store "i" (i is a natural number equal to or less than n), wherein when each memory cell holds "1," "2," . . . , "r–1" or "r" (r is 2 or a greater natural number), the memory cell comes to store "1," "2," . . . , "s–1" or "s" (s is a natural number greater than r) according to a write data item input from an external device and a data item held in the memory cell; and when each memory cell holds "1," "2," . . . , "s–1" or "s," the memory cell comes to store "1," "2," . . . , "t–1" or "t" (t is a natural number greater than s) according to a write data item input from an external device and a data item held in the memory cell, or a semiconductor memory device comprising: n-value memory cells (n is 4 or a greater natural number), each having a first threshold voltage to store "1," a second threshold voltage to store "2," a third threshold voltage to store "3," and an i-th threshold voltage to store "i" (i is a natural number equal to or less than n); programming means for applying a bias to each of the memory cells, thereby to change the threshold voltage of the memory cell over a desired range; and verify means for detecting whether the programming means has changed the threshold voltage of each memory to a desired value, every time the bias is applied to the memory cell for a predetermined time, and for causing the programming means to repeatedly applying the bias to the memory cell until the threshold voltage of the memory cell is changed to the desired value, the bias increasing stepwise each time the bias is applied to the memory cell, wherein when each memory cell is programmed to a threshold voltage corresponding to "1," "2," . . . , "r–1" or "r" (r is 2 or a greater natural number), the threshold voltage is changed to a threshold voltage corresponding to "1," "2," . . . , "s–1" or "s" (s is a natural number greater than r) in the j-th programming operation (j is 2 or a greater natural number) according to a write data item input from an external device and threshold voltage of the memory cell; when each memory cell is programmed to a threshold voltage corresponding to "1" or "2," . . . "s–1" or "s," the threshold voltage is changed to a threshold voltage corresponding to "1," "2," . . . , "t–1" or "t" (t is a natural number greater than s) in the (j+1)th programming operation according to a write data item input from an external device and the threshold voltage of the memory cell; and a step-up value $\Delta Vppj$ by which the bias increases in the j-th programming operation is less than a step-up value $\Delta Vpp(j+1)$ by which the bias increases in the (j+1)th programming operation ($\Delta Vppj < \Delta Vpp(j+1)$). In this semiconductor memory device, the threshold voltage distribution width of "r+1," "r+2," . . . , "s–1" or "s" in the memory cell is narrower than the threshold voltage distribution width of "s+1," "s+2," . . . , "t–1," "t." Each memory cell stores "1" while assuming an erased state, and the threshold voltage distribution width of "2," . . . , "r–1" or "r" in the memory cell is narrower than the threshold voltage distribution width of "r+1," "r+2," . . . , "s–1," "s."

According to the second aspect of the invention, there is provided a further semiconductor memory device comprising: n-value memory cells (n is 4 or a greater natural number), each having a first threshold voltage to store "1," a second threshold voltage to store "2," a third threshold voltage to store "3," and an i-th threshold voltage to store "i" (i is a natural number equal to or less than n), wherein when each memory cell holds "1," "2," . . . , "$2^{k-1}-1$" or "$2^{k-1}$" (k is 2 or a greater natural number), the memory cell comes to store "1," "2," . . . , "$2^k-1$" or "$2^k$" according to a write data item input from an external device and a data item held in the memory cell; and when each memory cell holds "1," "2," "$2^k-1$" or "$2^k$," the memory cell comes to store "1," "2," . . . , $2^{k+1}-1$" or "$2^{k+1}$" according to a write data item input from an external device and a data item held in the memory cell, or a semiconductor memory device comprising: n-value memory cells (n is 4 or a greater natural number), each having a first threshold voltage to store "1," a second threshold voltage to store "2,"a third threshold voltage to store "3," and an i-th threshold voltage to store "i" (i is a natural number equal to or less than n); programming means for applying a bias to each of the memory cells, thereby to change the threshold voltage of the memory cell over a desired range; and verify means for detecting whether the programming means has changed the threshold voltage of each memory to a desired value, every time the bias is applied to the memory cell for a predetermined time, and for causing the programming means to repeatedly applying the bias to the memory cell until the threshold voltage of the memory cell is changed to the desired value, the bias increasing stepwise each time the bias is applied to the memory cell, wherein when each memory cell is programmed to a threshold voltage corresponding to "1," "2," . . . , "$2^{k-1}-1$" or $2^{k-1}$" (k is 2 or a greater natural number), the threshold voltage is changed to a threshold voltage corresponding to "1," "2," . . . "$2^k-1$" or "$2^k$" in the k-th programming operation according to a write data item input from an external device and threshold voltage of the memory cell; when each memory cell is programmed to a threshold voltage corresponding to "1" or "2," . . . , "$2^k-1$" or "$2^k$," the threshold voltage is changed to a threshold voltage corresponding to "1," "2," . . . , "$2^{k+1}-1$," or $2^{k+1}$" in the (k+1)th programming operation according to a write data item input from an external device and the threshold voltage of the memory cell; and a step-up value $\Delta Vppk$ by which the bias increases in the kth programming operation is less than a step-up value $\Delta Vpp(k+1)$ by which the bias increases in the (k+1)th programming operation ($\Delta Vppk < \Delta Vpp(k+1)$). In the memory device, the threshold voltage distribution width of "$2^{k-1}+1$ "or "$2^{k-1}+2$," . . . , "$2^k-1$ " and "$2^k$" in the memory cell is narrower than the threshold voltage distribution width of "$2^k+1$," "$2^k+2$," . . . "$2^{k+1}-1$" or "$2^{k+1}$." Each memory cell stores "1" while assuming an erased state, and the threshold voltage distribution width of "1," "2," ..., "$2^{k-1}-1$" or "$2^{k-1}$" in the memory cell is narrower than the threshold voltage distribution width of "$2^{k-1}+1$," "$2^{k-1}+2$," ..., "$2^k-1$" or "$2^k$." Each memory cell stores "1" while assuming an erased state, and the threshold voltage distribution width of "2" in the memory cell is narrower than the threshold voltage distribution width of "3," "4," ..., "$2^{k-1}-1$" or "$2^{k-1}$."

According to the second aspect, there is provided another semiconductor memory device semiconductor memory device comprising: n-value memory cells (n is 3 or a greater natural number), each having a first threshold voltage to store "1," a second threshold voltage to store "2," a third threshold voltage to store "3," and an i-th threshold voltage to store "i" (i is a natural number equal to or less than n), wherein during the first programming operation, each memory cell stores "1" in the input data is a first logic level and stores "2" in the input data is a second logic level, and during the kth programming operation, each memory cell stores "A" in the input data is a (2k−1)th logic level and stores "A+$2^{k-1}$" in the input data is a 2kth logic level in the case where the memory cell has been storing "A" during a (k−1)th programming operation (k is 2 or a greater natural number), or a semiconductor memory device comprising: n-value memory cells (n is 3 or a greater natural number), each having a first threshold voltage to store "1," a second threshold voltage to store "2," a third threshold voltage to store "3," and an i-th threshold voltage to store "i" (i is a natural number equal to or less than n); programming means for applying a bias to each of the memory cells, thereby to change the threshold voltage of the memory cell over a desired range; and verify means for detecting whether the programming means has changed the threshold voltage of each memory to a desired value, every time the bias is applied to the memory cell for a predetermined time, and for causing the programming means to repeatedly applying the bias to the memory cell until the threshold voltage of the memory cell is changed to the desired value, the bias increasing stepwise each time the bias is applied to the memory cell, wherein during the first programming operation, each memory cell stores "1" in the input data is a first logic level and stores "2" in the input data is a second logic level, and during the kth programming operation, each memory cell stores "A" in the input data is a (2k−1)th logic level and stores "A+$2^{k-1}$" in the input data is a 2kth logic level in the case where the memory cell has been storing "A" during a (k−1)th programming operation (k is 2 or a greater natural number); and a step-up value ΔVpp1 by which the bias increases in the first mode for performing the first programming operation is less than a step-up value ΔVppk by which the bias increases in the kth programming operation for performing the k-th programming operation (ΔVpp1<ΔVppk). In this memory device, each memory cell stores "1" while assuming an erased state, and the threshold voltage distribution width of "2" in the memory cell is narrower than the threshold voltage distribution width of "A+$2^{k-1}$." The threshold voltage distribution width of "A" in the memory cell is narrower than the threshold voltage distribution width of "A+$2^{k-1}$."

According to the second aspect of the invention, there is a further semiconductor memory device comprising: n-value memory cells (n is 4 or a greater natural number), each having a first threshold voltage to store "1," a second threshold voltage to store "2," a third threshold voltage to store "3," and an i-th threshold voltage to store "i" (i is a natural number equal to or less than n), wherein during the first programming operation, each memory cell stores "1" in the input data is a first logic level and stores "2" in the input data is a second logic level; during the second programming operation, each memory cell stores "1" in the input data is a third logic level or stores "3" in the input data is a fourth logic level in the case where the memory cell has been storing "1" during the first programming operation; and during the second programming operation, each memory cell stores "2" in the input data is the third logic level or stores "4" in the input data is the fourth logic level in the case where the memory cell has been storing "2" during the first programming operation, or a semiconductor memory device comprising: n-value memory cells (n is 4 or a greater natural number), each having a first threshold voltage to store "1," a second threshold voltage to store "2," a third threshold voltage to store "3," and an i-th threshold voltage to store "i" (i is a natural number equal to or less than n); programming means for applying a bias to each of the memory cells, thereby to change the threshold voltage of the memory cell over a desired range; and verify means for detecting whether the programming means has changed the threshold voltage of each memory to a desired value, every time the bias is applied to the memory cell for a predetermined time, and for causing the programming means to repeatedly applying the bias to the memory cell until the threshold voltage of the memory cell is changed to the desired value, the bias increasing stepwise each time the bias is applied to the memory cell, wherein during the first programming operation, each memory cell stores "1" in the input data is a first logic level and stores "2" in the input data is a second logic level; during the second programming operation, each memory cell stores "1" in the input data is a third logic level or stores "3" in the input data is a fourth logic level in the case where the memory cell has been storing "1" during the first programming operation; during the second programming operation, each memory cell stores "2" in the input data is the third logic level or stores "4" in the input data is the fourth logic level in the case where the memory cell has been storing "2" during the first programming operation; and a step-up value ΔVpp1 by which the bias increases in the first mode for performing the first programming operation is less than a step-up value ΔVpp2 by which the bias increases in the second programming operation for performing the second programming operation (ΔVpp1<ΔVpp2). In this memory device, each memory cell stores "1" while assuming an erased state, and the threshold voltage distribution width of "2" in the memory cell is narrower than the threshold voltage distribution width of "3" or "4." The third threshold voltage is higher than the second threshold voltage. A difference between threshold voltage distributions corresponding to "2" and "4" is equal to a difference between threshold voltage distributions corresponding to "2" and "3." A difference between threshold voltage distributions corresponding to "2" and "4" is greater than a difference between threshold voltage distributions corresponding to "2" and "3." The third threshold voltage is lower than the second threshold voltage. A difference between threshold voltage distributions corresponding to "3" and "4" is equal to a difference between threshold voltage distributions corresponding to "2" and "3." A difference between threshold voltage distributions corresponding to "3" and "4" is greater than a difference between threshold voltage distributions corresponding to "2", and "3."

According to the second aspect of the invention, there is provided another semiconductor memory device comprising: n-value memory cells (n is 4 or a greater natural number), each having a first threshold voltage to store "1,"

a second threshold voltage to store "2," a third threshold voltage to store "3," and an i-th threshold voltage to store "i" (i is a natural number equal to or less than n), wherein during the first programming operation, each memory cell stores "1" in the input data is a first logic level and stores "2" in the input data is a second logic level; during the second programming operation, each memory cell stores "1" in the input data is a third logic level and according to the data item held in the memory cell, and stores "3" in the input data is a fourth logic level and according to the data item held in the memory cell, in the case where the memory cell has been storing "1" during the first programming operation; and during the second programming operation, each memory cell stores "2" in the input data is the third logic level and the data item held in the memory cell, and stores "4" in the input data is the fourth logic level and the data item held in the memory cell, in the case where the memory cell has been storing "2" during the first programming operation, or a semiconductor memory device comprising: n-value memory cells (n is 4 or a greater natural number), each having a first threshold voltage to store "1," a second threshold voltage to store "2," a third threshold voltage to store "3," and an i-th threshold voltage to store "i" (i is a natural number equal to or less than n); and a data circuit for holding a write data to be written into the memory cells, wherein each memory cell stores "1" when a first write data item held in the data circuit is at a first logic level and stores "2" when the first write data item is at a second logic level; and after the data circuit holds a second write data item input from an external device and a data item read from each memory cell, the memory comes to store "1" when the memory cell stores "1" and the data circuit holds the second write data item of a third logic level, comes to store "3" when the memory cell stores "1" and the data circuit holds the second write data item of a fourth logic level, comes to store "2" when the memory cell stores "2" and the data circuit holds the second write data item of the third logic level, comes to store "4" when the memory cell stores "2" and the data circuit holds the second write data item of the fourth logic level. In the memory device, the first logic level is equal to the third logic level, and the second logic level is equal to the fourth logic level.

According to the second aspect of the invention, there is provided still another semiconductor memory device comprising: n-value memory cells (n is 3 or a greater natural number), each having a first threshold voltage to store "1," a second threshold voltage to store "2," a third threshold voltage to store "3," and an i-th threshold voltage to store "i" (i is a natural number equal to or less than n); and a data circuit for holding a write data to be written into the memory cells, wherein when each memory cell stores "1," "2," . . . , "m-1," "m" ( m is a natural number greater than 2), the memory cell stores "1," "2," . . . , "k-1" or "k" (k is a natural number greater than m) according to a write data item input from an external device and also a data item read from the memory cell and held in the data circuit, or a semiconductor memory device comprising: n-value memory cells (n is 3 or a greater natural number), each having a first threshold voltage to store "1," a second threshold voltage to store "2," a third threshold voltage to store "3," and an i-th threshold voltage to store "i" (i is a natural number equal to or less than n); and a data circuit for holding a write data to be written into the memory cells, programming means for applying a bias to each of the memory cells, thereby to change the threshold voltage of the memory cell over a desired range; and verify means for detecting whether the programming means has changed the threshold voltage of each memory to a desired value, every time the bias is applied to the memory cell for a predetermined time, and for causing the programming means to repeatedly applying the bias to the memory cell until the threshold voltage of the memory cell is changed to the desired value, the bias increasing stepwise each time the bias is applied to the memory cell, wherein when each memory cell is at a threshold voltage to store "1," the memory cell is programmed to a threshold voltage to store "1," "2," . . . , "m-1" or "m" (m is 2 or a greater natural number) in a first programming operation according to a write data item input from an external device and held in the data circuit; when each memory cell is at a threshold voltage to store "1," "2," . . . , "m-1" or "m," the memory cell is programmed to a threshold voltage to store "1," "2," . . . , "k-1" or "k" (k is a natural number greater than m) in a second programming operation according to a write data input from the external device and also a data item read from the memory cell and held in the data circuit; and a step-up value $\Delta V_{pp1}$ by which the bias increases in the first programming operation is less than a step-up value $\Delta V_{pp2}$ by which the bias increases in the second programming operation ($\Delta V_{pp1} < \Delta V_{pp2}$). In the memory device, each memory cell stores "1" while assuming an erased state, and the threshold voltage distribution width of "2," "3,". . . , "m-1" or "m" in the memory cell is narrower than the threshold voltage distribution width of "m+1," "m+2," . . . "k-1" or "k."

According to the second aspect, there is provided another semiconductor memory device comprising: n-value memory cells (n is 3 or a greater natural number), each having a first threshold voltage to store "1," a second threshold voltage to store "2," a third threshold voltage to store "3," and an i-th threshold voltage to store "i" (i is a natural number equal to or less than n); and a data circuit for holding a write data to be written into the memory cells, wherein when each memory cell stores "1" or "2," the memory cell is programmed to "1," "2," "3" or "4" according to a write data item input from an external device and also a data item read from the memory cell and held in the data circuit, or a semiconductor memory device comprising: n-value memory cells (n is 4 or a greater natural number), each having a first threshold voltage to store "1," a second threshold voltage to store "2," a third threshold voltage to store "3," and an i-th threshold voltage to store "i" (i is a natural number equal to or less than n); and a data circuit for holding a write data to be written into the memory cells, programming means for applying a bias to each of the memory cells, thereby to change the threshold voltage of the memory cell over a desired range; and verify means for detecting whether the programming means has changed the threshold voltage of each memory to a desired value, every time the bias is applied to the memory cell for a predetermined time, and for causing the programming means to repeatedly applying the bias to the memory cell until the threshold voltage of the memory cell is changed to the desired value, the bias increasing stepwise each time the bias is applied to the memory cell, wherein when each memory cell is at a threshold voltage to store "1," the memory cell is programmed to a threshold voltage to store "1" or "3" in a first programming operation according to a write data item input from an external device and held in the data circuit; when each memory cell is at a threshold voltage to store "1" or "2," the memory cell is programmed to a threshold voltage to store "1," "2," "3" or "4" in a second programming operation according to a write data input from the external device and also a data item read from the memory cell and held in the data circuit; and a step-up value $\Delta V_{pp1}$ by which the bias increases in the first programming operation is less than a step-up value ΔVpp2 by which the bias increases in the second programming operation (ΔVpp1<ΔVpp2). In the memory device, each memory cell stores "1" while assuming an erased state, and the threshold voltage distribution width of "2" in the memory cell is narrower than the threshold voltage distribution width of "3" or "4."

According to the second aspect of the invention, there is provided still another semiconductor memory device comprising: memory cells capable of storing multi-bit data items; and a data circuit for holding an data item to be written into the memory cells, wherein each of the multi-bit data item contains upper bit and lower bit; the upper bit is written into each memory cell after a first write data item is input from an external device and temporarily held in the data circuit; and the lower bit is written into the memory cell after a second write data item is input from the external device and temporarily held in the data circuit. In the memory device, the lower bit is written in each memory cell after the second write data item input from the external device and the upper bit read from the memory cell is held in the data circuit.

According to the second aspect of the invention, there is provided a further semiconductor memory device comprising: a plurality of memory cells, each capable of storing multi-bit data item, the memory cells divided into a plurality of groups, each containing a predetermined number of memory cells and constituting a page; a data circuit for holding data items to be written into the memory cells, wherein each of the multi-bit data item contains upper bit to be written first into each memory cell and lower bit to be written next into each memory cell, the upper bit is first written into the memory cells of one group constituting an upper page, and the lower bits are then written into the memory cells of another group constituting a lower page. In this semiconductor memory device, the upper page is written after a first data item is input to the data circuit from an external device and temporarily held in the data circuit, and the lower page is then written after a second data item is input to the data circuit from the external device temporarily held in the data circuit. The memory cells are divided into groups, and the data circuit is provided in plurality, each provided for one group of memory cells.

According to the second aspect of the invention, there is provided another semiconductor memory device comprising: memory cells capable of storing multi-bit data items; a data circuit for holding a write data item to be written into the memory cells; programming means for programming the memory cells according to the write data item held in the data circuit; and verify means for detecting whether the programming means has written the write data item held in the data circuit, into the memory cells, and for causing the programming means to repeatedly applying the bias to the memory cell until the programming means sufficiently programs the memory cells, wherein each of the multi-bit data item contains upper bit and lower bit; the programming means writes the upper bit into each memory cell after the verify means detects that the programming means has sufficiently programmed and the programming means writes the lower bits into the memory cell. In the memory device, lower bit is written into the memory cell after the upper bit has been written into the memory cell and after the data circuit holds a write data item input from an external device and the upper bits read from the memory cell.

According to the second aspect, there is provided still another semiconductor memory device comprising: a plurality of memory cells, each capable of storing multi-bit data item, the memory cells divided into a plurality of groups, each containing a predetermined number of memory cells and constituting a page; a data circuit for holding data items to be written into the memory cells, programming means for programming the memory cells according to the write data item held in the data circuit; and verify means for detecting whether the programming means has written the write data item held in the data circuit, into the memory cells, and for causing the programming means to repeatedly applying the bias to the memory cell until the programming means sufficiently programs the memory cells, wherein each of the multi-bit data item contains upper bit and lower bit, the programming means writes the upper bit into the memory cells of a group constituting an upper page after the verify means detects that the programming means has sufficiently programmed the memory cell of the group constituting the upper page, and the programming means writes the lower bits into the memory cells of another group constituting a lower page. In this memory device, the lower bit is written into the memory cell after the upper bit has been written into the memory cell and after the data circuit holds a write data item input from an external device and the upper bit read from the memory cell. The data circuit is provided in plurality, each provided for one group of memory cells.

According to the second aspect, there is provided still another semiconductor memory device comprising: n-value memory cells (n is 3 or a greater natural number), each capable of storing multi-bit data item, a page block containing said memory cells; wherein a memory cell of a first page block is programmed in the p-th programming operation (p is 1 or a greater natural number), and a memory cell of a first page block is programmed in the (p+1)th programming operation after the first and the second page blocks have been programmed in the p-th programming operation, or a semiconductor memory device comprising: a plurality of memory cells, each capable of storing multi-bit data item, a page block containing memory cells; a data circuit for holding data items to be written into the memory cells, programming means for programming the memory cells according to the write data item held in the data circuit; and verify means for detecting whether the programming means has written the write data item held in the data circuit, into the memory cells, and for causing the programming means to repeatedly applying the bias to the memory cell until the programming means sufficiently programs the memory cells, wherein a memory cell of a first page block is programmed in the p-th programming operation (p is 1 or a greater natural number), and a memory cell of a first page block is programmed in the (p+1)th programming operation after the first page and the second page blocks have been programmed in the p-th programming operation. In the memory device, the (p+1)th programming operation is performed on the second page after the (p+1)th programming operation has been performed on the first page. The programming means performs the p-th programming operation on the second memory after the verify means detects that the first memory is sufficiently programmed in the p-th programming operation. The programming means performs the (p+1)th programming operation on the first memory after the verify means detects that the second memory is sufficiently programmed in the p-th programming operation. The p-th programming operation is first programming operation, and the (p+1)th programming operation is the second programming operation. Each of the memory cells is an n-value memory cell (n is 3 or a greater natural number) which has a first threshold voltage to store "1," a second threshold voltage to store "2," a third threshold voltage to store "3," and an i-th threshold voltage to store "i" (i is a natural number equal to or less than n); when each memory cell is at a threshold voltage to store "1," the first programming operation is performed in a first programming operation according to a write data item input from an external device, thereby to set the memory cell at a threshold voltage to store "1," "2," . . . . , "m–1" or "m" (m is 2 or a greater natural number); when each memory cell is at a threshold voltage to store "1," "2," . . . , "m–1" or "m," the second programming operation is performed in a second programming operation according to a write data item input from the external device and also the threshold voltage of the memory cell, thereby to the memory cell at a threshold voltage to store "1," "2," . . . , "k–1," "k," (k>m). Each of the memory cells is an n-value memory cell (n is 4 or a greater natural number) which has a first threshold voltage to store "1," a second threshold voltage to store "2," a third threshold voltage to store "3," and an i-th threshold voltage to store "i" (i is a natural number equal to or less than n); when each memory cell is at a threshold voltage to store "1," "2,", . . . . , "r–1" or "r" (r is 2 or a greater natural number), the p-th programming operation is performed in a j-th programming operation (j is 2 or a greater natural number) according to a write data item input from an external device and also the threshold voltage of the memory cell, thereby to set the memory cell at a threshold voltage to store "1," "2," . . . . "s–1" or "s" (s is a natural number greater than r); when each memory cell is at a threshold voltage to store "1," "2," . . . , "s–1" or "s," the (p+1)th programming operation is performed in a (j+1)th programming operation according to a write data item input from the external device and also the threshold voltage of the memory cell, thereby to set the memory cell at a threshold voltage to store "1," "2," . . . , "t–1" or "t" (t is a natural number greater than s).

According to the second aspect, there is provided a further semiconductor memory device comprising: n-value memory cells (n is 3 or a greater natural number), each capable of storing multi-bit data item, a page block containing memory cells; wherein the (p+1)th programming operation (p is 1 or a greater natural number) is performed on the memory cells constituting the first page block after the p-th programming operation has been performed on the memory cells constituting the first page block and after the p-th programming operation has been performed on the memory cells constituting the second page block, or a semiconductor memory device comprising: a plurality of memory cells, each capable of storing multi-bit data item, a page block containing memory cells; a data circuit for holding data items to be written into the memory cells, programming means for programming the memory cells according to the write data item held in the data circuit; and verify means for detecting whether the programming means has written the write data item held in the data circuit, into the memory cells, and for causing the programming means to repeatedly applying the bias to the memory cell until the programming means sufficiently programs the memory cells, wherein the (p+1)th programming operation (p is 1 or a greater natural number) is performed on the memory cells constituting the first page block after the p-th programming operation has been performed on the memory cells constituting the first page block and after the p-th programming operation has been performed on the memory cells constituting the second page block. In the memory device, (p+1)th programming operation is performed on the memory cells constituting the second page block after the (p+1)th programming operation has been performed on the memory cells constituting the first page block. The programming means performs the p-th programming operation on the memory cells constituting the second page block after the verify means detects that all memory cells constituting the first page block are sufficiently programmed in the p-th programming operation. The programming means performs the (p+1)th programming operation on the memory cells constituting the first page block after the verify means detects that all memory cells constituting the second page block are sufficiently programmed in the p-th programming operation. The p-th programming operation is the first programming operation, and the (p+1)th programming operation is the second programming operation. Each of the memory cells is an n-value memory cell (n is 3 or a greater natural number) which has a first threshold voltage to store "1," a second threshold voltage to store "2," a third threshold voltage to store "3," and an i-th threshold voltage to store "i" (i is a natural number equal to or less than n); when each memory cell is at a threshold voltage to store "1," the first programming operation is performed in a first programming operation according to a write data item input from an external device, thereby to set the memory cell at a threshold voltage to store "1," "2," . . . . "m–1" or "m" (m is 2 or a greater natural number); when each memory cell is at a threshold voltage to store "1," "2," . . . , "m–1" or "m," the second programming operation is performed in a second programming operation according to a write data item input from the external device and also the threshold voltage of the memory cell, thereby to the memory cell at a threshold voltage to store "1," "2," . . . , "k–1," "k" (k>m). Each of the memory cells is an n-value memory cell (n is 4 or a greater natural number) which has a first threshold voltage to store "1," a second threshold voltage to store "2," a third threshold voltage to store "i" (i is a natural number equal to or less than n); when each memory cell is at a threshold voltage to store "1," "2,", . . . . , "r–1" or "r" (r is 2 or a greater natural number), the p-th programming operation is performed in a j-th programming operation (j is 2 or a greater natural number) according to a write data item input from an external device and also the threshold voltage of the memory cell, thereby to set the memory cell at a threshold voltage to store "1," "2." . . . . "s–1" or "s" (s is a natural number greater than r); when each memory cell is at a threshold voltage to store "1," "2," . . . . , "s–1" or "s," the (p+1)th programming operation is performed in a (j+1)th programming operation according to a write data item input from the external device and also the threshold voltage of the memory cell, thereby to set the memory cell at a threshold voltage to store "1," "2," . . . . "t–1" or "t" (t is a natural number greater than s). The the (p+1)th programming operation is performed on the memory cells constituting the first page block after the p-th programming operation has been performed on all the memory cells provided in the device. The number of times the (p+1)th programming operation has been performed on each page block is recorded, and the order in which the page blocks are to be programmed is determined according to the number of times recorded.

According to the third aspect of the invention, there is provided a memory system comprising: a plurality of semiconductor memory devices, each having memory cells capable of storing multi-bit data item; wherein the (p+1)th programming operation (p is 1 or a greater natural number) is performed on the memory cells provided on a first semiconductor memory device after the p-th programming operation has been performed on the memory cells provided in the first semiconductor memory device and after the p-th programming operation has been performed on the memory cells provided in the second semiconductor memory device.

In the memory system, the (p+1)th programming operation is performed on the memory cells provided in the second semiconductor memory device after the (p+1)th programming operation is performed on the memory cells provided in the first semiconductor memory device. The (p+1)th programming operation is performed on the memory cells provided in the second semiconductor memory device after the (p+1)th programming operation is performed on only a part of the memory cells provided in the first semiconductor memory device. The p-th programming operation is the first programming operation, and the (p+1)th programming operation is the second programming operation. Each of the memory cells is an n-value memory cell (n is 3 or a greater natural number) which has a first threshold voltage to store "1," a second threshold voltage to store "2," a third threshold voltage to store "3," and an i-th threshold voltage to store "i" (i is a natural number equal to or less than n); when each memory cell is at a threshold voltage to store "1," the first programming operation is performed in a first programming operation according to a write data item input from an external device, thereby to set the memory cell at a threshold voltage to store "1," "2," . . . , "m−1" or "m" (m is 2 or a greater natural number); when each memory cell is at a threshold voltage to store "1," "2," . . . , "m−1" or "m," the second programming operation is performed in a second programming operation according to a write data item input from the external device and also the threshold voltage of the memory cell, thereby to the memory cell at a threshold voltage to store "1," "2,", . . . , "k−1," "k" (k>m). Each of the memory cells is an n-value memory cell (n is 4 or a greater natural number) which has a first threshold voltage to store "1," a second threshold voltage to store "2," a third threshold voltage to store "3," and an i-th threshold voltage to store "i" (i is a natural number equal to or less than n); when each memory cell is at a threshold voltage to store "1," "2,", . . . , "r−1" or "r" (r is 2 or a greater natural number), the p-th programming operation is performed in a j-th programming operation (j is 2 or a greater natural number) according to a write data item input from an external device and also the threshold voltage of the memory cell, thereby to set the memory cell at a threshold voltage to store "1," "2," . . . , "s−1" or "s" (s is a natural number greater than r); when each memory cell is at a threshold voltage to store "1," "2,", . . . , "s−1" or "s," the (p+1)th programming operation is performed in a (j+1)th programming operation according to a write data item input from the external device and also the threshold voltage of the memory cell, thereby to set the memory cell at a threshold voltage to store "1," "2," . . . , "t−1" or "t" (t is a natural number greater than s). The (p−1)th programming operation is performed on the memory cells provided in the first semiconductor device after the p-th programming operation has been performed on all the memory cells provided in all semiconductor devices. The memory system further comprises control means for controlling the semiconductor memory devices. The control means controls the order in which memory cells are programmed. The order is determined in units of memory cells that share the same word line. The order is determined in units of semiconductor memory devices.

In any memory device according to the second aspect of the invention and in the memory system according to the third aspect of the invention, each memory cell can be programmed to store, for example, a four-value data item. In the first programming operation, either "1" or "2" is written into the memory cell. In the second programming operation, "1" is maintained in the memory cell or "3" is written into the memory cell, or "2" is maintained in the memory cell or "4" is written into the memory cell. Thus, each memory cell is programmed to store a four-value data item by performing programming operation two times.

That is, the first programming operation is effected, almost in the same way as is performed on binary memory cells. The second operation is achieved, almost in the same way as is performed on three-value cells. As a result, the memory cells can be programmed at high speed by a simple programming circuit.

The memory cells may be those designed to store multi-value data items other than four-value data items. If so, each multi-value data item is divided into bits, and the bit are sequentially written into one memory cell by repeating the programming operation. In this case, too, the memory cells can be programmed at high speed.

As mentioned above, the present invention provides a multi-value data storing semiconductor memory device, in which the memory cells are programmed in a specific manner at high speed and by a simple programming circuit, and which operates with high reliability.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL
VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 1A is a plan view of a NAND cell, and FIG. 1B is a circuit diagram thereof;

FIG. 10 is a circuit diagram showing the memory cell arrays and column series circuit which are incorporated in the flash memory shown in FIG. 9;

FIG. 12 is a block diagram illustrating the data circuits in detail. which are incorporated in the flash memory of FIG. 9;

FIG. 16 is a timing chart explaining how data is read from the NAND-type flash memory which is the second embodiment;

FIG. 17 is a table showing the data items the flip-flops provided in the NAND-type flash memory may sense and latch at a specific time;

FIG. 18 is a table presenting the data items to be read from the memory. which the flip-flops may sense and latch in the second embodiment;

FIG. 19 is a table presenting the data items to be written into the memory. which the flip-flops may sense and latch in the second embodiment;

FIG. 25 is a circuit diagram of still another type of a data circuit which may be used in place of the data circuit shown in FIG. 15;

FIGS. 27A to 27C are diagrams showing the distribution of threshold voltages of each memory cell provided in a multi-value data memory EEPROM which is a fourth embodiment of the invention, and explaining how data is output from the EEPROM;

FIG. 29 is a diagram for explaining how data is written into and read from a multi-value data memory EEPROM according to a sixth embodiment of the present invention;

FIG. 33 is a circuit diagram showing an EEPROM which has a modified column arrangement;

FIG. 34 is a circuit diagram illustrating a memory cell array comprising NOR-type cells MC;

FIG. 35 is a circuit diagram showing a memory cell array comprising NOR-type cells MC of another type;

FIG. 38 is a diagram illustrating a memory cell array comprising alternate ground-array cells MC;

FIG. 39 is a circuit diagram showing a memory cell array comprising alternate ground-array cells MC of another type;

FIG. 40 is a diagram representing a memory cell array comprising DINOR (DIvided NOR)-type cells;

FIG. 48 is a block diagram of the tenth embodiment;

FIG. 49 is a diagram for explaining how the memory cells are programmed in the tenth embodiment;

FIG. 50 is a diagram explaining how data items are read from the memory cells of the tenth embodiment;

FIGS. 51A to 51D are circuit diagrams showing various types of memory-cell units for use in the tenth embodiment;

FIGS. 52A to 52G are circuit diagrams illustrating other types of memory-cell units for use in the tenth embodiment;

FIG. 53 is a diagram showing the memory cell array and data circuits. which are incorporated in an NAND-type flash memory according to an eleventh embodiment of the present invention;

FIG. 54 is a diagram showing the distribution of threshold voltages which each memory cell has in the eleventh embodiment;

FIG. 55 is a block diagram illustrating the data circuits in detail. which are incorporated in the eleventh embodiment;

FIG. 57 is a circuit diagram showing one of the identical data circuits provided in the eleventh embodiment;

FIG. 62 is a timing chart explaining how to read and invert the upper page before the lower page is programmed in the eleventh embodiment;

FIGS. 63A and 63B are a diagram and a table, for explaining how the lower page is programmed in the eleventh embodiment;

FIG. 66 is a circuit diagram showing another type of a data circuit for use in the eleventh embodiment;

FIG. 68 is a timing chart for explaining how the lower page is verify-read from the eleventh embodiment;

FIGS. 69A and 69B are a timing chart explaining how data is read from the eleventh embodiment;

FIG. 70 is a table representing various potentials which the nodes in a flip-flop have to read data from the eleventh embodiment;

FIG. 71 is a table showing various potentials which the nodes in each data circuit has to read data from the eleventh embodiment;

FIG. 72 is a table showing various potentials the nodes have to read data from the eleventh embodiment;

FIG. 77 is a timing chart for explaining how an upper page is programmed in the thirteenth embodiment;

FIG. 80 is a timing chart explaining how the lower page is programmed in the thirteenth embodiment;

FIG. 81 is a timing chart for explaining how the lower page is verify-read from the twelfth embodiment;

FIG. 82 is a timing chart explaining another method of programming the lower page in the thirteenth embodiment;

FIG. 85 is a block diagram showing one of the identical data circuits used in the fourteenth embodiment and designed to hold data items to be written into or read from four-value cells;

FIG. 87 is a block diagram showing one of the identical data circuits used in the fourteenth embodiment and designed to hold data items to be written into or read from eight-value cells;

FIGS. 88A to 88D are diagrams for explaining how each 16-value cell is programmed in the fourteenth embodiment;

FIG. 89 is a block diagram showing one of the identical data circuits used in the fourteenth embodiment and designed to hold data items to be written into or read from 16-value cells;

FIG. 91 is a block diagram showing one of the identical data circuits used in the fourteenth embodiment and designed to hold data items to be written into or read from 2m-value cells;

FIGS. 92A and 92B are flowcharts explaining how an upper page and a lower page are programmed in a memory device according to a fifteenth embodiment of the invention;

FIG. 102 is a timing chart for explaining a method of Verify-Read Operation a lower page from the sixteenth embodiment;

FIGS. 103A and 103B are a timing chart explaining how data is read from the sixteenth embodiment;

FIGS. 106A and 106B are diagrams showing a memory cell array in which "2" and "4" are respectively programmed in every memory cell;

FIG. 108 is a diagram illustrating a memory system according to an eighteenth embodiment of the invention;

FIG. 110 is a diagram showing the memory system which is programmed to 70% of the memory capacity.

DETAILED DESCRIPTION OF THE INVENTION

Embodiments of the present invention will be described, with reference to the accompanying drawings.

The first embodiment of the invention is a multi-value data storing NAND-type flash memory. The flash memory will be described, with reference to FIG. 9.

Figure 9:
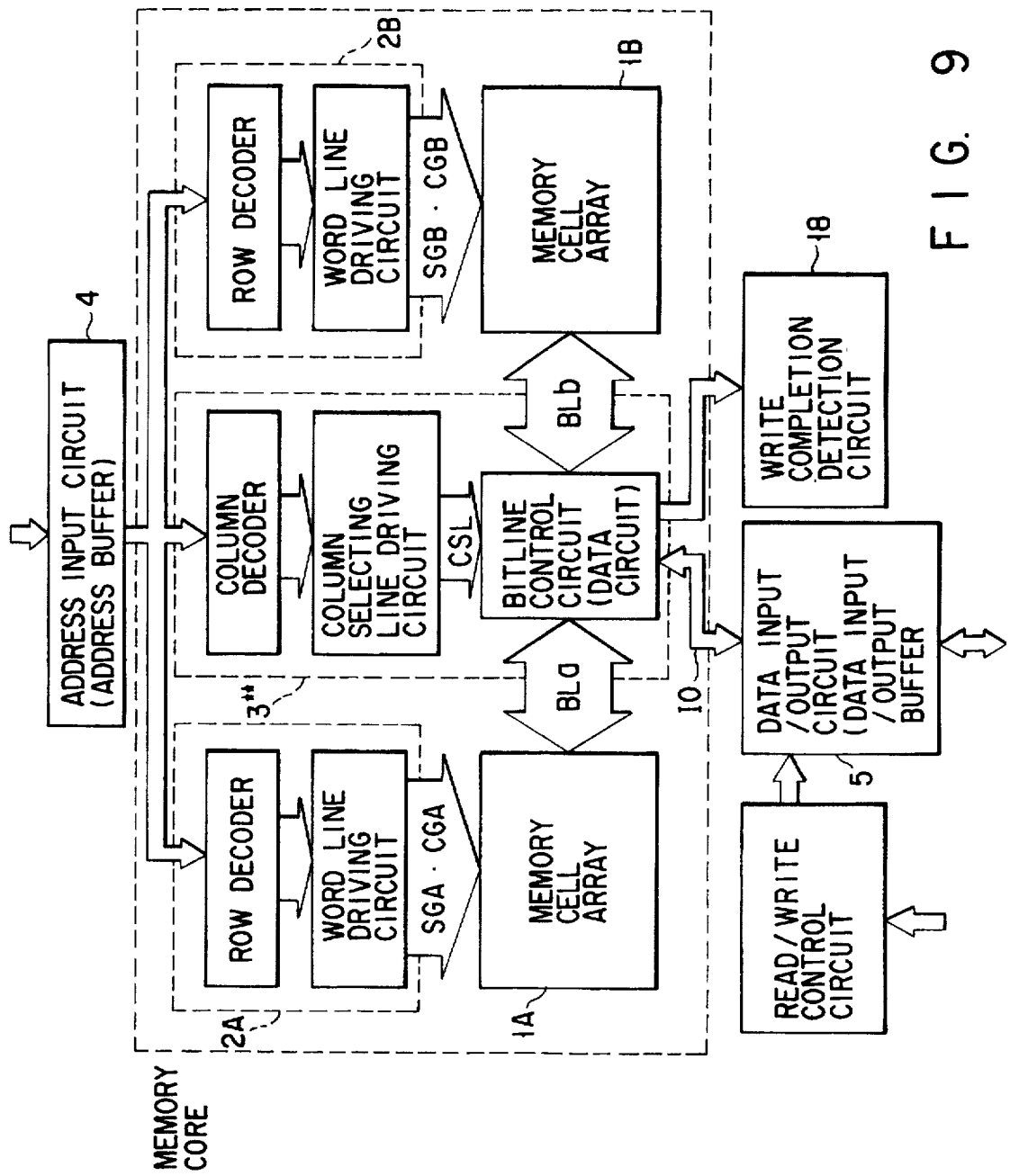
FIG. 9 is a block diagram showing a multi-value data storing NAND-type flash memory according to a first embodiment of the present invention.

As FIG. 9 shows, the first embodiment has a so-called open-bit structure. The multi-value data storing NAND-type flash memory comprises two memory cell arrays 1A and 1B, a two row series circuits 2A and 2B, and a column series circuit 3. The arrays 1A and 1B have each a plurality of memory cells which are arranged in rows and columns, forming a matrix. The row series circuits 2A and 2B are provided for the memory cell arrays 1A and 1B, respectively. The column series circuit 3 is provided for both memory cell arrays 1A and 1B.

Each row series circuit includes a row decoder and a word line driving circuit. The row decoder receives an address signal from an address input circuit (i.e., an address buffer) 4 and selects one memory-cell row provided in the associated memory cell array, in accordance with the address signal. The word line driving circuit drives one word line in accordance with the output of the row decoder. If the NAND-type flash memory is a NAND-type EEPROM, the word line driving circuit is a control gate/select gate driving circuit. This is because the word lines are the select gate SG (SGA or SGB) and control gate CG (CGA or CGB).

The column series circuit 3** provided for both memory cell arrays 1A and 1B includes a column decoder and a column selecting line driving circuit. The column decoder receives an address signal from the address buffer 4 and selects one memory-cell column provided in each memory cell array. The column selecting line driving circuit drives a column selecting line for selecting one memory-cell column provided in each memory cell array.

The column series circuit 3 further comprises a bit line control circuit (i.e., data circuit). The bit line control circuit is designed to temporarily hold the data which is to be written into memory cells or the data which has been read therefrom. The bit line control circuit is connected to a data input/output buffer (i.e., a data input/output circuit) 5 by a data input/output line IO. It is connected also to the memory cells of the array 1A by bit lines BLa and to the memory cells of the array 1B by bit lines BLb.

The bit-line control circuit receives data from the data input/output buffer 5 and supplies the data to the memory cells, thereby to write the data into the memory cells. It receives data from the memory cells and supplies the data to the data input/output buffer 5, in order to read the data.

The data input/output buffer 5 is provided to control the data transfer to and from the memory core which is constituted by the memory cell arrays 1A and 1B, row series circuits 2A and 2B and column series circuit 3**. In other words, the buffer 5 supplies data output from an external device to the memory core and supplies data read from the memory core to the external device.

Like the data input/output buffer 5, a write completion detection circuit 18 is provided outside the memory core. The circuit 18 receives the output of the bit-line control circuit and detect whether the memory cells have been sufficiently programmed, from the output of the bit-line control circuit.

The memory cell arrays 1A and 1B and the column series circuit 3** will be described in detail, with reference to FIG. 10.

As shown in FIG. 10, the memory cell arrays 1A and 1B have a plurality of memory cells MC arranged, forming a matrix. The column series circuit 3 has m data circuits (i.e., bit-line control circuits) 6. Each data circuit 6 is connected one bit line BLa and one bit line BLb.

Figure 11:
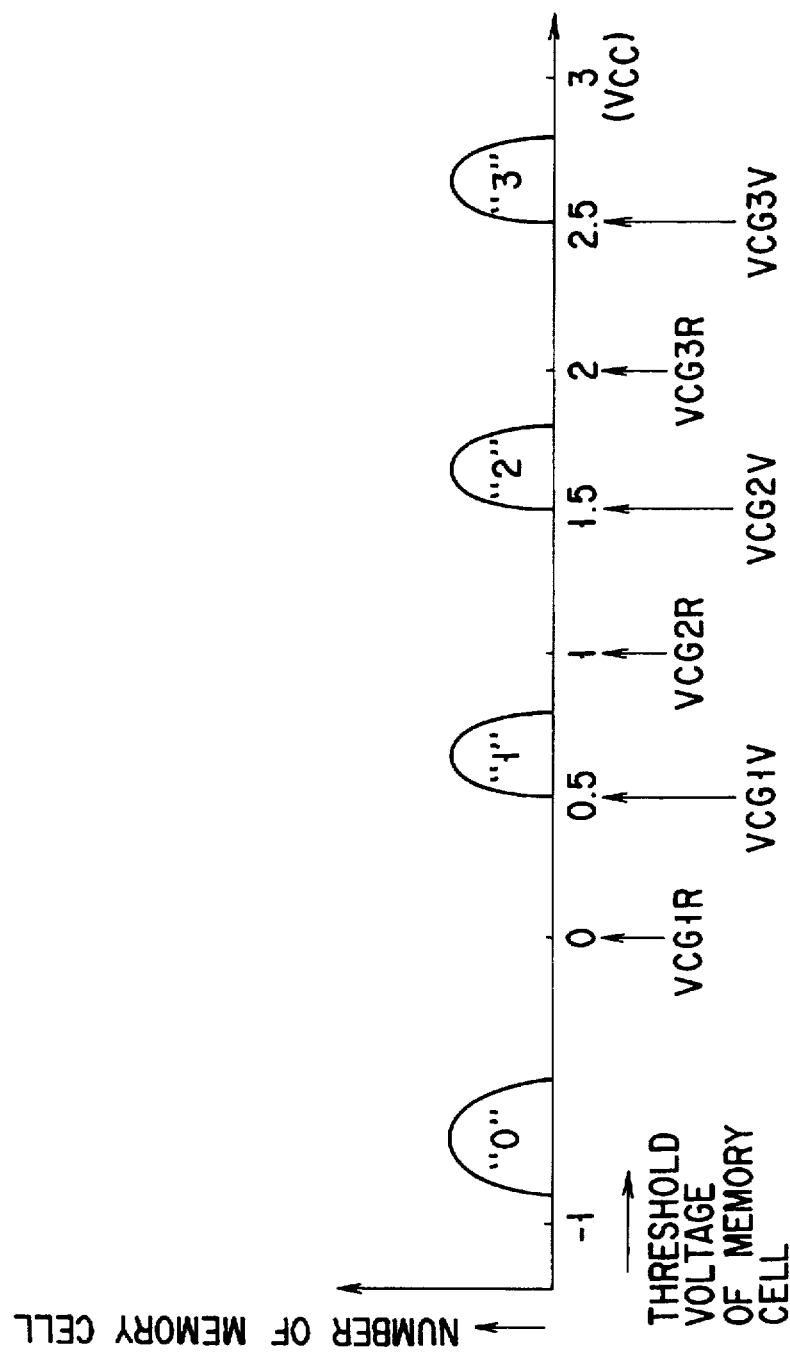
FIG. 11 is a diagram representing a distribution of the threshold voltages of each four-value cell MC provided in the flash memory of FIG. 9.

FIG. 11 is a diagram showing four threshold values.

The transistor of each memory cell provided in the cell arrays 1A and 1B must have so that the memory cell may store four-value data. If the NAND-type flash memory is an EEPROM which stores four-value data items, each memory-cell transistor M must assume one of four different write state. These write states are defined by four threshold voltages the transistor M may have.

Assume the power-supply voltage VCC of the EEPROM is 3V. As shown in FIG. 11, the memory-cell transistor M has, for example, a negative threshold voltage while the cell is storing data "0," as in the case data has been read from the cell. The memory-cell transistor has a threshold voltage of, for example, 0.5 to 0.8V while the cell is storing data "1," a threshold voltage of, for example, 1.5 to 1.8V while the cell is storing data "2," and a threshold voltage of, for example, 2.5 to 2.8V while the cell is storing data "3."

To read data from the memory-cell transistor M, read voltages VCG2R, VCG3R and VCG1R are applied to the control gate CG of the transistor M, one after another.

First, the read voltage VCG2R is applied to the control gate CG of the memory-cell transistor M. If the transistor M is turned on, it is determined that the memory cell stores either "0" or "1." If the transistor M is turned off, it is determined that the cell stores either "2" or "3." Next, the read voltage VCG3R is applied to the control gate CG of the memory-cell transistor M. If the transistor M is turned on, it is determined that the memory cell stores "2"; if the transistor M is turned off, it is determined that the cell stores "3." Finally, the read voltage VCG1R is applied to the control gate CG of the memory-cell transistor M. If the transistor M is turned on, it is determined that the memory cell stores "0"; if the transistor M is turned off, it is determined that the cell stores "1." The read voltages VCG2R, VCG3R and VCG4R are, for instance, 0V, 1V and 2V, respectively.

Shown in FIG. 11 are verify read voltages VGC1V, VGC2V and VGC3V, which are used to check to see whether the four-value cells have been sufficiently programmed. The verify voltages VGC1V, VGC2V and VGC3V are applied to the control gate of each memory cell after programming operation has been performed on the memory cell, in order to effect verification, or to determine whether or not the memory cell is sufficiently programmed or not. If the memory-cell transistor M is turned on when a verify voltage is applied to the memory cell MC, it is detected that the transistor M has its threshold voltage changed to the value corresponding to the data just written into the memory cell MC. If the transistor M is turned off when the verify voltage is applied to the memory cell MC, it is detected that the transistor M has its threshold voltage not changed to the value corresponding to the data to be written into the cell MC. The verify voltages VGC1V, VGC2V and VGC3V are 0.5V, 1.5V and 2.5V, respectively.

FIG. 12 is a block diagram illustrating the data circuits 6 (FIG. 10), in greater detail.

As seen from FIG. 12, each of the data circuits 6** incorporates two latch circuits. Two 2-bit data items are held in the first and second latch circuits, respectively, before they are written into one memory cell MC. Four-value data read from the memory cell MC is stored in the latch circuits before it is output from the memory chip through data input/output lines IO1 and IO2.

It will be explained how 512-bit data (at column addresses A0, A1, A2, ..., A510, and A511) is written into and read from the NAND-type flash memory (i.e., the first embodiment).

Programming

First, the data item to be written at the start address A0 is input to the first latch circuit RT1-0 of the data circuit 6-1 and held in the circuit RT1-0. Then, the data items to be written at the addresses A1, A2, ... A254 and A255 are input to and held in the latch circuits RT1-1, RT1-2, ..., RT1-254 and RT1-255 of the data circuits 6-1, 6-2, ..., 6-254 and 6-255, respectively. Further, the data items to be written at the addresses A256, A257, ... A510 and A511 are input to and held in the latch circuits RT2-1 to RT2-255 of the data circuits 6-1 to 6-255, respectively. Thereafter, data is written into the memory cells MC according to the two-bit data items stored in the data circuits 6-1 to 6-255.

If the data contains less than 512 bits, the write data is input to the first latch circuit of every data circuit, but no data is input to the second latch circuit thereof. In this case, it suffices to store such data in the second latch circuit as would the memory cell MC stores either data "0" or data "1" which corresponds to a low threshold voltage of the memory-cell transistor.

Data-Reading

Figure 13A:
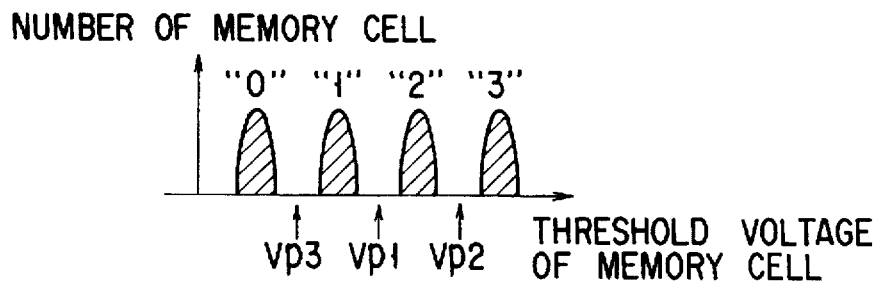
FIG. 13A is a diagram showing another distribution of the threshold voltages of each four-value cell MC provided in the flash memory of FIG. 9.
Figure 13B:
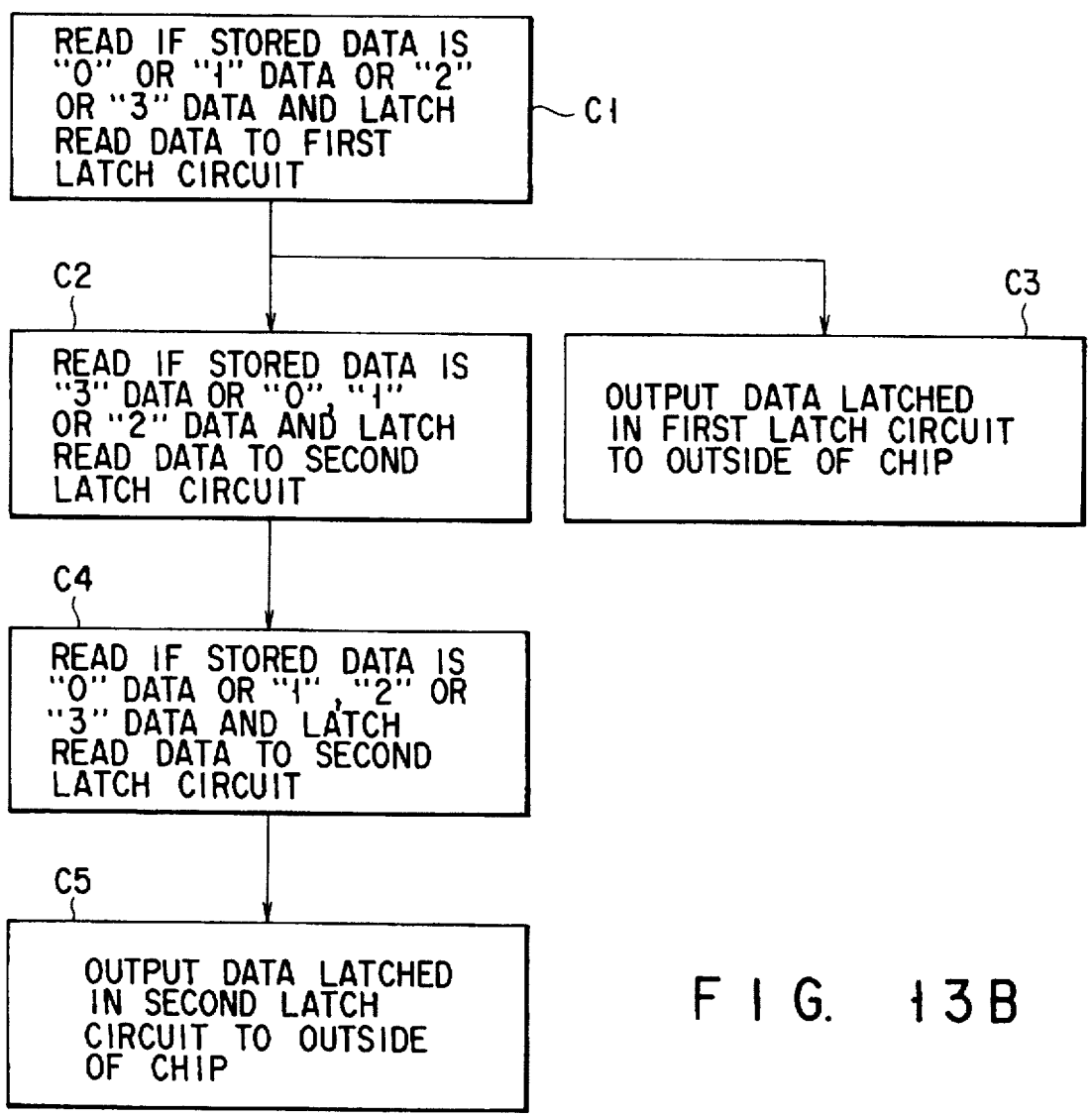
FIG. 13B is a flowchart for explaining a method of reading data from each of the memory cells MC provided in the flash memory of FIG. 9.

One method of reading 512-bit data from the NAND-type flash memory will be explained, with reference to FIGS. 13A and 13B. FIG. 13A shows a distribution of threshold voltages of each four-value cell MC. FIG. 13B is a flowchart for explaining how data is read from each memory cell MC.

At first, a voltage Vp1 intermediate between two voltages corresponding to data values "1" and "2" is applied to the word line to which the memory cell MC is connected (Step C1). If the memory cell is turned on, it is known that the cell stores value "0" or "1." If the memory cell is turned off, it is determined that the cell stores value "2" or "3."

Next, a voltage Vp2 is applied to the word line, thereby detecting that the memory cell MC stores "3," or "0," or "1" or "2." The data read from the cell MC is held in the second latch circuit (Step C2). In the meantime, the data held in the first latch circuit (corresponding to the column address A0, A1, A2, ..., A254, or A255) is output from the memory chip through the data input/output line IO1 (Step C3).

Then, a voltage Vp3 is applied to the word line, determining that the memory cell MC stores "0" or any other value "1", "2" or "3." The two-bit data held in the memory cell MC is thereby read out. The data read out and corresponding to the column address A256, A257, ..., A510, A511 is held in the second latch circuit (Step C4). After the data held in the first latch circuit and corresponding to the column address A0, A1, A2, ..., A254, A255 is output from the memory chip, the data held in the second latch circuit and corresponding to the column address A256, A257, ..., A510 or A511 is output from the memory chip through the data input/output line IO2 (Step C5).

In this data-reading method, the data read from any memory cell is first held in the first latch circuit and then output from the memory chip immediately. The read time is therefore much shorter than in the conventional multi-value data storing memory, almost as short as the read time of the binary data storing memory. This is because the data is output from the memory chip after it is read from the memory cell by applying a prescribed read voltage to the word line, whereas in the conventional multi-value data storing memory, the word line voltage must be changed three times before the data stored in the memory cell is read from the memory chip.

Figure 14A:
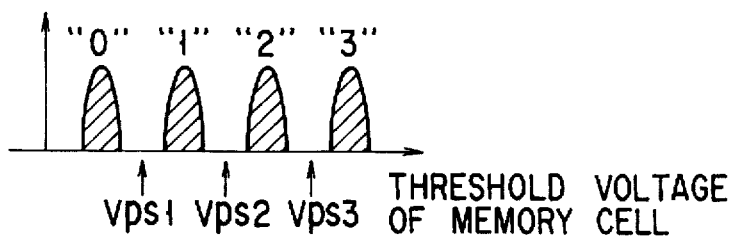
FIG. 14A is a diagram showing still another distribution of threshold voltages of each four-value cell MC provided in the flash memory of FIG. 9.
Figure 14B:
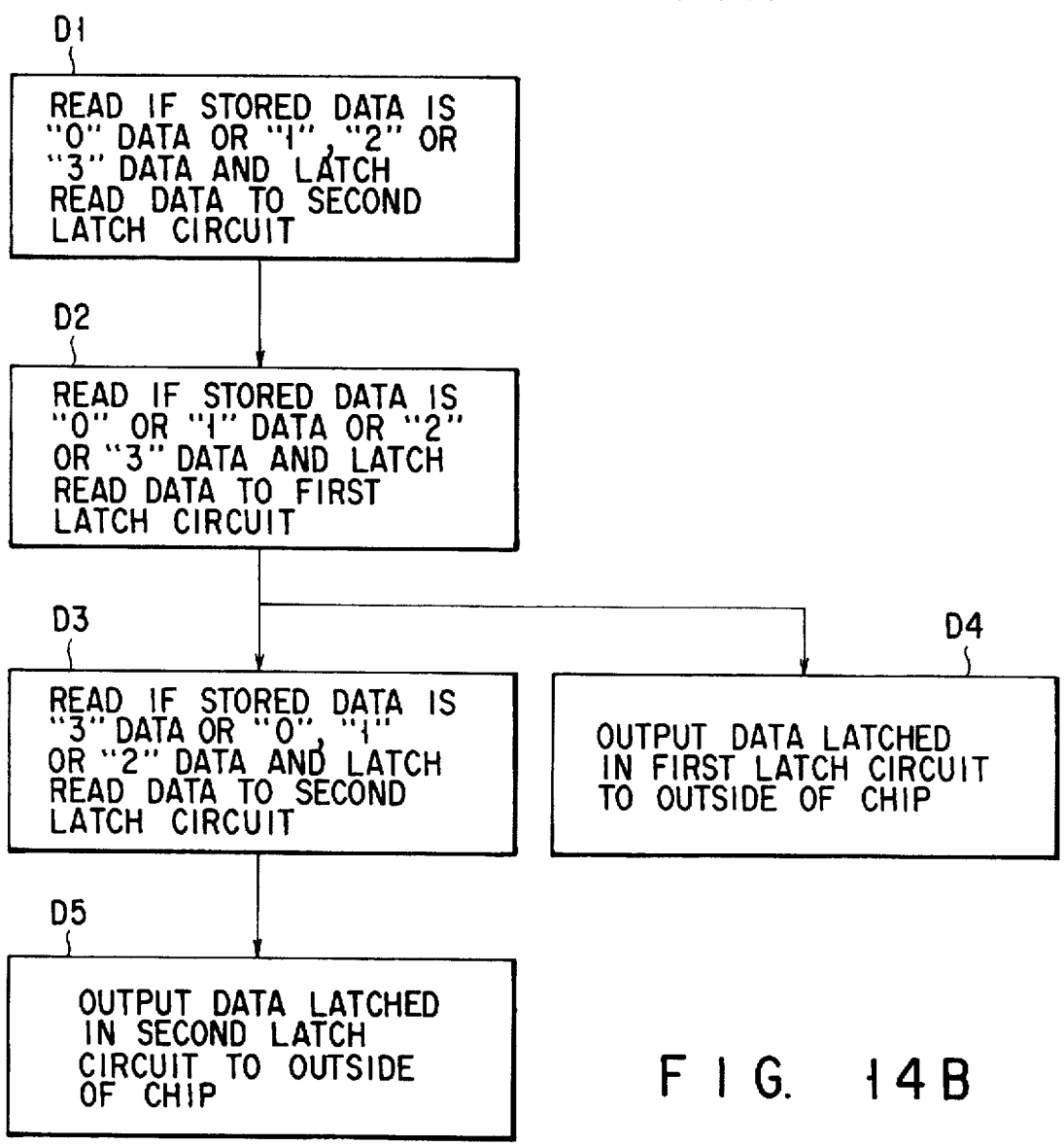
FIG. 14B is a flowchart for explaining another method of reading data from each of the memory cells MC provided in the flash memory of FIG. 9.

Another method of reading 512-bit data from the NAND-type flash memory will be explained, with reference to FIGS. 14A and 14B. FIG. 14A represents a distribution of the threshold voltages of each four-value cell MC. FIG. 14B is a flowchart explaining how data is read from each memory cell MC in this method.

First, a voltage Vps1 which is intermediate between two voltages corresponding to data values "0" and "1" is applied to the word line to which the memory cell MC is connected. If the memory cell is turned on, it is known that the cell stores value "0." If the memory cell is turned off, it is determined that the cell stores value "1," "2" or "3." The data read from the memory cell MC is held in the second latch circuit (Step D1).

Next, a voltage Vps2 is applied to the word line, thereby detecting that the memory cell MC stores "0" or "1," or "2" or "3." The data read from the cell MC, which corresponds to the column address A0, A1, A2, (Step D2). Thereafter, the data held in the first latch circuit (i.e., the data corresponding to the column address A0, A1, A2, ..., A254, or A255) is output from the memory chip through the data input/output line IO1 (Step D4).

Finally, a voltage Vps3 is applied to the word line, thereby detecting that the memory cell MC stores "3" or one of the other three values "0," "1" and "2." The two-bit data stored in the memory cell MC is thereby read out. This data, which corresponds to the column address A256, A257, ..., A510, or A511, is held in the second latch circuit (Step D3). The data held in the second latch circuit (i.e., the data corresponding to column address A256, A257, ..., A510, or A511) is output from the memory chip via the input/output line IO2 (Step D5).

With the first embodiment it is possible to output the data held in the first latch circuit at the same time data is read from each memory cell into the second latch circuit, once after the data read from the memory cell into the first latch circuit has been determined. That is, the NAND-type flash memory according to the first embodiment has a high read speed.

The second embodiment of the invention is also a multi-value data storing NAND-type flash memory. The second embodiment is similar in structure to the first embodiment (FIG. 9). The transistor of each memory cell incorporated in the second embodiment has four threshold voltages specified in FIG. 11 so the memory cell may store four-value data.

Figure 15:
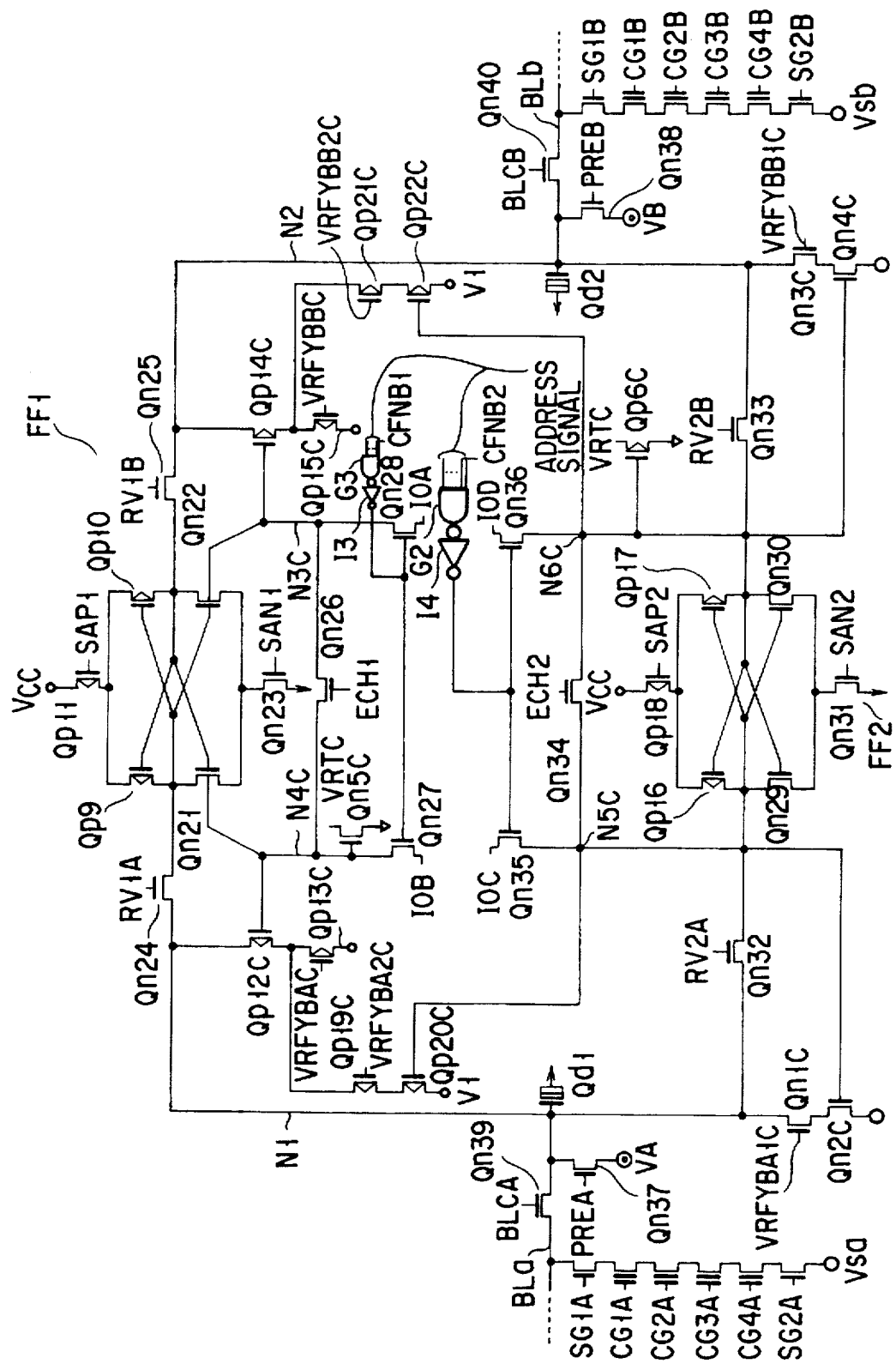
FIG. 15 is a circuit diagram of one of the identical data circuits incorporated in a NAND-type flash memory according to a second embodiment of the present invention.

The NAND-type flash memory according to the second embodiment has a plurality of data circuits of the same structure, which is illustrated in FIG. 15. The data circuits are designed to process four-value data items.

As shown in FIG. 15, each data circuit 6** comprises two flip-flops FF1 and FF2. The flip-flop FF1 is constituted by n-channel MOS transistors Qn21, Qn22 and Qn23 and p-channel MOS transistors Qp9, Qp10 and Qp11. The flip-flop circuit FF2 is comprised of n-channel MOS transistors Qn29, Qn30 and Qn31 and p-channel MOS transistors Qp16, Qp17 and Qp18. The flip-flops FF1 and FF2 are provided to latch data items read from one memory cell. They function as sense amplifiers, too.

The flip-flops FF1 and FF2 cooperate to latch data "0," "1," "2," or "3" before the data is written into one memory cell and to sense and latch data "0" "1," "2," or "3" before the data is output from the memory chip.

The flip-flop FF1 is connected to data input/output lines IOA and IOB by an n-channel MOS transistors Qn28 and Qn27, respectively. Similarly, the flip-flop FF2 is connected to data input/output lines IOC and IOD by an n-channel MOS transistors Qn35 and Qn36, respectively. The data input/output lines IOA, IOB, IOC and IOD are connected the input/output buffer 5 (FIG. 9). The gates of the n-channel transistors Qn27 and Qn28 are connected to the output of a column address decoder which comprises a NAND logic circuit G3 and an inverter I3. The data held in the flip-flop FF1 is output to the data input/output lines IOA and IOB when a column enable signal CENB1 is activated. The gates of the n-channel MOS transistors Qn35 and Qn36 are connected to a column address decoder which comprises a NAND logic circuit and an inverter I4. The data held in the flip-flop FF2 is output to the data input/output lines IOC and IOD when a column enable signal CENB2 is activated.

Signals ECH1 and ECH2 are supplied to the n-channel MOS transistors Qn26 and Qn34, respectively. These transistors Qn26 and Qn34 equalize the flip-flops FF1 and FF2 when the signals ECH1 and ECH2 rise to "H1" level. n-channel MOS transistors Qn24, Qn25, Qn32 and Qn33 are provided. The transistor Qn24 connects the flip-flop FF1 to or disconnects the same from a MOS capacitor Qd1. The transistor Qn32 connects the flip-flop FF2 to or disconnects the flip-flop FF2 from the MOS capacitor Qd1. The transistor Qn25 connects the flip-flop FF1 to or disconnects the flip-flop FF1 from a MOS capacitor Qd2. The transistor Qn33 connects the flip-flop FF2 to or disconnects the same from the MOS capacitor Qd1.

P-channel MOS transistors Qp12C and Q13C constitute a circuit, which changes the gate voltage of the MOS capacitor Qd1 according to the data held in the flip-flop FF1, in the input data is a activation signal VRFYBAC. P-channel MOS transistors Qp14C and Q15C constitute a circuit, which changes the gate voltage of the MOS capacitor Qd2 according to the data held in the flip-flop FF2, in the input data is a activation signal VRFYBBC. The p-channel MOS transistor Qp12C and p-channel MOS transistors Qp19C and Qp20C constitute a circuit, which changes the gate voltage of the MOS capacitor Qd1 according to the data items held in the flip-flops FF1 and FF2, in the input data is an activation signal VRFYBA2C. The p-channel MOS transistor Qp14C and p-channel MOS transistors Qp21C and Qp22C constitute a circuit, which changes the gate voltage of the MOS capacitor Qd2 according to the data items held in the flip-flops FF1 and FF2, in the input data is an activation signal VRFYBB2C. N-channel MOS transistors Qn1C and Qn2C constitute a circuit, which changes the gate voltage of the MOS capacitor Qd1 according to the data held in the flip-flop FF2, in the input data is an activation signal VRFYBA1C. N-channel MOS transistors Qn3C and Qn4C constitute a circuit, which changes the gate voltage of the MOS capacitor Qd2 according to the data held in the flip-flop FF2, in the input data is an activation signal VRFYBB1C.

The MOS capacitors Qd1 and Qd2 are constituted by a depletion n-channel MOS transistor each. They have a capacitance much less than the bit-line capacitance. An n-channel MOS transistor Qn37 charges the MOS capacitor Qd1 to a voltage VA when it receives a signal PREA. An n-channel MOS transistor Qn38 charges the MOS capacitor Qd2 to a voltage VB when it receives a signal PREB. N-channel MOS transistors Qn39 and Qn40 connects the data circuit 6 to or disconnects the same from bit lines BLa and BLb in the input data is signals BLCA and BLCB, respectively. The n-channel MOS transistors Qn37 and Qn38 constitute a circuit, which controls the voltages of the bit lines BLa and BLb.

It will be explained how the NAND-type flash memory (the second embodiment) described above operates when the control gate CG2A is selected.

Data-Reading

First, it will be described how data is read from the flash memory, with reference to the timing chart of FIG. 16.

At time t1RC, the voltages VA and VB are set at 1.8V and 1.5V, whereby the bit lines BLa and BLb are set at 1.8V and 1.5V, respectively. As a result, the signals BLCA and BLCB falls to "L" level. The bit lines BLa and BLb are thereby disconnected from the MOS capacitors Qd1 and Qd2, respectively, and assumes floating state. The signals PREA and PREB fall to "L" level, setting the nodes N1 and N2, or the gates of the MOS capacitors Qd1 and Qd2, into floating state. Then, at time t2RC, the control gate CG2A in the block selected by a control gate/select gate driving circuit is programmed to 0V, while the control gates CG1A, CG3A and CG4A, each not selected, and the control gates SG1A and SG2A, both selected, are set at VCC. If the memory cell selected has a threshold voltage of 0V or less, the bit-line voltage will be lower than 1.5V. If the memory cell selected is 0V or more, the bit-line voltage will remain at 1.8V. Thereafter, at time t3RC, the signals BLCA and BLCB rise to "H" level. The data items on the bit lines BLa and BLb are thereby transferred to the MOS capacitors Qd1 and Qd2. The signals BLCA and BLCB then fall to "L" level, whereby the bit lines BLa and BLb are disconnected from the MOS capacitors Qd1 and Qd2. Signals SAN1 and SAP1 change to "L" level and "H" level, respectively. The flip-flop FF1 is thereby deactivated. The signal ECH1 rises to "H" level, equalizing the flip-flop FF1. Thereafter, signals RV1A and RV1B rise to "H" level. At time t4RC, the signals SAN1 and SAP1 change to "H" level and "L" level, respectively. The voltage at the node N1 is sensed and latched. The flip-flop FF1 detects that the memory cell stores "0" or one of the other three values "1," "2" or "3." The data showing this fact is latched.

Next, the control gate CG2A (i.e., the control gate selected) is programmed to 1V. If the memory cell selected has a threshold voltage of 1V or less, the bit-line voltage will be less than 1.5V. If the memory cell has a threshold voltage of 1V or more, the bit-line voltage will remain at 1.8V. At time t5RC, the signals PREA and PREB rise to "H" level, setting the nodes N1 and N2, or the gate electrodes of the MOS capacitors Qd1 and Qd2, at 1.8V and 1.5V, respectively. Then, the signals PREA and PREB fall to "L" level, whereby the nodes N1 and N2 assume floating state. At time t6RC, the signals BLCA and BLCB rise to "H" level and then falls to "L" level. The bit lines BLa and BLb are disconnected from the MOS capacitors Qd1 and Qd2. Signals SAN2 and SAP2 change to "L" level and "H" level, respectively, deactivating the flip-flop FF2. The signal ECH2 rises "H" level, equalizing the flip-flop FF2. Further, signals RV2A and RV2B rise to "H" level. At time t7RC, the signals SAN2 and SAP2 again change to "L" level and "H" level, whereby the voltage at the node N1 is sensed and latched. Thus, the flip-flop FF2 detects that the data stored in the memory cell is "0" or "1," or "2" or "3." The data showing this fact is latched.

FIG. 17 is a table showing the data items to be read from the NAND-type flash memory, which the flip-flops FF1 and FF2 may sense and latch at time t7RC. At time t7RC, the nodes N3C and N5C in the flip-flops FF1 and FF2 may assume the potentials shown in FIG. 17.

The data held in the flip-flop FF2 is output from the memory chip at time tCB1 when the column enable signal CENB2 is activated.

Finally it is detected that the data written into the memory cell selected is "2" or "3." The control gate CG2A, i.e., the selected gate, is then set at 2V. If the memory cell selected has a threshold voltage of 2V or less, the bit-line voltage will be lower than 1.5V. If the memory cell has a threshold voltage of 2V or more, the bit-line voltage will remain at 1.8V. At time t8RC, the signals PREA and PREB rise to "H" level. The nodes N1 and N2, i.e., the gate electrodes of the MOS capacitors Qd1 and Qd2, are set at 1.8V and 1.5V, respectively. Then, the signals PREA and PREB fall to "L" level, setting the nodes N1 and N2 into floating state. At time t10RC, the signals BLCA and BLCB rise to "H" level. Thereafter, the signals BLCA and BLCB again fall to "L" level, whereby the bit lines BLa and BLb are disconnected from the MOS capacitors Qd1 and Qd2. At time t11RC, the signal VRFYBA2C is programmed to 0V before the data in either MOS capacitor is sensed. As can be understood from FIG. 17, it is only when the data is "1" that the nodes N5C and N3C are at "L" level and "H" level, respectively. Thus, the p-channel MOS transistors Qp12C, Qp19C and Qp20C are turned on and the node N1 is programmed to VCC only when the memory cell selected stores "1."

Thereafter, the signals SAN1 and SAP1 change to "L" level and "H" level, deactivating the flip-flop FF1. The signal ECH1 rises to "H" level, equalizing the flip-flop FF1. Then, the signals RV1A and RV1B rise to "H" level. At time t12RC, the signals SAN1 and SAP1 change to "H" level and "L" level, causing the flip-flop FF1 to latch the voltage at the node N1. Namely, the flip-flop FF1 detects that the data stored in the memory cell is either "2" or "3." The data showing this fact is latched.

After the data held in the flip-flop FF2 is output from the memory chip, the data held in the flip-flop FF1 is output from the chip at time tCB2 when the column enable signal CENB1 is activated.

FIG. 18 shows the data items to be read out, which the flip-flops FF1 and FF2 may sense and latch.

The flip-flops FF1 and FF2 latch a four-value data item in the way described above. The threshold value of the four-value data item is as follows:

Threshold value for data "0": 0V or less
Threshold value for data "1": 0.5V–0.8V
Threshold value for data "2": 1.5V–1.8V
Threshold value for data "3": 2.5V–2.8V While a four-value data item is being read from the memory cell selected, the signals VRFYBAC and VRFYBBC remain at "H" level, the signals VRFYBA1C and VRFYBB1C remain at "L" level, and the voltage Vs remains at 0V.

The data stored in the memory cell, the threshold voltage of the memory-cell transistor, and the voltage levels output to the data input/output lines IOA, IOB, IOC and IOD after the data is read from the cell have the relationship specified in FIG. 18.

Programming

First, data is loaded into the flip-flops FF1 and FF2. Then, data items "1," "2" and "3" are written almost simultaneously into the memory cells. Verify read operation is carried out, determining whether the memory cells have been programmed to data items "1," "2" and "3." If there is any memory cell that has been insufficiently programmed, the data items are written again into the memory cells. When the write completion detection circuit 18 (FIG. 9) all memory cells are sufficiently programmed, the programming is terminated.

How the NAND-type flash memory is programmed will be described, and how the verify read operation is performed.

(1) Programming

The data input is converted by the data input/output buffer 5 and input to the data circuit 6**, before it is written into the memory cells.

FIG. 19 shows the data items to be written, which the flip-flops FF1 and FF2 may sense and latch. FIG. 19 also represents the relationship a four-value data item to be written into one memory cell has with the voltage levels of the data input/output lines IOA, IOB, IOC and IOD.

Assume that the NAND-type flash memory has 256 data circuits 6** as the NAND-type flash memory according to the first embodiment (that is, one page contains 256 bytes memory cells, thus having a memory capacity of 256 bytes (=256×8 bits). The first 256 bits externally supplied are input to the flip-flops FF1 through the data input/output lines IOA and IOB while the column enable signal CENB1 remains at "H" level. Then, the next 256 bits externally supplied are input to the flip-flops FF2 through the data input/output lines IOC and IOD while the column enable signal CENB2 remains at "H" level.

As seen from FIGS. 18 and 19, the data input to each flip-flop FF1 via the data input/output lines IOA and IOB and thus written is read, when necessary, into one flip-flop FF2 and output from the memory chip via the data input/output lines IOC and IOD. In other words, the data input/output buffer 5 is controlled such that the data once written via the IOA is read out through the IOD, and that the data once written via the line IOB is read out through the line IOC.

On the other hand, the data input to each flip-flop FF2 via the data input/output lines IOC and IOD and thus written is read, when necessary, into one flip-flop FF1 and output from the memory chip via the data input/output lines IOC and IOD. In other words, the data input/output buffer 5 is controlled such that the data once written via the IOC is read out through the IOB, and that the data once written via the line IOD is read out through the line IOA.

How data is written will be explained, with reference to the timing chart of FIG. 20.

Figure 20:
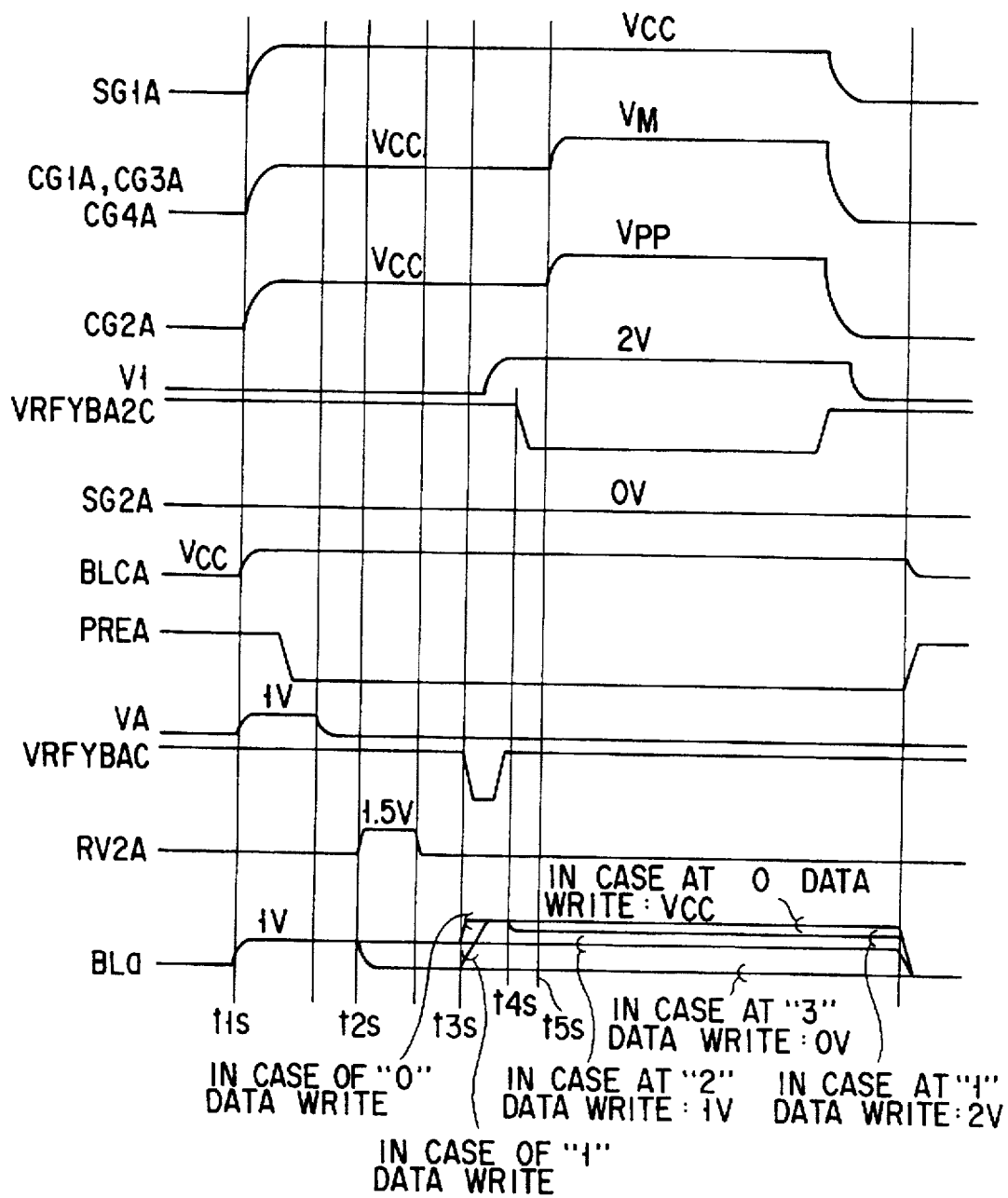
FIG. 20 is a timing chart explaining how data is written into the NAND-type flash memory which is the second embodiment.

As shown in FIG. 20, the voltage bit-line write control voltage VA rises to 1V at time t1s, setting the bit line BLa at 1V. If a voltage drop equivalent to the threshold voltage of the n-channel MOS transistor Qn39 makes a problem, it suffices to raise the level of the signal BLCA. Then, the signal PREA falls to "L" level, setting the bit line BLa in floating state. At time t2s, the signal RV2A is programmed to 1.5V, the data circuit storing "1" or "3" applies a bit-line control voltage of 0V to the bit line BLa. Assume that the n-channel MOS transistor Qn32 has a threshold voltage of 1V while data is being written. Then, the n-channel MOS transistor Qn32 is turned off if the data being written is "0" or "1," or is turned off if the data being written is "1" or "3." Thereafter, at time t3s, the signal VRFYBAC changes to 0V, whereby the data circuit storing "0" or "1" applies a bit-line control voltage VCC to the bit line BLa. At time t4s, the signal VRFYBA2C falls to 0V, whereby the data circuit holding "1" applies a write voltage of 2V to the bit line BLa, for writing data "1."

Thus, the bit line BLa is programmed to VCC to write "0," at 2V to write "1," at 1V to write "2," and at 0V to write "3."

At time t1s, the select gate SG1A and control gates CG1A to CG4A of the block selected are set at VCC by the control gate/select gate driving circuit. The select gate SG2A of the block is programmed to 2V. Then, the control gate CG2A selected is programmed to a high voltage VPP (e.g., 20V), while the control gages CG1A, CG3A and CG4A, all not selected, are set at a voltage VM (e.g., 10V). In the memory cell connected to the data circuit holding "3", electrons are injected into the floating gate, increasing the threshold voltage of the memory-cell transistor, due to the difference between the potential (0V) of the channel and the potential (VPP) of the control gate. In the memory cell connected to the data circuit holding "2", electrons are injected into the floating gate, increasing the threshold voltage of the memory-cell transistor, due to the difference between the potential (1V) of the channel and the potential (VPP) of the control gate. In the memory cell connected to the data circuit holding "1", electrons are injected into the floating gate, increasing the threshold voltage of the memory-cell transistor, due to the difference between the potential (2V) of the channel and the potential (VPP) of the control gate. The channel potential is 1V to write "2" in the memory cell, and is 2V to write "1" in the memory. Namely, the greater the value to write in the cell, the lower the channel potential of the memory-cell transistor. In the memory cell connected to the data circuit holding "0", the potential difference between the channel and the control gate is so small that electrons are not injected into the floating gate in an amount large enough to change the threshold voltage of the memory-cell transistor.

During the programming operation, the signals SAN1, SAN2, PREB, and BLCB remain at "H" level, the signals SAP1, SAP2, VRFYBA1C, RV1A, RV1B, RV2B, ECH1 and ECH2 remain at "L" level, and the voltage VB remains at 0V.

(2) Verify-Read Operation

After the programming operation, it is determined whether data has been completely written. (That is, write verify operation is carried out.) If the threshold voltage of the memory cell has reached a desired value, the data held in the data circuit is changed to "1." Otherwise, the data held in the data circuit is left unchanged, and the data is written again into the memory cell. Data-writing and write verify operation are repeated until all memory cells into which "1" must be written come to have a desired threshold voltage, all memory cells into which "2" must be written come to have another desired threshold voltage, and all memory cells into which "3" must be written come to have still another desired threshold voltage.

Figure 21:
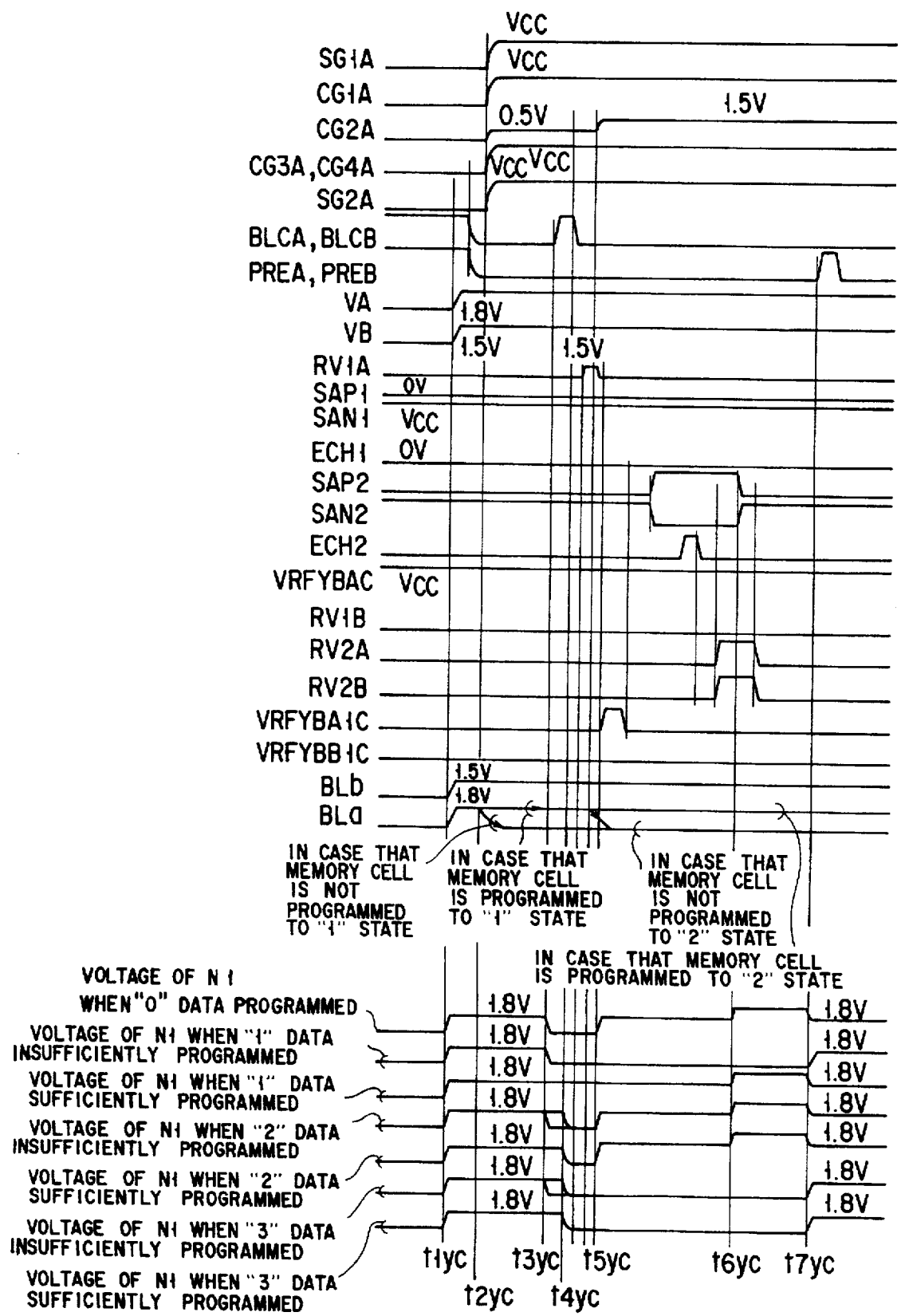
FIGS. 21 and 22 are a timing chart explaining how verify read is performed in the second embodiment.

The verify read operation will be described, with reference to the timing chart of FIGS. 21 and 22.

First, it is determined, in the following way, whether the threshold voltage of a memory cell in which "1" must be written has reached a predetermined value.

At time t1yc, the voltages VA and VB are set at 1.8V and 1.5V, respectively. The bit lines BLa and BLb are thereby set at 1.8V and 1.5V. The signals BLCA and BLCB fall to "L" level, disconnecting the bit line BLa from the MOS capacitor Qd1 and the bit line BLb from the MOS capacitor Qd2.

The bit lines BLa and BLb therefore assume floating state. The signals PREB falls to "L" level, setting the nodes N1 and N2, i.e., the gate electrodes of the MOS capacitors Qd1 and Qd2, into floating state. At time t2yc, the selected control gate CG2A of the block selected by the control gate/select gate driving circuit is programmed to 0.5V, while the control gates CG1A, CG3A and CG4A not selected and the select gates SG1A and SG2A are set at VCC. If the threshold voltage of the memory cell selected, is 0.5V or less, the bit-line voltage is less than 1.5V. If the threshold voltage is 0.5V or more, the bit-line voltage will remain at 1.8V. At time t3yc, the signals BLCA and BLCB rise to "H" level, and the potentials of the bit lines are applied to the nodes N1 and N2. Then, the signals BLCA and BLCB fall to "L" level, disconnecting the bit line BLa from the MOS capacitor Qd1 and the bit line BLb from the MOS capacitor Qd2. Thereafter, at time t4yc, the signal RV1A is programmed to 1.5V. The node N1 is discharged to 0V if the memory cell is to store "2" or "3." At time t5yc, the signal VRFYBA1C rises to "H" level, the n-channel MOS transistor Qn2 is turned on and the node N1 is programmed to VCC in the data circuit which holds "0" or "2." Thus, the node N1 is programmed to VCC to write "0" or "2" into the memory cell, or at 0V to write "3" into the memory cell.

The signals SAN2 and SAP2 change to "L" level and "H" level, respectively, deactivating the flip-flop FF2. The signal ECH1 rises to "H" level, equalizing the flip-flop FF2. Then, the signals RV1A and RV1B rise to "H" level. At time t6yc, the voltage at the node 1 is sensed and latched. It is determined whether the memory cell connected to the data circuit holding "1" has been sufficiently programmed to data "1" or not. If the memory cell stores "1," the flip-flop FF2 senses and latches the voltage at the node N1, whereby the data to be written into the memory cell is changed to "0." If the memory cell does not store "1," the flip-flop FF1 senses and latches the voltage at the node N2, whereby the data "1" is maintained in the memory cell. Any other data, "0," "2" or "3," remains unchanged in whichever data circuit that hold it.

Next, the control gate selected is programmed to 1.5V. If the threshold voltage of the memory cell selected is 1.5V or less, the bit-line voltage will be less than 1.5V. If the threshold voltage is 1.5V or more, the bit-line voltage will remain at 1.8V. At time t7yc, the signals PREA and PREB are set at VCC. The nodes N1 and N2 are thereby set at 1.8V and 1.5V, respectively, and assume floating state. At time t8yc, the signals BLCA and BLCB rise to "H" level, whereby the bit-line potential is applied to the nodes N1 and N2. Then, the signals BLCA and BLCB fall to "L" level, disconnecting the bit line BLa from the MOS capacitor Qd1 and the bit line BLb from the MOS capacitor Qd2. Thereafter, at time t9yc, the signal RV2A is programmed to a voltage lower than VCC, for example 1.5V. If the threshold voltage of the n-channel MOS transistor Qn32 is 1V, the transistor Qn32 is turned on and the node N1 is programmed to 0V in any data circuit that holds "3." In any data circuit that holds "2," the n-channel MOS transistor Qn32 is turned off and the node N1 is maintained at 1.5V or more if the memory cell connected to the data circuit is sufficiently programmed to data "2." If the memory cell is insufficiently programmed to data "2," the node N1 is maintained at 1.5V or less. At time t10yc when the signal VRFYBAC falls to "L" level, the p-channel MOS transistor Qp13 is turned on, thereby the node N1 is set to VCC at "0" or "2" data write, and is set to 0V at "3" data write.

The signals SAN1 and SAP1 change to "L" level and "H" level, respectively. The flip-flop FF1 is thereby deactivated.

The signal ECH1 rises to "H" level, equalizing the flip-flop FF1. Thereafter, the signals RV1A and RV1B rise to "H" level. At time t11yc, the signals SAN1 and SAP1 change to "H" level and "L" level, respectively, and the voltage at the node N1 is sensed and latched. Thus it is detected whether or not the memory cell has been sufficiently programmed to "2." If the data stored in the memory cell is "2," the flip-flop FF1 senses and latches the voltage at the node N1. The data to be written into the memory cell is thereby changed to "0." If the data stored in the memory cell is not "2," the flip-flop FF1 senses and latches the voltage at the node N1. In this case, the data to be written is maintained "2." The data held in any data circuit that stores "0," "2" or "3" is not changed at all.

Next, the control gate selected is set to 2.5V. If the threshold voltage of the selected memory cell is 2.5V or less, the bit-line voltage becomes less than 1.5V, and if the threshold voltage of the selected memory cell is 2.5V or more, the bit-line voltage remains at 1.8V. Thereafter, at time t12yc, the signals BLCA and BLCB are set at "H" level, whereby the bit-line potential is applied to the nodes N1 and N2. Then, the signals BLCA and BLCB fall to "L" level, disconnecting the bit line BLa from the MOS capacitor Qd1 and the bit line BLb from the MOS capacitor Qd2. At time t13yc, the signal VRFYBAC falls to "L" level. In any data circuit that holds "0" or "1" and in any data circuit that holds "2" completely, the p-channel MOS transistor Qp13 is turned on, and the node N1 is programmed to VCC. The signals SAN1 and SAP1 change to "L" level and "H" level. The flip-flop FF1 is thereby deactivated. The signal ECH1 rises to "H" level, equalizing the flip-flop FF1. Then, the signals RV1A and RV1B rise to "H" level. At time t14yc, the signal SAN1 rises to "H" level and the signal SAP1 falls to "L" level. The voltage at the node N1 is thereby sensed and latched.

Figure 22:
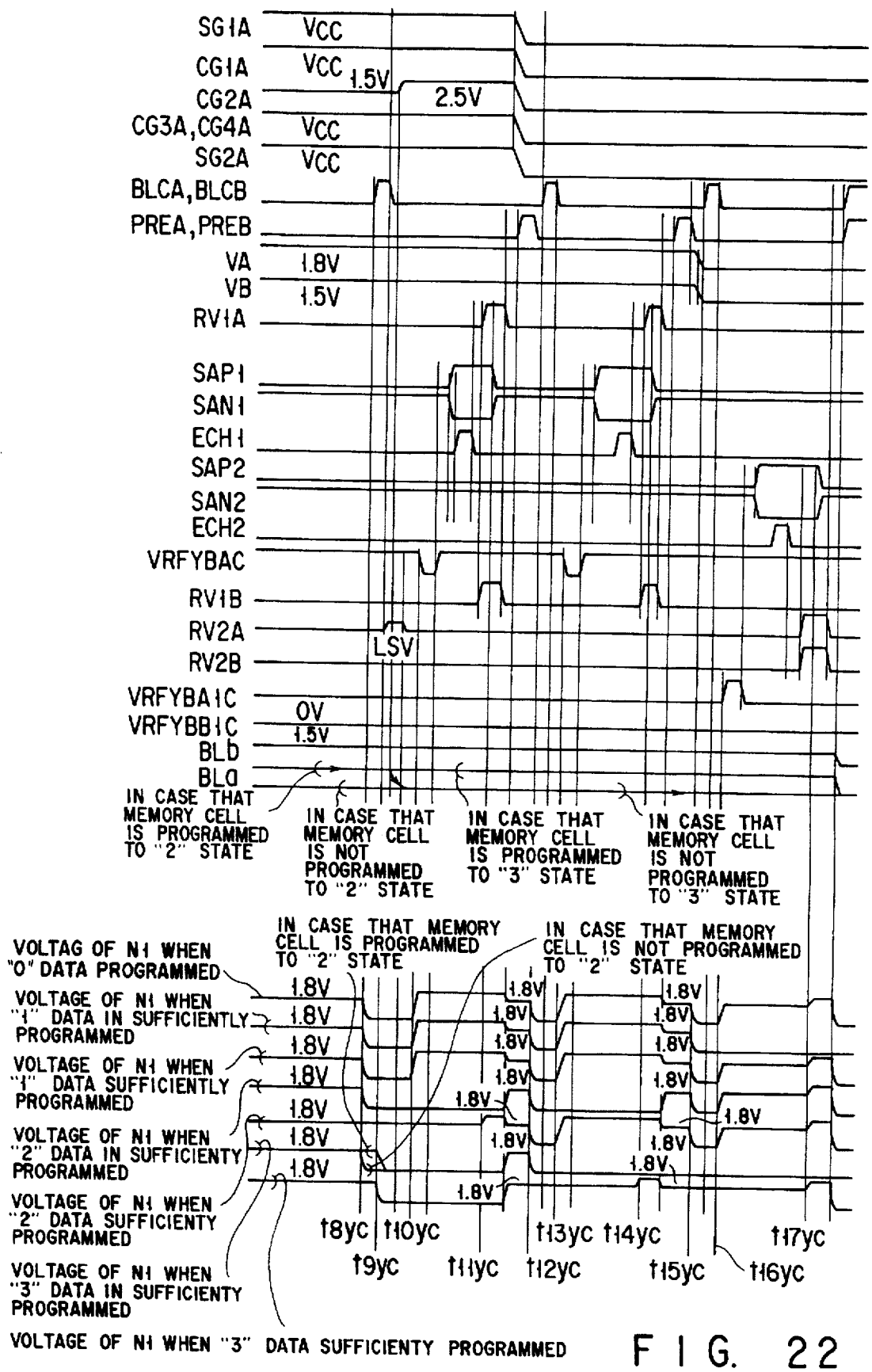

Thereafter, as shown in FIG. 22, the data to be written is changed. More precisely, the signals BLCA and BLCB set at "H" level at time t15yc. The bit-line potential is thereby applied to the nodes N1 and N2. Then, the signals BLCA and BLCB again fall to "L" level, disconnecting the bit line BLa from the MOS capacitor Qd1 and the bit line BLb from the MOS capacitor Qd2. At time t16yc, the signal VRFYBA1C rises to "H" level. In any data circuit that holds "0" or "2" and in any data circuit that holds "1" completely, the channel MOS transistor Qn2C is turned on, and the node N1 is programmed to VCC. The signals SAN1 and SAP1 change to "L" level and "H" level, respectively. The flip-flop FF2 is thereby deactivated. The signal ECH2 rises to "H" level, equalizing the flip-flop FF2. Then, the signals RV2A and RV2B rise to "H" level. At time t17yc, the signal SAN2 rises to "H" level and the signal SAP2 falls to "L" level. The voltage at the node N1 is thereby sensed and latched.

In the second embodiment, the signal VRFYBA1C is programmed to VCC at time t16yc. Therefore, the MOS capacitor Qd1 may be charged such that the node N1 is programmed to a potential higher than the node 2 (set at 1.5V) when "0," "2" or "1" is completely written. The signal RV2B may be set at, for example, 1.5V. In this case, the n-channel MOS transistor Qn33 is turned on and the voltage at the node N2 is 0V. This is because, the node N6C is at 0V when "0" and "2" or "1," or "1" has not been thoroughly, the node N6C is at 0V. Thus, n-channel MOS transistor Q33 is turned on, and the node N2 is programmed to 0V.

When "1" is not completely written or when "3" is written, the nodes N6C and N2 are set at VCC and 1.5V, respectively. In this case, the n-channel MOS transistor Qn33 is turned off, and the node N2 remains at 1.5V. At time t16yc, the signal VRFYBA1C is programmed to VCC to charge the node N2 when "0" or "2" is written or when "1" is not completely written. Since the node N2 is at 0V at time t16yc, it suffices to charge the node N2 to a relatively low voltage of, for example, about 0.5V.

As described above, it is determined whether the memory cell connected to any data circuit that holds "3" has been programmed to data "3" or not. If the memory cell has been sufficiently programmed to "3," the flip-flops FF1 and FF2 sense and latch the voltage at the node N1, thereby changing the data to be written into the memory cell to "0." Otherwise, the flip-flops FF1 and FF2 sense and latch the voltage at the node N1, thereby maintaining the data "3" in the data circuit. Any other data to be written, "0," "1" or "2," remains unchanged in whichever data circuit that holds it.

During the verify read, the signal VRFYBBC remains at "H" level, the signal VRFYBB1C at "L" level, and the voltage Vs at 0V.

If the threshold voltages of all memory cells selected reached desired values, the data items held in the data circuits are changed to "0." That is, when the memory cells selected are sufficiently programmed, the nodes N4C and N6C are set "L" level. From this fact it determining that all memory cells selected have now desired threshold voltages. To detect that the memory cells have been sufficiently programmed, it suffices to use the write-completion detecting transistors Qn5C and Qn6C, both shown in FIG. 15. After the verify read operation, the signal VRTC is precharged to VCC. If even one memory cell has been sufficiently programmed, the node N4C or node N6C, or both, of the data circuit to which the memory cell is connected are at "H" level. Thus, the n-channel MOS transistor Qn5C or the n-channel MOS transistor Qn6C, or both, are turned on, whereby the signal VRTC falls from the precharge voltage. When all memory cells selected are sufficiently programmed, the nodes N4C and N6C in the data circuits 6–0, 6–1, . . . 6–m–1, and 6–m fall to "L" level. As a result, the n-channel MOS transistors Qn5C and Qn6C are turned off in any data circuit, whereby the signal VRTC remains at the precharge voltage.

The verify read, programming and data-read can be performed in other manners in the multi-value storing NAND-type flash memory according to the second embodiment of the invention.

Figure 23:
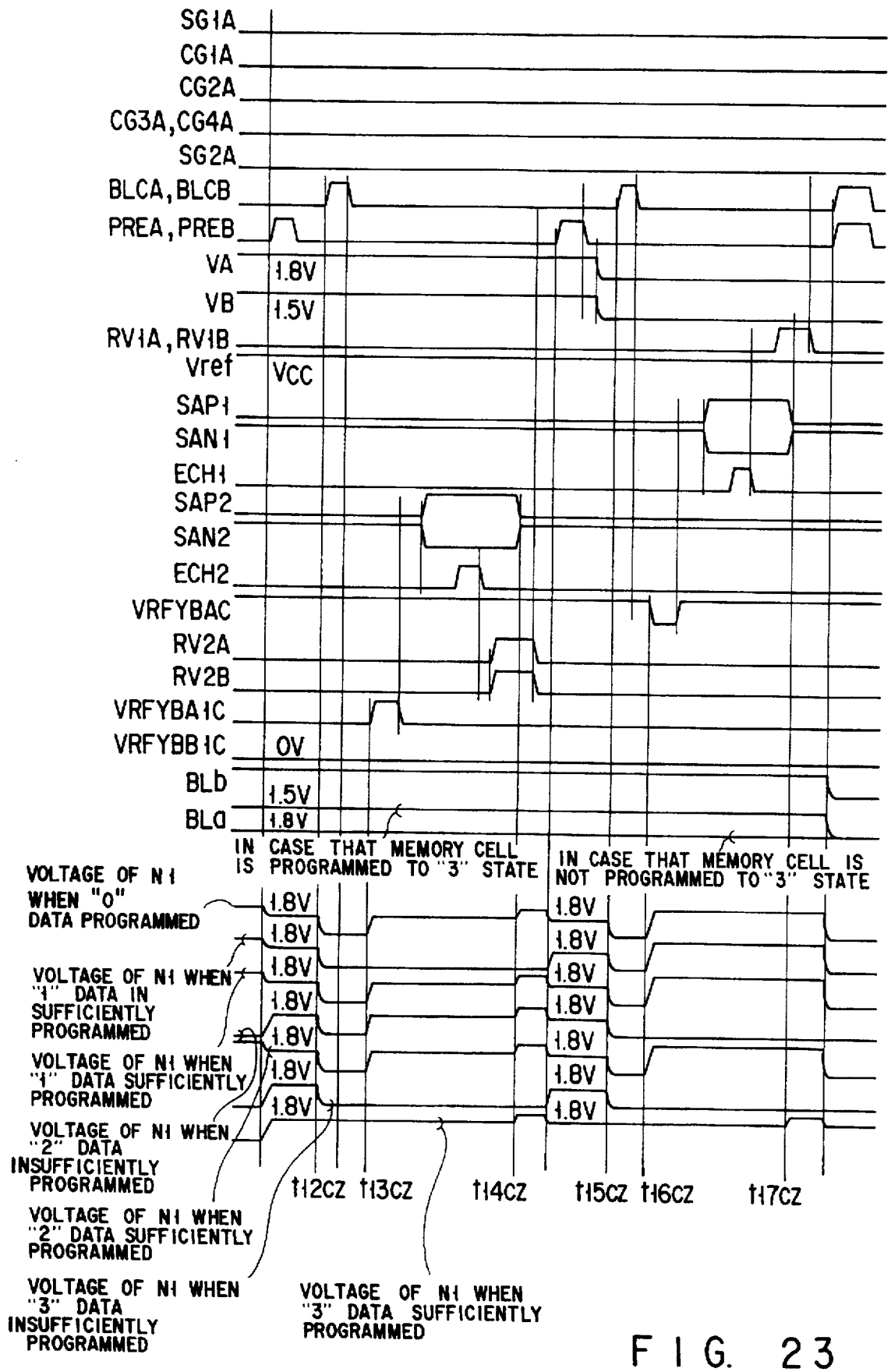
FIG. 23 is a timing chart explaining how verify read operation is performed in another method in the second embodiment.

The verify read may be effected by the method illustrated in FIG. 23. In this method, the same steps are performed until time t12yc. From time t12yc on, different steps are performed in this method.

At time t12yc, the signals BLCA and BLCB rise to "H" level, whereby the bit-line is applied to the nodes N1 and N2. If the threshold voltage of a memory cell selected is 2.5V or more, the bit line BLa will be set at 1.5V or more. If the threshold voltage is 2.5V or less, the bit line BLb will be set at 1.5V or less. Thereafter, the signals BLCA and BLCB falls to "L" level, disconnecting the bit line BLa from the MOS capacitor Qd1 and the bit line BLb from the MOS capacitor Qd2. At time t13zc when the signal VRFYBA1C rises to "H" level, the n-channel MOS transistor Qn2 is turned on and the node N1 is programmed to 1.5V in any data circuit that holds "0" or "2" or in any data circuit which is sufficiently programmed to data "1." The signals SAN1 and SAP1 change to "L" level and "H" level, respectively. The flip-flop FF2 is thereby deactivated. The signal ECH2 rises to "H" level, equalizing the flip-flop FF2. Thereafter, the signals RV2A and RV2B rise to "H" level. At time t14zc, the signal SAN2 rises to "H" level, and the signal SAP2 falls to "L" level. The voltage at the node N1 is sensed and latched.

Thereafter, the written data is converted as illustrated in FIG. 23. At time t15zc, the signals BLCA and BLCB rise to "H" level, and the bit-line potential is applied to the nodes N1 and N2. The signals BLCA and BLCB fall to "L" level again, disconnecting the bit lines BLa and BLb from the MOS capacitors Qn1 and Qn2, respectively. At time t16zc when the signal VRFYBAC falls to "L" level, the p-channel MOS transistor Qp13 is turned on and the node N1 is programmed to VCC in any data circuit that holds "0" or "1" and in any data circuit that has been sufficiently programmed to data "2." The signals SAN1 and SAP1 change to "L" level and "H" level, respectively. The flip-flop FF1 is thereby deactivated. The signal ECH1 rises to "H" level, equalizing the flip-flop FF1. Then, the signals RV1A and RV1B rise to "H" level. At time t17zc, the signals SAN1 and SAP1 change to "H" level and "L" level, respectively. The voltage at the node N1 is thereby sensed and latched.

Figure 24:
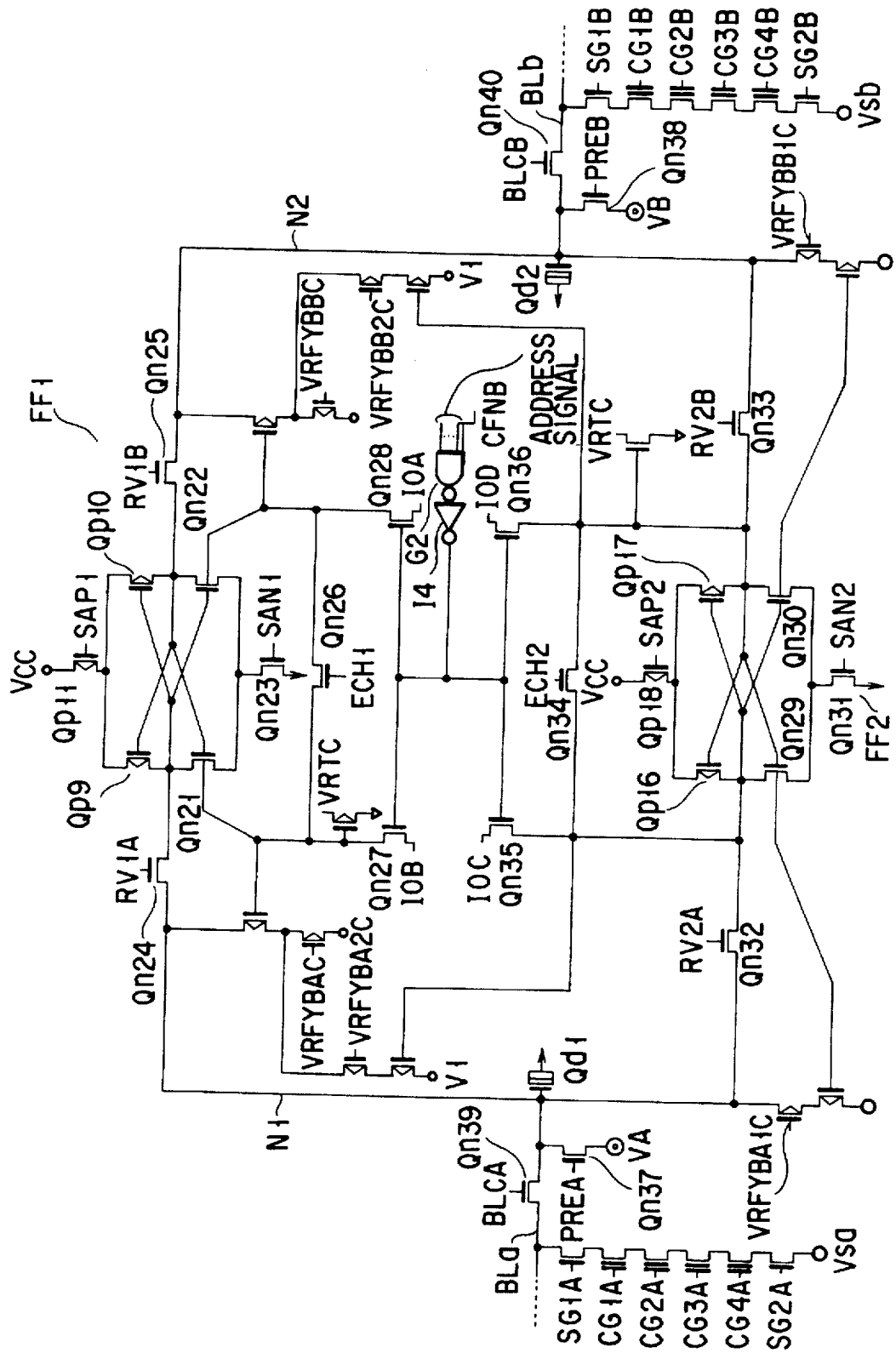
FIG. 24 is a circuit diagram of another type of a data circuit which may be used in place of the data circuit shown in FIG. 15.

The data circuits are not limited to the type shown in FIG. 15. Rather, they may be of other structures. FIGS. 24 and 25 show other two types of data circuits.

In the data circuit of FIG. 24, VCC is 0V if the signals VRFYBA1C and VRFYBB1C have the same waveforms as in the data circuit shown in FIG. 15, or as is illustrated in FIGS. 16, 20, 21, 22 and 23. The signals VRFYBAC, VRFYBBC, VRFYBA2C and VRFYBB2 have the same waveforms as in the data circuit shown in FIG. 15.

In the data circuit of FIG. 25, VCC is 0V if the signals VRFYBAC, VRFYBBC, VRFYBA2C and VRFYBB2C have the same waveforms as in the data circuit shown in FIG. 15, or as is illustrated in FIGS. 16, 20, 21, 22 and 23. The signals VRFYBA1C and VRFYBB1C have the same waveforms as in the data circuit illustrated in FIG. 15.

An NAND-type flash memory according to the third embodiment of the invention will be described.

In the third embodiment, each of the data circuits comprises two latch circuits. Data read from the second latch circuit is output from the memory chip while data is being read from the first latch circuit. One bit of the 2-bit data item stored in any four-value cell selected is output from the memory chip as soon as its value is determined, even the other bit is read from the four-value cell. Due to this method of reading data, the NAND-type flash memory has a higher read speed than the NAND-type flash memory according to the second embodiment.

Figure 26:
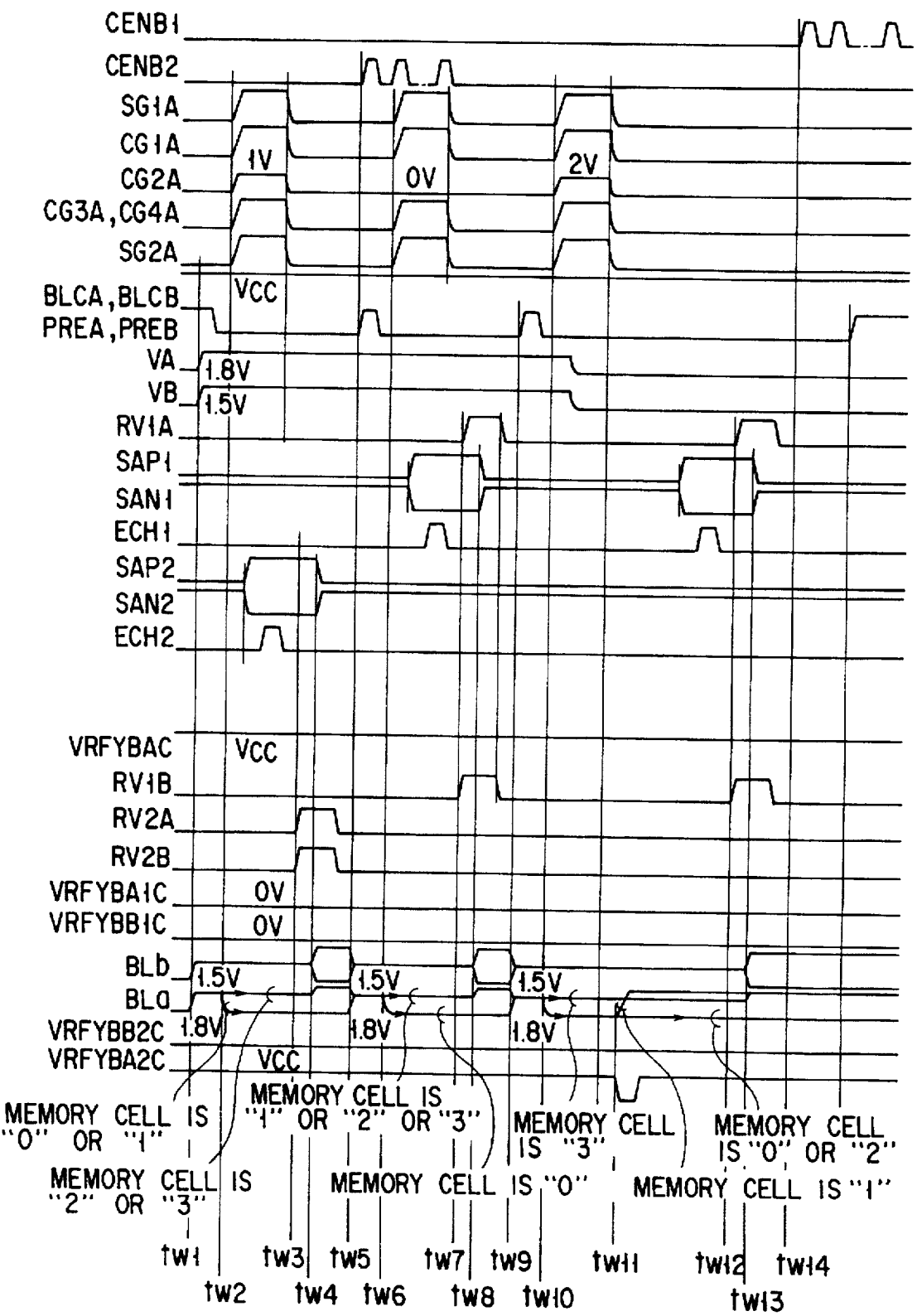
FIG. 26 is a timing chart explaining how data is read from a NAND-type flash memory according to a third embodiment of the invention.

As shown in the timing chart of FIG. 26, voltages VA and VB are set at 1.8V and 1.5V at time tw1. The bit lines BLa and BLb are thereby set at 1.8V and 1.5V, respectively. Then, signals PREA and PREB fall to "L" level, and both bit lines BLa and BLb assume floating state. At time tw2, the selected control gate CG2A of the block selected by the control gate/select gate driving circuit is programmed to 1V, while the control gates CG1A, CG3A and CG4A not selected and the select gates SG1A and SG2A are set at VCC. If the threshold voltage of the memory cell selected is 1V or less, the bit-line voltage is less than 1.5V. If the threshold voltage is 1V or more, the bit-line voltage will remain at 1.8V. Thereafter, signals SAN2 and SAP2 change "L" level and "H" level, respectively, deactivating the flip-flop FF2. The signal ECH2 rise to "H" level, whereby the flip-flop FF2 is equalized. At time t3w, signals RVA2A and RV2B rise to "H" level. At time t4w, the signals SAN2 and SAP2 change to "H level and "L" level, respectively. The voltage at the node N1 is thereby sensed and latched. The flip-flop FF2 therefore determines that the memory cell selected stores "0" or "1" or "2" or "3."

At time tw5, signal CENB2 is activated. The data held in the flip-flop FF2 is thereby output from the memory chip.

It is determined whether the threshold voltage of the memory cell selected is 0V or more, or 0V or less. At time tw5, the bit line BLa and the dummy bit line BLb are precharged to 1.8V and 1.5V, respectively. Then, the bit lines BLa and BLb are set in floating state. At time tw6, the control gate selected is programmed to 0V. If the threshold voltage of the memory cell selected is 0V or less, the bit-line voltage will be less than 1.5V. If the threshold voltage is 0V or more, the bit-line voltage will remain at 1.8V. The signals SAN1 and SAP1 change to "L" level and "H" level, respectively, whereby the flip-flop FF1 is deactivated. The signal ECH1 rises to "H" level, equalizing the flip-flop FF1. At time tw7, signals RV1A and RV1B rise to "H" level. At time tw8, the signals SAN1 and SAP1 change to "H" level and "L" level. The voltage at the node N1 is thereby sensed and latched. Thus, the flip-flop FF1 detects that the memory cell stores "0" or any other value "1," "2" or "3." The data showing this fact is latched. At this time the nodes N3C in the flip-flop FF1 and the node N5C in the flip-flop FF2 are set at the potentials specified in FIG. 17.

It is then determined whether the memory cell stores "3" or any other value "0," "1" or "2." At time tw9, the bit line BLa and the dummy bit line BLa are precharged to 1.8V and 1.5V, respectively. The bit lines BLa and BLb are then set in floating state. At time tw10, the control gate selected is programmed to 2V. If the threshold voltage of the memory cell selected is 2V or less, the bit-line voltage will be less than 1.5V. If the threshold voltage is 2V or more, the bit-line voltage will remain at 8V. At time tw11, the signal VRFYBA2C is set al 0V. As seen from FIG. 17, it is only when the data is "1" that the nodes N4C and N3C are set at "high level" (that is, the node N4C is programmed to "low level"). Hence, the p-channel MOS transistors Qp12C, Qp19C and Qp20C are turned on, and the node N1 is programmed to VCC. Thereafter, the signals SAN1 and SAP1 change to "L" level and "H" level, respectively, deactivating the flip-flop FF1. The signal ECH1 rises to "H" level, equalizing the flip-flop FF1. At time tw12, the signals RV1A and RV1B rise to "H" level. At time tw13, the signals SAN1 and SAP1 change to "H" level and "L" level, whereby the voltage at the node N1 is sensed and latched. The flip-flop FF1 determines whether the memory cell stores "3" or any other data "0," "1" or "2." The data showing this fact is latched.

At time tw14 when the signal CENB1 is activated, the data held in the flip-flop FF1 is output from the memory chip. A four-value data item is thereby read from the selected memory cell, and the flip-flops FF1 and FF2 latch this data item.

Data programming and verify read may be carried out in the third embodiment, in almost the same way as in the second embodiment.

In the third embodiment, the bit line and the dummy bit line are precharged before the read voltage is applied to the word line, every time the data is to be read from the selected memory cell.

In the second embodiment, the data-reading and the verify read are effected, first by precharging the bit line and the dummy bit line and then by changing the read voltage of the word line (for example, from 0V to 1V or 2V), without recharging the bit line or the dummy bit line. Alternatively, the bit line and the dummy bit line may be precharged every time the read voltage (e.g., 0V, 1V or 2V) is applied to the word line.

A multi-value data memory EEPROM according to the fourth embodiment of the present invention will be described, with reference to FIGS. 27A to 27C. FIGS. 27A to 27C show the distribution of threshold voltages of each memory cell provided in the EEPROM and explain how data is output from the EEPROM.

The multi-value data memory EEPROM comprises a memory cell array and a plurality of data circuits. The memory cell array has memory cells arranged in rows and columns. Each memory cell can store an n-value data item, where n is a natural number greater than 3. Each data circuit comprises m latch circuits for holding the n-value data item read from a memory cell selected.

As shown in FIGS. 27A to 27C, the data item read from the memory cell is input to k number of latch circuits provided in the data circuit. The data item held in these latch circuits is output from the memory chip before the same data item is input to the remaining (m−k) latch circuits of the data circuit. The number k may be 2 as shown in FIG. 27A, 1 as shown in FIG. 27B, or 3 as shown in FIG. 27C.

The m latch circuits of each data circuit can hold the n-value data item which is supplied from an external device and which is to be written into the selected memory cell. The data item externally supplied is input to k number of latch circuits provided in the data circuit. The data item held in these latch circuits is written into the memory cell before the same externally supplied data item is input to the remaining (m−k) latch circuits of the data circuit.

Figure 3:
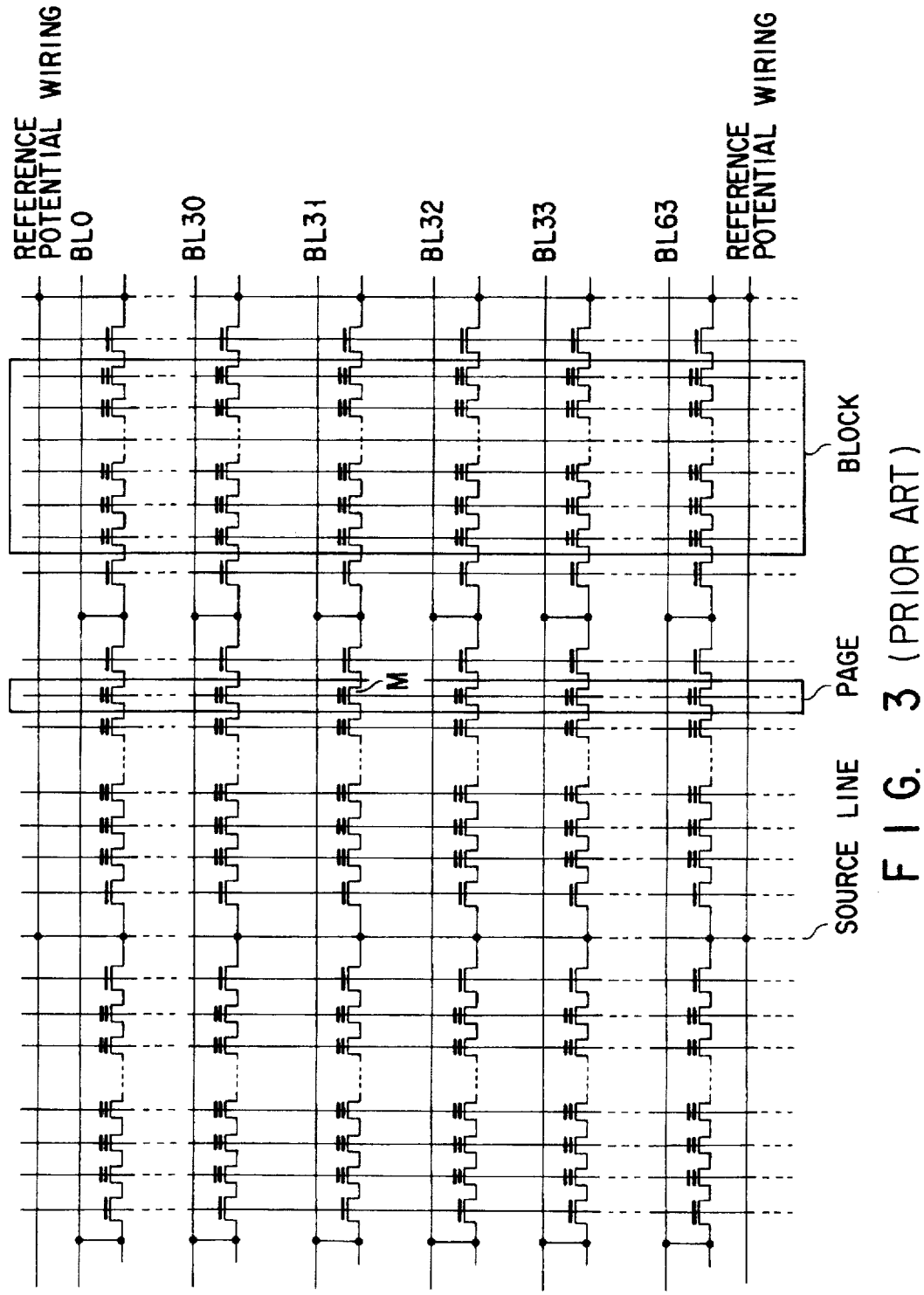
FIG. 3 is a circuit diagram illustrating a NAND-cell array.
Figure 4:
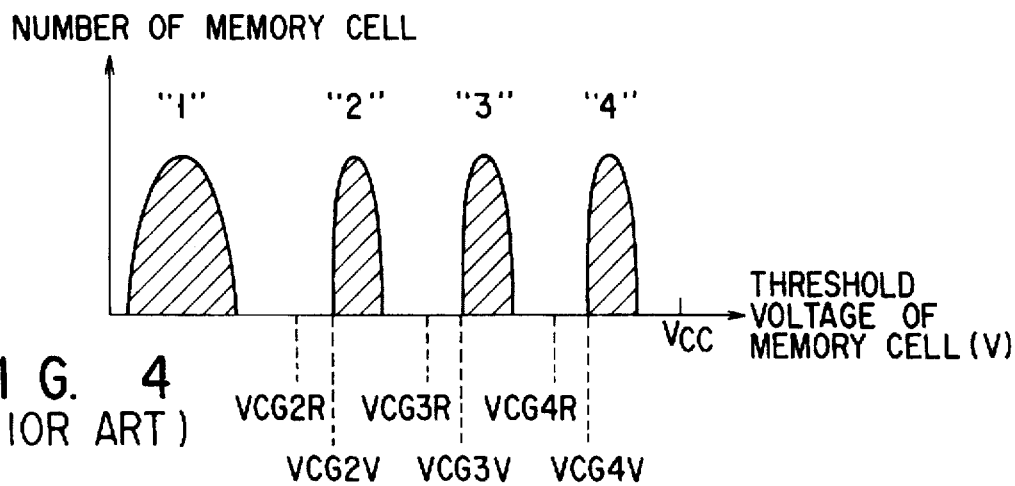
FIG. 4 is a diagram representing the relation between the threshold voltage of the transistor of a conventional four-value cell and the four data items of different values the cell can store.
Figure 5:
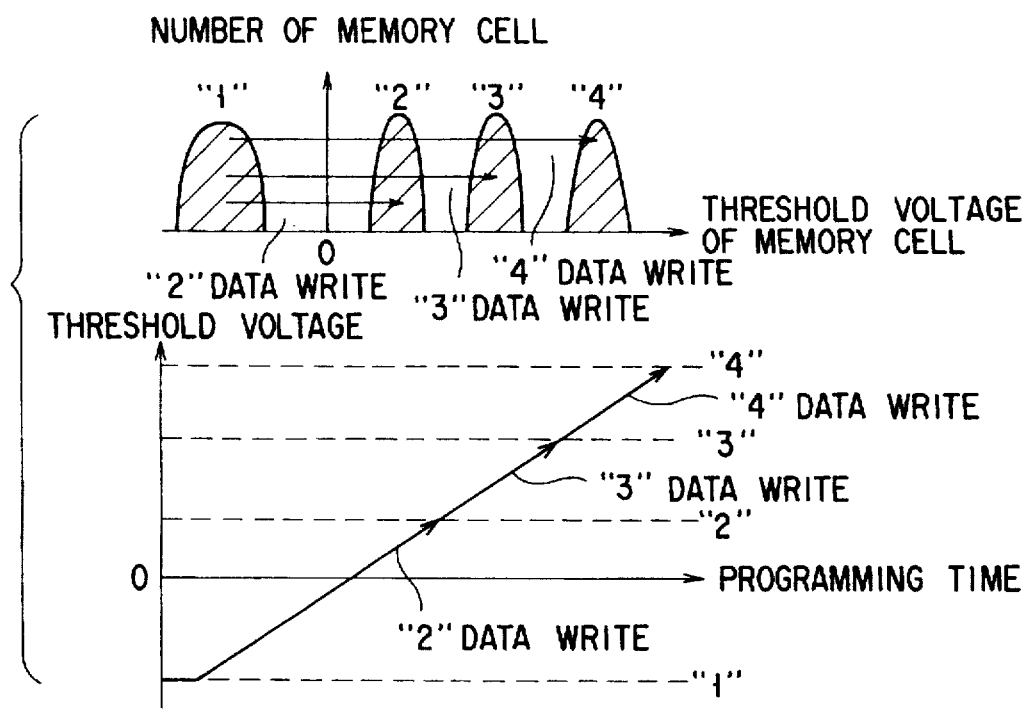
FIG. 5 is a diagram explaining how data is written into a conventional four-value cell.
Figure 6:
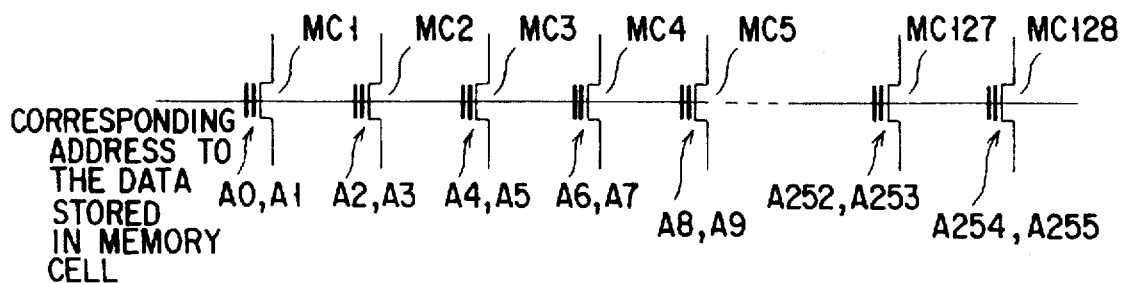
FIG. 6 is a diagram illustrating the relation between conventional memory cells and the addresses thereof.
Figure 7A:
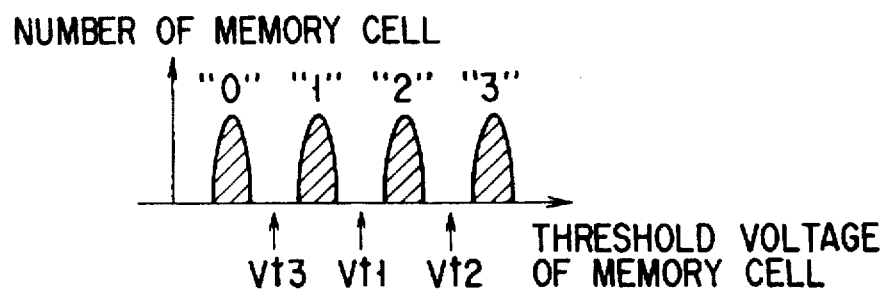
FIG. 7A is a diagram representing a distribution of threshold voltages of a conventional four-value cell.
Figure 7B:
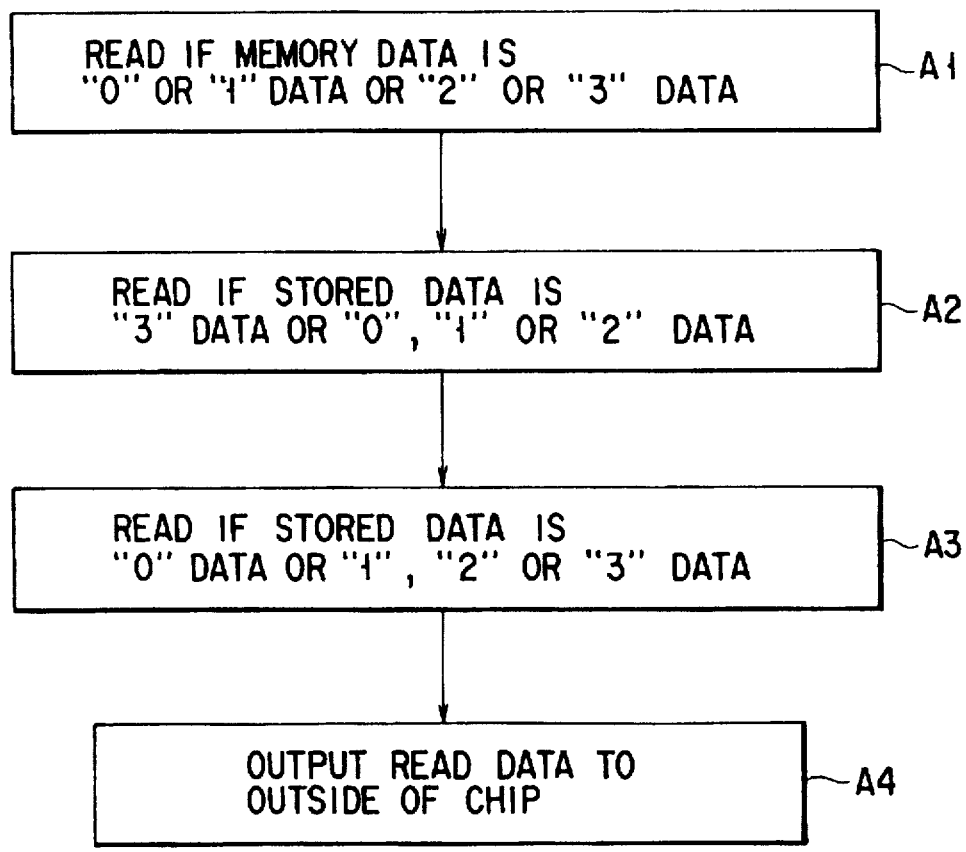
FIG. 7B is a flowchart for explaining a conventional method of reading data from the four-value cell.
Figure 8A:
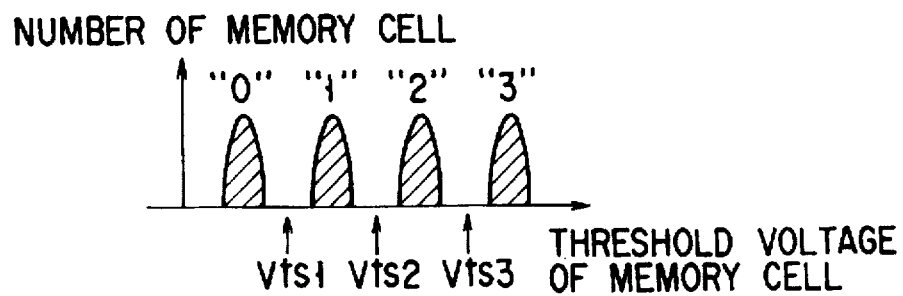
FIG. 8A is a diagram depicting another distribution of threshold voltages of the four-value cell.
Figure 8B:
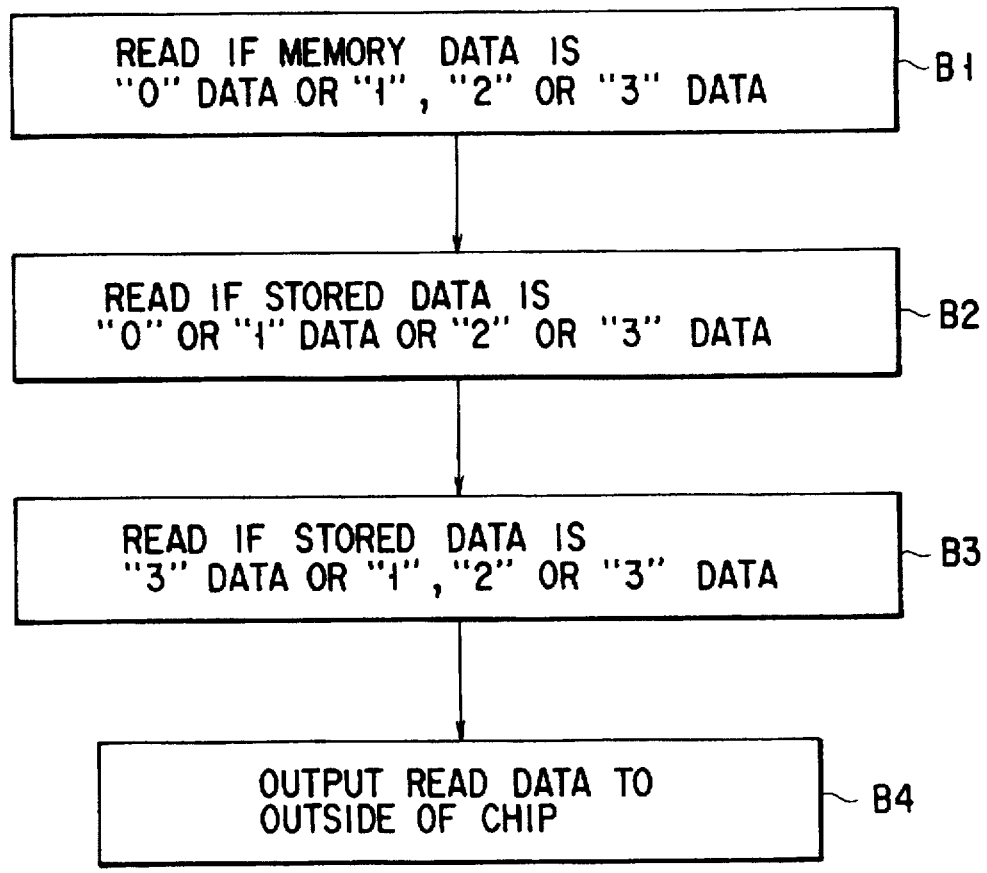
FIG. 8B is a flowchart for explaining another conventional data-reading method.

In this case, too, the number k may be 2 as shown in FIG. 27A, 1 as shown in FIG. 27B, or 3 as shown in FIG. 27C.

A multi-value data memory EEPROM according to the fifth embodiment of the invention will be described, with reference to FIGS. 28A to 28C.

Figure 28A:
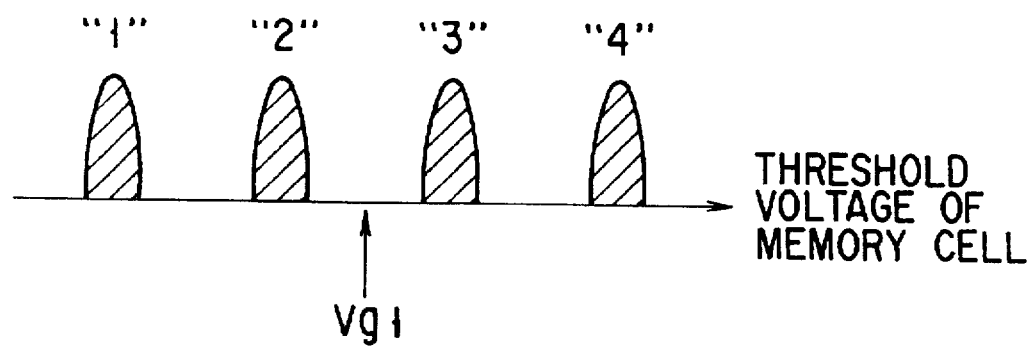
FIGS. 28A to 28C are diagrams showing the distribution of threshold voltages of each memory cell provided in a multi-value data memory EEPROM which is a fifth embodiment of this invention.
Figure 28B:
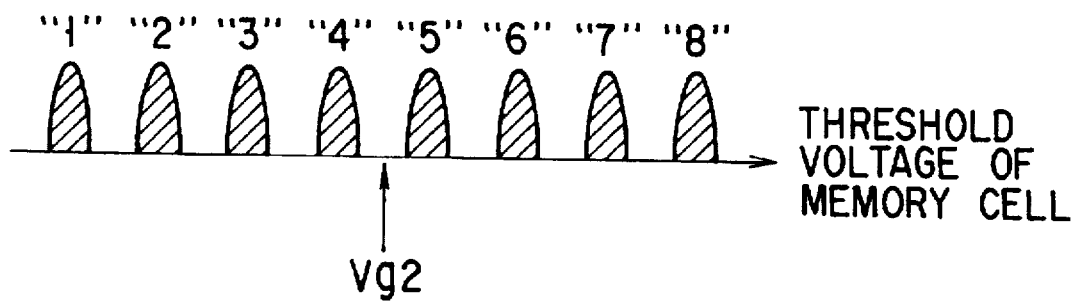
Figure 28C:
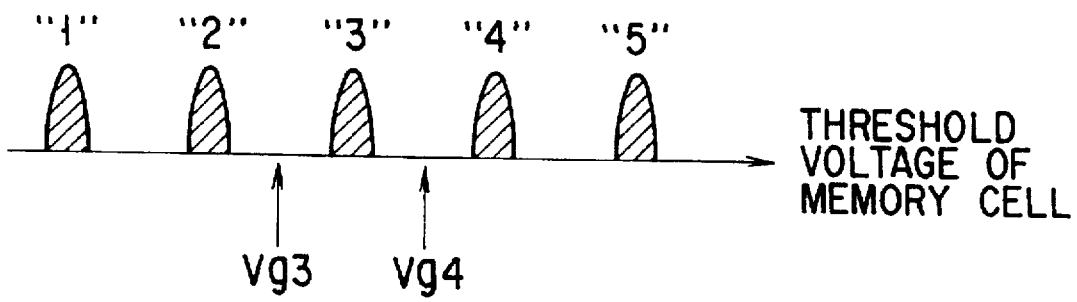

FIGS. 28A to 28C illustrate the distribution of threshold voltages which each memory cell provided in the EEPROM has to store multi-value data item.

This multi-value data memory EEPROM according to fifth embodiment comprises a memory cell array and a plurality of data circuits. The memory cell array has memory cells arranged in rows and columns. Each memory cell can store an n-value data item which can be electrically rewritten, where n is a natural number equal to or greater than 3. Each data circuit comprises m latch circuits for holding the n-value data item read from a memory cell selected.

Each memory cell can store a 2n-value data item which can be electrically rewritten, where n is a natural number equal to or greater than 1. The memory cell stores "1" when its threshold voltage is in the first voltage region; it stores "2" when its threshold voltage is in the second voltage region; and so forth. Thus, the cell stores "2n" when its threshold voltage is in the 2n-th voltage region, or higher than the (2n−1)th voltage region.

To read data from the memory cell selected, it is determined whether the memory cell has a threshold voltage equal to or less than the value corresponding to data value "n," or equal to or greater than the value corresponding to data value "n+1." The data item held in the k latch circuits is output before the same data item is input to the remaining (m−k) latch circuits of the data circuit.

Assume that the memory cells of this EEPROM are four-value cells as is illustrated in FIG. 28A. Then, to read the data item from any memory cell it suffices to apply a voltage Vg1 intermediate between two voltages corresponding to data values "3" and "2" applied to the word line (control gate) to which the memory cell is connected. It is thereby determined whether the memory cell stores "1" or "2," or "3" or "4."

The memory cells of the EEPROM may be eight-value cells as shown in FIG. 28B. In this case, to read data from a memory cell selected, a voltage Vg2 intermediate between two voltages corresponding to data values "4" and "5" is applied to the word line (control gate) to which the memory cell is connected. It is thereby determined whether the memory cell stores one of the data values "1" to "4" or one of the data values "5", to "8."

Alternatively, the memory cells of the EEPROM may be (2n+1)-value cells. In this case, as shown in FIG. 28C, to read data from one memory cell for the first time, a voltage Vg3 or Vg4 is applied to the word line (control gate) to which the memory cell is connected. It is thereby determined whether the memory cell stores an n-value data item or an (n+1)-value data item.

In the fifth embodiment, the m latch circuits of each data circuit hold a data item read from the memory cell before the data item is output from the memory chip, and hold a data item supplied from an external device before the data item is written into the memory cell.

A multi-value data memory EEPROM according to the sixth embodiment of this invention will be described, with reference to FIG. 29.

The EEPROM according to the sixth embodiment comprises a memory cell array and t number of data circuits. The memory cell array has memory cells arranged in rows and columns. Each memory cell can store an n-value data item, where n is a natural number greater than 3. Each of the data circuits comprises m latch circuits, where m is a natural number greater than 2. The latch circuits are provided to hold the n-value data item read from a memory cell selected.

The first t data items at the start address are loaded into the first latch circuits of the data circuits, respectively; the next t data items at the next address are into the second latch circuits of the data circuits, respectively; and so forth. Finally, the t data items at the (1×t+1)th address are loaded into the (i+1)th latch circuits of the data circuits, respectively. Here, 1≦i≦m−1, and i is a natural number.

In each data circuit, the m latch circuits hold the data supplied from an external device before the data is written into the memory cell, and also hold the data read from the memory cell before the data is output from the memory chip. The sixth embodiment may be combined with the fourth embodiment.

That is, to write data into the memory cells, the first t data items at the start address are loaded into the first latch circuits of the data circuits, the next t data items at the next address are loaded into the second latch circuits of the data circuits, and so forth. Finally, the t data items at the (i×t+1)th address are loaded into the (i+1)th latch circuits of the data circuits. To read data from the EEPROM, in each data circuit the data item read from the memory cell is input to the k number of latch circuits as illustrated in FIGS. 27A to 27C. The data item held in these latch circuits is output from the memory chip before the same data item read from the memory cell held in the remaining (m−k) latch circuits.

The data may be read from the EEPROM in another way. Namely, in each data circuit, the data item read from the memory cell and held in the k number of latch circuits is output from the memory chip before the same data item is input to the remaining m−k latch circuits, and the data item held in the d latch circuits among the (m−k) latch circuits is then output from the memory chip before the same data item is input to the still remaining (m−k−d) latch circuits.

A multi-value data memory EEPROM according to the seventh embodiment of this invention will be described, with reference to FIG. 30. The EEPROM according to the seventh embodiment is identical in structure with the sixth embodiment.

Figure 30:
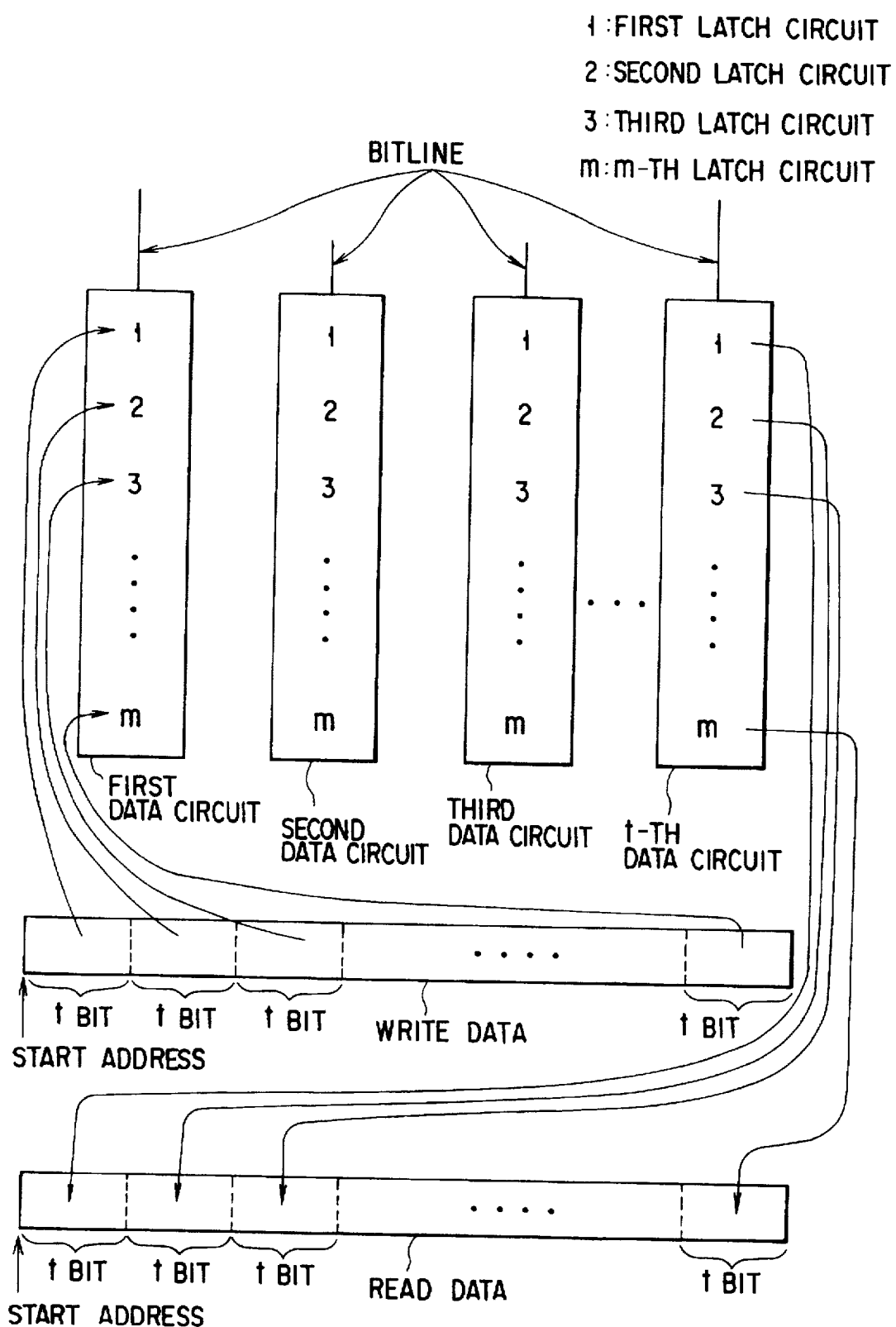
FIG. 30 is a diagram for explaining how data is written into and read from a multi-value data memory EEPROM according to a seventh embodiment of this invention.

As seen from FIG. 30, to write data into the memory cells, the first t data items at the start address are loaded into the first latch circuits of the data circuits, respectively; the next t data items at the next address are into the second latch circuits of the data circuits, respectively; and so forth. Finally, the t data items at the (i×t+1)th address are loaded into the (i+1)th latch circuits of the data circuits, respectively. Here, $1 \leq i \leq m-1$, and i is a natural number.

Data is read from the EEPROM in the following manner. In each data circuit, the data item held in the first latch circuit is output from the memory chip before the same data item is held in the other m−1 latch circuits. Then, the data item held in the second latch circuit is output from the memory chip before the same data item is held in the remaining m−2 latch circuits. Further, the data item held in the j-th latch circuit ($1 \leq j \leq m$, j being a natural number) is output from the memory chip before the same data item is held in the remaining m−j latch circuits.

A multi-value data memory EEPROM according to the eighth embodiment of the invention will be described, with reference to FIG. 31. The EEPROM according to the eighth embodiment is identical in structure with the sixth embodiment.

Figure 31:
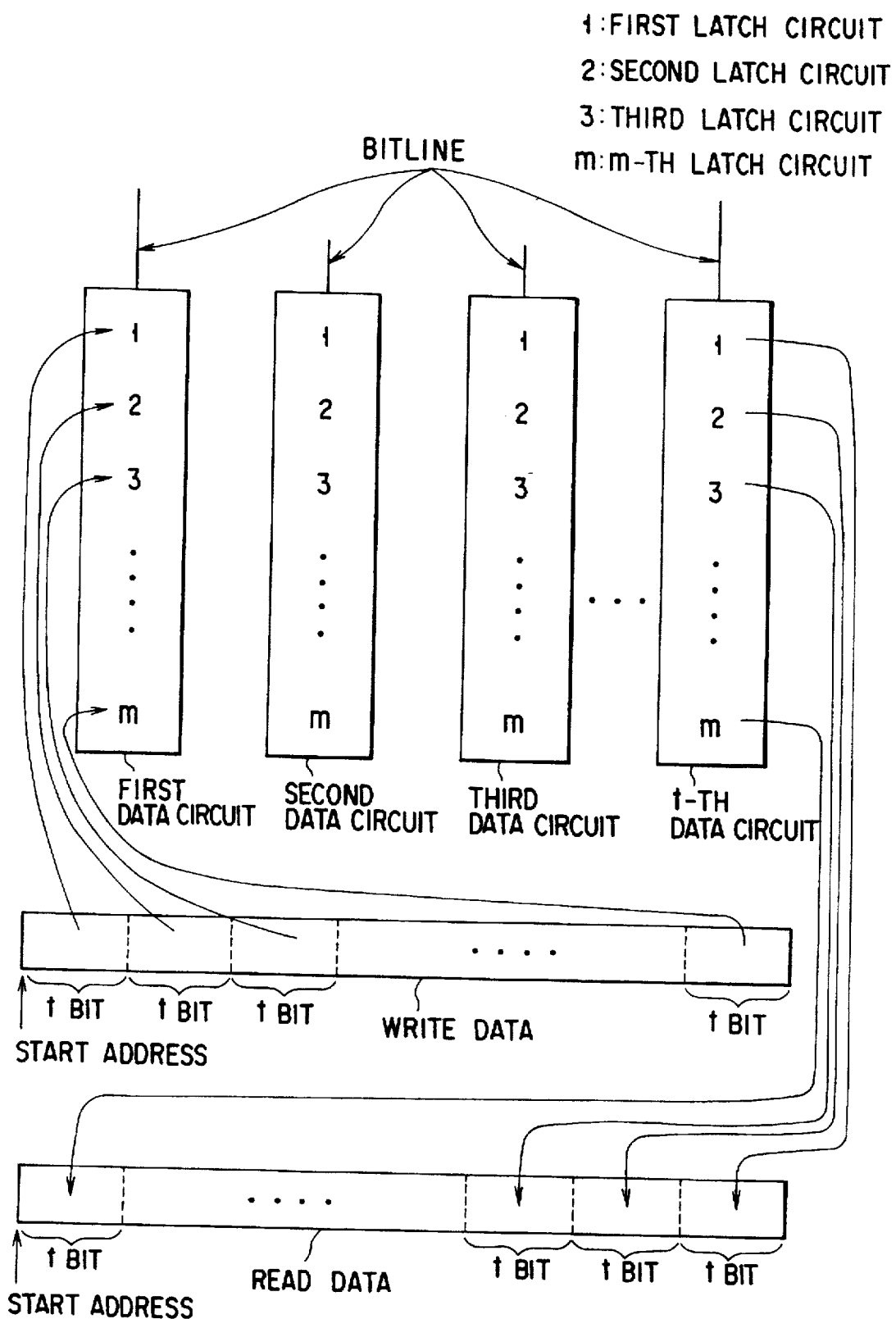
FIG. 31 is a diagram for explaining how data is written into and read from a multi-value data memory EEPROM according to an eighth embodiment of the present invention.

As seen from FIG. 31, to write data into the memory cells, the first t data items at the start address are loaded into the first latch circuits of the data circuits, respectively; the next t data items at the next address are into the second latch circuits of the data circuits, respectively; and so forth. Finally, the t data items at the (i×t+1)th address are loaded into the (i+1)th latch circuits of the data circuits, respectively. Here, $1 \leq i \leq m-1$, and i is a natural number.

Data is read from the EEPROM according to the eighth embodiment, in the following manner. In each data circuit, the data item held in the m-th (last) latch circuit is output from the memory chip before the same data item is held in the remaining m−1 latch circuits. Then, the data item held in the (m−1)th latch circuit is output from the memory chip before the same data item is held in the remaining (m−2) latch circuits. Further, the data item held in the p-th latch circuit ($1 \leq p \leq m$, p being a natural number) is output from the memory chip before the same data item is held in the remaining (m−p) latch circuits.

A multi-value data memory EEPROM according to the ninth embodiment of the invention will be described, with reference to FIG. 32. The EEPROM according to the eighth embodiment is identical in structure with the sixth embodiment.

Figure 32:
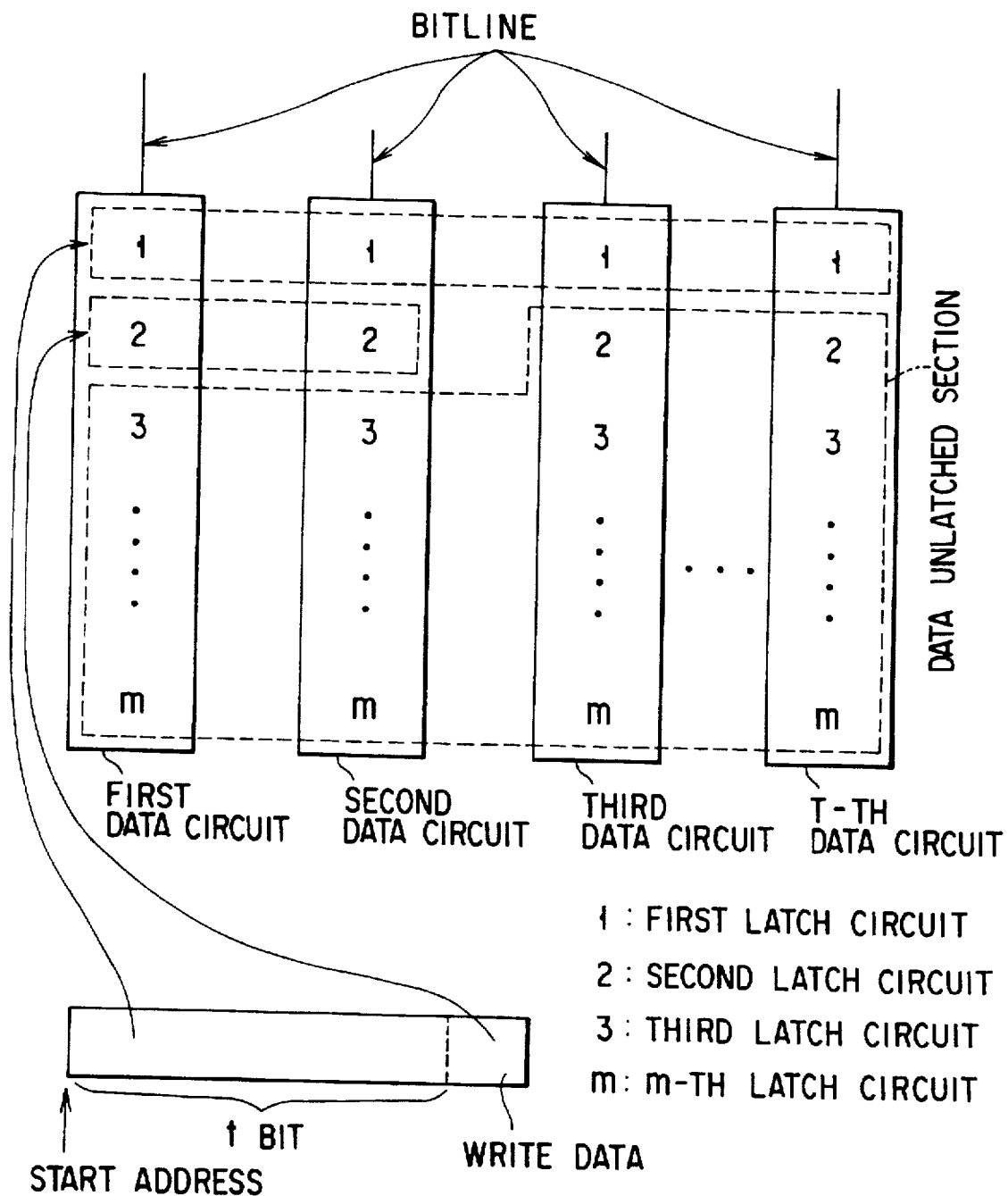
FIG. 32 is a diagram for explaining how data is written into and read from a multi-value data memory EEPROM according to a ninth embodiment of the invention.

As illustrated in FIG. 32, to write data into the memory cells, the first t data items at the start address are loaded into the first latch circuits of the data circuits, respectively; the next t data items at the next address are into the second latch circuits of the data circuits, respectively; and so forth. Finally, the t data items at the (i×t+1)th address are loaded into the (i+1)th latch circuits of the data circuits, respectively. Here, $1 \leq i \leq m-1$, and i is a natural number.

The data to be written into the EEPROM may contains less bits than the number of all latch circuits provided in the EEPROM. If this is the case, of the latch circuits of each data circuit, f latch circuit hold no data items as shown in FIG. 32. The f latch circuits constitute an unlatched section. The data input to the EEPROM from an external device may consist of less bits than the number of all latch circuits provided in the EEPROM. In this case, f latch circuits among those provided in each data circuit hold no data items supplied from the external device. The f latch circuits constitute a unlatched section as shown in FIG. 32. Since the unlatched section provided, data can be programmed in the EEPROM within a shorter time than otherwise. To be more specific, some of the latch circuits used in the data circuits hold no data items if the data input to the EEPROM is less than can be held in the data circuits and if the memory cells can store "0", "1", "3" and "4" each. In so, the other latch circuits may latch either "0" i or "1" or may latch "0", "1" or "2".

The EEPROMs according to the fourth to ninth embodiments can have a high read speed, for the same reason described in conjunction with the first to the third embodiments.

The first to ninth embodiments described above may be used in various combinations.

The first to ninth embodiment may be modified in various ways, as will be explained below.

FIG. 33 illustrates an EEPROM which has a modified column arrangement. This EEPROM is characterized in that each data circuit is provided for two bit-line sets each containing a plurality of bit lines, whereas each data circuit is provided for two bit lines in the first to fourth embodiments.

More specifically, as shown in FIG. 33, each of the data circuits 6-0 to 6-m is provided for bit four lines BLai-1 to BLai-4 and four more bit lines BLbi-1 to BLbi-4.

Of the two memory cell arrays 1A and 1B the EEPROM has, the first memory cell array 1A will be described.

As shown in FIG. 33, a transfer gate circuit 7*A is provided near the data circuits 6-0 to 6-m, and a transfer gate circuit 7**A is located near non-selected bit-line control circuits 20-0A to 20-mA.

To select one of the four bit lines BLai-1 to Blai-4, for example, the bit line BLai-1, signal BLC1, which is one of signals BLC1 to BLC4 for driving the transfer gate circuit 7*A, is programmed to "H" level, while the signals BLC2 to BLC4 are set at "L" level.

At the same time, to select the bit line BLai-1, signal BLC1D, which is one of signals BLC1D to BLC4D for driving the transfer gate circuit 7*B, is programmed to "H" level, while the signals BLC2D to BLC4D are set at "L" level. The bit line BLai-1 is thereby selected and connected to the data circuits 6-0 to 6-m.

The bit-lines BLai2 to BLai-4, not selected, are connected to the non-selected bit-line control circuits 20-0A to 20-mA. The circuit 20-0A is designed to control the potentials of the bit lines BLai-2 to Blai-4.

The memory cells of the memory cell arrays 1A and 1B are not limited to NAND cells. Rather, they may be NOR cells, ground-array cells, alternate ground-array cells, DINOR cells, or AND cells, which will be described below.

FIG. 34 shows a memory cell array 1 comprising NOR cells MC. Each NOR cell MC is connected to a bit line BL by a select gate.

FIG. 35 illustrates a memory cell array 1 comprising NOR cells MC of another type. Each NOR cell MC is connected directly to a bit line BL.

Figure 36:
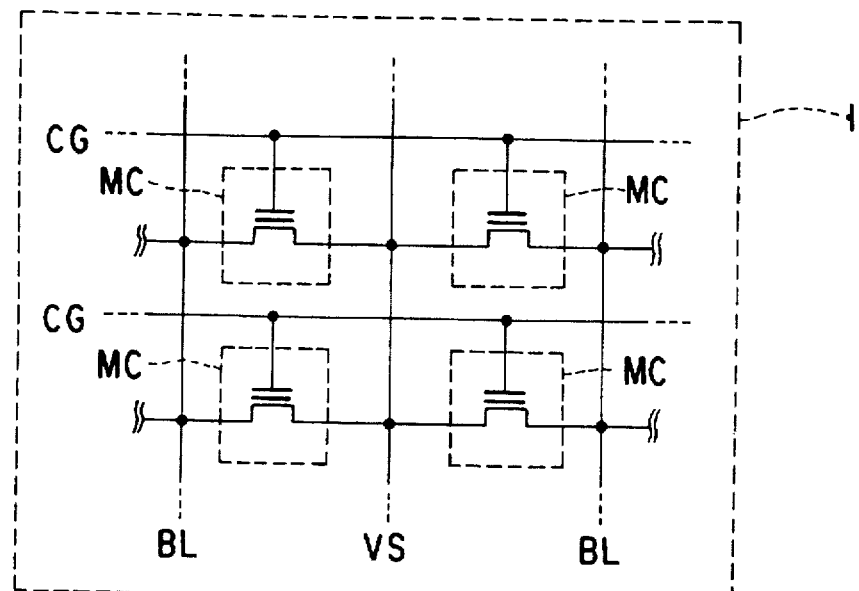
FIG. 36 is a diagram showing a memory cell array comprising ground-array cells MC.

FIG. 36 shows a memory cell array 1 comprising ground-array cells MC. Each ground-array cell MC is located between a bit line BL and a source line VS which extend parallel to each other.

Figure 37:
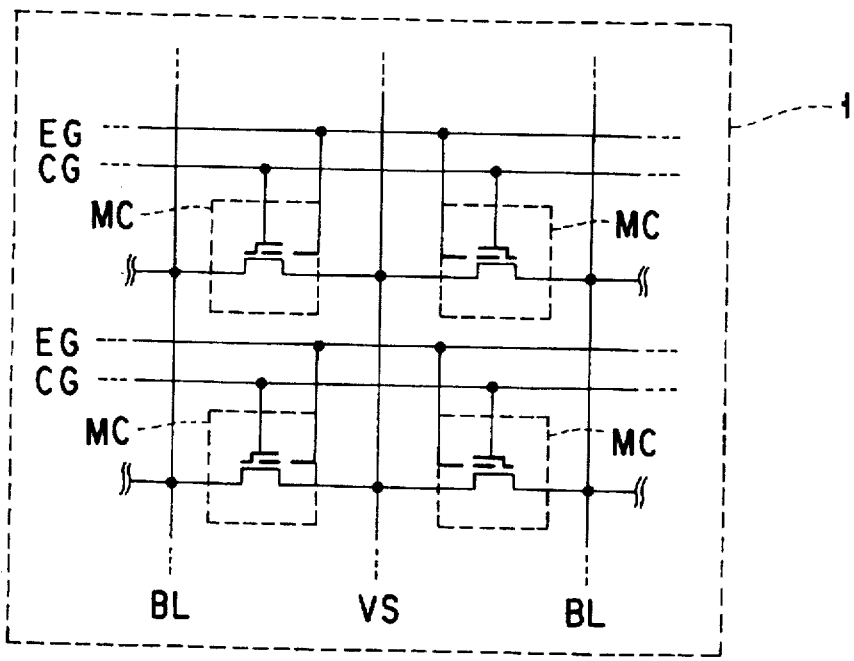
FIG. 37 is a circuit diagram depicting a memory cell array comprising ground-array cells MC of another type.

FIG. 37 shows a memory cell array 1 comprising ground-array cells MC of another type. Each ground-array cell MC has an erasing gate EG which is used to erase data in the ground-array cell MC. The cell MC is a so-called "split channel type" in which a part of the control gate CG overlaps the channel of the memory-cell transistor.

FIG. 38 depicts a memory cell array 1 comprising alternate ground-array cells MC. Each cell MC is located between a bit line BL and a source line VS which extend parallel to each other, like the ground-array cell shown in FIG. 36. It is different in that it can be alternately connected to the bit lien BL and the source line VS.

FIG. 39 depicts a memory cell array 1 comprising alternate ground-array cells MC of another type. Each cell MC is similar in structure to the ground-array cells shown in FIG. 37.

FIG. 40 shows a memory cell array 1 comprising DINOR (DIvider NOR) cells. Each DINOR cell MC contains, for example, four memory-cell transistors connected in parallel. The cell MC is connected to a bit line BL by a selecting transistor. Of the four memory-cell transistors, two are connected to a source line VS, and the remaining two are connected to another source line VS.

Figure 41:
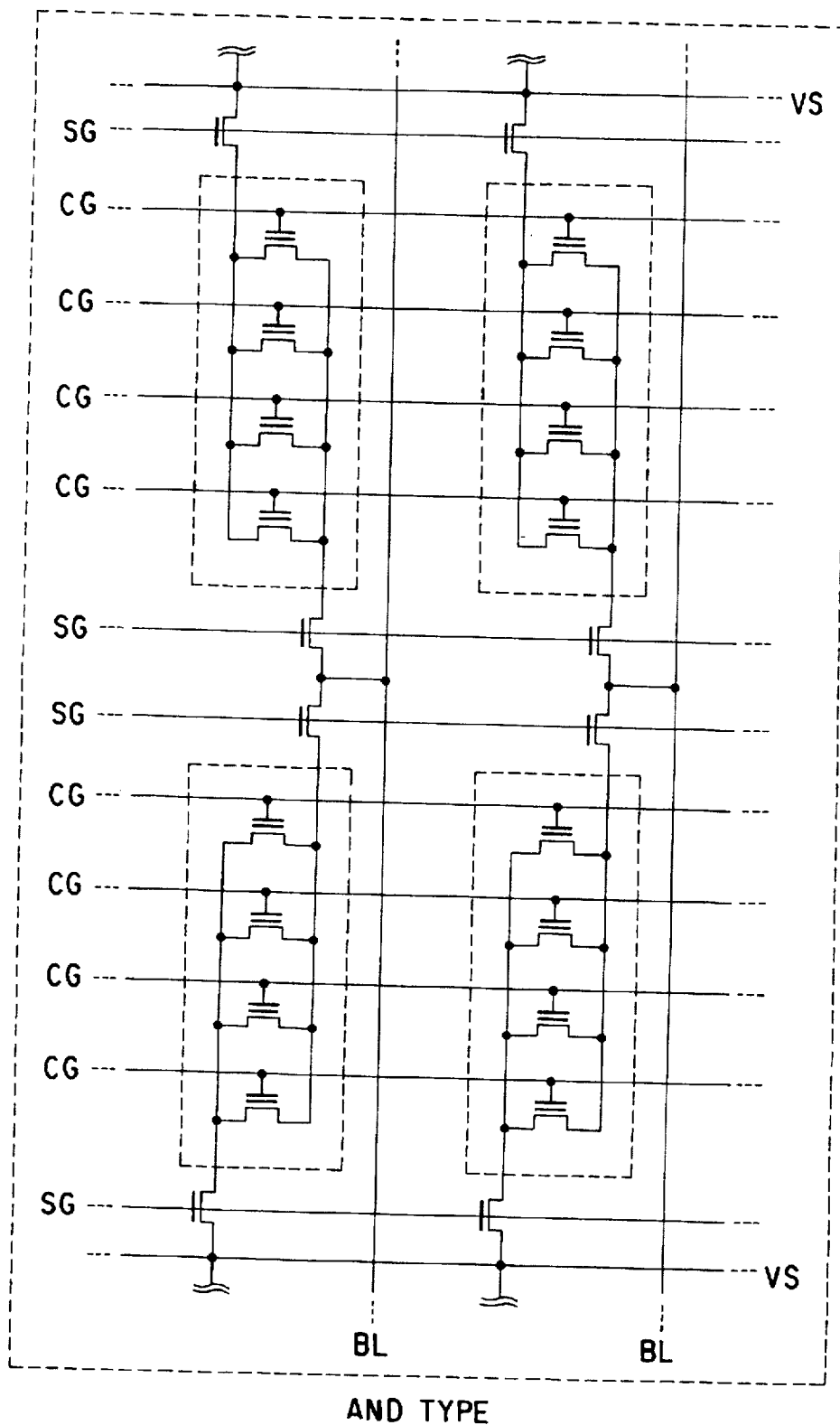
FIG. 41 is a circuit diagram showing a memory cell array comprising AND-type cells.

FIG. 41 shows a memory cell array 1 comprising AND cells. Each AND cell contains, for example, four memory-cell transistors connected in parallel. The AND cell is connected to a bit line by a selecting transistor and to a source line VS by another selecting transistor.

In the first to ninth embodiments, the data item read from a memory cell and held in any latch circuit of each data circuit can be output from the memory chip once its value is determined, even though the data items read from the memory cell and held in the other latch circuits have yet to be determined. In addition, while the data item is being output from the memory chip, the data items held in the other latch circuits can be checked for their respective values. As soon as the value of one of these data items is determined, the data item is output from the memory chip. Needless to say, while this data item is being output, the data items still held in the other latch circuits can be checked for their values.

Since the data item held in any latch circuit can be output from the memory chip even if the values of the data items held in the other latch circuits have not determined yet. The first to ninth embodiments can therefore be nonvolatile semiconductor memories which has a high read speed, though they store multi-value data.

Figure 42:
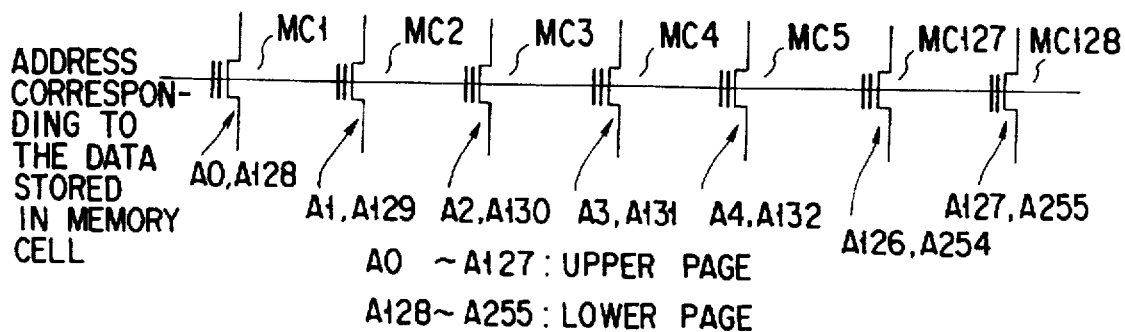
FIG. 42 is a diagram representing the relation the memory cells have with addresses in an EEPROM according to a tenth embodiment of the present invention.
Figure 43A:
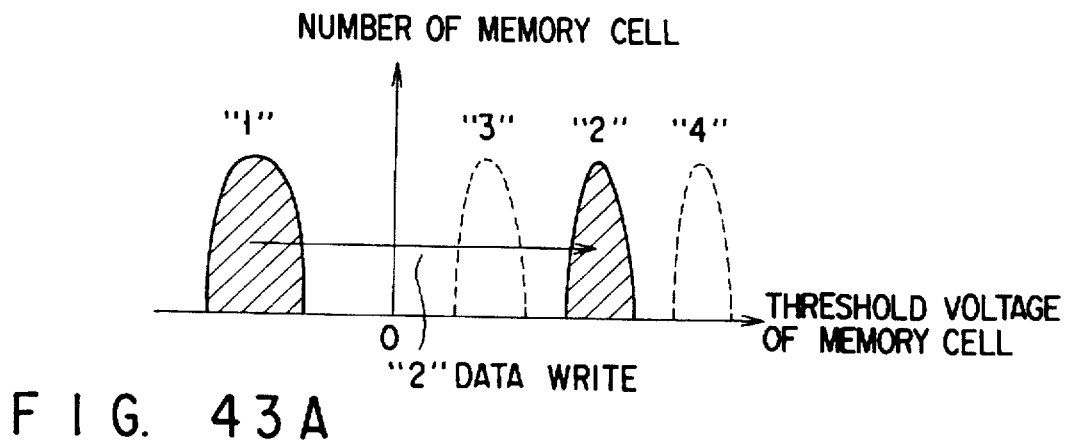
FIGS. 43A and 43B are diagrams for explaining how an upper page is programmed in the tenth embodiment.
Figure 43B:
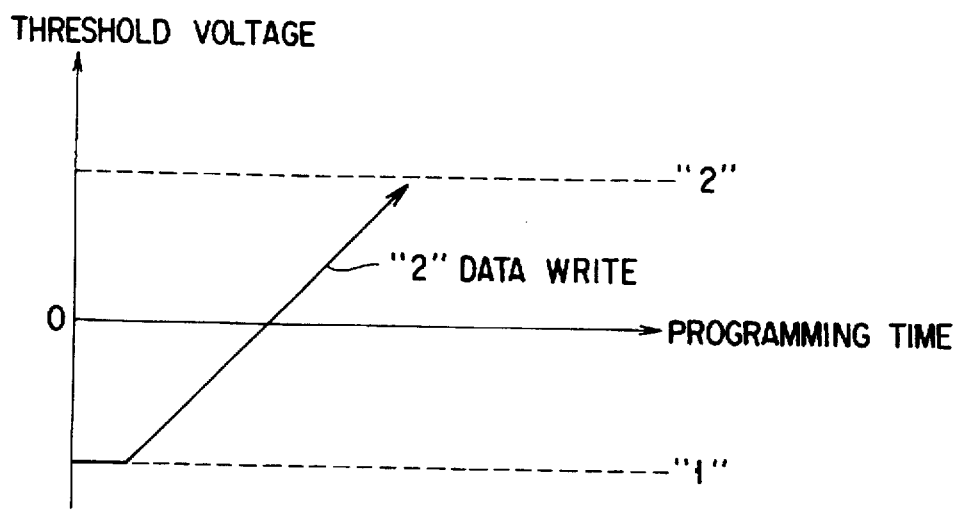

An EEPROM according to the tenth embodiment of the invention will be described, with reference to FIG. 42. FIG. 42 shows the memory cells connected to one word line. Of the data externally input to the EEPROM, the data item at the start address A0 is written into the memory cell MC1, the data item at the second address A1 into the memory cell MC2, the data item at the third address A2 into the memory cell MC3, and so forth. Thus, the data item at the address A127 is written into the memory cell MC128.

Programming of Upper Page

Figure 44A:
FIGS. 44A to 44C are diagrams for explaining how the memory cells are programmed in the tenth embodiment is programmed.
Figure 44B:
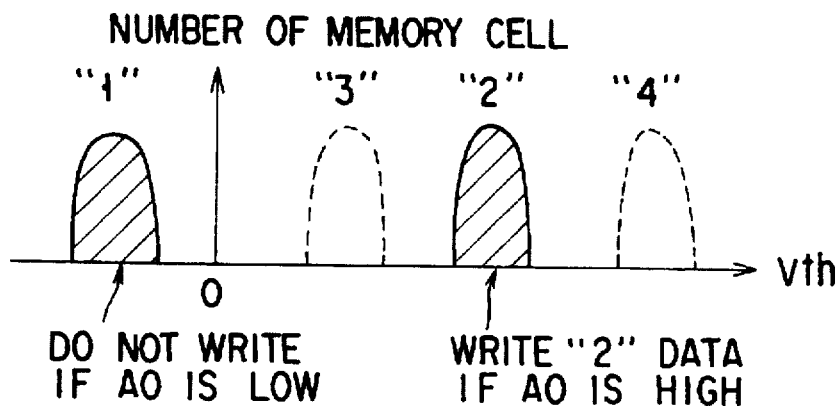

The addresses A0 to A127 constitute a first page (upper page). How the upper page is programmed will be explained, with reference to FIGS. 43A and 43B and FIGS. 44A to 44C. As long as the address A0 is at low level, the memory cell MC1 (FIG. 42) remains in erased state, storing "1." When the address A0 rises to high level, the memory cell MC1 stores "2" as shown in FIG. 44B. Data items are written into the other memory cells of the upper page (address A0 to A127), as fast as into binary memory cells.

Programming of Lower Page

The addresses A128 to A255 constitute a second page (lower page). How the upper page is programmed will be explained, with reference to FIG. 44B and FIGS. 45A and 45B. The data item at the address A128 is written into the memory cell MC1, the data item at the address A129 into the memory cell MC2, the data item at the address A130 into the memory cell MC3, and so forth. Thus, the data item at the lass address A255 is written into the last memory cell MC128. Before the lower page is programmed in the memory cells MC1 to MC128, the upper page remains programmed in the memory cells MC1 to MC128, and each memory cell stores either "1" or "2," as illustrated in FIG. 44B. As long as the address A128 remains at low level, the lower page cannot be written into the memory cells MC1 to MC128, and each memory cell keep storing either "1" or "2."

Figure 44C:
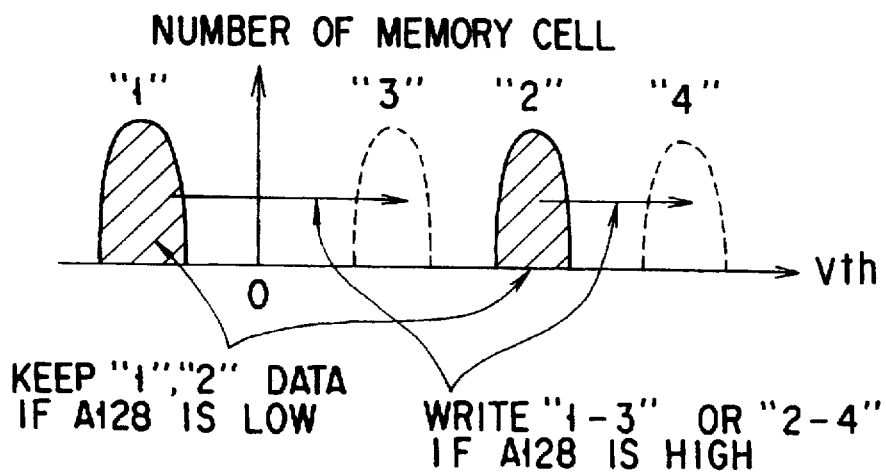
Figure 45A:
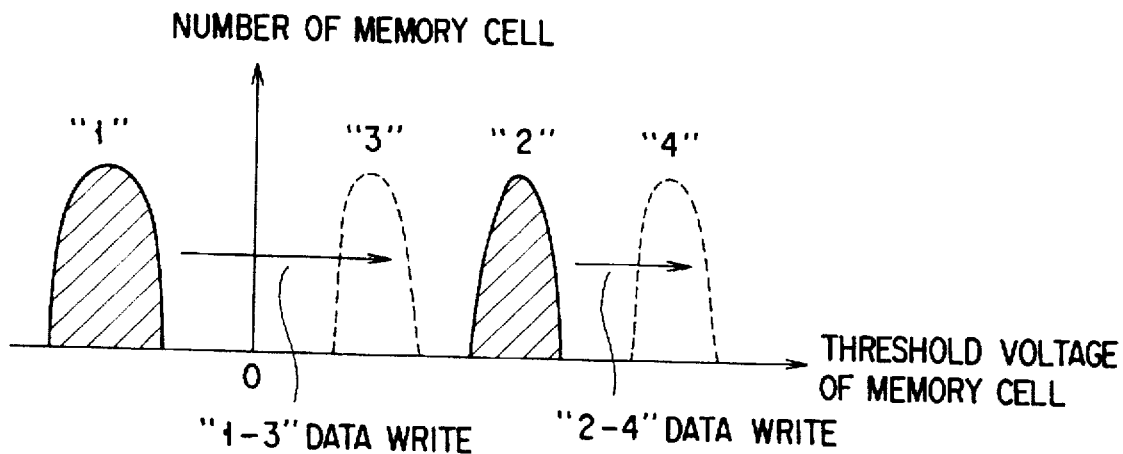
FIGS. 45A and 45B are diagrams for explaining how a lower page is programmed in the tenth embodiment.
Figure 45B:
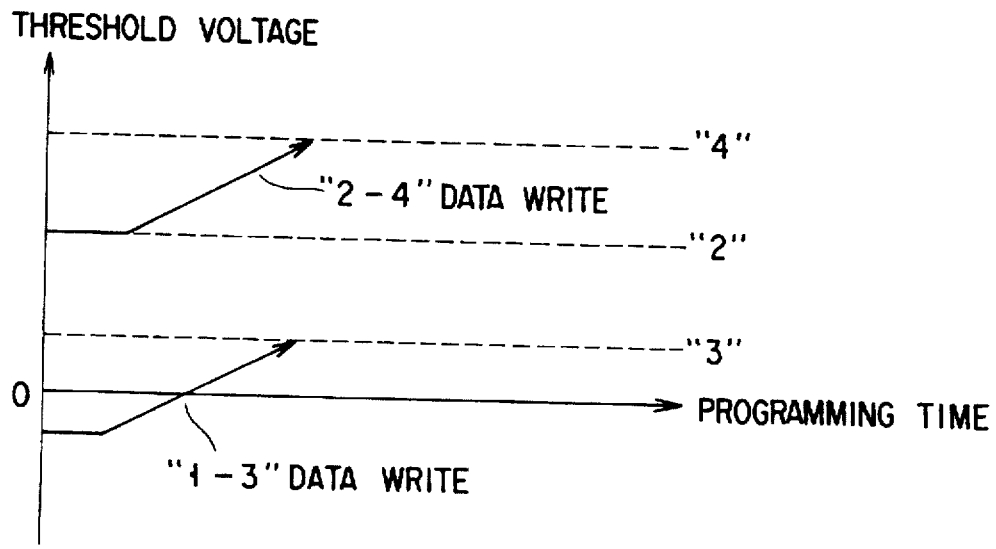

When the address A128 rises to high level, the lower page is programmed as shown in FIG. 44C and FIGS. 45A and 45B. That is, "3" is written into any memory cell which stored "1" previously, and "4" is written into any memory cell which stored "2" previously. Data can be written into the memory cells at high speed in this method because the threshold voltage of each memory cell changes less than in the conventional method, as seen from FIGS. 45A and 45B.

Figure 46A:
FIGS. 46A to 46C are diagrams for explaining how data is read from the memory cells of the tenth embodiment.
Figure 46B:
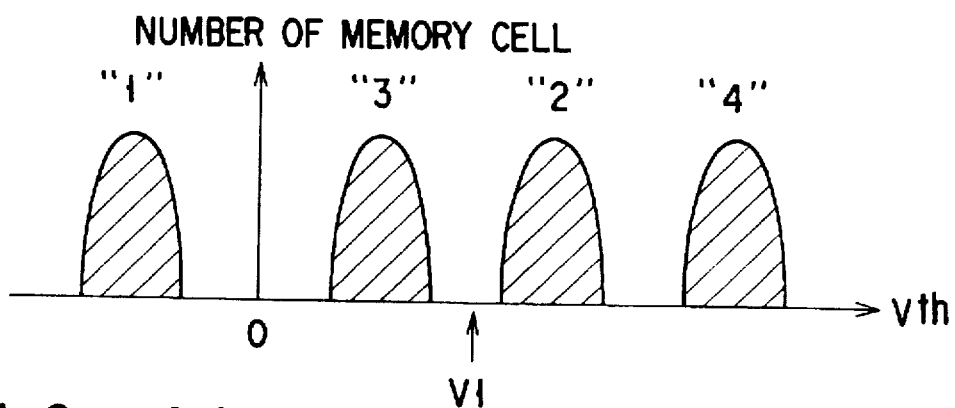
Figure 46C:
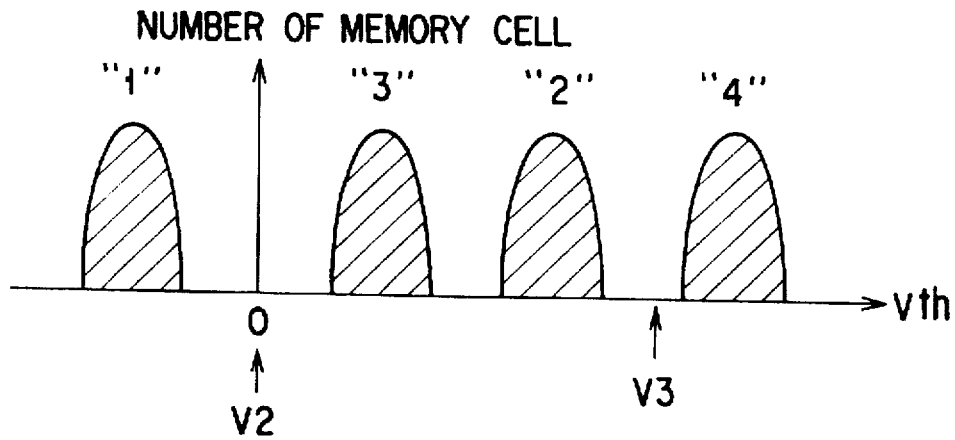
Figure 47A:
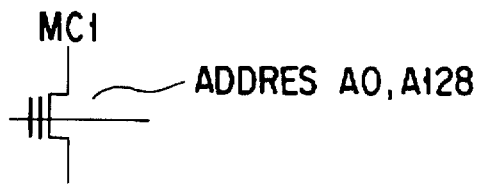
FIGS. 47A to 47C are diagrams explaining another method of reading data from the memory cells of the tenth embodiment.
Figure 47B:
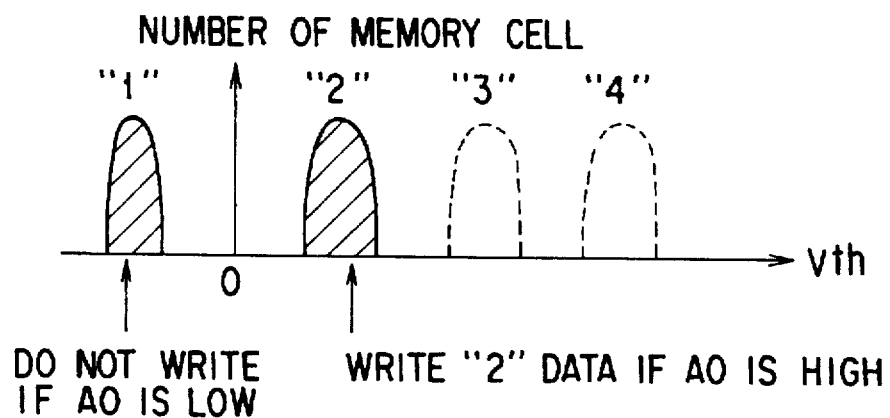
Figure 47C:
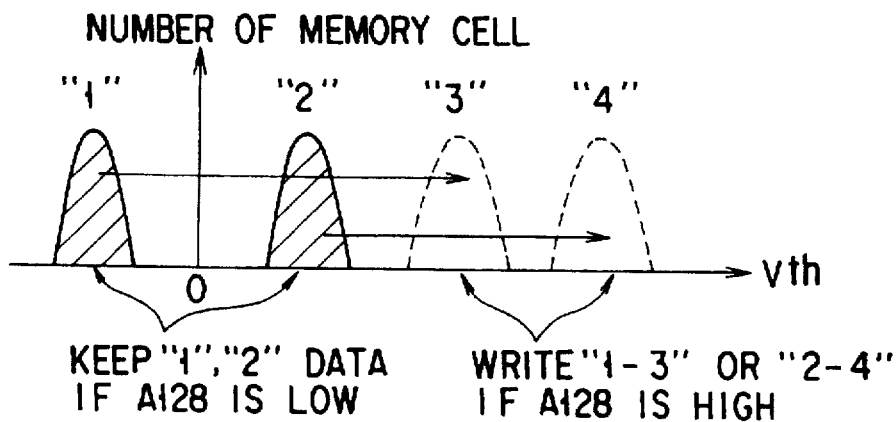

How pages are read from the EEPROM according to the tenth embodiment will be explained, with reference to FIGS. 46A to 46C.

Reading of Upper Page

To read the first page (upper page) from the EEPROM, a voltage (V1 shown in FIG. 46B) intermediate between two values corresponding to "3" and "2" is applied to the control gate of each memory cell. It is thereby determined whether each memory cell stores "1" or "3," or "2" or "4." If the memory-cell transistor is turned on, it is detected that the memory cell stores either "1" or "3." In this case, a low-level data item is output to an external device. On the other hand, if the memory-cell transistor remain off, it is detected that the memory cell stores either "2" or "4." As a result, a high-level data item, for example, is output to the external device.

Reading of Lower Page

To read the second page (lower page) from the EEPROM, a voltage (V1 shown in FIG. 46B) intermediate between two values corresponding to "3" and "2" is applied to the control gate of each memory cell. It is thereby determined whether each memory cell stores "1" or "2," or "3" or "4." If the memory-cell transistor is turned on, it is detected that the memory cell stores either "1" or "3." Then, a voltage (V2 shown in FIG. 46C) intermediate between two values corresponding to "1" and "3" is a applied to the control gate of the memory cell. It is thereby determined whether the memory cell stores "1" or not.

Further, a voltage (V3 shown in FIG. 46C) intermediate between two values corresponding to "2" and "4" is applied to the control gate of the memory cell. It is thereby determined whether the memory cell stores "4" or not. As a result, it is known that the memory cell stores either "1" or "2", or either "3" or "4." If the memory cell stores "1" or "2," a low-level data item, for example, is output to the external device. If the memory cell stores "3" or "4," a high-level data item, for example, is output to the external device.

In the tenth embodiment, the threshold voltage corresponding to data "3" written in the second programming operation is lower than the threshold voltage corresponding to data "2" written in the first programming operation. This serves to increase the programming speed, because the second programming operation is effected in the same way as to write data into three-value cell, whereas the first programming operation is carried out in the same way as to write data into binary memory cells. The threshold voltages corresponding to data items to be written may be set in any other manner. For instance, they may be set as is illustrated in FIGS. 27A to 27C.

In the case shown in FIGS. 27A to 27C, the threshold voltages corresponding to "1," "2," "3," and "4" have the same relationship as in the conventional NAND cell which is shown in FIGS. 1A and 1B. That is, the threshold voltage corresponding to data "3" to be written in the second programming operation is higher than the threshold voltage corresponding to data "2" to be written in the first programming operation. In this case, however, the upper page pertains to data items "1" and "2" as in the case shown in FIGS. 44A to 44C. Hence, the data item input from the external device is written into the memory cell in the same way as shown in FIGS. 44A to 44C. To be more specific, the memory cell MC1 stores "1" if the address A0 is at low level, and stores "2" if the address A0 is at high level. Before the lower page is programmed, the memory cell MC1 stores "1" or "2" if the address A128 is at low level, and stores "3" or "4" if the address A128 is at high level.

As indicated above, the multi-value data to be written into one memory cell is divided into two or more pages. More specifically, four-value data to store into the cell is divided into two pages, each being a binary data item; eight-value data to store into the cell is divided into three pages, each being a binary data item; and 16-value data to store into the cell is divided into four pages, each being a binary data item. To state it generally, 2n-value data (where n is a natural number) to be written into one memory cell is divided into the first page, the second page, . . . . . the n-th page.

The semiconductor memory according to the tenth embodiment is designed to store data items which can have three or more different values. To program each memory cell, a multi-value data item into a plurality of pages, and these pages are sequentially written into the memory cell. Thus, the memory cells are programmed at high speed.

The tenth embodiment described above is an EEPROM. Nevertheless, the present invention is also advantageous when applied to a SRAM, DRAM, mask ROM, and the like.

The tenth embodiment will be described in greater detail.

FIG. 48 is a block diagram of the multi-value data memory EEPROM according to the tenth embodiment. As shown in FIG. 48, the EEPROM comprises a memory cell array 1, an address buffer 4, a data input/output buffer 5, data circuits 6, and a control gate/select gate driving circuit 21. The circuit 21 is designed to select any memory cell of the array 1 and to apply a write voltage or a read voltage to the control gate of any memory cell selected. The circuit 21 is connected to the address buffer 4 and receives address signals from the address buffer 4. The data circuits 6 is provided for holding data items to be written into memory cells selected and data items read therefrom. The data circuits 6 are connected to the input/output buffer 5 and receive address signals from the address buffer 4. The data input/output buffer 5 holds data which is to be written into the memory cell array 1 and data which is to be output from the memory chip to an external device.

How data is written into the memory cells and read therefrom will be explained, with reference to FIGS. 49 and 50.

As shown in FIGS. 49 and 50, the memory cell array 1 comprises memory-cell units, each having at least one memory cell. The memory-cell units are connected to the data circuits 6 by bit lines, respectively. The memory cells MC1, MC2, MC3, . . . , MC127 and MC128 shown in FIGS. 49 and 50 are those whose gate electrodes are connected to the same word line WL1.

Programming

How data is written into the memory cells will be explained with reference to FIG. 49.

First, the first page (upper page) corresponding to addresses $A_0$ to $A_{127}$ is programmed. More precisely, the first data circuit latches the data item at address $A_0$, the second data circuit latches the data item at address $A_1$, the third data circuit latches the data item at address $A_2$, and so forth. Thus, the 128th data circuit latches the data item at address $A_{127}$. The upper page is then programmed in the memory cells MC1 to MC128 which are connected to the word line WL1, in accordance with the data items latched in the data circuits 6.

Next, the second page (lower page) corresponding to addresses $B_0$ to $B_{127}$ is programmed. That is, the first data circuit latches the data item at address $B_0$, the second data circuit latches the data item at address $B_1$, the third data circuit latches the data item at address $B_2$, and so forth. Thus, the 128th data circuit latches the data item at address $B_{127}$. While the data items at addresses $B_0$ to $B_{127}$ are being latched into the first to 127th data circuits 6, respectively, the data items are read from the memory cells MC1 to MC128 and held in the first to 127th data circuits 6. Then, the lower page is programmed in the memory cells MC1 to MC128 which are connected to the word line WL1, in accordance with the data items defining the upper page and latched in the data circuits 6 and the data items defining the lower page.

Data-Reading

How data is read from the memory cells will be explained with reference to FIG. 50.

At first, the first page (upper page) corresponding to addresses $A_0$ to $A_{127}$ is read from the memory cells. To be more specific, the data item at address $A_0$ is read from the memory cell MC1 and latched in the first data circuit, the data item at address $A_1$ is read from the memory cell MC2 and latched in the second data circuit, and the data item at address $A_2$ is read from the memory cell MC3 and latched in the third data circuit, and so forth. The data item at the address $A_{127}$ is read from the memory cell MC128 and latched in the 128th data circuit. Thus, the upper page is read from the memory cells MC1 to MC128 connected to the same word line WL1, into the first to 128th data circuits 6.

Next, the second page (lower page) corresponding to addresses $B_0$ to $B_{127}$ is read from the memory cells. More precisely, the data item at address $B_0$ is read from the memory cell MC1 and latched in the first data circuit, the data item at address $B_1$ is read from the memory cell MC2 and latched in the second data circuit, and the data item at address $B_2$ is read from the memory cell MC3 and latched in the third data circuit, and so forth. The data item at the address $B_{127}$ is read from the memory cell MC128 and latched in the 128th data circuit. Thus, the lower page is read from the memory cells MC1 to MC128 connected to the same word line WL1, into the first to 128th data circuits 6.

As described above, each memory-cell unit has at least one memory cell. It further comprises no select MOS transistor or at least one select MOS transistor. Various types of memory-cell units will be described, with reference to FIGS. 51A to 51D.

FIG. 51A shows a memory-cell unit for use in a NAND-type EEPROM or a NAND-type mask ROM. FIG. 51B illustrates a memory-cell unit which differs from the memory-cell unit of FIG. 51A in terms of the threshold voltages of the select MOS transistors (i.e., E-type and I-type transistors). FIG. 51C shows a memory-cell unit for use in a NAND-type nonvolatile memory, which has three select MOS transistors. FIG. 51D shows a memory-cell unit for use in a NAND-type nonvolatile memory, which has four select MOS transistors. (In the memory-cell unit of FIG. 51D, the E-type select MOS transistors have a positive threshold voltage, and the D-type select MOS transistors have a negative threshold voltage.) The NAND cells shown in FIGS. 51A to 51D are identical in structure to the NAND cell illustrated in FIGS. 1A, 1B and 2. Memory-cell units are arranged in the same way as shown in FIG. 3, no matter whichever type they are.

Figure 52A:
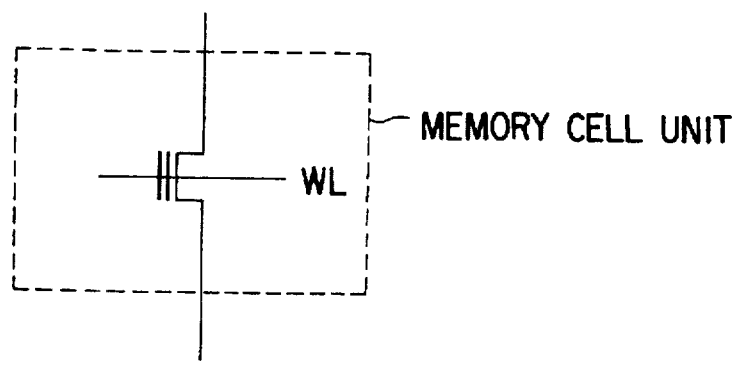
Figure 52B:
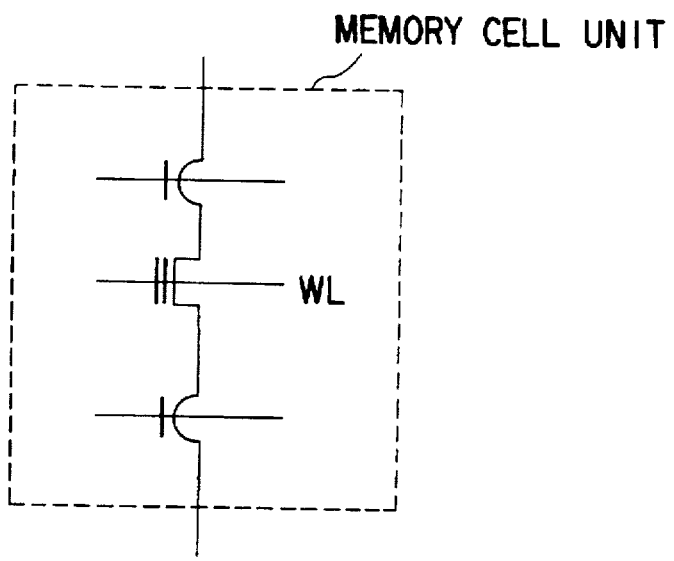
Figure 52C:
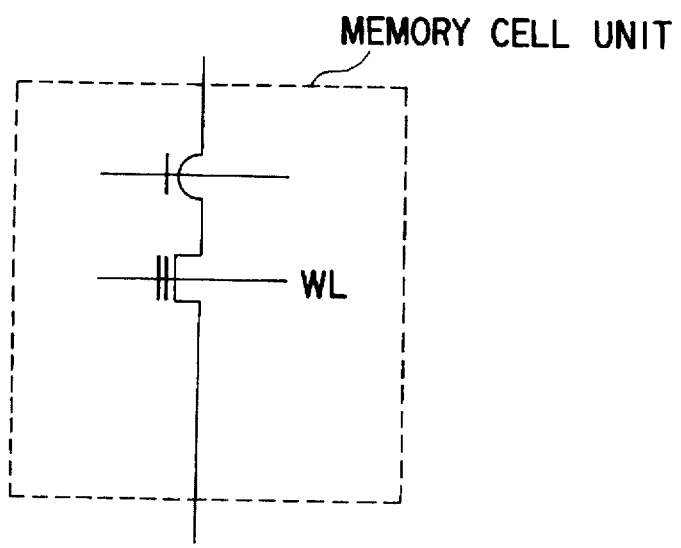
Figure 52G:
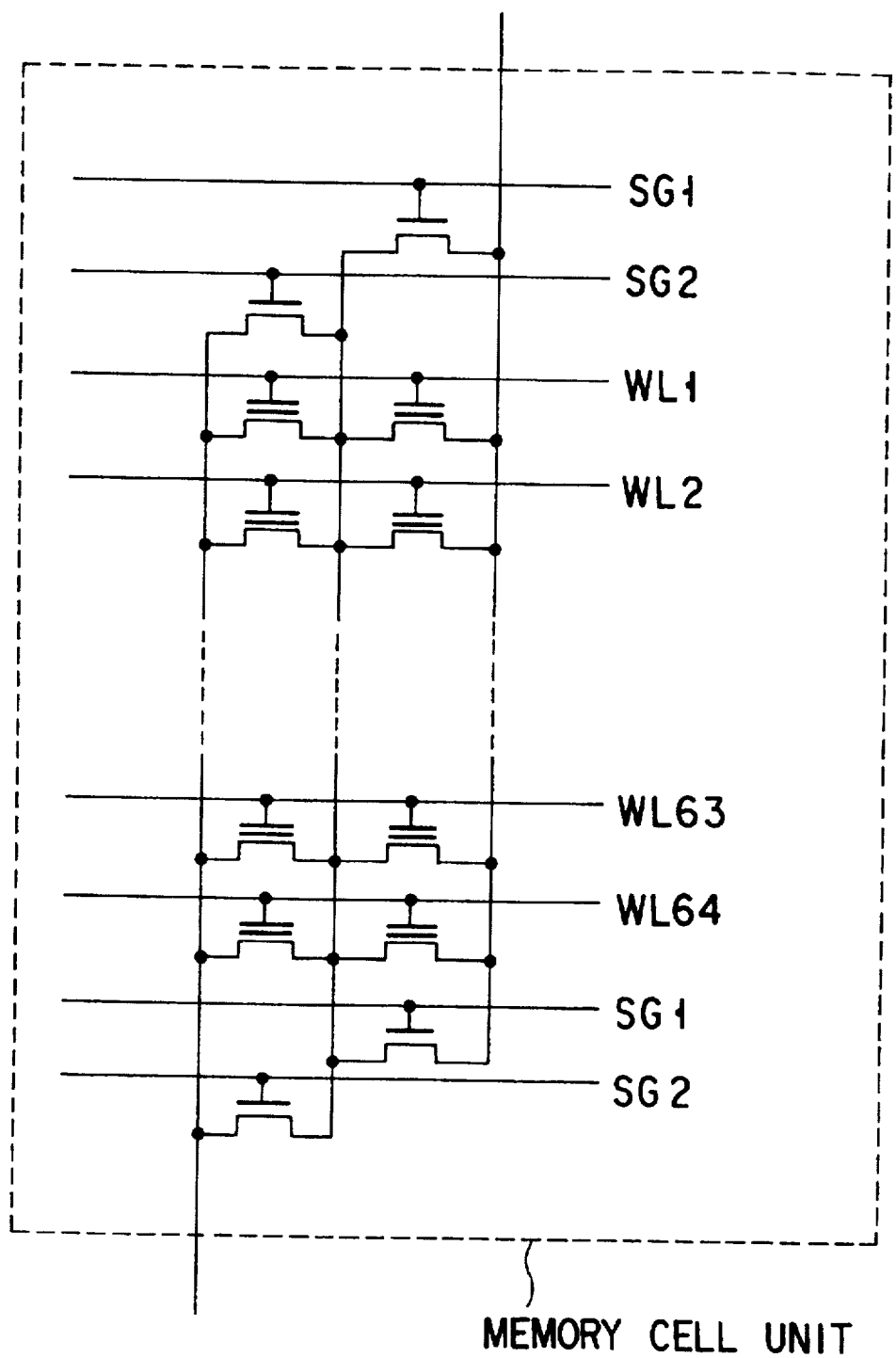

FIGS. 52A to 52G show other various types of memory-cell units. The memory-cell unit of FIG. 52A is for use in a NOR-type EEPROM or NOR-type mask ROM. The memory-cell unit shown in FIG. 52B is identical to the unit shown in FIG. 52A, except that it has two select MOS transistors. The memory-cell unit shown in FIG. 52C is identical to the unit shown in FIG. 52A, except that it has one select MOS transistor. The memory-cell unit of FIG. 52D comprises several memory cells which are connected in parallel and which have a common source and a common drain. The memory-cell unit of FIG. 52E is identical to the unit of FIG. 52D, except that it has one select MOS transistor. The memory-cell unit of FIG. 52F is identical to the unit of FIG. 52D, except that it has two select MOS transistor. The memory-cell unit shown in FIG. 52G comprises many memory cells connected in parallel and arranged in two columns.

A four-value data storing NAND-type flash memory, which is the eleventh embodiment of the invention, will be described, with reference to FIGS. 53 to 72. The flash memory, which is a multi-value data memory EEPROM, has the same structure as the tenth embodiment shown in FIG. 48.

FIG. 53 shows the memory cell array 1 and the data circuits 6-0 to 6-m of the eleventh embodiment. The array 1 has NAND cells. Each NAND cell comprises four memory cells M1 to M4 which are connected in series. Each NAND cell has one end connected to a bit line BL by a selector transistor S1 and the other end connected to a source line Vs by a selector transistor S2. The memory cells which are connected to four control gates CG1 to CG4 constitute a block or a page. The block is selected by the control gate/select gate driving circuit 21. The data circuits 6-0 to 6-m are connected to bit lines BL0A to BLmA, respectively, to temporarily store data items which are to be written into the memory cells. The structure of FIG. 53 is an open-bit arrangement, in which bit lines BL0B to BLmB are also connected to the data circuits 6-0 to 6-m.

The memory cells M1 to M4 may be four-value cells. If so, each memory cell M can have four threshold voltages shown in FIG. 54. The four threshold voltages correspond to four data items "1," "2," "3" and "4," respectively. Each memory cell stores a data item "1," or assumes erased state, when it has a negative threshold voltage. It stores a data item "2" when it has a threshold voltage of, for example, 0.5V to 0.8V, stores a data item "3" when it has a threshold voltage of, for example, 1.5V to 1.8V, and a data item "4" when it has a threshold voltage of, for example, 2.5V to 2.8V.

A read voltage VCG3R of 1V is applied to the control gate CG of the memory cell M. If the cell M is turned on, it is detected that the memory cell M stores either "1" or "2." If the cell M is turned off, it is detected that the cell M stores either "3" or "4." Then, two other read voltages VCG2R and CG4R, which are 0V and 2V, are sequentially applied to the control gate CG. It is thereby determined which data item the cell M stores, "1," "2," "3," or "4." The voltages VCG2V, VCG3V and VCG4V are sequentially applied to the control gate CG to determine whether or not the memory cell M has been sufficiently programmed. These voltages VCG2V, VCG3V and VCG4V are generally known as "verify voltages." They are, for example, 0.5V, 1.5V, and 2.5V, respectively.

The data circuits 6-0 to 6-m are identical in structure. As shown in FIG. 55, each data circuit comprises two latch circuits. A 2-bit write data item is stored in the two latch circuits before it is written into the memory cell. Also, the four-value data item read from the memory cell is stored in the two latch circuits before it is output from the memory chip through a data input/output line IO1.

In the eleventh embodiment, one page is constituted by 256 memory cells. In other words, 256 memory cells are simultaneously selected by using one control gate and one select gate. How a two-page data, i.e., 512 bits, is programmed in the eleventh embodiment and how it is read therefrom will be explained. The 512-bit data contains an upper page and a lower page. The upper page corresponds to column address $A_0, A_1, A_2, \ldots, A_{254}$ and $A_{255}$, whereas the lower page corresponds to column address $B_0, B_1, B_2, \ldots, B_{254}, B_{255}$ Programming of Upper Page ($A_0$–$A_{255}$)

First, the write data item at the start address $A_0$ is input to the first latch circuit RT1-0 of the data circuit 6-0 and held in the circuit RT1-0. Then, the write data items at the addresses $A_1, A_2, \ldots, A_{254}$ and $A_{255}$ are input and held in the first circuits RT1-1, RT1-2, . . . , RT1-254 and RT1-255, respectively. Thereafter, 256 memory cells are programmed according to the 1-bit data items held in the first latch circuits RT1-0 to RT1-255 of the data circuits 6-0 to 6-255. Hence, each memory cell stores either "1" or "2," whereby the upper page is programmed. The upper page programmed may contains less than 256 bits. This means that no data item has been held in at least the first latch circuit of at least one data circuit. In this case, it suffices to set a data item in the first latch circuit so that the corresponding memory cell may have a low threshold voltage which corresponds to a data item "1."

Programming of Lower Page ($B_0$–$B_{255}$)

First, the write data item at the start address $B_0$ is input to the first latch circuit RT1-0 of the data circuit 6-0 and held in the circuit RT1-0. Then, the write data items at the addresses $B_1, B_2, \ldots, B_{254}$ and $B_{255}$ are input and held in the first circuits RT1-1, RT1-2, . . . , RT1-254 and RT1-255, respectively. While the data items externally input are being loaded into the first latch circuits RT1-1 to RT1-255, the data items at addresses $A_0$ to $A_{255}$ are read from the 256 memory cells and input to the second latch circuits RT2-0 to RT2-255, respectively. Thereafter, the memory cells are programmed according to the 2-bit data items held in the data circuits 6-0 to 6-255.

That is, either a data item or a data item "2" is maintained in each memory cell, or the data item stored in each memory cell is changed from "1" to "3" or from "2" to "4." The data programmed may contains less than 512 bits. If so, at least one of the latch circuits of the data circuits 6-0 to 6-m holds no data item. In this case, it suffices to set a data item in that latch circuit so that the corresponding memory cell may have a low threshold voltage which corresponds to a data item "1," "2" or "3."

Data-Reading

Figure 56A:
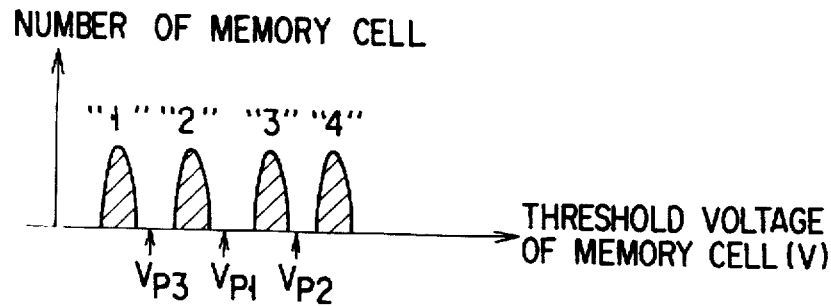
FIGS. 56A and 56B are diagrams for explaining how data is read from the eleventh embodiment.
Figure 56B:
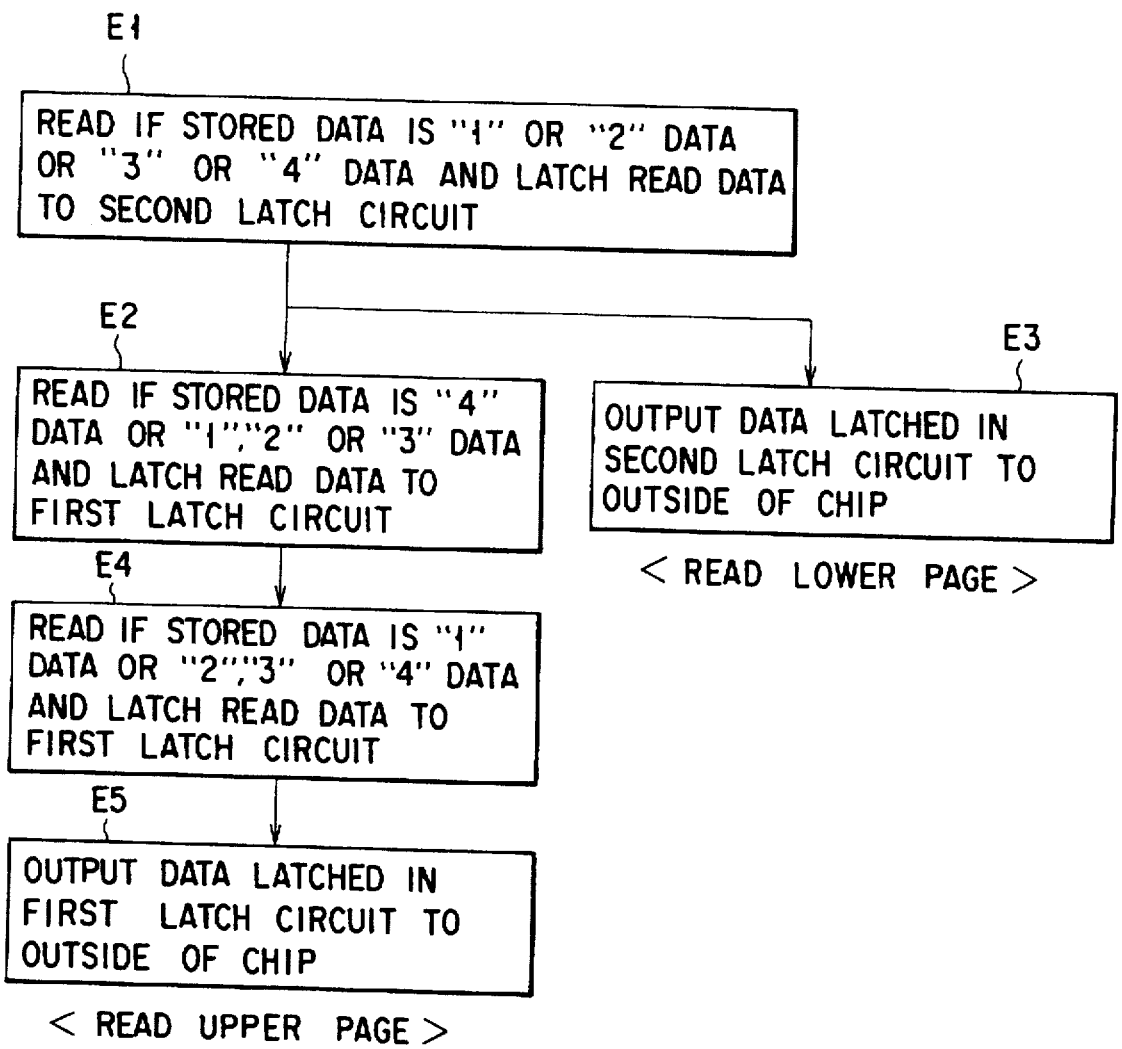

How date is read from the eleventh embodiment will be explained, with reference to FIGS. 56A and 56B. First, a voltage Vp1 intermediate between two values corresponding to "2" and "3" is applied to a word line selected. To the word line there are connected memory cells from which data is to be read. If the memory cells are turned on, it is detected that they store either "1" or "2." If the memory cells are turned off, it is detected that they store either "3" or "4." Thus, the lower page corresponding to column address $B_0, B_1, B_2, \ldots, B_{254}$ and $B_{255}$ is read from the memory cells and held in the second latch circuits of the data circuits. The lower page is then output from the memory chip through the data input/output line IO1.

To read the upper page, a voltage Vp2 intermediate between two values corresponding to "3" and "4" is applied to the word line selected. Thus, it is determined whether the memory cells connected to the word line store "4", or any one of the other data items "1," "2" and "3." The data thus read is held in the first latch circuits of the data circuits. Finally, a voltage Vp3 intermediate between two values corresponding to "1" and "2" is applied to the word line. Hence, it is detected whether the memory cells store "1" or any one of the other values "2," "3" and "4." The upper page corresponding to column address $A_0, A_1, A_2, \ldots, A_{254}$ and $A_{255}$ is read and held in the first latch circuits of the data circuits.

The upper page is then output from the memory chip.

As mentioned above, the eleventh embodiment, which is a multi-value data memory EEPROM, has the same structure as the tenth embodiment shown in FIG. 48.

Figure 2A:
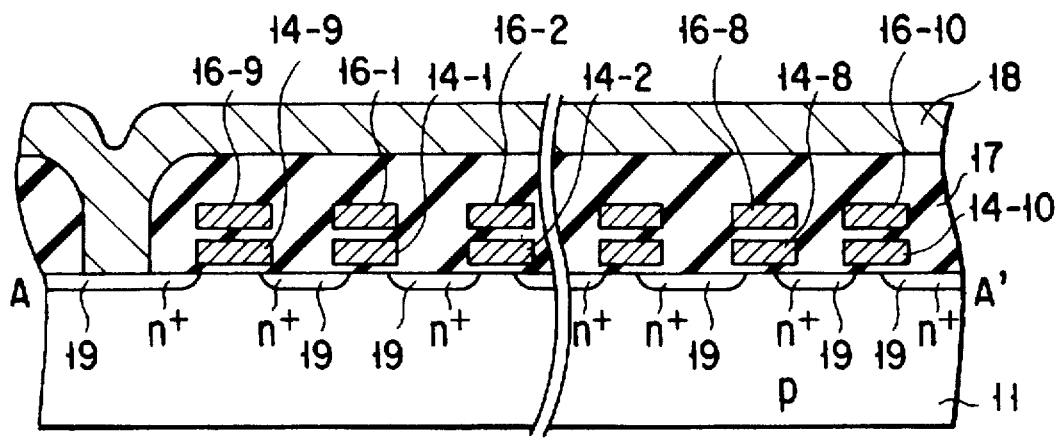
FIG. 2A is a sectional view, taken along line 2A—2A in FIG. 1A.
Figure 2B:
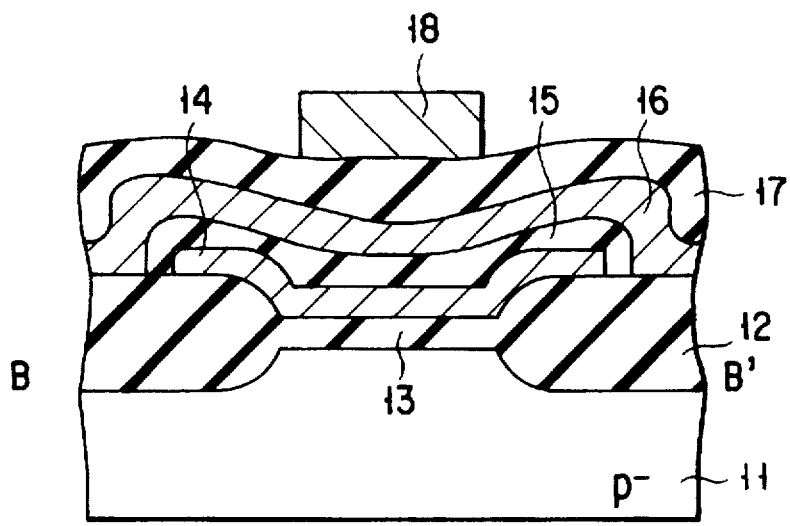
FIG. 2B is a sectional view, taken along line 2B—2B in FIG. 1A.

The NAND cells provided in the EEPROM are identical in structure to the NAND cell illustrated in FIGS. 1A, 1B and 2. Memory-cell units are arranged in the same way as shown in FIG. 3. Each memory cell can have four threshold voltages shown in FIG. 54, which correspond to four data items "1," "2," "3" and "4," respectively. The data circuits 6 incorporated in the eleventh embodiment have the structure illustrated in FIG. 57.

Each data circuit 6 is designed to hold a four-value data. As shown in FIG. 57, the data circuit 6 comprises two flip-flops FF1 and FF2. The flip-flop FF1 comprises n-channel MOS transistors Qn21, Qn22 and Qn23 and p-channel MOS transistors Qp9, Qp10 and Qp11. The flip-flop FF2 comprises n-channel MOS transistors Qn29, Qn30 and Qn31 and p-channel MOS transistors Qp6, Qp17 and Qp18. The flip-flops FF1 and FF2 cooperate to operate as a sense amplifier.

The flip-flops FF1 and FF2 latch a data item "1," "2," "3" or "4" which is to be written into a memory cell. They also sense and latch a data item "1," "2," "3" or "4" which has been read from a memory cell.

The flip-flop FF1 is connected to a data input/output line IOA by an n-channel MOS transistor Qn28 and to a data input/output line IOB by an n-channel MOS transistor Qn27. The flip-flop FF2 is connected to the data input/output line IOA by an n-channel MOS transistor Qn36 and to the data input/output line IOB by an n-channel MOS transistor Qn35. The data input/output lines IOA and IOB are connected to the buffer circuit 5 (FIG. 48). The read data held in the flip-flop FF1 is output to the lines IOA and IOB when a signal CENB1 is activated. The read data held in the flip-flop FF2 is output to the lines IOA and IOB when a signal CENB2 is activated.

N-channel MOS transistors Qn26 equalize the flip-flops FF1 and FF2, respectively, when signals ECH1 and ECH2 rise to "H" level. N-channel MOS transistor Qn24 connects the flip-flop FF1 to or disconnects the same from a MOS capacitor Qd1. N-channel MOS transistor Qn32 connects the flip-flop FF2 to or disconnects the flip-flop FF2 from the MOS capacitor Qd1. N-channel MOS transistor Qn25 connects the flip-flop FF1 to or disconnects the flip-flop FF 1 from a MOS capacitor Qd2. N-channel MOS transistor Qn33 connects the flip-flop FF2 to or disconnects the same from the MOS capacitor Qd2.

P-channel MOS transistors Qp12C and Q13C constitute a circuit, which changes the gate voltage of the MOS capacitor Qd1 according to the data held in the flip-flop FF1, in the input data is a activation signal VRFYBAC. P-channel MOS transistors Qp14C and Q15C constitute a circuit, which changes the gate voltage of the MOS capacitor Qd2 according to the data held in the flip-flop FF2, in the input data is an activation signal VRFYBBC. N-channel MOS transistors Qn1C and Qn2C constitute a circuit, which changes the gate voltage of the MOS capacitor Qd1 according to the data held in the flip-flop FF2, in the input data is an activation signal VRFYBA1C. N-channel MOS transistors Qn3C and Qn4C constitute a circuit, which changes the gate voltage of the MOS capacitor Qd2 according to the data item held in the flip-flop FF2, in the input data is an activation signal VRFYBB1C.

The MOS capacitors Qd1 and Qd2 are constituted by a depletion n-channel MOS transistor each. They have a capacitance much less than the bit-line capacitance. N-channel MOS transistor Qn37 charges the MOS capacitor Qd1 to a voltage VA when it receives a signal PREA. N-channel MOS transistor Qn38 charges the MOS capacitor Qd2 to a voltage VB when it receives a signal PREB. N-channel MOS transistors Qn39 and Qn40 connects the data circuit 6 to or disconnects the same from bit lines BLa and BLb in the input data is signals BLCA and BLCB, respectively. The n-channel MOS transistors Qn37 and Qn38 constitute a circuit, which controls the voltages of the bit lines BLa and BLb.

It will be explained how the EEPROM (the eleventh embodiment) described above operates when the control gate CG2A shown in FIG. 15 is selected.

Programming of Upper Page (1) Programming of Upper Page

Figures 58A, 58B:
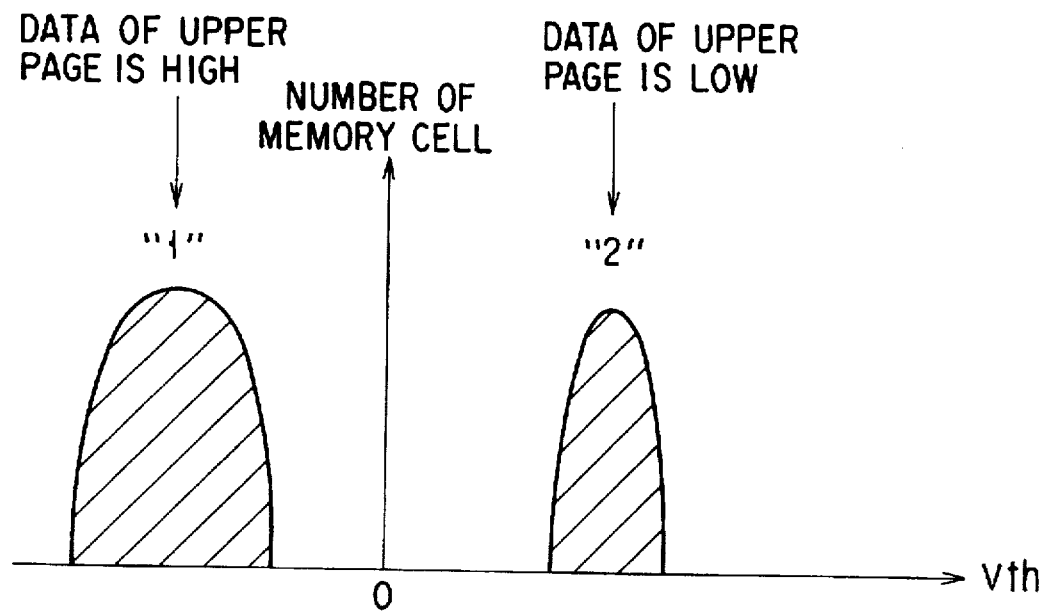
FIGS. 58A and 58B are a diagram and a table, for explaining how an upper page is programmed in the eleventh embodiment.

Data supplied from an external device is input via the data input/output buffer 5 to the data circuit 6. Assume that one page contains 256 bits and that the EEPROM incorporate 256 data circuits 6. Then, an upper page, externally supplied and containing 256 bits, is input to the first flip-flops FF1 through the lines IOA and IOB when a column-activating signal CENB1 is at "H" level. FIGS. 58A and 58B represent the relation between write data items and the potentials at the nodes N3C and N4C in the flip-flop FF1. As seen from FIG. 58a, "2" will be written if the input data item is at high level, and "1" will be written if the input data item is at low level.

Figure 59:
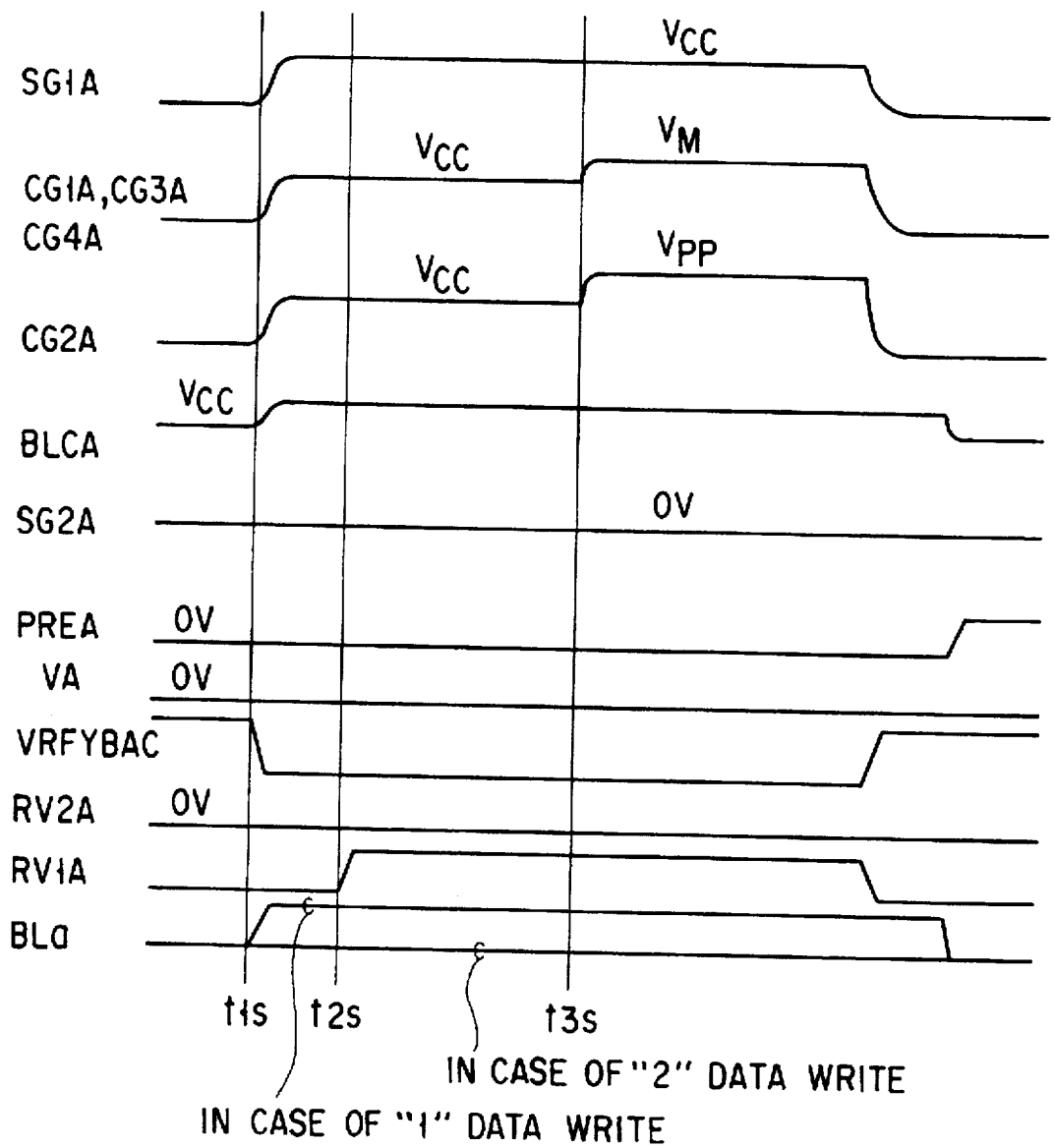
FIG. 59 is a timing chart explaining how the upper page is programmed in the eleventh embodiment.

How a data item is written into a memory cell will be explained, with reference to the timing chart of FIG. 59.

At time t1s, the activation signal VRFYBAC is programmed to 0V, whereby a bit-line write control voltage Vcc is applied to a bit line from the data circuit which holds data item "1." At time t2s, signal RV1A is programmed to Vcc, whereby 0V is applied to a bit line from the data circuit which holds data item "2." Thus, the bit line through which "1" is written into the memory cell is programmed to Vcc, and the bit line through which "2" is written into the memory cell is programmed to 0V.

At time t1s, the select gate SG1 of the block selected by the control gate/select gate driving circuit 21, and the control gates CG1A to CG4A are set at Vcc. The select gate SG2A is at 0V. At time t3s, the control gate CG2A selected is programmed to a high voltage Vpp (e.g., 20V), and the control gates CG1A, CG3A and CG4A, not selected, are set at a voltage VM (e.g., 10V). In the memory cell connected to any data circuit that holds "2," electrons are injected into the floating gate due to the difference between the channel potential of 0V and the potential Vpp of the control gate. The threshold voltage of the memory cell therefore increases. In the memory cell connected to any data circuit that hold "1," the selected gate SG1A is turned off, and the channel is set in floating state.

As a result, in the memory cell into which "1" is to be written, the channel is programmed to about 8V because of the capacitive coupling with the control gate. Hence, no electrons are written into the memory cell. The memory cell remains in erased state, namely storing data item "1." During the programming operation, signals SAN1, SAN2, PREB, BLCB remain at "H" level, signals SAP1, SAP2, VRFYBA1C, RV1B, RV2B, ECH1 and ECH2 remain at "L" level, and the voltage VB remain at 0V.

(2) Verify-Read Operation of Upper Page

After the programming operation, it is determined whether data has been sufficiently written. (That is, write verify operation is carried out.) If the threshold voltage of the memory cell has reached a desired value, the data held in the data circuit is changed to "11." Otherwise, the data held in the data circuit is left unchanged, and the data is written again into the memory cell. Data-writing and write verify operation are repeated until all memory cells into which "2" must be written come to have a desired threshold voltage.

Figure 60:
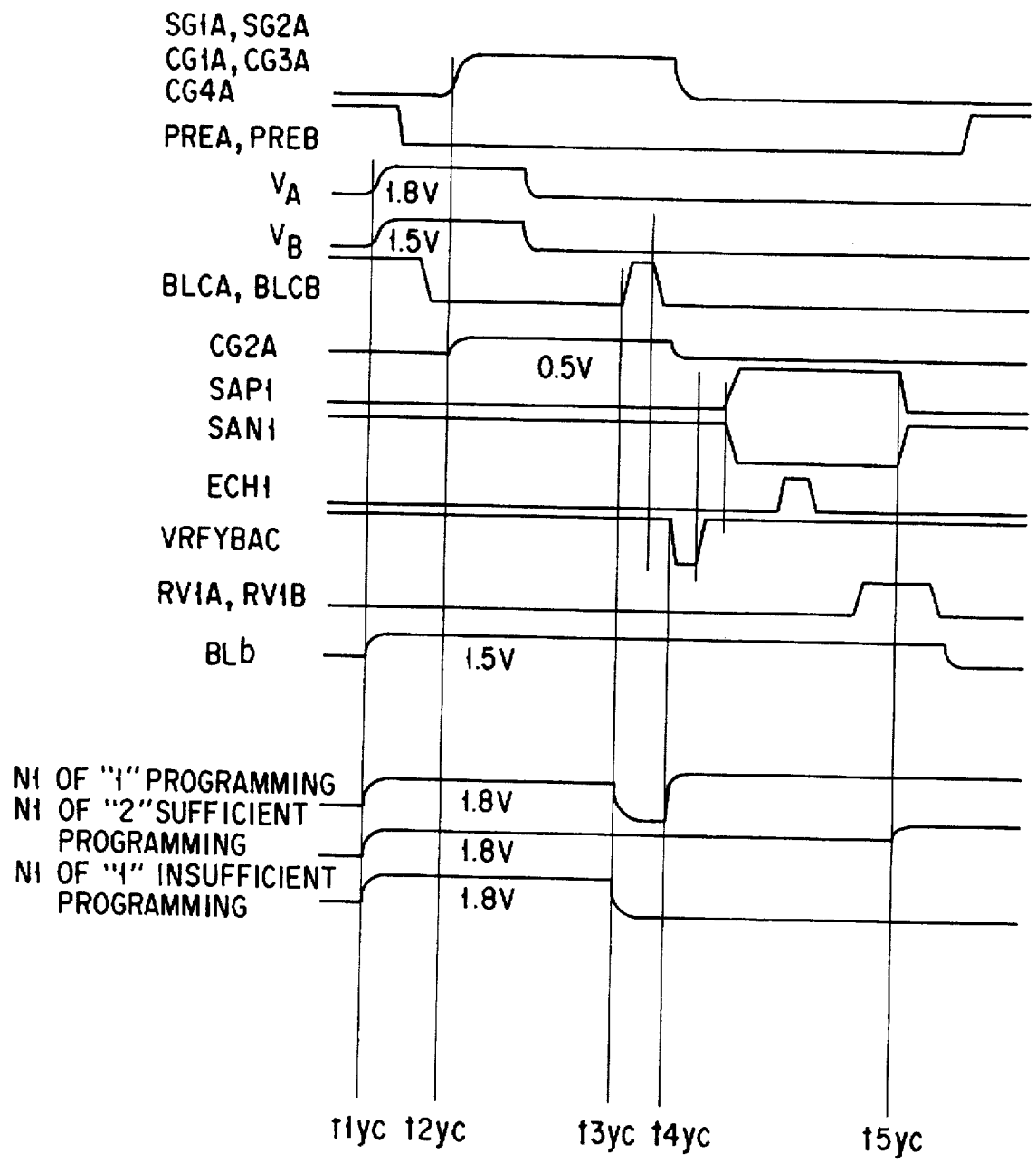
FIG. 60 is a timing chart explaining how the upper page is read from the eleventh embodiment in verify read mode.

How the write verify operation is effected will be explained with reference to the circuit diagram of FIGS. 57 and the timing chart of FIG. 60.

First, at time t1yc, the voltages VA and VB are set at 1.8V and 1.5V, respectively. The bit lines BLa and BLb are thereby set at 1.8V and 1.5V. The signals BLCA and BLCB fall to "L" level, disconnecting the bit line BLa from the MOS capacitor Qd1 and the bit line BLb from the MOS capacitor Qd2. The bit lines BLa and BLb therefore assume floating state. The signals PREB falls to "L" level, setting the nodes N1 and N2, i.e., the gate electrodes of the MOS capacitors Qd1 and Qd2, into floating state.

At time t2yc, the control gate CG2A of the block selected by the control gate/select gate driving circuit 21 is programmed to 0.5V, while the control gates CG1A, CG3A and CG4A not selected and the select gates SG1A and SG2A are set at Vcc. If the threshold voltage of the memory cell selected is 0.5V or less, the bit-line voltage is less than 1.5V. If the threshold voltage is 0.5V or more, the bit-line voltage will remain at 1.8V. At time t3yc, the signals BLCA and BLCB rise to "H" level, and the potentials of the bit lines are applied to the nodes N1 and N2. Then, the signals BLCA and BLCB fall to "L" level, disconnecting the bit line BLa from the MOS capacitor Qd1 and the bit line BLb from the MOS capacitor Qd2.

Thereafter, at time t4yc, the signal VRFYBAC is programmed to "L" level. Then, p-channel MOS transistor Qp12C is turned on and the node N1 is programmed to Vcc in the data circuit which holds a write data item "1." Namely, the node N1 is programmed to Vcc so that "1" may be written into the memory cell. The p-channel MOS transistor Qp12C is turned off if "2" is to be written into the memory cell. If the memory cell is sufficiently programmed to "2," the node N1 is programmed to Vcc. If the memory cell is insufficiently programmed to "2," the node N1 is programmed to 0V. Then, the signals SAN1 and SAP1 change to "L" level and "H" level, respectively, deactivating the flip-flop FF1. The signal ECH1 rises to "H" level, equalizing the flip-flop FF1.

Thereafter, the signals RV1A and RV1B rise to "H" level. The signals SAN1 and SAP1 again changes to "H" level and "L" level, respectively. At time t5yc, the voltage at the node N1 is sensed and latched. It is determined whether the memory cell connected to the data circuit holding the write data "2" has been sufficiently programmed to data "2" or not. If the memory cell stores "2," the flip-flop FF1 senses and latches the voltage at the node N1, whereby the data to be written into the memory cell is changed to "1." If the memory cell does not store "2," the flip-flop FF1 senses and latches the voltage at the node N1, whereby the data "2" is maintained in the data circuit. Data item "1" remains unchanged in whichever data circuit that holds it.

When the threshold voltages of all memory cells selected reach the desired values, the nodes N4C in the data circuits fall to "L" level. Thus, when the nodes N4C are found at "L" level, it is known that all memory cells selected have the desired threshold voltages. To determine that the cells are programmed, the write completion detection transistor Qn5C shown in FIG. 57 may be used. After the read verification is effected, signal VRTC is programmed to, for example, the precharge voltage Vcc. If there is even one memory cells insufficiently programmed, the node N4C of the data circuit to which that memory cell is connected is at "H" level. The n-channel MOS transistor Qn5C is turned on, and the signal VRTC falls from the precharge voltage Vcc. When all memory cells selected are sufficiently programmed, the nodes N4C in the data circuits 6-0, 6-1, ... 6-m-1, and 6-m fall to "L" level. As a result, the n-channel MOS transistors Qn5C are turned off in any data circuit, whereby the signal VRTC remains at the precharge voltage. Thus it is determined that all memory cells selected have been programmed.

Programming of Lower Page (1) Reading, Inverting of Loading of Upper Page

Figures 61A, 61B, 61C:
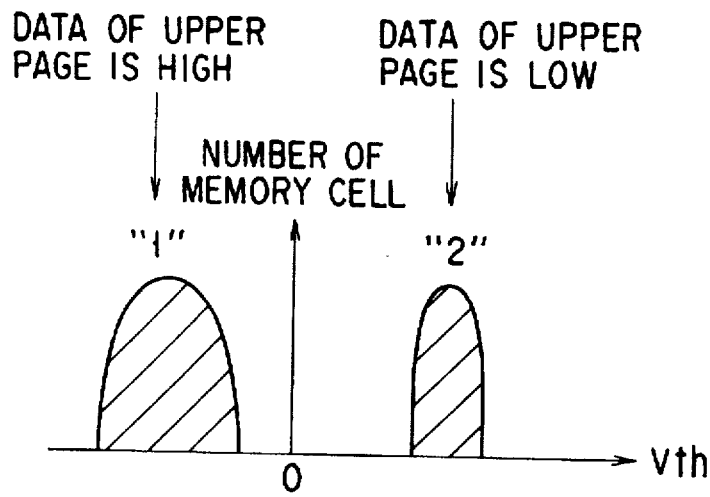
FIG. 61A is a diagram and FIGS. 61B and 61C are tables, for explaining how the upper page is read and inverted before a lower page is programmed in the eleventh embodiment.

Before the lower page is programmed, the upper page is programmed in the memory cells. Thus, each memory cell stores either "1" or "2" as shown in FIG. 61A. A data item of the upper page stored in the memory cells is read and held in the flip-flop FF1 at the same time a data item of the lower page is input to the flip-flop FF1 via the data input/output lines IOA and IOB from the external device.

How the data item of the upper page is read from a memory cell will be explained, with reference to FIGS. 61A to 61C and the timing chart of FIG. 62.

First, at time t1yd, the voltages VA and VB are set at 1.8V and 1.5V, respectively. The bit lines BLa and BLb are thereby set at 1.8V and 1.5V. The signals BLCA and BLCB fall to "L" level, disconnecting the bit line BLa from the MOS capacitor Qd1 and the bit line BLb from the MOS capacitor Qd2. The bit lines BLa and BLb therefore assume floating state. The signals PREB falls to "L" level, setting the nodes N1 and N2, i.e., the gate electrodes of the MOS capacitors Qd1 and Qd2, into floating state.

At time t2yd, the control gate CG2A of the block selected by the control gate/select gate driving circuit 21 is programmed to 0V, while the control gates CG1A, CG3A and CG4A not selected and the select gates SG1A and SG2A are set at Vcc. If the threshold voltage of the memory cell selected is 0V or less, the bit-line voltage is less than 1.5V. If the threshold voltage is 0V or more, the bit-line voltage will remain at 1.8V. At time t3yd, the signals BLCA and BLCB rise to "H" level, and the potentials of the bit lines are applied to the nodes N1 and N2. Then, the signals BLCA and BLCB fall to "L" level, disconnecting the bit line BLa from the MOS capacitor Qd1 and the bit line BLb from the MOS capacitor Qd2.

Thereafter, signals SAN2 and SAP2 change "L" level and "H" level, respectively, deactivating the flip-flop FF2. The signal ECH2 rise to "H" level, whereby the flip-flop FF2 is equalized. Signals RVA2A and RV2B then rise to "H" level. The signals SAN2 and SAP2 again change to "H" level and "L" level, respectively. At time t4yd, the voltage at the node N1 is thereby sensed and latched. At this time, the nodes N5C and N6C in the flip-flop FF2 are set at the potentials shown in FIG. 61B.

Thereafter, the data read out is inverted. When a data item "1," for example, is read out, the node N5C is at "L" level as shown in FIG. 61B. When the data item is inverted, the node N5C rises to "H" level.

At time t5yd, the signals PREA and PREB rise to "H" level. The nodes N1 and N2, i.e., the gate electrodes of the MOS capacitors Qd1 and Qd2, are precharged to 1.8V and 1.5V, respectively, and set into floating state. At time t6yd, the signal VRFYBA1C rises to "H" level. If the data circuit holds a write data item "2," the n-channel MOS transistor Qn2C is turned on and the node N1 is programmed to 0V. If the data circuit hold a write data item "1," the n-channel MOS transistor Qn2C is turned off and the node N1 remains at 1.8V.

Thereafter, signals SAN2 and SAP2 change "L" level and "H" level, respectively, deactivating the flip-flop FF2. The signal ECH2 rises to "H" level, whereby the flip-flop FF2 is equalized. Signals RVA2A and RV2B then rise to "H" level. The signals SAN2 and SAP2 again change to "H" level and "L" level, respectively. At time t7yd, the voltage at the node N1 is thereby sensed and latched. Now that the data has been inverted, the nodes N5C and N6C in the flip-flop FF2 are set at the potentials shown in FIG. 61C.

The write data item of the lower page, input to the flip-flop FF1 from the. external device, is illustrated in FIGS. 63A and 63B. If this data item is at "H" level, it is not written into the memory cell. The memory cell therefore keeps storing either "1" or "2." If the data item is at "L" level, it is written into the memory cell. In this case, the memory stores "3" instead of "1" or stores "4" instead of "2."

Figures 64A, 64B:
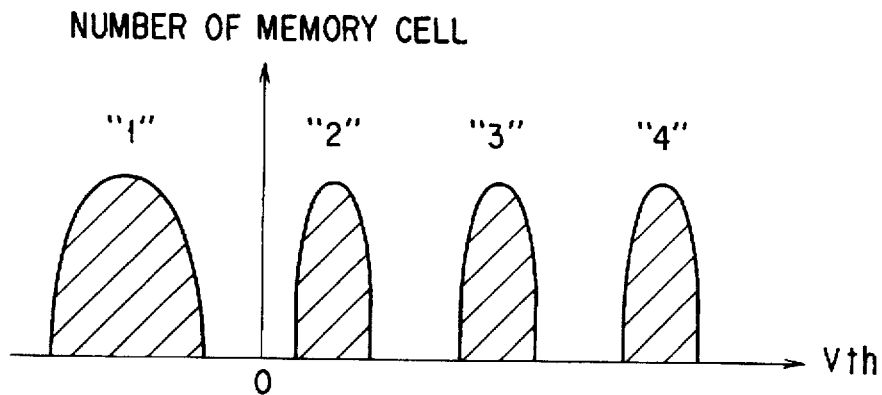
FIGS. 64A and 64B are a diagram and a table, showing the potentials which various nodes have when the lower page is programmed in the eleventh embodiment.

Thus, the nodes N3C and N4C in the flip-flop FF1 and the nodes N5C and N6C in the flip-flop FF2 are set at the potentials shown in FIGS. 64A and 64B during the programming of the lower page.

Figure 65:
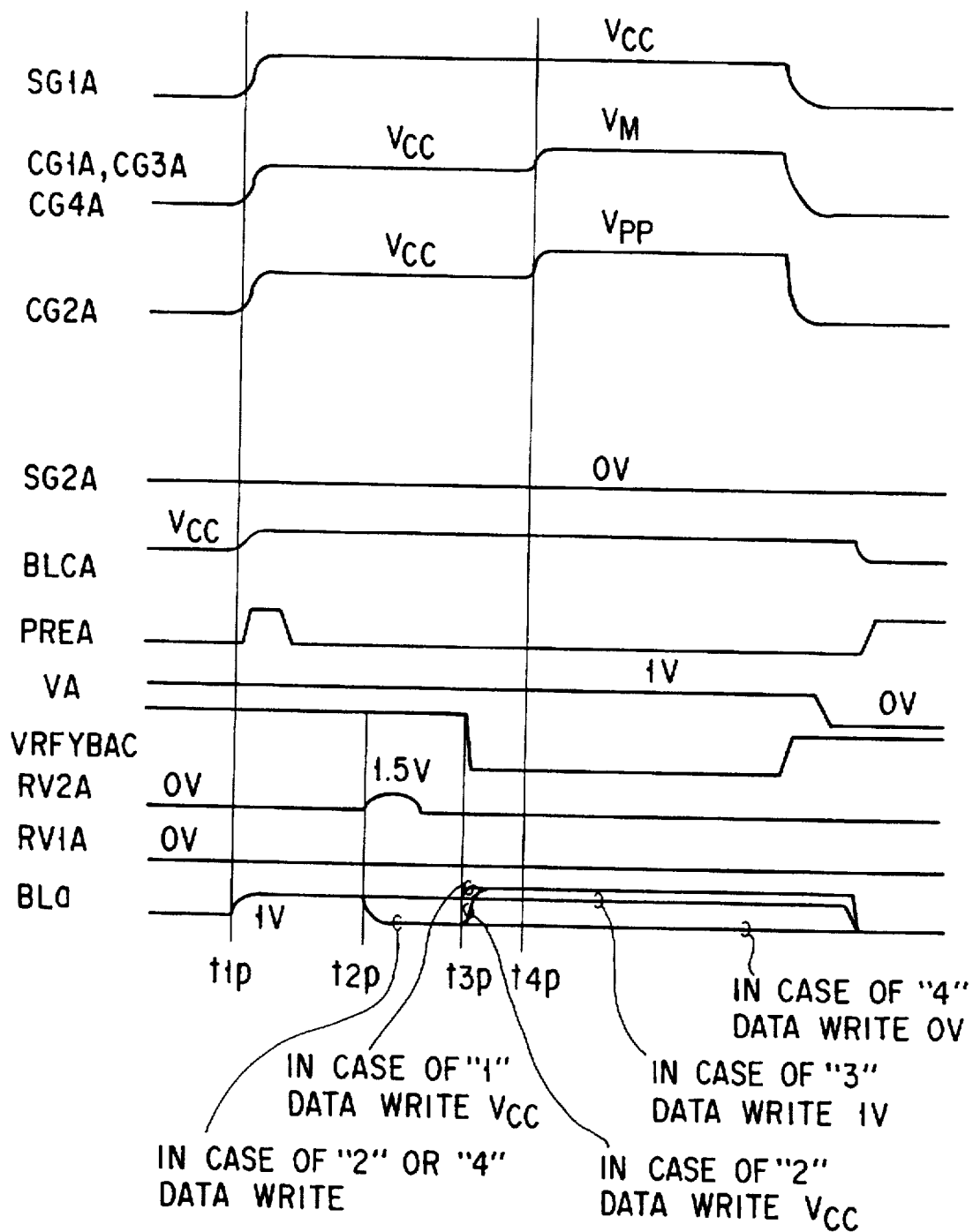
FIG. 65 is a timing chart explaining how the lower page is programmed in the eleventh embodiment.

(2) Programming of Lower Page How the lower page is programmed will be explained, with reference to the timing chart of FIG. 65.

At time t1p, the voltage VA used as a bit-line write voltage is programmed to 1V. The bit line BLa is thereby set at 1V. If a voltage drop equivalent to the threshold voltage of the n-channel MOS transistor Qn39 makes a problem, it suffices to raise the level of the signal BLCA. Then, the signal PREA falls to "L" level, setting the bit line BLa in floating state. At time t2p, the signal RV2A is programmed to 1.5V, and the data circuit storing "2" or "4" applies a bit-line control voltage of 0V to the bit line BLa.

Assume that the n-channel MOS transistor Qn32 has a threshold voltage of 1V. Then, the n-channel MOS transistor Qn32 is turned off if the data being written is "1" or "3," or is turned off if the data being written is "2" or "4." Thereafter, at time t3p, the signal VRFYBAC changes to 0V, whereby the data circuit storing "1" or "2" applies a bit-line control voltage Vcc to the bit line BLa.

As a result, the bit line through which either "1" or "2" is written is programmed to Vcc, the bit line through which "3" is written is programmed to 1V, and the bit line through which "4" is written is programmed to 0V.

At time tip, the select gate SG1A of the block selected by the control gate/select gate driving circuit 21, and the control gates CG1A to CG4A are set at Vcc. The select gate SG2A is at 0V. At time t4p, the control gate CG2A selected is programmed to a high voltage Vpp (e.g., 20V), and the control gates CG1A, CG3A and CG4A, not selected, are set at a voltage VM (e.g., 10V). In the memory cell connected to any data circuit that holds "4," electrons are injected into the floating gate due to the difference between the channel potential of 0V and the potential Vpp of the control gate. The threshold voltage of the memory cell therefore increases. In the memory cell connected to any data circuit that hold "3," electrons are injected to the floating gate due to the difference between the channel potential of 1V and the potential Vpp of the control gate. The threshold voltage of this cell therefore increases.

The channel of the memory cell which is to be programmed to "3" is programmed to potential of 1V, in order to injects less electrons into the floating gate than in the memory cell which is to be programmed to "4." In the memory cell connected to the data circuit which holds either "1" or "2," the difference between the potential of the channel and the potential Vpp of the control gate is so small that in effect no electrons are injected into the floating gate. Hence, the threshold voltage of the memory cell remains unchanged. During the programming operation, signals SAN1, SAN2, PREB, BLCB remain at "H" level, signals SAP1, SAP2, VRFYBA1C, RV1A, RV1B, RV2B, ECH1 and ECH2 remain at "L" level, and the voltage VB remain at 0V.

Figure 67:
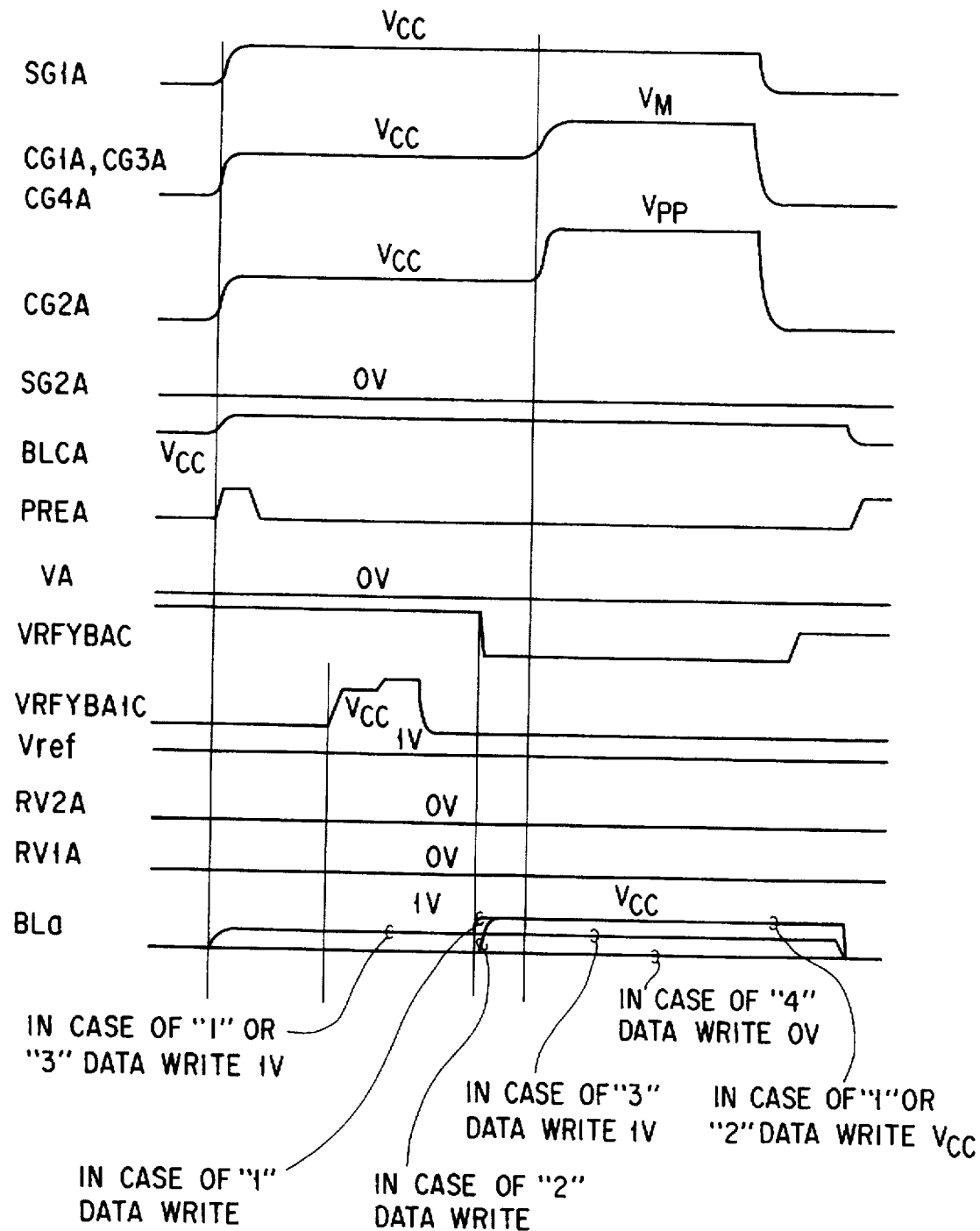
FIG. 67 is a timing chart explaining another method of programming the lower page in the eleventh embodiment.

The programming operation may be carried out in any other method. For instance, it can be performed as shown in the timing chart of FIG. 67 by setting the node of the n-channel transistors Qn2C and Qn4C at a fixed potential Vref as shown in FIG. 66, not at the ground potential as illustrated in FIG. 57. As shown in FIG. 67, the bit lines are set at 0V and thus in floating state. Then, signal VRFYBA1C is programmed to Vcc, whereby the bit line through which "1" or "3" is to be written is programmed to 1V. Thereafter, signal VRFYBAC is programmed to 0V, whereby the bit line through which "1" or "2" is to be written is programmed to Vcc. As a result, the bit line for writing "4" is programmed to 0V, the bit line for writing "3" at 1V, the bit line for writing "1" or "2" at Vcc.

(3) Verify-Read Operation of Lower Page

After the programming operation, it is determined whether data has been sufficiently written. (That is, write verify operation is carried out.) If the threshold voltage of the memory cell has reached a desired value, the node N3C of the flip-flop FF1 is programmed to "H" level. Otherwise, the data held in the data circuit is left unchanged, and the data is written again into the memory cell. Data-writing and write verify operation are repeated until any memory cell into which "3" must be written and any memory cell in which "4" must be written come to have desired threshold voltages.

How this write verify operation is effected will be explained with reference to the circuit diagram of FIGS. 57 and the timing chart of FIG. 68.

First, at time t1yx, the voltages VA and VB are set at 1.8V and 1.5V, respectively. The bit lines BLa and BLb are thereby set at 1.8V and 1.5V. The signals BLCA and BLCB fall to "L" level, disconnecting the bit line BLa from the MOS capacitor Qd1 and the bit line BLb from the MOS capacitor Qd2. The bit lines BLa and BLb therefore assume floating state. The signals PREB falls to "L" level, setting the nodes N1 and N2, i.e., the gate electrodes of the MOS capacitors Qd1 and Qd2, into floating state.

Then, the control gate CG2A of the block selected by the control gate/select gate driving circuit 21 is programmed to 0.5V, while the control gates CG1A, CG3A and CG4A not selected and the select gates SG1A and SG2A are set at Vcc. If the threshold voltage of the memory cell selected is 0.5V or less, the bit-line voltage is less than 1.5V. If the threshold voltage is 0.5V or more, the bit-line voltage will remain at 1.8V.

At time t2yx, the signals BLCA and BLCB rise to "H" level, and the potentials of the bit lines are applied to the nodes N1 and N2. Then, the signals BLCA and BLCB fall to "L" level, disconnecting the bit line BLa from the MOS capacitor Qd1 and the bit line BLb from the MOS capacitor Qd2. At time t3yx, the signal RV2A is programmed to 1.5V, the node N1 is discharged to 0V to write "2" or "4" into the memory cell. At time t4yx, the signal VRFYBAC is programmed to "L" level. Then, in the data circuit holding either "1" or "2," the p-channel MOS transistor Qp12C is turned on and the node N1 is programmed to Vcc. Namely, the node N1 is programmed to Vcc to write "1" or "2" into the memory cell, and at 0V to write "4" into the memory cell.

Then, the signals SAN1 and SAP1 change to "L" level and "H" level, respectively, deactivating the flip-flop FF1. The signal ECH1 rises to "H" level, equalizing the flip-flop FF1. Thereafter, the signals RV1A and RV1B rise to "H" level. The signals SAN1 and SAP1 again changes to "H" level and "L" level, respectively. At time t5yx, the voltage at the node N1 is sensed and latched. It is determined whether the memory cell connected to the data circuit holding the write data "3" has been sufficiently programmed to data "3" or not. If the memory cell stores "3," the flip-flop FF1 senses and latches the voltage at the node N1, whereby the data to be written into the memory cell is changed to "1." If the data in the memory cell is not "3," the flip-flop FF1 senses and latches the voltage at the node N2, whereby the data "3" is maintained in the data circuit. Data item "1," "2" and "4" remain unchanged in whichever data circuits they are held.

Next, the control gate selected is set 2.5V. If the threshold voltage of the memory cell selected is 2.5V or less, the bit-line voltage is less than 1.5V. If the threshold voltage is 2.5V or more, the bit-line voltage remains at 1.8V. At time t6yx, the signals PREA and PREB are set at a voltage lower than Vcc, setting the nodes N1 and N2 at 1.8V and 1.5V, respectively. The bit lines BLa and BLb therefore assume floating state. Then, at time t7yx, the signals BLCA and BLCB are set at "H" level, disconnecting the bit line BLa from the MOS capacitor Qd1 and the bit line BLb from the MOS capacitor Qd2.

At time t8yx, the signal VRFYBAC falls to "L" level. In any data circuit that holds "1" or "2" and in any data circuit that holds "1" because "3" has been sufficiently programmed, the p-channel MOS transistor Qp12 is turned on, and the node N1 is programmed to Vcc.

The signals SAN1 and SAP1 change to "L" level and "H" level. The flip-flop FF1 is thereby deactivated. The signal ECH" rises to "H" level, equalizing the flip-flop FF1. Then, the signals RV1A and RV1B rises to "H" level. The signals SAN1 and SAP1 change to "H" level and "L" level. At time t9yx, The voltage at the node N1 is thereby sensed and latched. It is determined whether the memory cell connected to the data circuit holding the write data "4" has been sufficiently programmed to data "4" or not. If this memory cell stores "4," the flip-flop FF1 senses and latches the voltage at the node N1, whereby the data to be written into the memory cell is changed to "2." No data item is written into the memory cell thereafter. If the data in the memory cell is not "4," the flip-flop FF1 senses and latches the voltage at the node N1, whereby the data item "4" is held in the data circuit and written therefrom into the memory cell. Then, additional data-writing is performed. Data items "1," "2" and "3", remain unchanged in whichever data circuits they are held.

When the threshold voltages of all memory cells selected reach the desired values, the nodes N4C in the data circuits fall to "L" level. Thus, when the nodes N4C are found at "L" level, it is known that all memory cells selected have the desired threshold voltages. To determine that the cells are programmed, the write completion detection transistor Qn5C shown in FIG. 57 may be used. After the read verification is effected, signal VRTC is programmed to, for example, the precharge voltage Vcc. If there is even one the memory cell insufficiently programmed, the node N4C of the data circuit to which that memory cell is connected is at "H" level. The n-channel MOS transistor Qn5C is turned on, and the signal VRTC falls from the precharge voltage Vcc. When all memory cells selected are sufficiently programmed, the nodes N4C in the data circuits 60, 6-1, . . . 6-m-1, and 6-m fall to "L" level. As a result, the n-channel MOS transistors Qn5C are turned off in any data circuit, whereby the signal VRTC remains at the precharge voltage. Thus it is determined that all memory cells selected have been programmed.

Reading of Upper Page

The upper page is read from the EEPROM, by determining whether each memory cell stores either "1" or "3," or either "2" or "4."

How the upper page is read will be explained, with reference to the timing chart of FIGS. 69A and 69B.

First, at time t1RD, the voltages VA and VB are set at 1.8V and 1.5V, respectively. The bit lines BLa and BLb are thereby set at 1.8V and 1.5V. The signals BLCA and BLCB fall to "L" level, disconnecting the bit line BLa from the MOS capacitor Qd1 and the bit line BLb from the MOS capacitor Qd2. The bit lines BLa and BLb therefore assume floating state. The signals PREB falls to "L" level, setting the nodes N1 and N2, i.e., the gate electrodes of the MOS capacitors Qd1 and Qd2, into floating state. Then, the control gate CG2A of the block selected by the control gate/select gate driving circuit 21 is programmed to 1V, while the control gates CG1A, CG3A and CG4A not selected and the select gates SG1A and SG2A are set at Vcc. If the threshold voltage of the memory cell selected is 1V or less, the bit-line voltage is less than 1.5V. If the threshold voltage is 1V or more, the bit-line voltage will remain at 1.8V.

At time t2RD, the signals BLCA and BLCB rise to "H" level, and the potentials of the bit lines are applied to the MOS capacitors Qd1 and Qd2. Then, the signals BLCA and BLCB again fall to "L" level, disconnecting the bit line BLa from the MOS capacitor Qd1 and the bit line BLb from the MOS capacitor Qd2. Signals SAN2 and SAP2 change "L" level and "H" level, respectively, deactivating the flip-flop FF2. The signal ECH2 rise to "H" level, whereby the flip-flop FF2 is equalized. Signals RVA2A and RV2B then rise to "H" level. At time t3RD, the signals SAN2 and SAP2 again change to "H" level and "L" level, respectively. The voltage at the node N1 is thereby sensed and latched. The flip-flop FF2 detects that the memory cell stores either "1" or "2," or either "3" or "4." The data showing this fact is latched. At this time, the nodes N5C and N6C in the flip-flop FF2 are set at the potential shown in FIG. 70.

The control gate selected is programmed to 2V. If the threshold voltage of the memory cell selected is 2V or less, the bit-line voltage will be less than 1.5V. If the threshold voltage is 2V or more, the bit-line voltage will remain at 1.8V. At time t4RD, the signals PREA and PREB rise to "H" level. The nodes N1 and N2, i.e., the gate electrodes of the MOS capacitors Qd1 and Qd2, are precharged to 1.8V and 1.5V. Then, the signals PREA and PREB falls to "L" level, whereby the nodes N1 and N2 assume floating state.

At time t5RD, the signals BLCA and BLCB rise to "H" level. Then, the signals BLCA and BLCB fall to "L" level, disconnecting the bit line BLa from the MOS capacitor Qd1 and the bit line BLb from the MOS capacitor Qd2. The signals SAN1 and SAP1 change to "L" level and "H" level, deactivating the flip-flop FF1. The signal ECH1 rises to "H" level, equalizing the flip-flop FF1. Thereafter, the signals RV1A and RV1B rise to "H" level. At time t6RD, the signals SAN1 and SAP1 again changes to "H" level and "L" level, respectively. The voltage at the node N1 is thereby sensed and latched.

Therefore, the flip-flop FF1 detects that the data item stored in the memory cell is a data item "4" or any one of the other data items "1," "2" or "3." The data indicative of this fact is latched. At this time, the nodes N3C in the flip-flop FF1 and the node N5C in the flip-flop FF2 are set at the potentials shown in FIG. 71.

Figure 69B:
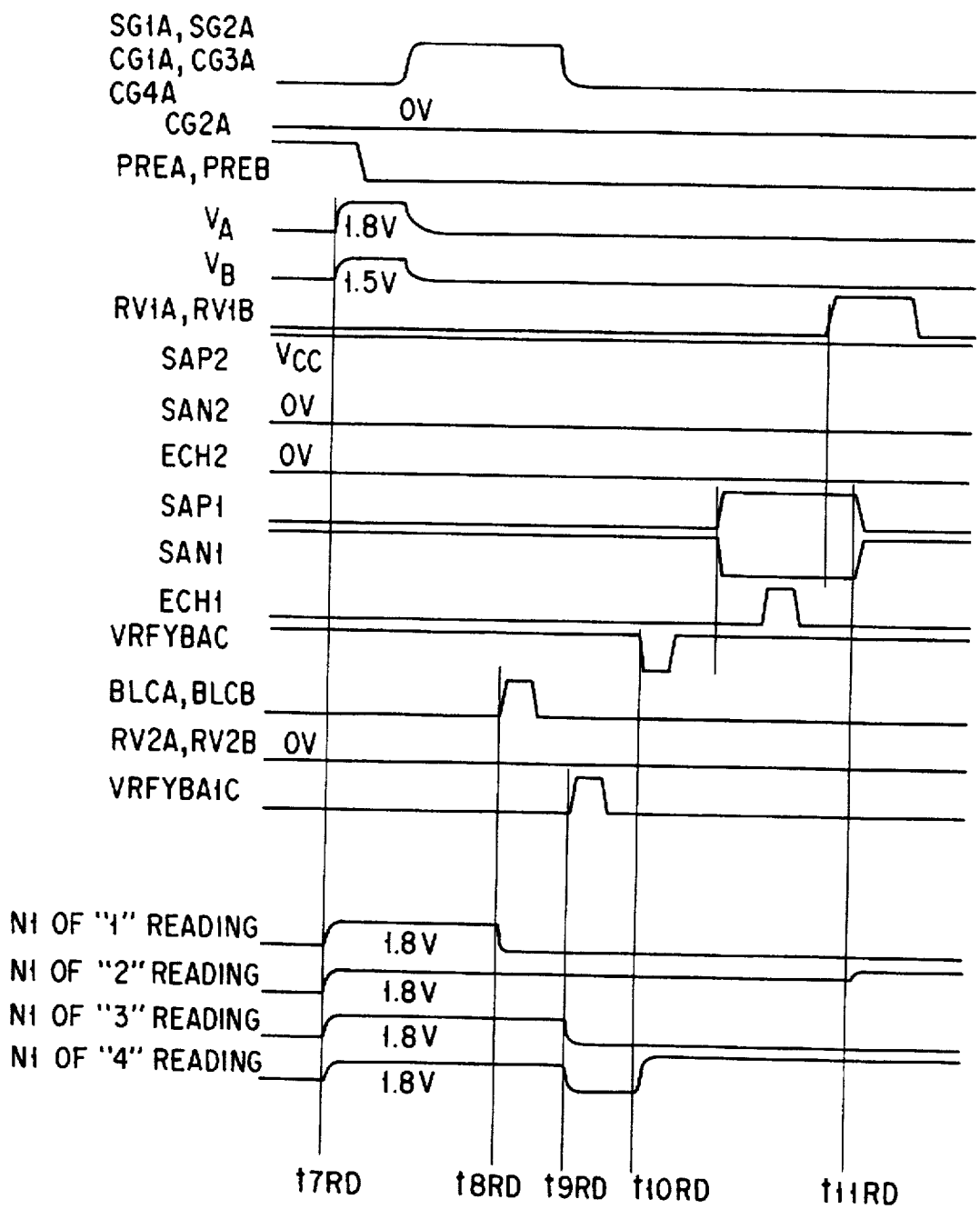

The data item is read from the memory cell as is illustrated in FIG. 69B. At time t7RD, the voltages VA and VB are set at 1.8V and 1.5V, respectively. The bit lines BLa and BLb are thereby set at 1.8V and 1.5V. The signals BLCA and BLCB fall to "L" level, disconnecting the bit line BLa from the MOS capacitor Qd1 and the bit line BLb from the MOS capacitor Qd2. The bit lines BLa and BLb therefore assume floating state. The signals PREB falls to "L" level, setting the nodes N1 and N2, i.e., the gate electrodes of the MOS capacitors Qd1 and Qd2, into floating state. Then, the control gate CG2A of the block selected by the control gate/select gate driving circuit 21 is programmed to 0V, while the control gates CG1A, CG3A and CG4A not selected and the select gates SG1A and SG2A are set at Vcc. If the threshold voltage of the memory cell selected is 0V or less, the bit-line voltage is less than 1.5V. If the threshold voltage is 1V or more, the bit-line voltage will remain at 1.8V.

Thereafter, at time t8RD, the signals BLCA and BLCB rise to "H" level, whereby the data items on the bit lines are transferred to the MOS capacitors Qd1 and Qd2, respectively. Then, the signals BLCA and BLCB fall to "L" level, disconnecting the bit line BLa from the MOS capacitor Qd1 and the bit line BLb from the MOS capacitor Qd2. At time t9RD, the signal VRFYBA1C rises to "H" level. The node N5C in the flip-flop FF2 is at "H" level at this time. This is because the data item being read is "3" or "4" as can be understood from FIG. 71.

In this case, the n-channel MOS transistor Qn2C shown in FIG. 57 is turned on. The node N1 from which either "3" or "4" is being read is connected to the ground.

At time t10RD, the signal VRFYBAC falls to "L" level. The node N3C in the flip-flop FF1 is at "H" level at this time. This is because the data being read is "3" as seen from FIG. 71. In this case, the n-channel MOS transistor Qn12C shown in FIG. 57 is turned on. The node N1 from which "4" is being read is programmed to Vcc. The signals SAN1 and SAP1 change to "L" level and "H" level, deactivating the flip-flop FF1. The signal ECH1 rises to "H" level, equalizing the flip-flop FF1. Thereafter, the signals RV1A and RV1B rise to "H" level. At time t11RD, the signals SAN1 and SAP1 again changes to "H" level and "L" level, respectively. The voltage at the node N1 is thereby sensed and latched. The flip-flop FF1 detects the potentials at the nodes N3C and N4C. The data showing this fact is latched. At this time, the nodes N3C and N4C in the flip-flop FF1 and the nodes N5C and N6C in the flip-flop FF2 are set at the potentials shown in FIG. 72.

The data items of the upper page are read to the nodes N3C and N4C of the flip-flop FF1 (see FIG. 72). More specifically, if the data item being read is either "1" or "3," the nodes N3C and N4C are at "L" level and "H" level, respectively, and if the data item being read is either "2" or "4," the nodes N3C and N4C are at "H" level and "L" level, respectively. As described in conjunction with the programming of the upper page, any data item of the upper page is either "1" or "3," or either "2" or "4." It is ascertained that the write data item programmed has been reliably read into the flip-flop FF1. The data item now held in the flip-flop FF1 is output from the memory chip when the signal CENB1 is activated.

Reading of Lower Page

The lower page is read from the EEPROM, by determining whether each memory cell stores either "1" or "2," or either "3" or "4."

How the lower page is read will be explained, with reference to the timing chart of FIG. 69A.

First, at time t1RD, the voltages VA and VB are set at 1.8V and 1.5V, respectively. The bit lines BLa and BLb are thereby set at 1.8V and 1.5V. The signals BLCA and BLCB fall to "L" level, disconnecting the bit line BLa from the MOS capacitor Qd1 and the bit line BLb from the MOS capacitor Qd2. The bit lines BLa and BLb therefore assume floating state. The signals PREB falls to "L" level, setting the nodes N1 and N2, i.e., the gate electrodes of the MOS capacitors Qd1 and Qd2, into floating state.

Then, the control gate CG2A of the block selected by the control gate/select gate driving circuit 21 is programmed to 1V, while the control gates CG1A, CG3A and CG4A not selected and the select gates SG1A and SG2A are set at Vcc. If the threshold voltage of the memory cell selected is 1V or less, the bit-line voltage is less than 1.5V. If the threshold voltage is 1V or more, the bit-line voltage will remain at 1.8V. At time t2RD, the signals BLCA and BLCB rise to "H" level, and the potentials of the bit lines are applied to the MOS capacitors Qd1 and Qd2.

Thereafter, the signals BLCA and BLCB again fall to "L" level, disconnecting the bit line BLa from the MOS capacitor Qd1 and the bit line BLb from the MOS capacitor Qd2. Signals SAN2 and SAP2 change "L" level and "H" level, respectively, deactivating the flip-flop FF2. The signal ECH2 rise to "H" level, whereby the flip-flop FF2 is equalized. Signals RVA2A and RV2B then rise to "H" level. At time t3RD, the signals SAN2 and SAP2 again change to "H" level and "L" level, respectively. The voltage at the node N1 is thereby sensed and latched. The flip-flop FF2 detects that the memory cell stores either "1" or "2," or either "3" or "4." The data showing this fact is latched. At this time, the nodes N5C and N6C in the flip-flop FF2 are set at the potential shown in FIG. 70.

The data items of the lower page are read to the nodes N5C and N6C of the flip-flop FF1 (see FIG. 70). More specifically, if the data item being read is either "1" or "2," the nodes N5C and N6C are at "L" level and "H" level, respectively, and if the data item being read is either "3" or "4," the nodes N5C and N6C are at "H" level and "L" level, respectively. As described in conjunction with the programming of the lower page, any data item of the lower page is either "1" or "2," or either "3" or "4." It is ascertained that the write data item programmed has been reliably read into the flip-flop FF2. The data item now held in the flip-flop FF2 is output from the memory chip when the signal CENB2 is activated.

As can be understood from the above, the reading of the lower page continues until time t3RD when the reading of the upper page is started. Hence, the upper page can be read while the lower page is being output from the memory chip to an external device. That is, the data item of the lower page is latched in the flip-flop FF1 at time t3RD, and the reading of the upper page continues as shown in FIGS. 69A and 69B, beginning at the same time, i.e., time t3RD. Hence, the upper page can be read, virtually at high speed.

In the eleventh embodiment, the upper page is read and inverted before the lower page is programmed. The lower page can be programmed even if it has not been inverted.

How the lower page is programmed in a four-value data storing NAND-type flash memory, which is the twelfth embodiment of the invention, will be explained, with reference to FIGS. 73A and 73B and FIGS. 74 to 75.

The twelfth embodiment has data circuits which are identical to the data circuit shown in FIG. 57. In the twelfth embodiment, the upper page is programmed in the same way as in the second embodiment.

(1) Upper-Page Reading Prior to Lower-Page Programming

Before the lower page is programmed, a data item of the upper page is written into a memory cell. As a result, the memory cell stores, for example, "1" or "2" as shown in FIG. 61A. A data item of the lower input to the flip-flop FF1 from the external device through the data input/output lines IOA and IOB. At the same time, the data item of the upper page, stored in the memory cell, is read into the flip-flop FF2. The upper page is read in almost the same way as in the eleventh embodiment, as illustrated in the timing chart of FIG. 62. The upper page is not inverted, however. Hence, the reading of the upper page ends at time t4yd when the voltage at the node N1 is thereby sensed and latched. The lower page is not programmed as shown in FIG. 64, but as will be described with reference to FIGS. 73A and 73B. Since no data is inverted, the logic levels of the nodes N5C and N6C in the flip-flop FF2 are inverted with respect to those which the nodes N5C and N6C assume in the eleventh embodiment.

(2) Programming of Lower Page

How the lower page is programmed in the twelfth embodiment will be explained, with reference to the timing chart of FIG. 74.

At time t1pq, the voltage VA used as a bit-line write voltage is programmed to 1V. The bit line BLa is thereby set at 1V. If a voltage drop equivalent to the threshold voltage of the n-channel MOS transistor Qn39 makes a problem, it suffices to raise the level of the signal BLCA. Then, the signal PREA falls to "L" level, setting the bit line BLa in floating state. At time t2pq, the signal VRFYBA1C is programmed to Vcc. The n-channel MOS transistor Qn2C is turned on to hold either "2" or "4." A bit-line control voltage of 0V is applied to the bit lines. The signal VRFYBA1C may be set at a level higher than Vcc. At time t3pq, the signal VRFYBAC is programmed to 0V, a bit-line control voltage of Vcc is applied to th bit lines from any data circuit that holds either "1" or "2."

As a result, the bit line for writing "1" or "2" is programmed to Vcc, the bit line for writing "3" at 1V, the bit line for writing "4" at 0V.

At time t1pq, the select gate SG1A of the block selected by the control gate/select gate driving circuit 21, and the control gates CG1A to CG4A are set at Vcc. The select gate SG2A is at 0V. At time t4pq, the control gate CG2A selected is programmed to a high voltage Vpp (e.g., 20V), and the control gates CG1A, CG3A and CG4A, not selected, are set at a voltage VM (e.g., 10V). In the memory cell connected to any data circuit that holds "4" electrons are injected into the floating gate due to the difference between the channel potential of 0V and the potential Vpp of the control gate. The threshold voltage of the memory cell therefore increases. In the memory cell connected to any data circuit that hold "3," electrons are injected to the floating gate due to the difference between the channel potential of 1V and the potential Vpp of the control gate. The threshold voltage of this cell therefore increases.

The channel of the memory cell which is to be programmed to "3" is programmed to potential of 1V, in order to injects less electrons into the floating gate than in the memory cell which is to be programmed to "4." In the memory cell connected to the data circuit which holds either "1" or "2," the difference between the potential of the channel and the potential Vpp of the control gate is so small that in effect no electrons are injected into the floating gate. Hence, the threshold voltage of the memory cell remains unchanged. During the programming operation, signals SAN1, SAN2, PREB, BLCB remain at "H" level, signals SAP1, SAP2, VRFYBA1C, RV1A, RV1B, RV2B, ECH1 and ECH2 remain at "L" level, and the voltage VB remain at 0V.

(3) Verify-Read Operation of Lower Page

After the programming operation, it is determined whether data has been sufficiently written. (That is, write verify operation is carried out.) If the threshold voltage of the memory cell has reached a desired value, the node N3C of the flip-flop FF1 is programmed to "H" level. Otherwise, the data held in the data circuit is left unchanged, and the data is written again into the memory cell. Data-writing and write verify operation are repeated until any memory cell into which "3" must be written and any memory cell in which "4" must be written come to have desired threshold voltages.

Figure 75:
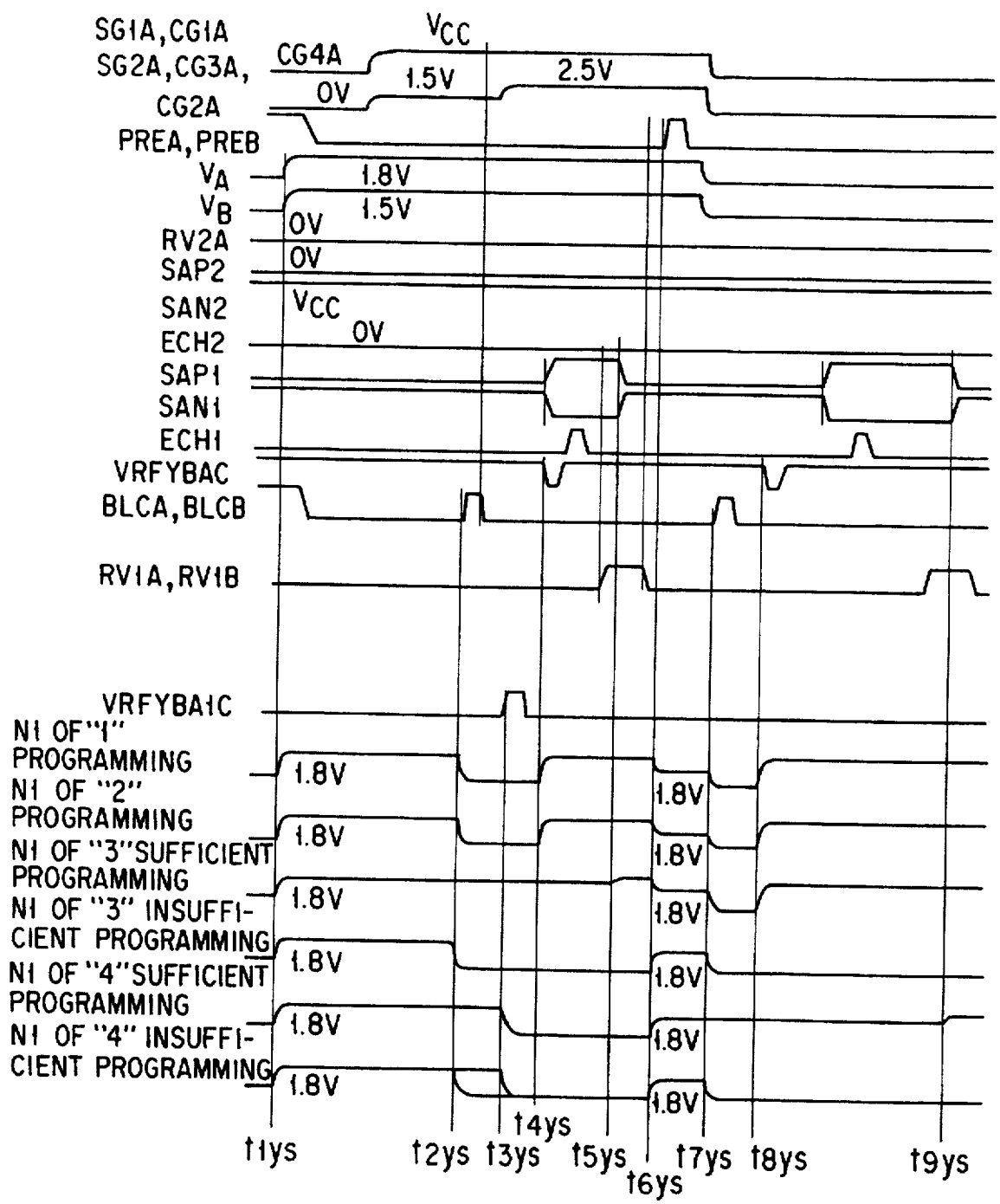
FIG. 75 is a timing chart for explaining how the lower page is verify-read from the twelfth embodiment.

How this write verify operation is effected will be explained with reference to the circuit diagram of FIGS. 57 and the timing chart of FIG. 75.

At time t1ys, the voltages VA and VB are set at 1.8V and 1.5V, respectively. The bit lines BLa and BLb are thereby set at 1.8V and 1.5V. The signals BLCA and BLCB fall to "L" level, disconnecting the bit line BLa from the MOS capacitor Qd1 and the bit line BLb from the MOS capacitor Qd2. The bit lines BLa and BLb therefore assume floating state. The signals PREB falls to "L" level, setting the nodes N1 and N2, i.e., the gate electrodes of the MOS capacitors Qd1 and Qd2, into floating state. Then, the control gate CG2A of the block selected by the control gate/select gate driving circuit 21 is programmed to 1.5V, while the control gates CG1A, CG3A and CG4A not selected and the select gates SG1A and SG2A are set at Vcc. If the threshold voltage of the memory cell selected is 1.5V or less, the bit-line voltage is less than 1.5V. If the threshold voltage is 1.5V or more, the bit-line voltage will remain at 1.8V.

At time t2ys, the signals BLCA and BLCB rise to "H" level, and the potentials of the bit lines are applied to the nodes N1 and N2. Then, the signals BLCA and BLCB fall to "L" level, disconnecting the bit line BLa from the MOS capacitor Qd1 and the bit line BLb from the MOS capacitor Qd2. At time t3ys, the signal VRFYBA1C is programmed to Vcc. The n-channel MOS transistor Qn2C is turned on to hold either "2" or "4," and the node N1 is discharged to 0V. At time t4ys, the signal VRFYBAC is programmed to "L" level. Then, in the data circuit holding either "1" or "2," the p-channel MOS transistor Qp12C is turned on and the node N1 is programmed to Vcc. Namely, the node N1 is programmed to Vcc to write "1" or "2" into the memory cell, and at 0V to write "4" into the memory cell.

Then, the signals SAN1 and SAP1 change to "L" level and "H" level, respectively, deactivating the flip-flop FF1. The signal ECH1 rises to "H" level, equalizing the flip-flop FF1. Thereafter, the signals RV1A and RV1B rise to "H" level. The signals SAN1 and SAP1 again changes to "H"

level and "L" level, respectively. At time t5ys, the voltage at the node N1 is sensed and latched. It is determined whether the memory cell connected to the data circuit holding the write data "3" has been sufficiently programmed to data "3" or not. If the memory cell stores "3," the flip-flop FF1 senses and latches the voltage at the node N1, whereby the data to be written into the memory cell is changed to "1." If the data in the memory cell is not "3," the flip-flop FF1 senses and latches the voltage at the node N2, whereby the data "3" is maintained in the data circuit. Data item "1," "2" and "4" remain unchanged in whichever data circuits they are held.

Next, the control gate selected is set 2.5V. If the threshold voltage of the memory cell selected is 2.5V or less, the bit-line voltage is less than 1.5V. If the threshold voltage is 2.5V or more, the bit-line voltage remains at 1.8V. At time t6ys, the signals PREA and PREB are set at "H" level. The potential of the bit lines are applied to the nodes N1 and N2. Then, at time t7ys, the signals BLCA and BLCB are set at "H" level, disconnecting the bit line BLa from the MOS capacitor Qd1 and the bit line BLb from the MOS capacitor Qd2. At time t8ys, the signal VRFYBAC falls to "L" level. In any data circuit that holds "1" or "2" and in any data circuit that holds "1" because "3" has been sufficiently programmed, the p-channel MOS transistor Qp12 is turned on, and the node N1 is programmed to Vcc.

The signals SAN1 and SAP1 change to "L" level and "H" level. The flip-flop FF1 is thereby deactivated. The signal ECH1 rises to "H" level, equalizing the flip-flop FF1. Then, the signals RV1A and RV1B rises to "H" level. The signals SAN1 and SAP 1 change to "H" level and "L" level. At time t9ys, the voltage at the node N1 is thereby sensed and latched. It is determined whether the memory cell connected to the data circuit holding the write data "4" has been sufficiently programmed to data "4" or not. If this memory cell stores "4," the flip-flop FF1 senses and latches the voltage at the node N1, whereby the data to be written into the memory cell is changed to "2." No data item is written into the memory cell thereafter. If the data in the memory cell is not "4," the flip-flop FF1 senses and latches the voltage at the node N1, whereby the data item "4" is held in the data circuit and written therefrom into the memory cell. Then, additional data-writing is carried out. Data items "1," "2" and "3" remain unchanged in whichever data circuits they are held.

When the threshold voltages of all memory cells selected reach the desired values, the nodes N4C in the data circuits fall to "L" level. Thus, when the nodes N4C are found at "L" level, it is known that all memory cells selected have the desired threshold voltages. To determine that the cells are programmed, the write completion detection transistor Qn5C shown in FIG. 57 may be used. After the read verification is effected, signal VRTC is programmed to, for example, the precharge voltage Vcc. If there is even one the memory cell insufficiently programmed, the node N4C of the data circuit to which that memory cell is connected is at "H" level. The n-channel MOS transistor Qn5C is turned on, and the signal VRTC falls from the precharge voltage Vcc. When all memory cells selected are sufficiently programmed, the nodes N4C in the data circuits 6-0, 6-1, 6-m-1, and 6**-m fall to "L" level. As a result, the n-channel MOS transistors Qn5C are turned off in any data circuit, whereby the signal VRTC remains at the precharge voltage. Thus it is determined that all memory cells selected have been programmed.

In the eleventh and twelfth embodiments, to program any memory cell that stores a data item "1," thus assuming erased state, the memory cell has a higher threshold voltage to store a data item "3" of the lower page than to store a data item "2" of the upper page.

In the twelfth embodiment, the threshold voltage each memory cell has to store a data item "2" of the upper page is higher than the threshold voltage it has to store a data item "3" of the lower page.

Figures 76A, 76B:
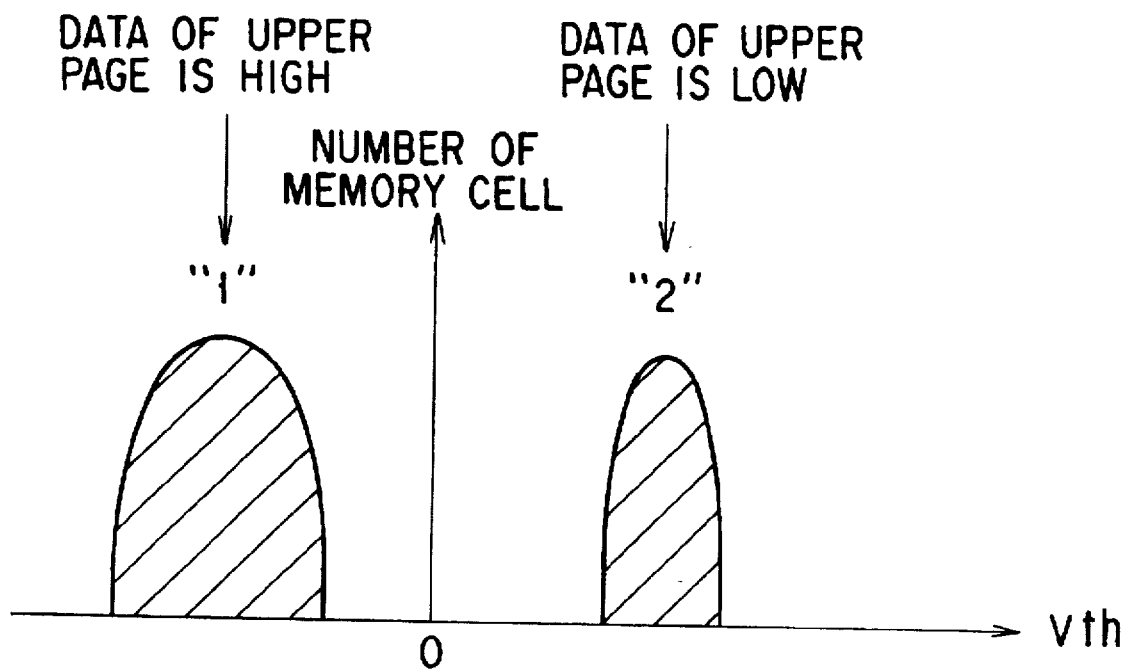
FIGS. 76A and 76B are a diagram and a table showing the data to be programmed in a memory device according to a thirteenth embodiment of the present invention.

A NAND-type flash memory, which is the thirteenth embodiment of the invention, will be described, explained, with reference to FIGS. 76A and 76B and FIGS. 77 to 83.
Programming and Verify-Read Operation of Upper Page The upper page is programmed in the thirteenth embodiment in almost the same way as in the eleventh embodiment. FIGS. 76A and 76B shows the data to be programmed in the thirteenth embodiment. The data is programmed as is illustrated in the timing chart of FIG. 59. The data is verify-read from the NAND-type flash memory as will be explained, with reference to the timing chart of FIG. 77. The thirteenth embodiment differs from the eleventh embodiment in the voltage applied to a selected control gate to verify-read a data item as shown in FIG. 77. Each memory cell is programmed to "2" when it has a threshold voltage ranging from 1.5V to 1.8V, and the data stored in each memory cell is verify-read until the threshold voltage rises to 1.5V.
Programming of Lower Page (1) Reading upper page, data inversion and data load The reading of the upper page and data inversion is carried out in almost the same manner as in the eleventh embodiment, as shown in the timing chart of FIG. 62. However, the voltage applied to the control gate selected (i.e., gate CG2A), to read the data item from the memory cell is 1V, not 0V as in the eleventh embodiment, because the threshold voltage the cell has to store "2" is different from the voltage the cell has to store "3."

(2) Programming

Figures 78A, 78B:
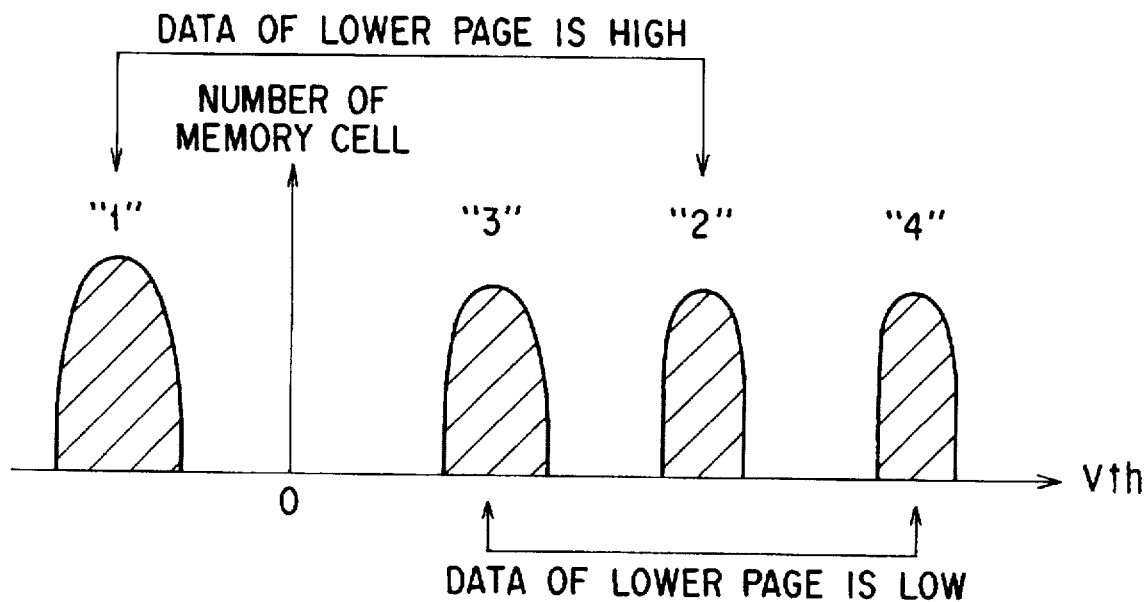
FIGS. 78A and 78B are a diagram and a table showing a lower page to be programmed in a memory device according to a thirteenth embodiment of the present invention.
Figures 79A, 79B:
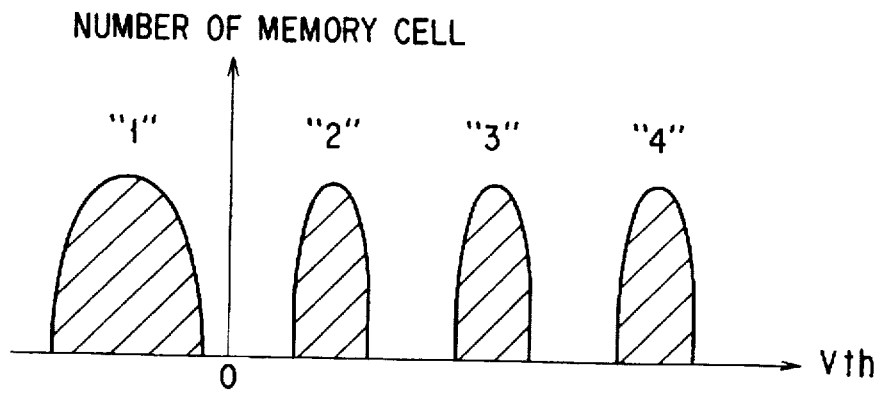
FIGS. 79A and 79B are a diagram and a table showing various potentials which the nodes in a data circuit have to program the lower page in the thirteenth embodiment of the present invention.
Figure 83:
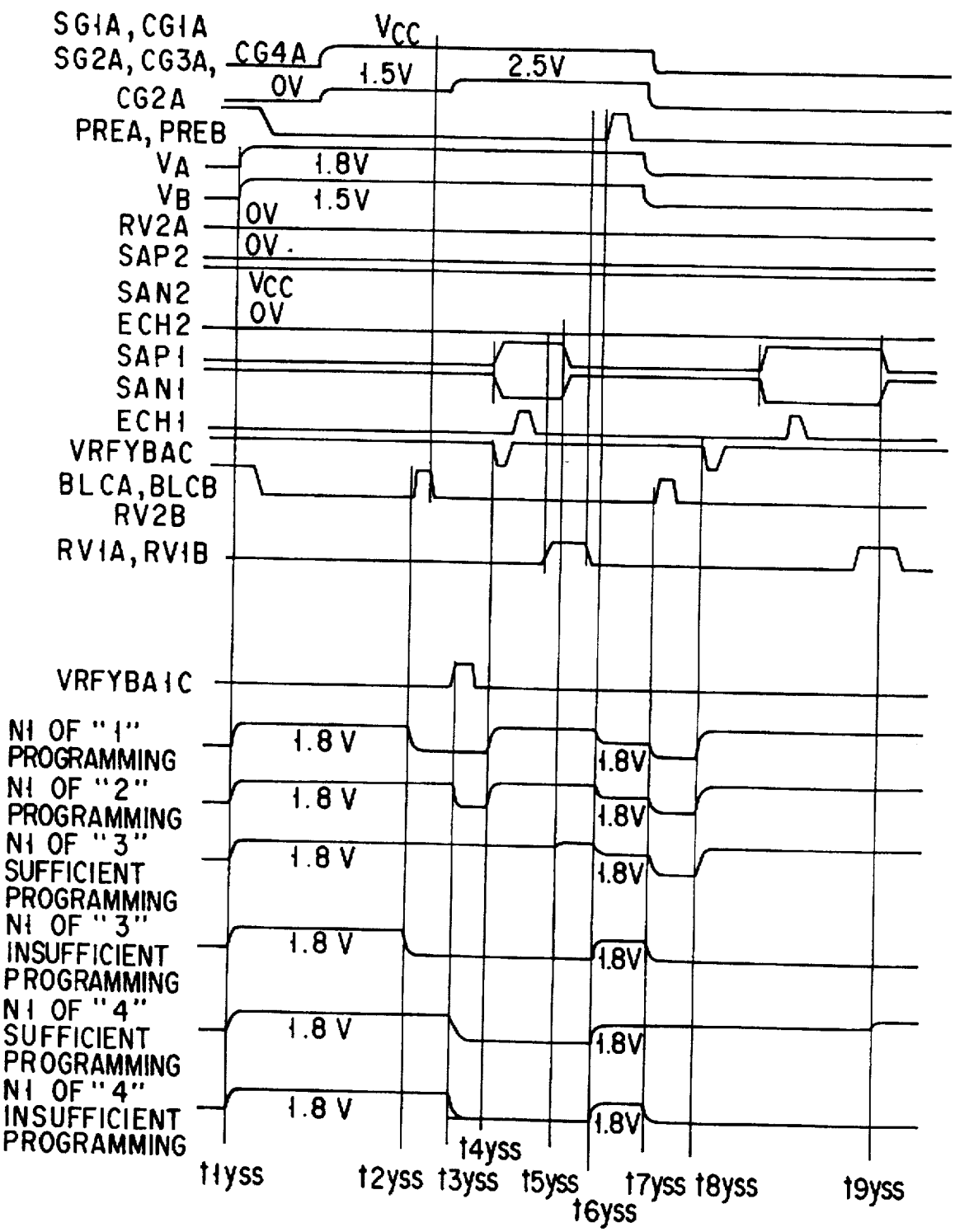
FIG. 83 is a timing chart explaining another method of Verify-Read Operation the lower page from the thirteenth embodiment.

The lower page to be programmed in the thirteenth embodiment is shown in FIGS. 78A and 78B. As seen from FIGS. 78A and 78B, the memory cell is programmed to "1" or "2" when the input data item is at "H" level. When the input data item is "L" level, the memory cell is programmed to "3" instead of "1", or to "4" instead of "2." FIGS. 79A and 79B represent the various potentials which the nodes in each data circuit have to program the lower page.

How the lower page is programmed in the thirteenth embodiment will be explained, with reference to the timing chart of FIG. 80.

At time t1ps, the voltage VA used as a bit-line write voltage is programmed to 2V. The bit line BLa is thereby set at 2V. If a voltage drop equivalent to the threshold voltage of the n-channel MOS transistor Qn39 makes a problem, it suffices to raise the level of the signal BLCA. Then, the signal PREA falls to "L" level, setting the bit line BLa in floating state. At time t2ps, the signal RV2A is programmed to 1.5V. The data circuit holding "2" or "4" applies a bit-line control voltage of 0V to the bit line. If the n-channel MOS transistor Qn32 has a threshold voltage of 1V, the transistor Qn32 is turned off to store either "1" or "3" and turned on to store either "2" or "4." Thereafter, at time t3ps, the signal VRFYBAC is programmed to 0V. The data circuit holding "1" or "2" applies a bit-line controlling voltage of Vcc to the bit line.

As a result, the bit line for writing "1" or "2" is programmed to Vcc, the bit line for writing "3" at 1V, the bit line for writing "4" at 0V.

At time t4sp, the select gate SG1A of the block selected by the control gate/select gate driving circuit 21, and the control gates CG1A to CG4A are set at Vcc. The select gate SG2A is at 0V. Next, the control gate CG2A selected is programmed to a high voltage vpp (e.g., 20V), and the control gates CG1A, CG3A and CG4A, not selected, are set at a voltage VM (e.g., 10V). In the memory cell connected to any data circuit that holds "4," electrons are injected into the floating gate due to the difference between the channel potential of 0V and the potential Vpp of the control gate. The threshold voltage of the memory cell therefore increases. In the memory cell connected to any data circuit that hold "3," electrons are injected to the floating gate due to the difference between the channel potential of 1V and the potential Vpp of the control gate. The threshold voltage of this cell therefore increases.

The channel of the memory cell which is to be programmed to "3" is programmed to potential of 1V, in order to injects less electrons into the floating gate than in the memory cell which is to be programmed to "4." In the memory cell connected to the data circuit which holds either "1" or "2,"1 the difference between the potential of the channel and the potential Vpp of the control gate is so small that in effect no electrons are injected into the floating gate. Hence, the threshold voltage of the memory cell remains unchanged. During the programming operation, signals SAN1, SAN2, PREB, BLCB remain at "H" level, signals SAP1, SAP2, VRFYBA1C, RV1A, RV1B, RV2B, ECH1 and ECH2 remain at "L" level, and the voltage VB remain at 0V.

(3) Verify-Read Operation of Lower Page

After the programming operation, it is determined whether data has been sufficiently written. (That is, write verify operation is carried out.) If the threshold voltage of the memory cell has reached a desired value, the node N3C of the flip-flop FF1 is programmed to "H" level. Otherwise, the data held in the data circuit is left unchanged, and the data is written again into the memory cell. Data-writing and write verify operation are repeated until any memory cell into which "3" must be written and any memory cell in which "4" must be written come to have desired threshold voltages.

How the write verify operation is effected will be explained with reference to the circuit diagram of FIGS. 57 and the timing chart of FIG. 81.

First, it is determined whether or not the threshold voltage of any memory cell which is to store "3" has reached a desired value. More specifically, at time t1yy, the voltages VA and VB are set at 1.8V and 1.5V, respectively. The bit lines BLa and BLb are thereby set at 1.8V and 1.5V. The signals BLCA and BLCB fall to "L" level, disconnecting the bit line BLa from the MOS capacitor Qd1 and the bit line BLb from the MOS capacitor Qd2. The bit lines BLa and BLb therefore assume floating state. The signals PREB falls to "L" level, setting the nodes N1 and N2, i.e., the gate electrodes of the MOS capacitors Qd1 and Qd2, into floating state. Then, the control gate CG2A of the block selected by the control gate/select gate driving circuit 21 is programmed to 0.5V, while the control gates CG1A, CG3A and CG4A not selected and the select gates-SG1A and SG2A are set at Vcc. If the threshold voltage of the memory cell selected is 0.5V or less, the bit-line voltage is less than 1.5V. If the threshold voltage is 0.5V or more, the bit-line voltage will remain at 1.8V.

At time t2yy, the signals BLCA and BLCB rise to "H" level, and the potentials of the bit lines are applied to the nodes N1 and N2. Then, the signals BLCA and BLCB fall to "L" level, disconnecting the bit line BLa from the MOS capacitor Qd1 and the bit line BLb from the MOS capacitor Qd2. At time t3yy, the signal RV2A is programmed to 1.5V. The node N1 is discharged to 0V to write either "2" or "4."

At time t4yy, the signal VRFYBAC is programmed to "L" level. Then, in the data circuit holding either "1" or "2," the p-channel MOS transistor Qp12C is turned on and the node N1 is programmed to Vcc. Namely, the node N1 is programmed to Vcc to write "1" or "2" into the memory cell, and at 0V to write "4" into the memory cell.

Then, the signals SAN1 and SAP1 change to "L" level and "H" level, respectively, deactivating the flip-flop FF1. The signal ECH1 rises to "H" level, equalizing the flip-flop FF1. Thereafter, the signals RV1A and RV1B rise to "H" level. The signals SAN1 and SAP1 again changes to "H" level and "L" level, respectively. At time t5yy, the voltage at the node N1 is sensed and latched. It is determined whether the memory cell connected to the data circuit holding the write data "3" has been sufficiently programmed to data "3" or not. If the memory cell stores "3," the flip-flop FF1 senses and latches the voltage at the node N1, whereby the data to be written into the memory cell is changed to "1." If the data in the memory cell is not "3," the flip-flop FF1 senses and latches the voltage at the node N2, whereby the data "3" is maintained in the data circuit. Thereafter, additional data-writing is effected. Data item "1," "2" and "4" remain unchanged in whichever data circuits they are held.

Next, the control gate selected is set 2.5V. If the threshold voltage of the memory cell selected is 2.5V or less, the bit-line voltage is less than 1.5V. If the threshold voltage is 2.5V or more, the bit-line voltage remains at 1.8V. At time t6yy, the signals PREA and PREB are set at Vcc, and the nodes N1 and N2 are set at 1.8V and 1.5V, respectively. The nodes N1 and N2 then assumes floating state. At time t7yy, the signals BLCA and BLCB are set at "H" level, disconnecting the bit line BLa from the MOS capacitor Qd1 and the bit line BLb from the MOS capacitor Qd2. At time t8yy, the signal VRFYBAC falls to "L" level. In any data circuit that holds "1" or "2" and in any data circuit that holds "1" because "3" has been sufficiently programmed, the p-channel MOS transistor Qp12 is turned on, and the node N1 is programmed to Vcc.

The signals SAN1 and SAP1 change to "L" level and "H" level. The flip-flop FF1 is thereby deactivated. The signal ECH1 rises to "H" level, equalizing the flip-flop FF1. Then, the signals RV1A and RV1B rises to "H" level. The signals SAN1 and SAP1 change to "H" level and "L" level. At time t9yy, the voltage at the node N1 is thereby sensed and latched. It is thereby, determined whether the memory cell connected to the data circuit holding the write data "4" has been sufficiently programmed to data "4" or not. If this memory cell stores "4," the flip-flop FF1 senses and latches the voltage at the node N1, whereby the data to be written into the memory cell is changed to "2." No data item is written into the memory cell thereafter. If the data in the memory cell is not "4," the flip-flop FF1 senses and latches the voltage at the node N1, whereby the data item "4" is held in the data circuit and written therefrom into the memory cell. Additional data-writing is then performed. Data items "1," "2" and "3" remain unchanged in whichever data circuits they are held.

When the threshold voltages of all memory cells selected reach the desired values, the nodes N4C in the data circuits fall to "L" level. Thus, when the nodes N4C are found at "L" level, it is known that all memory cells selected have the desired threshold voltages. To determine that the cells are programmed, the write completion detection transistor Qn5C shown in FIG. 57 may be used. After the read verification is effected, signal VRTC is programmed to, for example, the precharge voltage Vcc. If there is even one the memory cell insufficiently programmed, the node N4C of the data circuit to which that memory cell is connected is at "H" level. The n-channel MOS transistor Qn5C is turned on, and the signal VRTC falls from the precharge voltage Vcc. When all memory cells selected are sufficiently programmed, the nodes N4C in the data circuits 6-0, 6-1, . . . 6-m-1, and 6-m fall to "L" level. As a result, the n-channel MOS transistors Qn5C are turned off in any data circuit, whereby the signal VRTC remains at the precharge voltage. Thus it is determined that all memory cells selected have been programmed.

Reading of Upper Page

The upper page is read from the thirteenth embodiment, by detecting whether each memory cell stores either "1" or "3," or either "2" or "4." More precisely, 1V is applied to the control gate selected, to determine whether a current flows through the memory cell. As shown in the timing chart of FIG. 69A, the flip-flop FF2 latches the data item at time t3RD. Then, the signal CENB2 is programmed to "H" level, whereby the data item of the upper page is output to the external device. At this time, the flip-flip FF2 latches the data shown in FIG. 70.

Reading of Lower Page

The lower page is read from the thirteenth embodiment, by determining whether each memory cell stores either "0" or "2," or either "1" or "3," as is illustrated in the timing chart of FIGS. 69A and 69B.

To read data items, the nodes in the flip-flops FF1 and FF2 are set at the potentials represented in FIG. 72. The data item of the lower page is stored in the flip-flop FF1 (more correctly, at the nodes N3C and N4C). The data of the lower page can be output to the external device by activating the signal CENB1.

As can be understood from the above, the reading of the upper page continues until time t3RD when the reading of the lower page is started. Hence, the lower page can be read after the upper page, while the upper page is being output to from the memory chip to the external device. That is, the data item of the upper page is latched in the flip-flop FF2 at time t3RD, and the reading of the lower page continues as shown in FIGS. 69A and 69B, beginning at the same time, i.e., time t3RD. Hence, the lower page can be read, virtually at high speed.

Another Method of Programming Lower Page

In the thirteenth embodiment, the upper page is read and inverted before the lower page is programmed. As in the twelfth embodiment, the data of the upper page need not be inverted. The data is read from the thirteenth embodiment in almost the same way as in the twelfth embodiment, until time t4yd (FIG. 62). The thirteenth embodiment differs in that the control gate CG2A is programmed to 1V, not 0V, because each memory cell is programmed to "2" when it has a threshold voltage ranging from 1.5V to 1.8V. In the thirteenth embodiment, the programming operation and verify reading are performed as shown in the timing charts of FIGS. 82 and 83, almost in the same manner as in the twelfth embodiment, and therefore will not be described here in detail.

A multi-value storing memory, which is a fourteenth embodiment of the invention, will be described, with reference to FIGS. 84A and 84B to FIG. 91.

In this embodiment, data item "1" corresponds to the first threshold voltage of each memory cell, data item "2" to the second threshold voltage thereof, data item "3" to the third threshold voltage thereof, and so forth. Generally, data item "i" corresponds to the i-th threshold voltage of an n-value memory cell, where i is a natural number smaller than n, and n is 4 or a greater natural number. The data item can be changed as is illustrated in FIGS. 90A to 90E.

If each memory cell stores a data item "1," "2," $2^{k-1}-1$, or "$2^k-1$" (k is 2 or a greater natural number), the data item is changed to "1," "2," . . . , $2^k-1$," or "$2^k$," respectively, according to its own value and the write data item supplied from the external device. If each memory cell stores a data item "1," "2," . . . $2^k-1$," or "$2^k$," the data item is changed to "1," "2," . . . "$2^{k+1}-1$," or "$2^{k+1}$" according to its own value and the write data item supplied from the external device. If each memory cell stores a data item "1," "2," . . . "$2^{m-1}-1$," or "$2^{m-1}$" (m is a natural number, satisfying n=2m), the data item is changed to "1," "2," . . . "$2^m-1$" or "$2^m$" according to its own value the write data item supplied from the external device.

The fourteenth embodiment may be four-value storing memory which has four-value memory cells. In this case, each memory cell store "1," "2," "3" or "4" according to the data item which it stores and the write data item which is input to it, if the memory cell stores either "1" or "2," as is illustrated in FIGS. 84A and 84B.

Figure 84A:
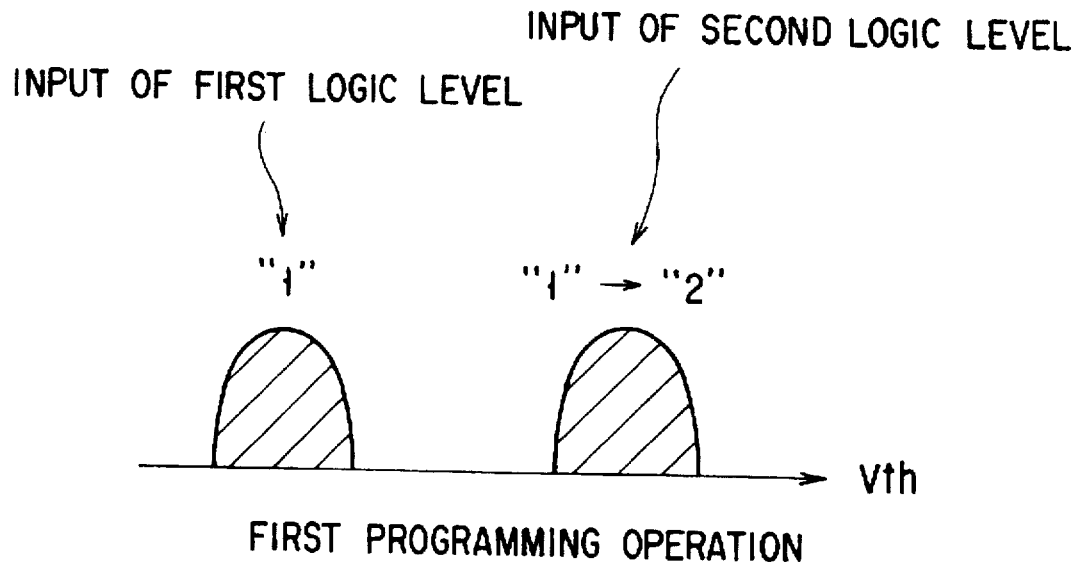
FIGS. 84A and 84B are diagrams for explaining a method of programming the four-value cells provided in a memory device according to a fourteenth embodiment of the invention.
Figure 84B:
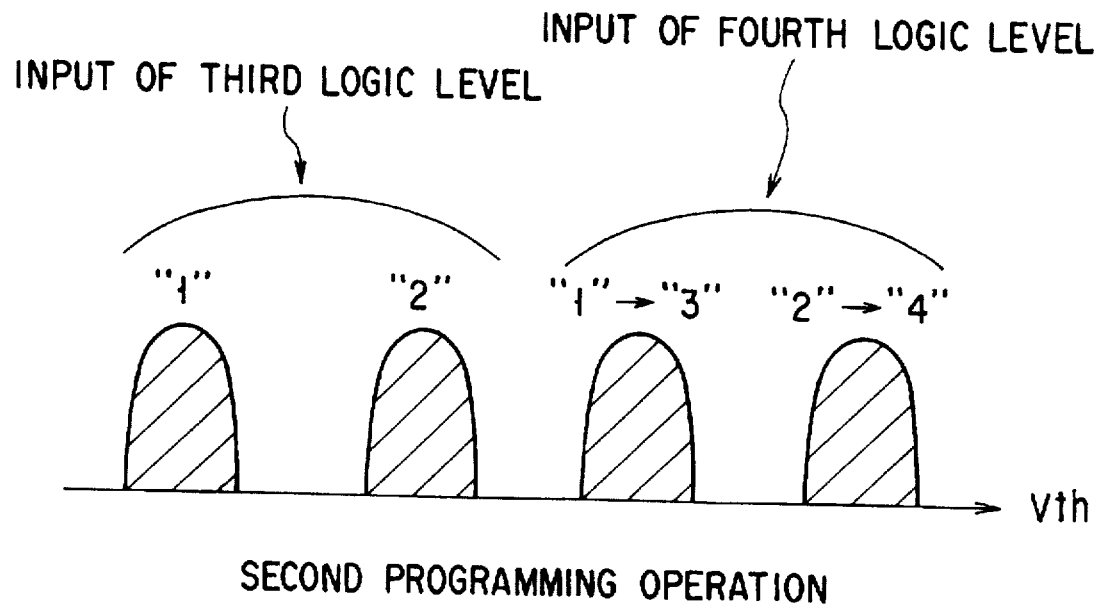

As shown in FIGS. 84A and 84B, too, in the first programming operation, the memory cell stores "1" if the first logic level is input to it, and stores "2" if the second logic level is input to it. In the second programming operation, the data item "1" stored in the cell remains unchanged when the third logic level is input to the cell and changes to "3" if the fourth logic level is input to the cell, or the data "2" stored in the cell remains unchanged if the third logic level is input to the cell and changes to "4" if the fourth logic level is input to the cell.

As shown in FIG. 85, the fourteen embodiment comprises memory cells (only one shown) and data circuits (only one shown). Each memory cell is an n-value cell which can store data items "1," "2," "3," a natural number smaller than n, and n is 4 or a greater natural number). Each data circuit is provided to hold the data item to be written into the memory cell.

Assume that the memory cell stores either "1" or "2." Then, the data item stored in the memory cell is changed to "1," "2," "3" or "4" depending on its own value and also on the write data item input from the external device.

In the first programming operation, the memory cell will store "1" if the first write data item the data circuit holds is the first logic level, and will store "2" if the first write data item is the second logic level. The data circuit holds the first write data item and the data item read from the memory cell. Thereafter, the memory cell will store "1" if the second write data item is the third logic level, and will store "3" if the second write data item is the fourth logic level, provided that the memory cell has been storing "1." The memory cell will store "2" if the second write data item is the third logic level, and will store "4" if the second write data item is the fourth logic level, provided that the memory cell has been storing "2."

In the case where the memory cell is a four-value cell, it is only necessary to have various threshold voltages which are distributed as shown in FIGS. 84A and 84B. The fourteenth embodiment can be programmed as is explained in FIGS. 84A and 84B and FIG. 85. As shown in FIG. 85, each data circuit may comprise two latch circuits.

In the first programming operation, the first write data item is input to the first latch circuit via the I/O line. As shown in FIG. 84A, the memory cell will store "1" if the first write data item is the first logic level, and will store "2" if the first write data item is the second logic level.

In the second programming operation, the first latch circuit in the data circuit latches the second write data item input from the external device, and the second latch circuit holds the first write data item read from the memory cell. Then, as shown in FIG. 84B, the memory cell will store "1" if the second write data item held in the data circuit is the third logic level, and will store "3" if the second write data item held in the data circuit is the fourth logic level, provided that the memory cell has been storing "1." Alternatively, the memory cell will store "2" if the second write data item held in the data circuit is the third logic level, and will store "4" if the second write data item held in the data circuit is the fourth logic level, provided that the memory cell has been storing "2."

The memory cells incorporated in the fourteenth embodiment are not limited to four-value cells. They may be eight-value cells, 16-value cells, and so on. Generally, they are 2m-value cells (m is a natural number.) Data to be stored in each memory cell is not limited to a multiple of 2. Rather, it may be three-value data, or five-value data item. of course, the data can be 6-value data, 10-value data, or 280-value data.

Figure 86A:
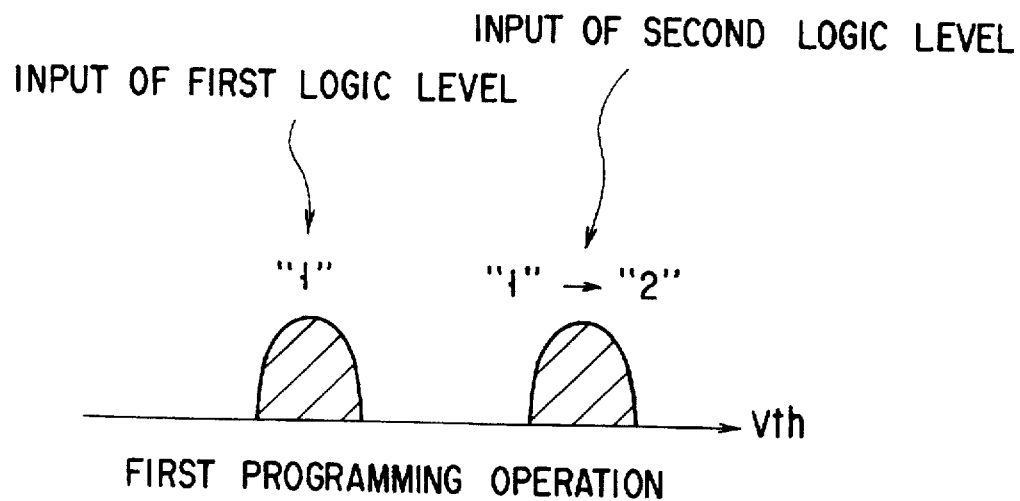
FIGS. 86A to 86C are diagrams for explaining how each eight-value cell is programmed in the fourteenth embodiment.
Figure 86B:
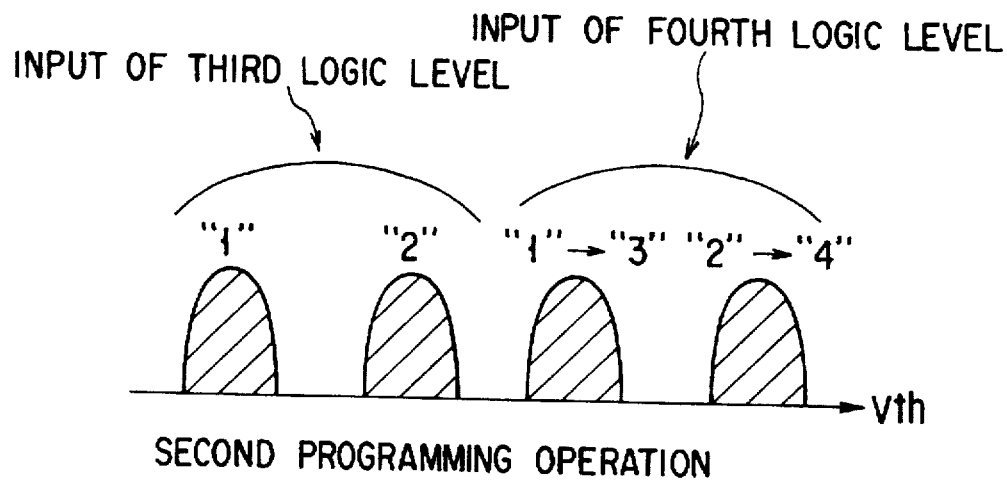
Figure 86C:
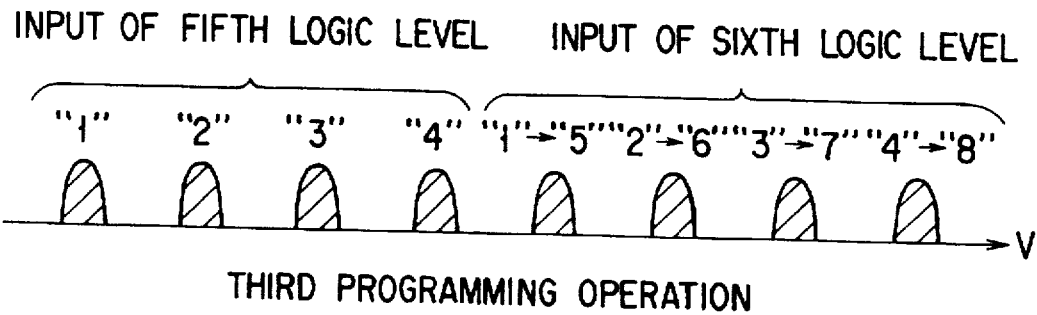

If the memory cells are eight-value cells, they may have various threshold voltages which are distributed as specified in FIGS. 86A to 86C and can be programmed as will be explained, with reference to FIGS. 86A to 86C. In this case, each of the data circuit has three latch circuits as shown in FIG. 87.

In the first programming operation, the first write data item is input to the first latch circuit via the I/O line. As shown in FIG. 86A, the memory cell will store "1" if the first write data item is the first logic level, and will store "2" if the first write data item is the second logic level, the memory cell will store "2."

In the second programming operation, the first latch circuit in the data circuit latches the second write data item input from the external device, and the second latch circuit holds the first write data item read from the memory cell. Thereafter, as shown in FIG. 86B, the memory cell will store "1" if the second write data item held in the data circuit is the third logic level, and will store "3" if the second write data item held in the data circuit is the fourth logic level, provided that the memory cell has been storing "1." Alternatively, the memory cell will store "2" if the second write data item held in the data circuit is the third logic level, and will store "4" if the second write data item held in the data circuit is the fourth logic level, provided that the memory cell has been storing "2."

In the third programming operation, the first latch circuit in the data circuit latches the third write data item input from the external device, and the second and third latch circuits hold the first and second write data items read from the memory cell, respectively. As shown in FIG. 86C, the memory cell will store "1," "3" or "4" if the third write data item is the fifth logic level, and will store "5," "6," "7" and "8," respectively, if the third write data item is the sixth logic level.

If the memory cells are 16-value cells, they may have various threshold voltages which are distributed as specified in FIGS. 88A to 88D and can be programmed as will be explained, with reference to FIGS. 88A to 88D. In this case, each of the data circuit has four latch circuits as illustrated in FIG. 89.

In the first programming operation, the first write data item is input to the first latch circuit via the I/O line. As shown in FIG. 88A, the memory cell will store "1" if the first write data item is the first logic level, and will store "2" if the first write data item is the second logic level, the memory cell will store "2."

In the second programming operation, the first latch circuit in the data circuit latches the second write data item input from the external device, and the second latch circuit holds the first write data item read from the memory cell. Thereafter, as shown in FIG. 88B, the memory cell will store "1" if the second write data item held in the data circuit is the third logic level, and will store "3" if the second write data item held in the data circuit is the fourth logic level, provided that the memory cell has been storing "1." Alternatively, the memory cell will store "2" if the second write data item held in the data circuit is the third logic level, and will store "4" if the second write data item held in the data circuit is the fourth logic level, provided that the memory cell has been storing "2."

In the third programming operation, the first latch circuit in the data circuit latches the third write data item input from the external device, and the second and third latch circuits hold the first and second write data items read from the memory cell, respectively. As shown in FIG. 86C, the memory cell will store "1," "3" or "4" if the third write data item is the fifth logic level, and will store "5," "6," "7" and "8," respectively, if the third write data item is the sixth logic level.

In the fourth programming operation, the first latch circuit in the data circuit latches the fourth write data item input from the external device, and the second, third and fourth latch circuits hold the first, second and third write data items read from the memory cell, respectively. Then, as shown in FIG. 88C, the memory cell will store one of data items "1" to "8" if the fourth write data item is the seventh logic level, and will store one of the data items "9" to "16" if the fourth write data is the eighth logic level.

If the memory cells are $2^m$-value cells, they may have various threshold voltages which are distributed as specified in FIGS. 90A to 90E and can be programmed as will be explained, with reference to FIGS. 90A to 90E. In this case, each of the data circuit has m latch circuits as illustrated in FIG. 91.

Figure 90A:
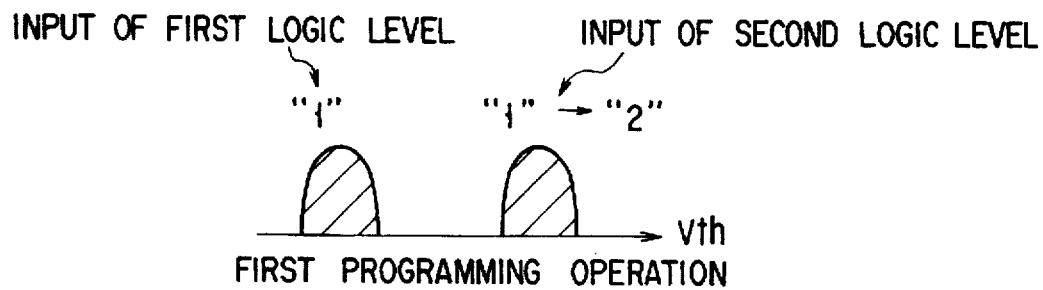
FIGS. 90A to 90E are diagrams for explaining how each 2m-value cell is programmed in the fourteenth embodiment.

In the first programming operation, the first write data item is input to the first latch circuit via the I/O line. As shown in FIG. 90A, the memory cell will store "1" if the first write data item is the first logic level, and will store "2" if the first write data item is the second logic level, the memory cell will store "2."

Figure 90B:
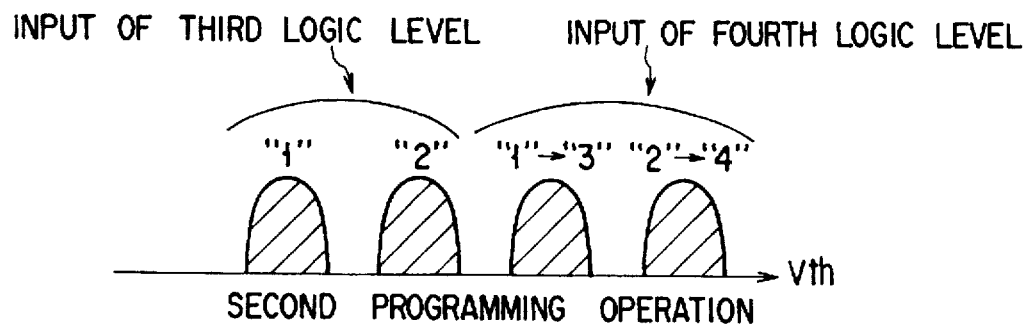

In the second programming operation, the first latch circuit in the data circuit latches the second write data item input from the external device, and the second latch circuit holds the first write data item read from the memory cell. Thereafter, as shown in FIG. 90B, the memory cell will store "1" if the second write data item held in the data circuit is the third logic level, and will store "3" if the second write data item held in the data circuit is the fourth logic level, provided that the memory cell has been storing "1." Alternatively, the memory cell will store "2" if the second write data item held in the data circuit is the third logic level, and will store "4" if the second write data item held in the data circuit is the fourth logic level, provided that the memory cell has been storing "2."

Figure 90C:
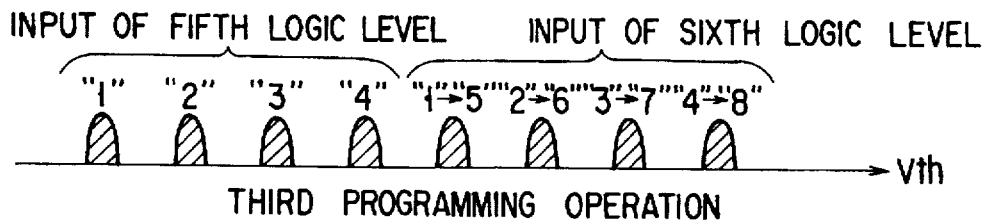

In the third programming operation, the first latch circuit in the data circuit latches the third write data item input from the external device, and the second and third latch circuits hold the first and second write data items read from the memory cell, respectively. As shown in FIG. 90C, the memory cell will store "1," "3" or "4" if the third write data item is the fifth logic level, and will store "5," "6," "7" and "8," respectively, if the third write data item is the sixth logic level.

Figure 90D:
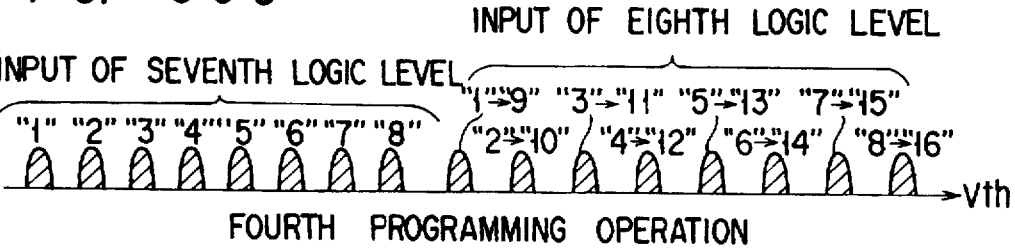
Figure 90E:
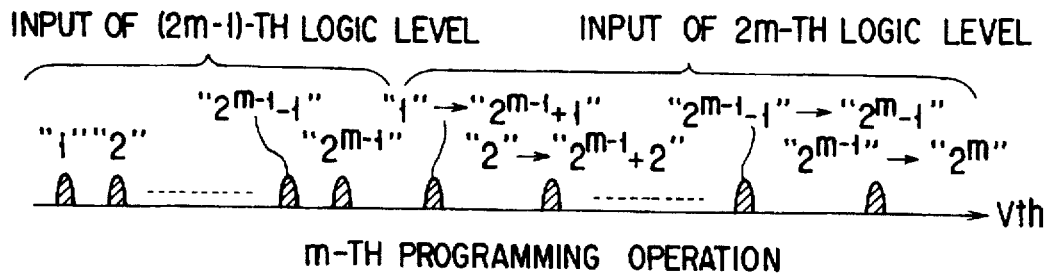

In the fourth programming operation, the first latch circuit in the data circuit latches the fourth write data item input from the external device, and the second, third and fourth latch circuits hold the first, second and third write data items read from the memory cell, respectively. Then, as shown in FIG. 90D, the memory cell will store one of data items "1" to "8" if the fourth write data item is the seventh logic level, and will store one of the data items "9" to "16" if the fourth write data is the eighth logic level.

And, in the m-th programming operation, the first latch circuit in the data circuit latches the mth write data item input from the external device, and the second, third, fourth, . . . and m-th latch circuits hold the first, second, third, . . . , (m−1)th write data items read from the memory cell, respectively. Then, as shown in FIG. 90D, the memory cell will store one of data items "1" to "2m−1" if the m-th write data item is the (2m−1)th logic level.

If the m-th write data item is the 2m-th logic level, the memory cell will store one of the data items "$2^{m-1}+1$," "$2^{m-1}+2$," . . . , "$2^m1$" and "$2^m$," instead of "1," "2," "3," . . . , "$2^{m-1}-1$," "$2^{m-1}$."

In the fourteenth embodiment, data item "1" corresponds to the first threshold voltage of each memory cell, data item "2" to the second threshold voltage thereof, data item "3" to the third threshold voltage thereof, and so forth. Generally, data item "i" corresponds to the i-th threshold voltage of an n-value memory cell (i is a natural number smaller than n, and n is 3 or a greater natural number). The threshold voltage corresponding to the data item written into each memory in the p-th programming operation (p is 1 or a greater natural number) ranges less than the threshold voltage corresponding to the data item written into the memory cell in the (p+1)th programming operation.

A NAND-type flash memory, which is the fifteenth embodiment of the invention, will be described with reference to FIGS. 92A to 100B.

Into the memory cells of this flash memory there can be written a plurality of bits which can be divided into upper bits and lower bits. The upper bits are written into a group of memory cells in the upper-page programming operation. The lower bits are written into another group of memory cells in the lower-page programming operation.

How the upper and lower pages are programmed will be explained, with reference to FIGS. 92A and 92B. Each memory cell of one group remains in erased state, storing "1" if the write upper-page data item is at high level, and stores "2" if the write upper-page data item is at low level. Any memory cell of the other group that stores "1" or "2" remains storing the same data item if the write lower-page data item is at high level, and stores "3" or "4" if the write lower-page data item is at low level. Since a write data item of the upper page is written into one memory cell of one group, while a write data item of the lower page is written into one memory cell of the other group, data can be programmed in the flash memory at higher speed than otherwise.

As seen from FIG. 92A, "2"-verify reading is performed in the upper-page programming operation, to determine whether the memory cell has been sufficiently programmed to "2." By contrast, as shown in FIG. 92B, "3"-verify reading and "4"-verity reading are effected in the lower-page programming operation, to determine whether the memory cell has been sufficiently programmed to either "3" or "4." Generally, the higher the threshold voltage the memory cell has to store a data item, (the cell has the highest threshold voltage to store "4"), the longer the verify reading lasts. In order to change the threshold voltage of the memory-cell transistor in the programming operation, a pulse used as a write bias is supplied to the word line. The write bias is gradually increased, step by step, until the memory cell is sufficiently programmed. If the voltage for writing an upper-page data item and the voltage for writing a lower-page data (hereinafter referred to as "upper-page write voltage" and "lower-page write voltage," respectively are increased, step by step, at the same rate, the upper page can be programmed faster than the lower page.

However, the write time of the flash memory, generally the time required to program one page, is determined by the upper-page programming time or the lower-page programming time, which is longer than the other. Inevitably, the write time is the lower-page programming time which is longer than the upper-page programming time. No great advantage resides in that only the upper page is programmed at high speed. In view of this, the upper page is programmed more slowly and, thus, with higher precision, in the fifteenth embodiment. Hence, the upper-page write time becomes equal to the lower-page write time.

More specifically, the step-up value $\Delta Vpp1$ of the upper-page write voltage is less than the step-up value $\Delta Vpp2$ of the lower-page write voltage—that is, $\Delta Vpp1 < \Delta Vpp2$. Since the upper page is programmed with higher precision than the lower page, the threshold voltage corresponding to data item "2" ranges less than otherwise. This enhances the operating reliability of the memory cell.

The fifteenth embodiment will be described in more detail, in comparison with a NAND-type flash memory in which , $\Delta Vpp1 = \Delta Vpp2$.

Figure 93:
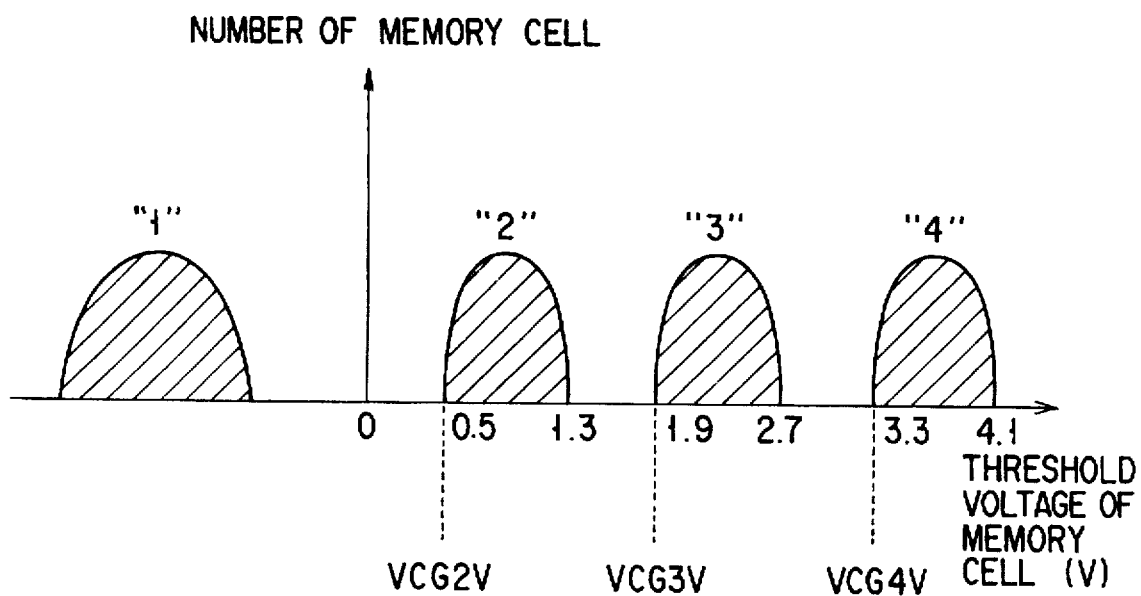
FIG. 93 is a diagram showing the distribution of threshold voltages which each memory cell has in the fifteenth embodiment.
Figure 94:
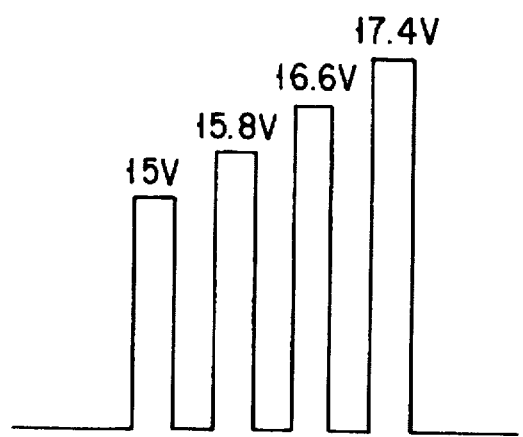
FIG. 94 is a diagram representing the waveform of a pulse signal supplied to each memory cell provided in the fifteenth embodiment.

FIG. 93 shows the distributions of the threshold voltages each memory cell has when the step-up values of the upper-page and lower-page write voltages are equal ($\Delta Vpp1 = \Delta Vpp2$) and when the threshold voltage corresponding to "2" written in the upper-page programming operation is distributed over the same range as the threshold voltages corresponding to "3" and "4" written in the lower-page programming operation. Also shown in FIG. 93 are verify voltages VCG2V, VCG3V and VCG4V which are applied to determine whether or not the memory cell has been sufficiently programmed to "2," "3" and "4," respectively. FIG. 94 illustrates the waveform of the pulse signal supplied to the memory cell in order to program the same.

As seen from FIG. 93, the threshold voltages corresponding to "2," "3" and "4" are distributed over the range of 0.8V. In this case, the upper-page write voltage is increased stepwise, each time by 0.8V, from the initial value of, for example, 15V. On the other hand, the lower-page write voltage is increased stepwise, each time by 0.8V, from the initial value of 17.8V. This initial value of 17.8V is the sum of the initial value (15V) for the upper-page write voltage and the difference (2.8V) between the verify voltages VCG2V and VCG4V (i.e., the voltages applied to determine whether the memory cell has been sufficiently programmed to "2" and "4"). The channel of the memory cell which is to be programmed to "4" and the bit line to which the memory cell is connected are set at 0V. The channel of the memory cell which is to be programmed to "3" and the bit line to which the memory cell is connected are set at 1.4V, which is the difference between the verify voltages VCG3V and VCG4V (i.e., the voltages applied to determine whether the memory cell has been sufficiently programmed to "3" and "4"). These measures taken, data items "3" and "4" can be written almost at the same time during the lower-page programming operation.

FIGS. 95A to 95E show how the threshold voltages of each memory cell are distributed in the fifteenth embodiment. FIGS. 96A to 96D and FIGS. 97A and 97B illustrate the waveforms of the pulse signals supplied to the memory cell in order to program the same.

Figure 95A:
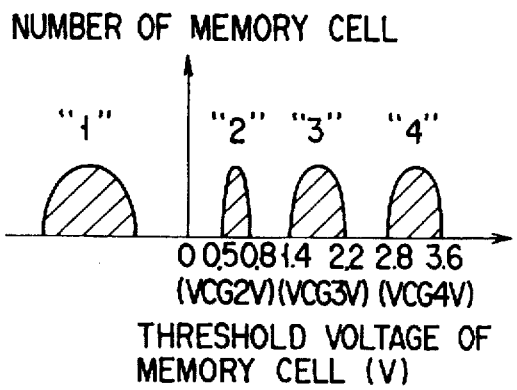
FIGS. 95A to 95E are diagrams illustrating the various distributions of threshold voltages which each memory cell has in the fifteenth embodiment.
Figure 96A:
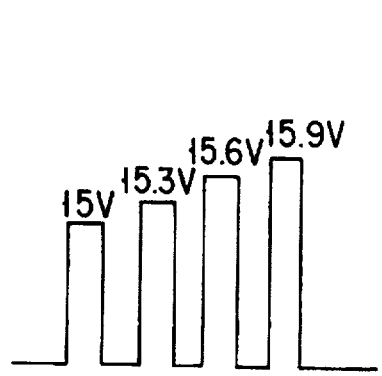
FIGS. 96A to 96D are diagrams showing the waveforms of various pulse signals supplied to each memory cell provided in the fifteenth embodiment.
Figure 96B:
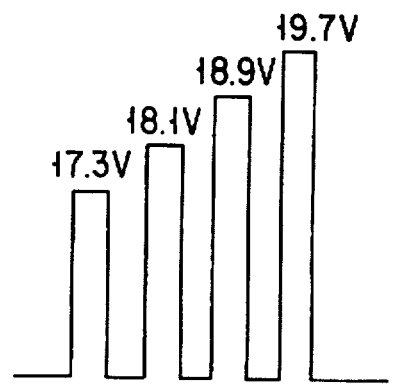

To attain such distributions of threshold voltages as shown in FIG. 95A, it suffices to use the pulse signals of FIGS. 96A and 96B as write voltages. More precisely, the pulse signal of FIG. 96A increasing stepwise, each time by 0.3V, from the initial value of 15V is used as the upper-page write voltage. The range over which the threshold voltage corresponding to "2" is distributed can thereby reduced to 0.3V. Since the step-up value of the upper-page write voltage is only 0.3V, the upper page can be programmed with high precision, but the write time inevitably increases. It is therefore desirable to set the step-up value of the upper-page write voltage at such a value that the upper-page programming time (including the verity-read time) may be substantially equal to the lower-page programming time (including the verity-read time).

As shown in FIG. 96B, the lower-page write voltage is increased stepwise, each time by 0.8V, from the initial value of 17.3V. The initial value of the lower-page write voltage is the sum of the initial value for the upper-page write voltage and the difference between the verify voltages applied to determine whether the memory cell has been sufficiently programmed to "2" and "4," respectively. The step-up value of the lower-page write voltage is 0.8V as in the case where the threshold voltages attain the distributions illustrated in FIG. 93. The channel of the memory cell which is to be programmed to "4" and the bit line to which the memory cell is connected are set at 0V. The channel of the memory cell which is to be programmed to "3" and the bit line to which the memory cell is connected are set at 1.4V, which is the difference between the verify voltages applied to determine whether the memory cell has been sufficiently programmed to "3" and "4". These measures taken, data items "3" and "4" can be written almost at the same time during the lower-page programming operation.

Since the threshold voltage corresponding to "2" is distributed over the range of only 0.3V as shown in FIG. 95A, the range over which the highest threshold voltage corresponding to "4" distributes decreases about 0.5V more than is illustrated in FIG. 93. As a result, the leakage of charge from the floating gate of the memory cell into the substrate is inhibited. The data-holding time of the memory cell can therefore increase two times or three times. This enhances the operating reliability of the memory cell.

Thus, the upper page can be programmed with high precision, but at a decreased speed. Nonetheless, the write speed of the memory chip does not decrease unless the upper-page programming speed is lower than the lower-page programming speed. This is because the write speed of the memory chip is determined by the lower-page programming speed since it takes longer to program the lower page than to program the upper page.

Figure 95B:
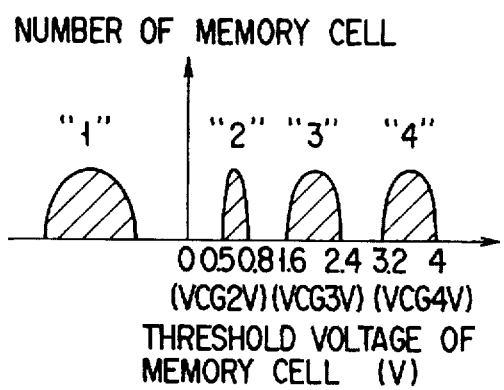

In the present embodiment, the threshold voltages each memory cell may have can be distributed over more or less than is described above. For example, they can be distributed as illustrated in FIG. 95B. In this case, the upper page is programmed with high precision, whereby the range over which threshold voltage corresponding to "2" is distributed is reduced to 0.3V as in the case shown in FIG. 95A. However, the difference among the ranges of the threshold voltages corresponding to "2," "3" and "4" is greater than in the case shown in FIG. 95A.

To be more specific, in the cases shown in FIGS. 93 and 95A, the difference among the ranges of the threshold voltages corresponding to "2," "3" and "4" is 0.6V. If the threshold voltage of the memory cell storing a data item "3" or "4" may decrease by more than 0.6V due to the charge leaking from the floating gate, the data item will change from "3" to "2," or from "4" to "3." That is, the data item may be lost. By contrast, in the case shown in FIG. 95B, the data item stored in the memory cell is not lost unless the threshold voltage decreases by more than 0.8V, because the difference among the ranges of the threshold voltages is 0.8V. Thus, the lifetime of the memory cell is lengthened and, hence, the reliability thereof will increase if the threshold voltages are distributed as illustrated in FIG. 95B.

Figure 96C:
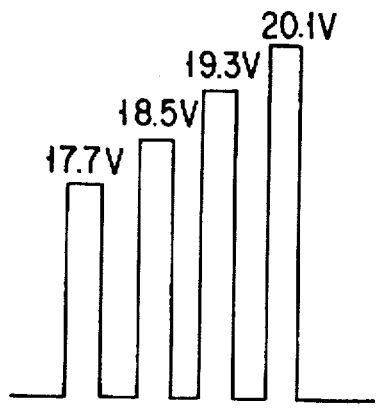

To distribute the threshold voltages as shown in FIG. 95B it suffices to use the pulse signals shown in FIGS. 96A and 96C as the upper-page and lower-page write voltages, respectively. The pulse signal of FIG. 96A used as the upper-page write voltage increases step by step, each time by 0.3V, from the initial value of 15V. When this pulse signal is applied, the distribution range of the threshold voltage corresponding to "2" is reduced to 0.3V. Since the step-up value of the upper-page write voltage is small, the upper page is programmed with high precision, but the upper-page write time increases. In view of this, it is desirable that the step-up value of the upper-page write voltage be such that the upper-page programming time is almost the same as the lower-page programming time. (Either programming time includes the verity-read time.)

On the other hand, the pulse signal of FIG. 96C used as the lower-page write voltage increases step by step, each time by 0.8V, from the initial value of 17.7V. This initial value is the sum of the initial value for the upper-page write voltage and the difference between the verify voltages applied to determine whether the memory cell has been sufficiently programmed to "2" and "4," respectively. The step-up value of the lower-page write voltage is 0.8V as in the case where the threshold voltages attain the distributions illustrated in FIG. 93. The channel of the memory cell which is to be programmed to "4" and the bit line to which the memory cell is connected are set at 0V. The channel of the memory cell which is to be programmed to "3" and the bit line to which the memory cell is connected are set at 1.6V, which is the difference between the verify voltages applied to determine whether the memory cell has been sufficiently programmed to "3" and "4". These measures taken, data items "3" and "4" can be written almost at the same time during the lower-page programming operation.

Figure 95C:
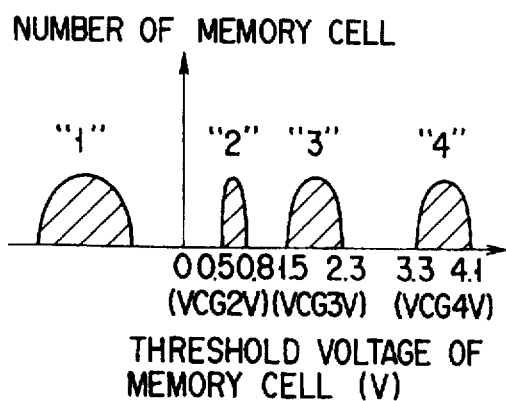

The threshold voltages each memory cell may have can be distributed in another way as illustrated in FIG. 95C. In this case, the difference between the threshold voltages corresponding to "3" and "4" is greater than the difference between the threshold voltages corresponding to "2" and "3," whereas these differences are equal in the case shown in FIGS. 95A and 95B. More correctly, the difference between the threshold voltages corresponding to "2" and "3" is 0.7V, while the difference between the threshold voltages corresponding to "3" and "4" is 1V. This measure is taken since the charge is more likely to leak from the floating gate of the memory cell as the threshold voltage increases, ultimately lowering the threshold voltage.

Figure 96D:
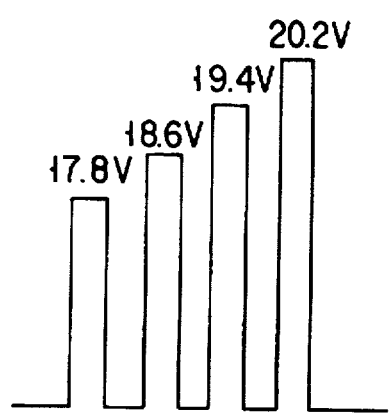

In order to distribute the threshold voltages as shown in FIG. 95C it suffices to use the pulse signals shown in FIGS. 96A and 96D as the upper-page and lower-page write voltages, respectively. The pulse signal of FIG. 96A used as the upper-page write voltage increases step by step, each time by 0.3V, from the initial value of 15V. The pulse signal of FIG. 96D used as the lower-page write voltage increases step by step, each time by 0.8V, from the initial value of 17.8V. This initial value is the sum of the initial value for the upper-page write voltage and the difference between the verify voltages applied to determine whether the memory cell has been sufficiently programmed to "2" and "4,"

respectively. The step-up value of the lower-page write voltage is 0.8V as in the case where the threshold voltages attain the distributions illustrated in FIG. 93. The channel of the memory cell which is to be programmed to "4" and the bit line to which the memory cell is connected are set at 0V. The channel of the memory cell which is to be programmed to "3" and the bit line to which the memory cell is connected is programmed to 1.8V, which is the difference between the verify voltages applied to determine whether the memory cell has been sufficiently programmed to "3" and "4". These measures taken, data items "3" and "4" can be written almost at the same time during the lower-page programming operation.

Figure 95D:
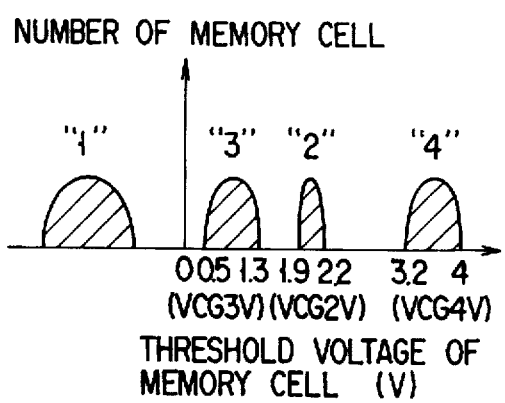
Figure 95E:
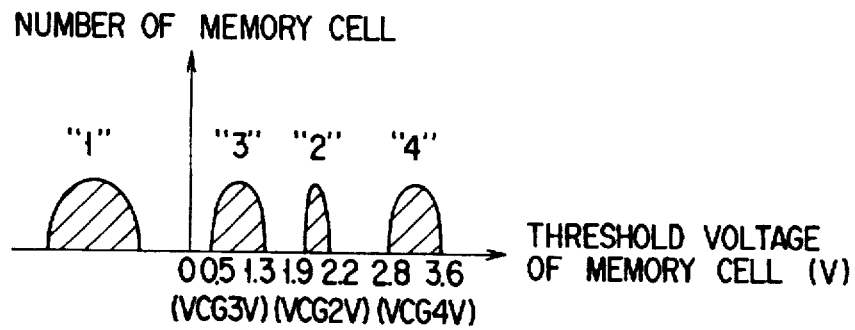

The threshold voltages each memory cell may have can be distributed in still another way as described in FIG. 95D and 95E. In these cases, the relationship of the data items "1" to "4" differs from that in the cases shown in FIGS. 95A to 95C. More specifically, the threshold voltage corresponding to "2" to be written in the upper-page programming operation is higher than the threshold voltage corresponding to "3" to be written in the lower-page programming operation.

Also in the cases shown in FIGS. 95D and 95E, the threshold voltage corresponding to "2" is distributed over the range of only 0.3V as shown in FIG. 95A, the range over which the highest threshold voltage corresponding to "4" distributes can be shifted to the lower side, despite that the distribution range of the threshold voltage corresponding to "2" is reduced to 0.3V. In the case of FIG. 95D, the difference between the threshold voltages corresponding to "2" and "3" is 0.6V, while the difference between the threshold voltages corresponding to "2" and "4" is 1V, as in the case of FIG. 95C. This helps increase the difference between the distribution ranges of the higher threshold voltages.

Figure 97A:
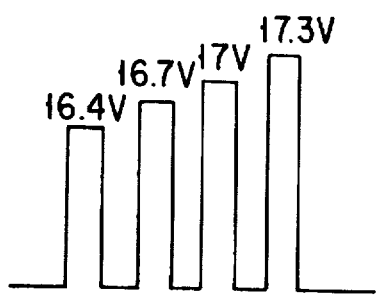
FIGS. 97A and 97B are diagrams showing the waveforms of two different pulse signals supplied to each memory cell provided in the fifteenth embodiment.
Figure 97B:
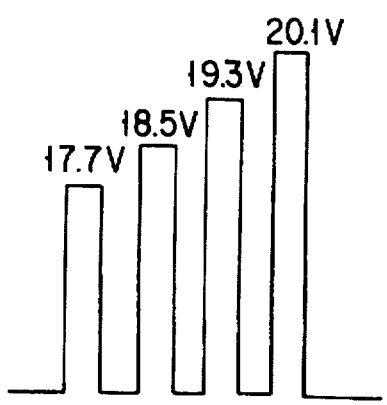
Figure 98A:
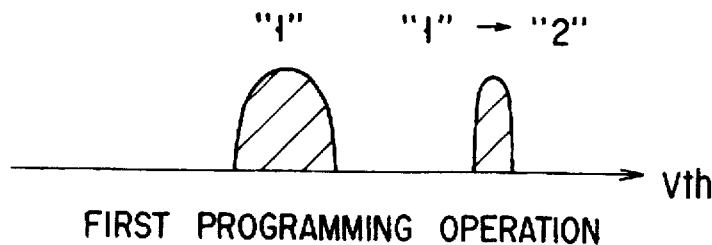
FIGS. 98A to 98E are diagrams representing other distributions of threshold voltages which each memory cell may have in the fifteenth embodiment.
Figure 98B:
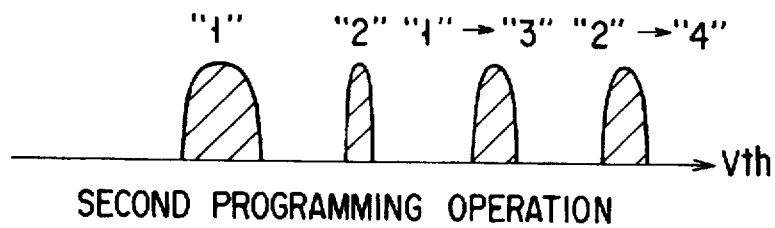
Figure 98C:
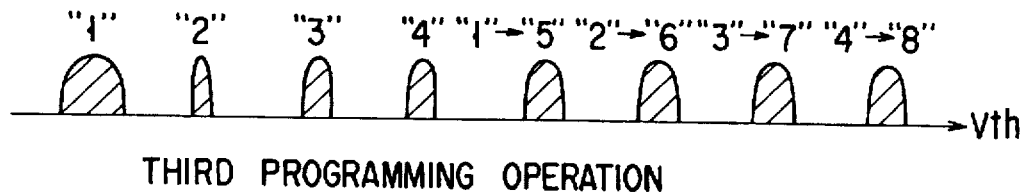
Figure 98D:
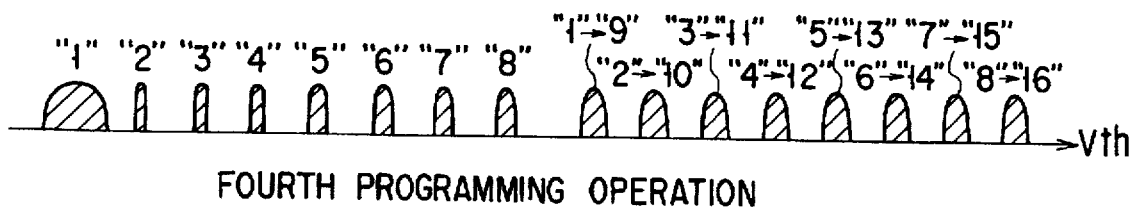
Figure 98E:
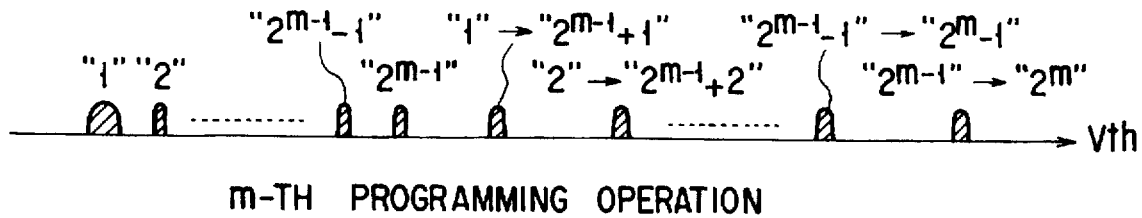

To distribute the threshold voltages as shown in FIG. 95D it suffices to use the pulse signals shown in FIGS. 97A and 97B as the upper-page and lower-page write voltages, respectively. The pulse signal of FIG. 97A used as the upper-page write voltage increases step by step, each time by 0.3V, from the initial value of 16.4V. The pulse signal of FIG. 97B used as the lower-page write voltage increases step by step, each time by 0.8V, from the initial value of 17.7V. This initial value is the sum of the initial value for the upper-page write voltage and the difference between the verify voltages applied to determine whether the memory cell has been sufficiently programmed to "2" and "4," respectively. The step-up value of the lower-page write voltage is 0.8V as in the case where the threshold voltages attain the distributions illustrated in FIG. 93. The channel of the memory cell which is to be programmed to "4" and the bit line to which the memory cell is connected are set at 0V. The channel of the memory cell which is to be programmed to "3" and the bit line to which the memory cell is connected are set at 2.7V, which is the difference between the verify voltages applied to determine whether the memory cell has been sufficiently programmed to "3" and "4". These measures are taken, data items "3" and "4" can be written almost at the same time during the lower-page programming operation.

In the case shown in FIG. 95E, the difference between the ranges of the threshold voltages corresponding to "3" and "2" is 0.6V, and the difference between the ranges of the threshold voltages corresponding to "2" and "4" is also 0.6V. To attain these distribution ranges of threshold voltages, it suffices to program the lower page in the same way as in the case shown in FIG. 95D, except that the channel of the memory cell which is to be programmed to "3" and the bit line to which the memory cell is connected are set at 2.3V.

It has been explained how the first and second programming operation are performed on each four-value memory cell in the fifteenth embodiment. Nonetheless, the first and second programming operation may be performed on other multi-value memory cells. This can be accomplished by using a small step-up value of write voltage in the first programming operation and a large step-up value of write voltage in the second programming operation, whereby the range of the threshold voltage corresponding to a data item to be written in the first programming operation is made less broad than the range of the threshold voltage corresponding to a data item to be written in the first programming operation.

For instance, the fifteenth embodiment may have memory cells of the same type as incorporated in the fourteenth embodiment, i.e., $2^m$-value memory cells (m is a natural number).

Each memory cell may be an n-value cell which can have a first threshold voltage corresponding to data item "1," a second threshold voltage corresponding to data item "2," a third threshold voltage corresponding to data item "3," and so forth, and can have i-th threshold voltage corresponding to data item "i" (i is a natural number equal to or less than n, and n is 4 or a greater natural number). In this case, if the memory cell has a threshold voltage corresponding to "1," the first programming operation is carried out according to the data item input from an external device, whereby the threshold voltage remains unchanged or is changed to "2." If the memory cell has a threshold voltage corresponding to "1," "2,"... "$2^{k-1}-1$" or "$2^k-1$," the k-th programming operation is carried out according to the data item input from the external device and the threshold voltage of the memory cell, whereby the threshold voltage remains unchanged or is changed to "2," "3,"... "$2^{k-1}$" or "$2^k$." If the memory cell has a threshold voltage corresponding to "1," "2,"..."$2^{k-1}$" or "$2^k$," the (k+1)th programming operation is effected according to the data item input from the external device and the threshold voltage of the memory cell, whereby the threshold voltage remains unchanged or is changed to "2," "3,"... "$2^{k+1}-1$" or "$2^{k+1}$." If the memory cell has a threshold voltage corresponding to "1," "2,"..."$2^{m-1}-1$" or "$2^{m-1}$" (m is a natural number satisfying n=2m), the m-th programming operation is effected according to the data item input from the external device and the threshold voltage of the memory cell, whereby the threshold voltage remains unchanged or is changed to "1," "2," "$2^{m-1}$" or "$2^m$." In this cases, the memory cell has threshold voltages which are distributed as is shown in FIGS. 98A to 98E.

Figure 99A:
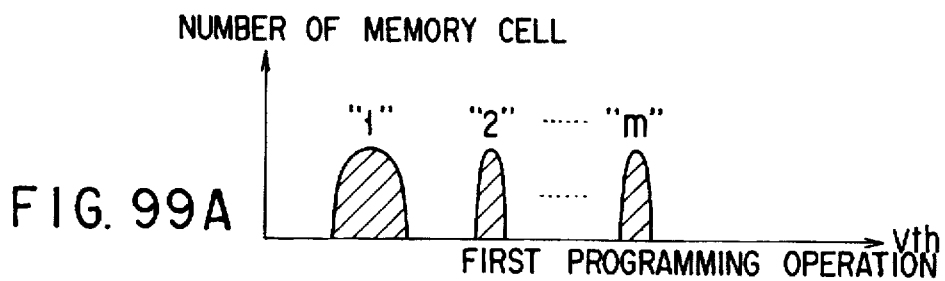
FIGS. 99A and 99B are diagrams showing still other distributions of threshold voltages which each memory cell may have in the fifteenth embodiment.
Figure 99B:
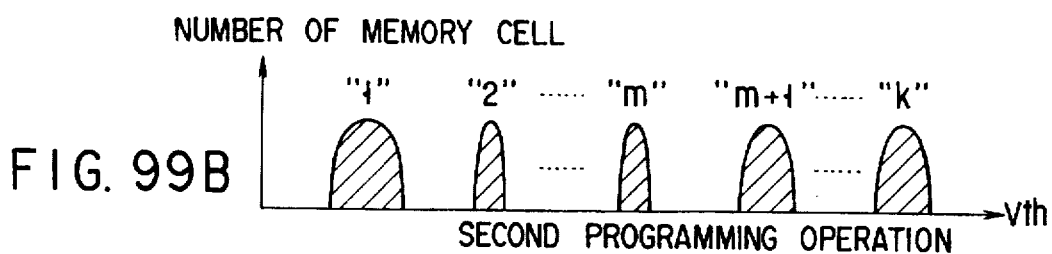

Alternatively, each memory cell may be an n-value cell which can have a first threshold voltage corresponding to data item "1," a second threshold voltage corresponding to data item "2," a third threshold voltage corresponding to data item "3," and so forth, and can have i-th threshold voltage corresponding to data item "i" (i is a natural number equal to or less than n, and n is 3 or a greater natural number). Then, if the memory cell has a threshold voltage corresponding to "1," the first programming operation is carried out according to the data item input from an external device, whereby the threshold voltage remains unchanged or is changed to "2," "3,"... "m–1" or "m" (m is 2 or a greater natural number). If the memory cell has a threshold voltage corresponding to "1," "2,",... "m–1" or "m," the second programming operation is effected according to the data item input from the external device and the threshold voltage of the memory cell, whereby the threshold voltage remains unchanged or is changed to "2," "3,"... "k–1" or "k" (k is a natural number greater than m). In this cases, the memory cell has threshold voltages which are distributed as is shown in FIGS. 99A and 99B.

Figure 100A:
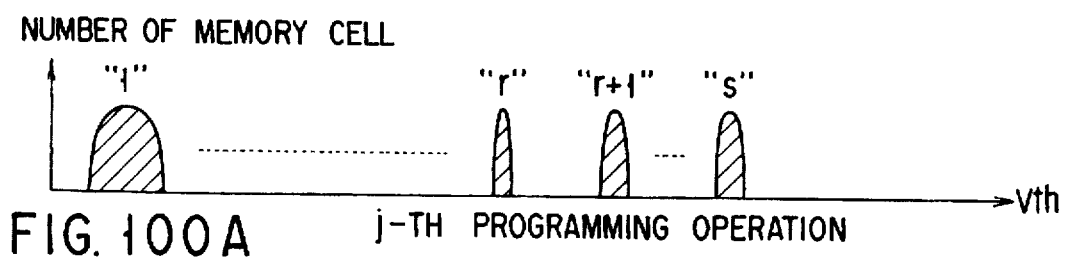
FIGS. 100A and 100B are diagrams showing other distributions of threshold voltages which each memory cell may have in the fifteenth embodiment.
Figure 100B:
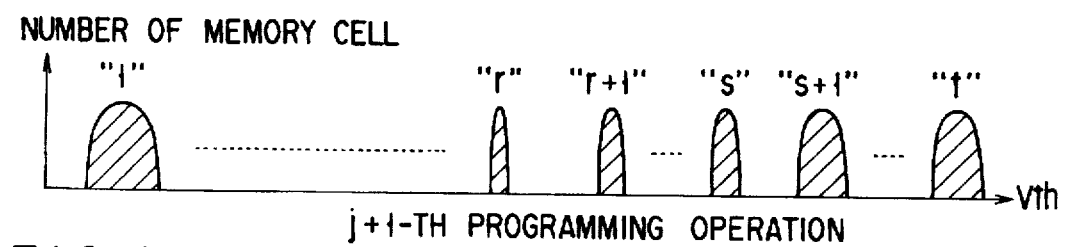

Further, each memory cell may be an n-value cell which can have a first threshold voltage corresponding to data item "1," a second threshold voltage corresponding to data item "2," a third threshold voltage corresponding to data item "3," and so forth, and can have i-th threshold voltage corresponding to data item "i" (i is a natural number equal to or less than n, and n is 4 or a greater natural number). Then, if the memory cell has a threshold voltage corresponding to "1," "2," ... "r−1" or "r" (r is 2 or a greater natural number), the j-th (j is 2 or a greater natural number) is written according to the data item input from the external device and the threshold voltage of the memory cell, whereby the threshold voltage remains unchanged or is changed to "2," "3," .... "r"). If the memory cell has a threshold voltage corresponding to "1," "2," .... "s−1" or "s," the (j+1)th programming operation is performed according to the data item input from the external device and the threshold voltage of the memory cell, whereby the threshold voltage remains unchanged or is changed to "2," "3," ... "t−1" or "t" (t is a natural number greater than s). In this cases, the memory cell has threshold voltages which are distributed as is shown in FIGS. 100A and 100B.

Still further, each memory cell may be an n-value cell which can have a first threshold voltage corresponding to data item "1," a second threshold voltage corresponding to data item "2," a third threshold voltage corresponding to data item "3," and so forth, and can have i-th threshold voltage corresponding to data item "i" (i is a natural number equal to or less than n, and n is 3 or a greater natural number). The cell will store "1" if the first logic level is input to it will store "2" if the second logic level is input to it the memory cell, in the first programming operation. Assuming that the memory cell may store "A" in the (k−1)th programming operation (k is 2 or a greater natural number), the threshold voltage will remain unchanged if the (2k−1)th logic level is input to the memory cell, and will change to "A+2$^{k-1}$" if the 2k−th logic level is input to the memory cell.

A four-value data storing NAND-type flash memory according to the sixteenth embodiment of the invention will be described, with reference to FIG. 101, FIG. 102 and FIGS. 103A and 103B. Like the eleventh embodiment, this flash memory has the same structure as shown in FIG. 48, and incorporates data circuits identical to the one illustrated in FIG. 57. It differs from the eleventh embodiment in the relationship between the four data items and the threshold voltages each memory has to store these data items.

Figure 101:
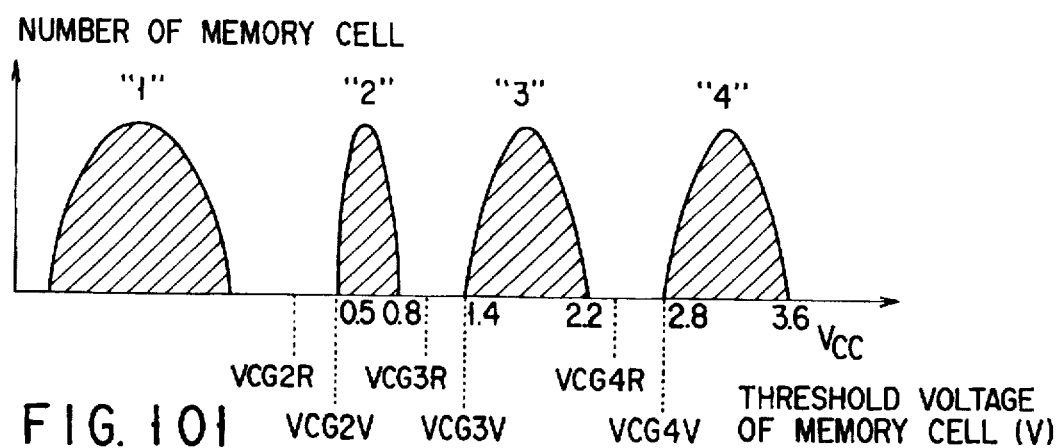
FIG. 101 is a diagram illustrating the distribution of threshold voltages each memory cell has in a memory device according to a sixteenth embodiment of the invention.

FIG. 101 represents the relationship between four data items "1" to "4," on the one hand, and the threshold voltages the cell has to store these data items. The four threshold voltages correspond to four data items "1," "2," "3" and "4," respectively. Each memory cell stores a data item "1," or assumes erased state, when it has a negative threshold voltage. It stores a data item "2" when it has a threshold voltage of, for example, 0.5V to 0.8V, stores a data item "3" when it has a threshold voltage of, for example, 1.5V to 1.8V, and a data item "4" when it has a threshold voltage of, for example, 2.5V to 2.8V.

In the sixteenth embodiment, a read voltage of, for example, 1.1V is applied to the control gate CG of any memory cell selected. If the cell is turned on, it is detected that the memory cell stores either "1" or "2." If the cell is turned off, it is detected that the cell M stores either "3" or "4." Then, read voltages of, for example, 2.5V and 0V are sequentially applied to the control gate CG. It is thereby determined which data item the memory cell stores. These verify voltages VCG2V, VCG3V and VCG4V are, for example, 0.5V, 1.4V, and 2.8V, respectively.

How the sixteenth embodiment operates will be described in detail. The data circuits incorporated in this embodiment are designed to hold a four-value data.

As shown in FIG. 57, each data circuit comprises two flip-flops FF1 and FF2. The flip-flop FF1 comprises n-channel MOS transistors Qn21, Qn22 and Qn23 and p-channel MOS transistors Qp9, Qp10 and Qp11. The flip-flop FF2 comprises n-channel MOS transistors Qn29, Qn30 and Qn31 and p-channel MOS transistors Qp6, Qp17 and Qp18. The flip-flops FF1 and FF2 cooperate to operate as a sense amplifier. The flip-flops FF1 and FF2 latch a data item "1," "2," "3" or "4" which is to be written into a memory cell. They also sense and latch a data item "1," "2," "3" or "4" which has been read from the memory cell.

The flip-flop FF1 is connected to a data input/output line IOA by an n-channel MOS transistor Qn28 and to a data input/output line IOB by an n-channel MOS transistor Qn27. The flip-flop FF2 is connected to the data input/output line IOA by an n-channel MOS transistor Qn36 and to the data input/output line IOB by an n-channel MOS transistor Qn35. The data input/output lines IOA and IOB are connected to the buffer circuit 5 (FIG. 48). The read data held in the flip-flop FF1 is output to the lines IOA and IOB when a signal CENB1 is activated. The read data held in the flip-flop FF2 is output to the lines IOA and IOB when a signal CENB2 is activated.

N-channel MOS transistors Qn26 equalize the flip-flops FF1 and FF2, respectively, when signals ECH1 and ECH2 rise to "H" level. N-channel MOS transistor Qn24 connects the flip-flop FF1 to or disconnects the same from a MOS capacitor Qd1. N-channel MOS transistor Qn32 connects the flip-flop FF2 to or disconnects the flip-flop FF2 from the MOS capacitor Qd1. N-channel MOS transistor Qn25 connects the flip-flop FF1 to or disconnects the flip-flop FF I from a MOS capacitor Qd2. N-channel MOS transistor Qn33 connects the flip-flop FF2 to or disconnects the same from the MOS capacitor Qd2.

P-channel MOS transistors Qp12C and Q13C constitute a circuit, which changes the gate voltage of the MOS capacitor Qd1 according to the data held in the flip-flop FF1, in the input data is a activation signal VRFYBAC. P-channel MOS transistors Qp14C and Q15C constitute a circuit, which changes the gate voltage of the MOS capacitor Qd2 according to the data held in the flip-flop FF2, in the input data is an activation signal VRFYBBC. N-channel MOS transistors Qn1C and Qn2C constitute a circuit, which changes the gate voltage of the MOS capacitor Qd1 according to the data held in the flip-flop FF2, in the input data is an activation signal VRFYBA1C. N-channel MOS transistors Qn3C and Qn4C constitute a circuit, which changes the gate voltage of the MOS capacitor Qd2 according to the data item held in the flip-flop FF2, in the input data is an activation signal VRFYBB1C.

The MOS capacitors Qd1 and Qd2 are constituted by a depletion n-channel MOS transistor each. They have a capacitance much less than the bit-line capacitance. N-channel MOS transistor Qn37 charges the MOS capacitor Qd1 to a voltage VA when it receives a signal PREA. N-channel MOS transistor Qn38 charges the MOS capacitor Qd2 to a voltage VB when it receives a signal PREB. N-channel MOS transistors Qn39 and Qn40 connects the data circuit 6 to or disconnects the same from bit lines BLa and BLb in the input data is signals BLCA and BLCB, respectively. The n-channel MOS transistors Qn37 and Qn38 constitute a circuit, which controls the voltages of the bit lines BLa and BLb.

It will be explained how the EEPROM (the eleventh embodiment) described above operates when the control gate CG2A is selected.

Programming of Upper Page (1) Programming of Upper Page

Data supplied from an external device is input via the data input/output buffer 5 to the data circuit 6. Assume that one page contains 256 bits and that the EEPROM incorporate 256 data circuits 6. Then, an upper page, externally supplied and containing 256 bits, is input to the first flip-flops FF1 through the lines IOA and IOB when a column-activating signal CENB1 is at "H" level. FIGS. 58A and 58B represent the relation between write data items and the potentials at the nodes N3C and N4C in the flip-flop FF1. As seen from FIG. 58A, "2" will be written if the input data item is at high level, and "1" will be written if the input data item is at low level.

How a data item is written into the memory cell will be explained, with reference to the timing chart of FIG. 59.

At time t1s, the activation signal VRFYBAC is programmed to 0V, whereby a bit-line write control voltage Vcc is applied to a bit line from the data circuit which holds data item "1." At time t2s, signal RV1A is programmed to Vcc, whereby 0V is applied to a bit line from the data circuit which holds data item "2." Thus, the bit line through which "1" is written into the memory cell is programmed to Vcc, and the bit line through which "2" is written into the memory cell is programmed to 0V.

At time t1s, the select gate SG1 of the block selected by the control gate/select gate driving circuit 21, and the control gates CG1A to CG4A are set at Vcc. The select gate SG2A is at 0V. At time t3s, the control gate CG2A selected is programmed to a high voltage Vpp (e.g., 15V), and the control gates CG1A, CG3A and CG4A, not selected, are set at a voltage VM (e.g., 10V). In the memory cell connected to any data circuit that holds "2," electrons are injected into the floating gate due to the difference between the channel potential of 0V and the potential Vpp of the control gate. The threshold voltage of the memory cell therefore increases. In the memory cell connected to any data circuit that hold "1," the selected gate SG1A is turned off, and the channel is set in floating state.

As a result, in the memory cell into which "1" is to be written, the channel is programmed to about 8V because of the capacitive coupling with the control gate. Hence, no electrons are written into the memory cell. The memory cell remains in erased state, namely storing data item "1." During the programming operation, signals SAN1, SAN2, PREB, BLCB remain at "H" level, signals SAP1, SAP2, VRFYBA1C, RV1B, RV2B, ECH1 and ECH2 remain at "L" level, and the voltage VB remain at 0V.

(2) Verify-Read Operation of Upper Page

After the programming operation, it is determined whether data has been sufficiently written. (That is, write verify operation is carried out.) If the threshold voltage of the memory cell has reached a desired value, the data held in the data circuit is changed to "1." Otherwise, the data held in the data circuit is left unchanged, and the data is written again into the memory cell. Data-writing and write verify operation are repeated until all memory cells into which "2" must be written come to have a desired threshold voltage. Every time the data-writing and write verify operation are repeated, the voltage Vpp applied to the control gate CG2A is increased by, for example, 0.3V as shown in FIG. 96A. Thus, the voltage Vpp is raised stepwise, each time by 0.3V, from the initial value of 15V.

How the write verify operation is effected will be explained with reference to the circuit diagram of FIGS. 57 and the timing chart of FIG. 60.

First, at time t1yc, the voltages VA and VB are set at 1.8V and 1.5V, respectively. The bit lines BLa and BLb are thereby set at 1.8V and 1.5V. The signals BLCA and BLCB fall to "L" level, disconnecting the bit line BLa from the MOS capacitor Qd1 and the bit line BLb from the MOS capacitor Qd2. The bit lines BLa and BLb therefore assume floating state. The signals PREB falls to "L" level, setting the nodes N1 and N2, i.e., the gate electrodes of the MOS capacitors Qd1 and Qd2, into floating state.

At time t2yc, the control gate CG2A of the block selected by the control gate/select gate driving circuit 21 is programmed to 0.5V, while the control gates CG1A, CG3A and CG4A not selected and the select gates SG1A and SG2A are set at Vcc. If the threshold voltage of the memory cell selected is 0.5V or less, the bit-line voltage is less than 1.5V. If the threshold voltage is 0.5V or more, the bit-line voltage will remain at 1.8V. At time t3yc, the signals BLCA and BLCB rise to "H" level, and the potentials of the bit lines are applied to the nodes N1 and N2. Then, the signals BLCA and BLCB fall to "L" level, disconnecting the bit line BLa from the MOS capacitor Qd1 and the bit line BLb from the MOS capacitor Qd2.

Thereafter, at time t4yc, the signal VRFYBAC is programmed to "L" level. Then, p-channel MOS transistor Qp12C is turned on and the node N1 is programmed to Vcc in the data circuit which holds a write data item "1." Namely, the node N1 is programmed to Vcc so that "1" may be written into the memory cell. The p-channel MOS transistor Qp12C is turned off if "2" is to be written into the memory cell. If the memory cell is sufficiently programmed to "2," the node N1 is programmed to Vcc. If the memory cell is insufficiently programmed to "2," the node N1 is programmed to 0V. Then, the signals SAN1 and SAP1 change to "L" level and "H" level, respectively, deactivating the flip-flop FF1. The signal ECH1 rises to "H" level, equalizing the flip-flop FF1.

Thereafter, the signals RV1A and RV1B rise to "H" level. The signals SAN1 and SAP1 again changes to "H" level and "L" level, respectively. At time t5yc, the voltage at the node N1 is sensed and latched. It is determined whether the memory cell connected to the data circuit holding the write data "2" has been sufficiently programmed to data "2" or not. If the memory cell stores "2," the flip-flop FF1 senses and latches the voltage at the node N1, whereby the data to be written into the memory cell is changed to "1." If the memory cell does not store "2," the flip-flop FF1 senses and latches the voltage at the node N1, whereby the data "2" is maintained in the data circuit. Data item "1" remains unchanged in whichever data circuit that holds it.

When the threshold voltages of all memory cells selected reach the desired values, the nodes N4C in the data circuits fall to "L" level. Thus, when the nodes N4C are found at "L" level, it is known that all memory cells-selected have the desired threshold voltages. To determine that the cells are programmed, the write completion detection transistor Qn5C shown in FIG. 57 may be used. After the read verification is effected, signal VRTC is programmed to, for example, the precharge voltage Vcc. If there is even one memory cells insufficiently programmed, the node N4C of the data circuit to which that memory cell is connected is at "H" level. The n-channel MOS transistor Qn5C is turned on, and the signal VRTC falls from the precharge voltage Vcc. When all memory cells selected are sufficiently programmed, the nodes N4C in the data circuits 6-0, 6-1, . . . 6-m-1, and 6-m fall to "L" level. As a result, the n-channel MOS transistors Qn5C are turned off in any data circuit, whereby the signal VRTC remains at the precharge voltage.

Thus it is determined that all memory cells selected have been programmed.

The threshold voltage corresponding to "2" thus written ranges from 0.5V to 0.8V since the step-up value for the voltage Vpp applied to the control gate CGA is 0.3V.

Programming of Lower Page (1) Reading and Loading of Upper Page

Before the lower page is programmed, the upper page is programmed in the memory cells. Thus, each memory cell stores either "1" or "2" as shown in FIG. 61A. A data item of the upper page stored in the memory cells is read and held in the flip-flop FF1 at the same time a data item of the lower page is input to the flip-flop FF1 via the data input/output lines IOA and IOB from the external device.

How the data item of the upper page is read from a memory cell will be explained, with reference to FIGS. 61A to 61C and the timing chart of FIG. 62.

First, at time t1yd, the voltages VA and VB are set at 1.8V and 1.5V, respectively. The bit lines BLa and BLb are thereby set at 1.8V and 1.5V. The signals BLCA and BLCB fall to "L" level, disconnecting the bit line BLa from the MOS capacitor Qd1 and the bit line BLb from the MOS capacitor Qd2. The bit lines BLa and BLb therefore assume floating state. The signals PREB falls to "L" level, setting the nodes N1 and N2, i.e., the gate electrodes of the MOS capacitors Qd1 and Qd2, into floating state.

At time t2yd, the control gate CG2A of the block selected by the control gate/select gate driving circuit 21 is programmed to 0V, while the control gates CG1A, CG3A and CG4A not selected and the select gates SG1A and SG2A are set at Vcc. If the threshold voltage of the memory cell selected is 0V or less, the bit-line voltage is less than 1.5V. If the threshold voltage is 0V or more, the bit-line voltage will remain at 1.8V. At time t3yd, the signals BLCA and BLCB rise to "H" level, and the potentials of the bit lines are applied to the nodes N1 and N2. Then, the signals BLCA and BLCB fall to "L" level, disconnecting the bit line BLa from the MOS capacitor Qd1 and the bit line BLb from the MOS capacitor Qd2.

Thereafter, signals SAN2 and SAP2 change "L" level and "H" level, respectively, deactivating the flip-flop FF2. The signal ECH2 rise to "H" level, whereby the flip-flop FF2 is equalized. Signals RVA2A and RV2B then rise to "H" level. The signals SAN2 and SAP2 again change to "H" level and "L" level, respectively. At time t4yd, the voltage at the node N1 is thereby sensed and latched. At this time, the nodes N5C and N6C in the flip-flop FF2 are set at the potentials shown in FIG. 61B. The upper page read out is not inverted, and the flip-flop FF1 completely holds the data when it senses it at time t4yd.

The write data item of the lower page, input to the flip-flop FF1 from the external device, is illustrated in FIGS. 63A and 63B. If this data item is at "H" level, it is not written into the memory cell. The memory cell therefore keeps storing either "1" or "2." If the data item is at "L" level, it is written into the memory cell. In this is case, the memory stores "3" instead of "1" or stores "4" instead of "2."

Figures 73A, 73B:
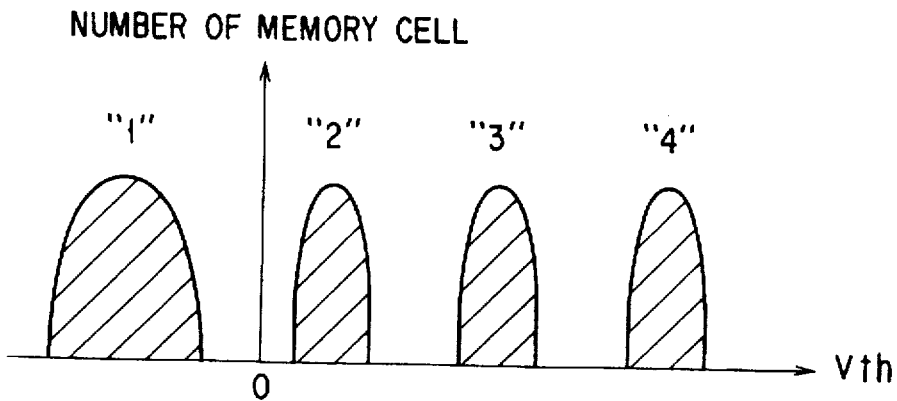
FIGS. 73A and 73B are a diagram and a table showing various potentials which the nodes in a data circuit have to program a lower page in a memory device according to a twelfth embodiment of the present invention.

Thus, the nodes N3C and N4C in the flip-flop FF1 and the nodes N5C and N6C in the flip-flop FF2 are set at the potentials shown in FIGS. 73A and 73B during the programming of the lower page.

(2) Programming of Lower Page

Figure 74:
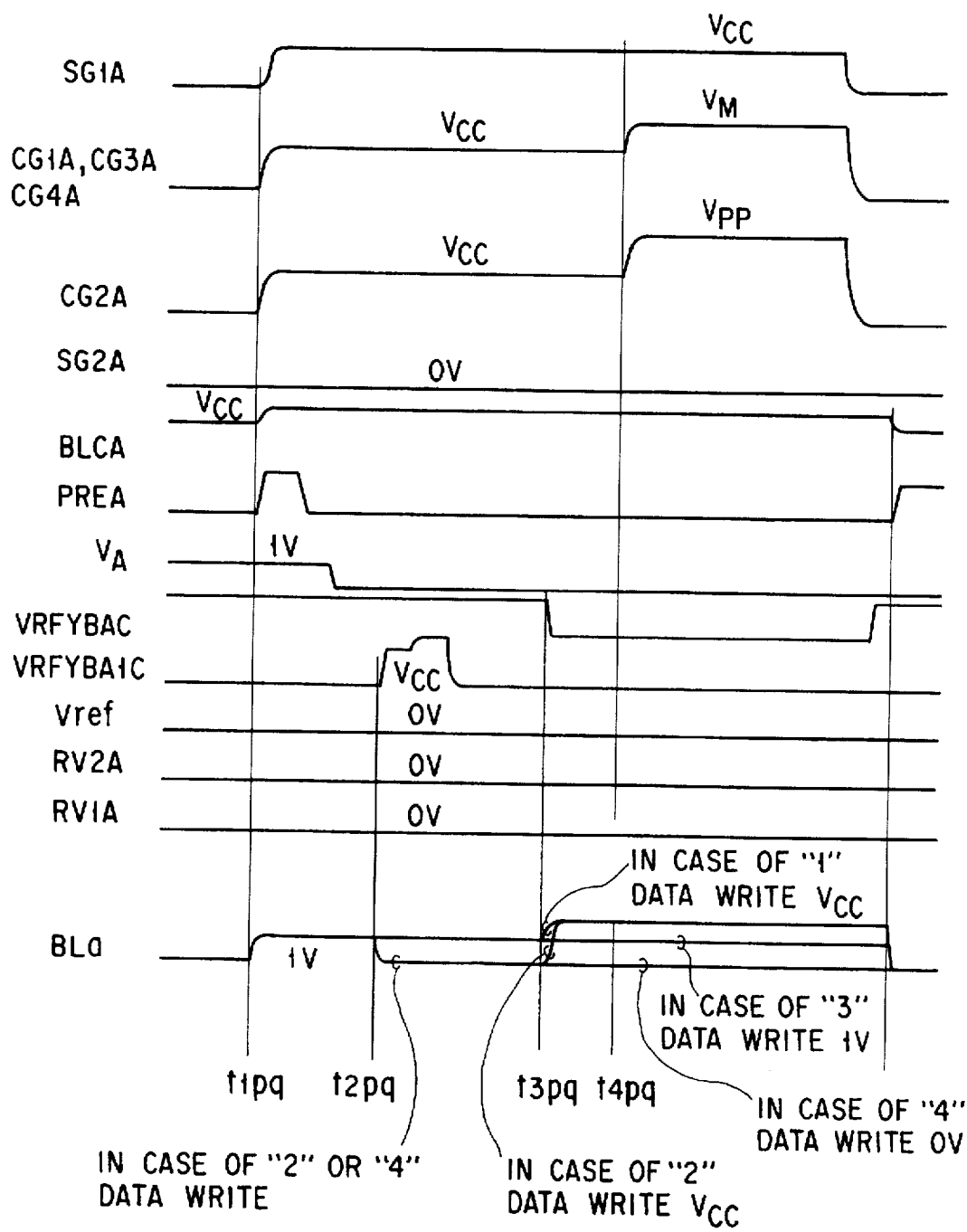
FIG. 74 is a timing chart explaining how the lower page is programmed in the twelfth embodiment.

The lower page is programmed, almost in the same way as has been explained in FIG. 74. However, the bit-line write control voltage is programmed to 1.4V at time t1pq, setting the bit line BLa at 1.4V. How the lower page is programmed will be explained, with reference to the timing chart of FIG. 74.

If a voltage drop equivalent to the threshold voltage of the n-channel MOS transistor Qn39 makes a problem, it suffices to raise the level of the signal BLCA. Then, the signal PREA falls to "L" level, setting the bit line BLa in floating state. At time t2pq, the signal VRFYBA1C is programmed to Vcc. The n-channel MOS transistor Qn2C is turned on to hold either "1" or "3." A bit-line control voltage of 0V is applied to the bit lines. As shown in FIG. 74, the signal VRFYBA1C may be set at a level higher than Vcc. At time t3pq, the signal VRFYBAC is programmed to 0V, a bit-line control voltage of Vcc is applied to th bit lines from any data circuit that holds either "1" or "2."

As a result, the bit line for writing "1" or "2" is programmed to Vcc, the bit line for writing "3" at 1V, the bit line for writing "4" at 0V.

At time t1pq, the select gate SG1A of the block selected by the control gate/select gate driving circuit 21, and the control gates CG1A to CG4A are set at Vcc. The select gate SG2A is at 0V. At time t4pq, the control gate CG2A selected is programmed to a high voltage Vpp (e.g., the initial value of 17.3V), and the control gates CG1A, CG3A and CG4A, not selected, are set at a voltage VM (e.g., 10V). In the memory cell connected to any data circuit that holds "4," electrons are injected into the floating gate due to the difference between the channel potential of 0V and the potential Vpp of the control gate. The threshold voltage of the memory cell therefore increases. In the memory cell connected to any data circuit that hold "3," electrons are injected to the floating gate due to the difference between the channel potential of 1V and the potential Vpp of the control gate. The threshold voltage of this cell therefore increases.

The channel of the memory cell which is to be programmed to "3" is programmed to potential of 1.4V, in order to injects less electrons into the floating gate than in the memory cell which is to be programmed to "4." In the memory cell connected to the data circuit which holds either "1" or "2," the difference between the potential of the channel and the potential Vpp of the control gate is so small that in effect no electrons are injected into the floating gate. Hence, the threshold voltage of the memory cell remains unchanged. During the programming operation, signals SAN1, SAN2, PREB, BLCB remain at "H" level, signals SAP1, SAP2, VRFYBA1C, RV1A, RV1B, RV2B, ECH1 and ECH2 remain at "L"level, and the voltage VB remain at 0V.

(3) Verify-Read Operation of Lower Page

After the programming operation, it is determined whether data has been sufficiently written. (That is, write verify operation is carried out.) If the threshold voltage of the memory cell has reached a desired value, the node N3C of the flip-flop FF1 is programmed to "H" level. Otherwise, the data held in the data circuit is left unchanged, and the data is written again into the memory cell. Data-writing and write verify operation are repeated until any memory cell into which "3" must be written and any memory cell in which "4" must be written come to have desired threshold voltages.

Every time the data-writing and write verify operation are repeated, the voltage Vpp applied to the control gate CG2A is increased by, for example, 0.8V as shown in FIG. 96B. Thus, the voltage Vpp is raised stepwise, each time by 0.8V, from the initial value of 17.3V.

How this write verify operation is effected will be explained with reference to the circuit diagram of FIGS. 57 and the timing chart of FIG. 102.

At time t1ys, the voltages VA and VB are set at 1.8V and 1.5V, respectively. The bit lines BLa and BLb are thereby set at 1.8V and 1.5V. The signals BLCA and BLCB fall to "L" level, disconnecting the bit line BLa from the MOS capacitor Qd1 and the bit line BLb from the MOS capacitor Qd2. The bit lines BLa and BLb therefore assume floating state. The signals PREB falls to "L" level, setting the nodes N1 and N2, i.e., the gate electrodes of the MOS capacitors Qd1 and Qd2, into floating state. Then, the control gate CG2A of the block selected by the control gate/select gate driving circuit 21 is programmed to 1.4V, while the control gates CG1A, CG3A and CG4A not selected and the select gates SG1A and SG2A are set at Vcc. If the threshold voltage of the memory cell selected is 1.4V or less, the bit-line voltage is less than 1.4V. If the threshold voltage is 1.4V or more, the bit-line voltage will remain at 1.8V.

At time t2ys, the signals BLCA and BLCB rise to "H" level, and the potentials of the bit lines are applied to the nodes N1 and N2. Then, the signals BLCA and BLCB fall to "L" level, disconnecting the bit line BLa from the MOS capacitor Qd1 and the bit line BLb from the MOS capacitor Qd2. At time t3ys, the signal VRFYBA1C is programmed to a potential less than Vcc. The n-channel MOS transistor Qn2C is turned on to hold either "2" or "4," and the node N1 is discharged to 0V. At time t4ys, the signal VRFYBAC is programmed to "L" level. Then, in the data circuit holding either "1" or "2," the p-channel MOS transistor Qp12C is turned on and the node N1 is programmed to Vcc. Namely, the node N1 is programmed to Vcc to write "1" or "2" into the memory cell, and at 0V to write "4" into the memory cell.

Then, the signals SAN1 and SAP1 change to "L" level and "H" level, respectively, deactivating the flip-flop FF1. The signal ECH1 rises to "H" level, equalizing the flip-flop FF1. Thereafter, the signals RV1A and RV1B rise to "H" level. The signals SAN1 and SAP1 again changes to "H" level and "L" level, respectively. At time t5ys, the voltage at the node N1 is sensed and latched. It is determined whether the memory cell connected to the data circuit holding the write data "3" has been sufficiently programmed to data "3" or not. If the memory cell stores "3," the flip-flop FF1 senses and latches the voltage at the node N1, whereby the data to be written into the memory cell is changed to "1." If the data in the memory cell is not "3," the flip-flop FF1 senses and latches the voltage at the node N2, whereby the data "3" is maintained in the data circuit. Data item "1," "2" and "4" remain unchanged in whichever data circuits they are held.

Next, the control gate selected is set 2.8V. If the threshold voltage of the memory cell selected is 2.8V or less, the bit-line voltage is less than 1.5V. If the threshold voltage is 2.5V or more, the bit-line voltage remains at 1.8V. At time t6ys, the signals PREA and PREB are set at Vcc. The nodes N1 and N2 are thereby set at 1.8V and 1.5V, respectively, and set in floating state. Then, at time t7ys, the signals BLCA and BLCB are set at "H" level, disconnecting the bit line BLa from the MOS capacitor Qd1 and the bit line BLb from the MOS capacitor Qd2.

At time t8ys, the signal VRFYBAC falls to "L" level. In any data circuit that holds "1" or "2" and in any data circuit that holds "1" because "3" has been sufficiently programmed, the p-channel MOS transistor Qp12 is turned on, and the node N1 is programmed to Vcc.

The signals SAN1 and SAP1 change to "L" level and "H" level. The flip-flop FF1 is thereby deactivated. The signal ECH1 rises to "H" level, equalizing the flip-flop FF1. Then, the signals RV1A and RV1B rises to "H" level. The signals SAN1 and SAP1 change to "H" level and "L" level. At time t9ys, the voltage at the node N1 is thereby sensed and latched. It is thus determined whether the memory cell connected to the data circuit holding the write data "4" has been sufficiently programmed to data "4" or not. If this memory cell stores "4," the flip-flop FF1 senses and latches the voltage at the node N1, whereby the data to be written into the memory cell is changed to "2." No data item is written into the memory cell thereafter. If the data in the memory cell is not "4," the flip-flop FF1 senses and latches the voltage at the node N1, whereby the data item "4" is held in the data circuit and written therefrom into the memory cell. Then, additional data-writing is carried out. Data items "1," "2" and "3" remain unchanged in whichever data circuits they are held.

When the threshold voltages of all memory cells selected reach the desired values, the nodes N4C in the data circuits fall to "L" level. Thus, when the nodes N4C are found at "L" level, it is known that all memory cells selected have the desired threshold voltages. To determine that the cells are programmed, the write completion detection transistor Qn5C shown in FIG. 57 may be used. After the read verification is effected, signal VRTC is programmed to, for example, the precharge voltage Vcc. If there is even one the memory cell insufficiently programmed, the node N4C of the data circuit to which that memory cell is connected is at "H" level. The n-channel MOS transistor Qn5C is turned on, and the signal VRTC falls from the precharge voltage. When all memory cells selected are sufficiently programmed, the nodes N4C in the data circuits 6-0, 6-1, . . . 6-m-1, and 6-m fall to "L" level. As a result, the n-channel MOS transistors Qn5C are turned off in any data circuit, whereby the signal VRTC remains at the precharge voltage. Thus it is determined that all memory cells selected have been programmed.

Reading of Upper Page

The upper page is read from the sixteenth embodiment, by detecting whether each memory cell stores either "1" or "3," or either "2" or "4."

Figure 103A:
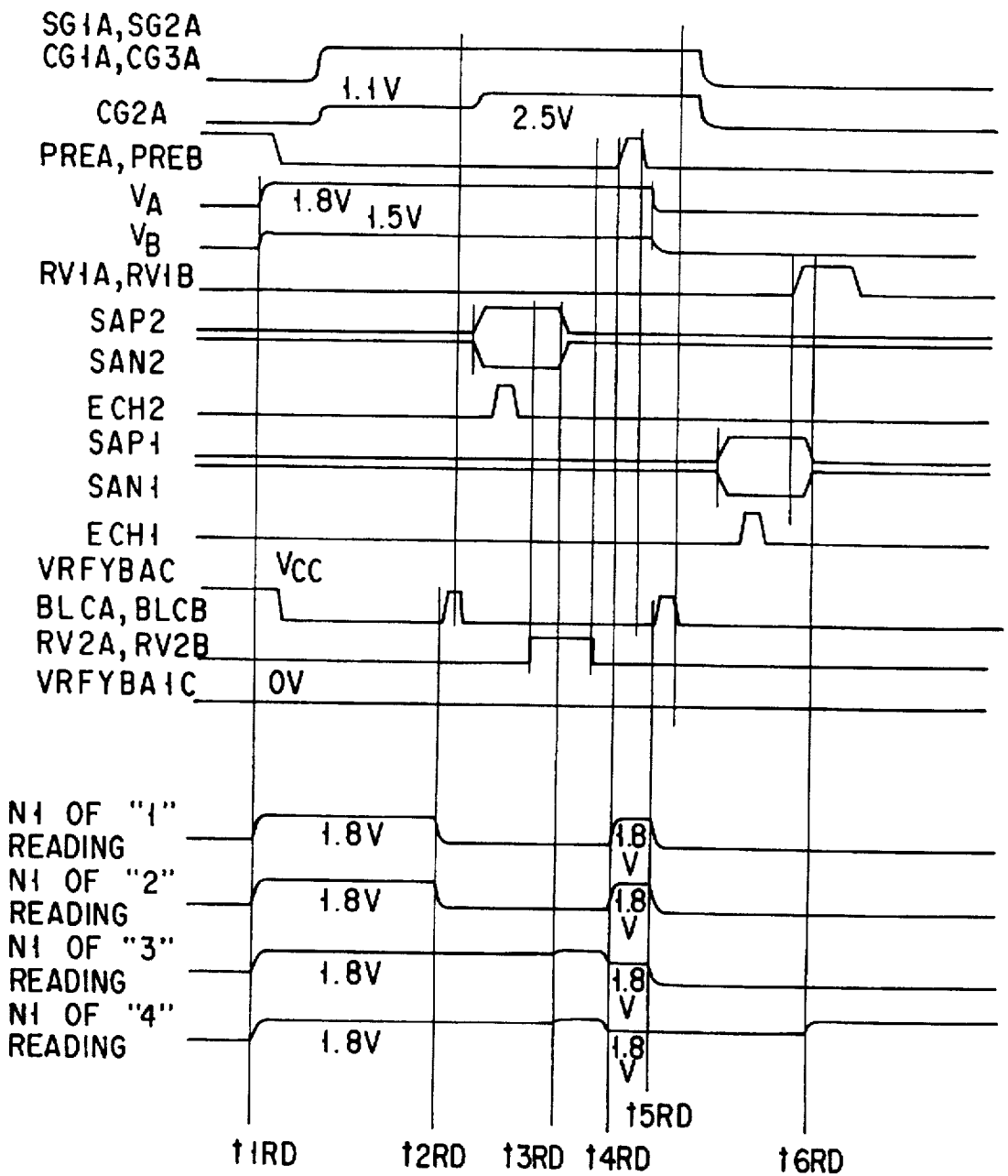

How the upper page is read will be explained, with reference to the timing chart of FIGS. 103A and 103B.

First, at time t1RD, the voltages VA and VB are set at 1.8V and 1.5V, respectively. The bit lines BLa and BLb are thereby set at 1.8V and 1.5V. The signals BLCA and BLCB fall to "L" level, disconnecting the bit line BLa from the MOS capacitor Qd1 and the bit line BLb from the MOS capacitor Qd2. The bit lines BLa and BLb therefore assume floating state. The signals PREB falls to "L" level, setting the nodes N1 and N2, i.e., the gate electrodes of the MOS capacitors Qd1 and Qd2, into floating state. Then, the control gate CG2A of the block selected by the control gate/select gate driving circuit 21 is programmed to 1.1V, while the control gates CG1A, CG3A and CG4A not selected and the select gates SG1A and SG2A are set at Vcc. If the threshold voltage of the memory cell selected is 1.1V or less, the bit-line voltage is less than 1.5V. If the threshold voltage is 1.1V or more, the bit-line voltage will remain at 1.8V.

At time t2RD, the signals BLCA and BLCB rise to "H" level, and the potentials of the bit lines are applied to the MOS capacitors Qd1 and Qd2. Thereafter, the signals BLCA and BLCB again fall to "L" level, disconnecting the bit line BLa from the MOS capacitor Qd1 and the bit line BLb from the MOS capacitor Qd2. Signals SAN2 and SAP2 change "L" level and "H" level, respectively, deactivating the flip-flop FF2. The signal ECH2 rise to "H" level, whereby the flip-flop FF2 is equalized. Signals RVA2A and RV2B then rise to "H" level. At time t3RD, the signals SAN2 and SAP2 again change to "H" level and "L" level, respectively. The voltage at the node N1 is thereby sensed and latched.

The flip-flop FF2 detects that the memory cell stores either "1" or "2," or either "3" or "4." The data showing this fact is latched. At this time, the nodes N5C and N6C in the flip-flop FF2 are set at the potential shown in FIG. 70.

The control gate selected is programmed to 2.5V. If the threshold voltage of the memory cell selected is 2.5V or less, the bit-line voltage will be less than 1.5V. If the threshold voltage is 2.5V or more, the bit-line voltage will remain at 1.8V. At time t4RD, the signals PREA and PREB rise to "H" level. The nodes N1 and N2, i.e., the gate electrodes of the MOS capacitors Qd1 and Qd2, are precharged to 1.8V and 1.5V. Then, the signals PREA and PREB falls to "L" level, whereby the nodes N1 and N2 assume floating state.

At time t5RD, the signals BLCA and BLCB rise to "H" level. Then, the signals BLCA and BLCB fall to "L" level, disconnecting the bit line BLa from the MOS capacitor Qd1 and the bit line BLb from the MOS capacitor Qd2. The signals SAN1 and SAP1 change to "L" level and "H" level, deactivating the flip-flop FF1. The signal ECH1 rises to "H" level, equalizing the flip-flop FF1. Thereafter, the signals RV1A and RV1B rise to "H" level. At time t6RD, the signals SAN1 and SAP1 again changes to "H" level and "L" level, respectively. The voltage at the node N1 is thereby sensed and latched. Therefore, the flip-flop FF1 detects that the data item stored in the memory cell is "4" or any one of the other data items "1," "2" or "3." The data indicative of this fact is latched. At this time, the nodes N3C in the flip-flop FF1 and the node N5C in the flip-flop FF2 are set at the potentials shown in FIG. 71.

The data item is read from the memory cell as is illustrated in FIG. 103B. At time t7RD, the voltages VA and VB are set at 1.8V and 1.5V, respectively. The bit lines BLa and BLb are thereby set at 1.8V and 1.5V. The signals BLCA and BLCB fall to "L" level, disconnecting the bit line BLa from the MOS capacitor Qd1 and the bit line BLb from the MOS capacitor Qd2. The bit lines BLa and BLb therefore assume floating state. The signals PREB falls to "L" level, setting the nodes N1 and N2, i.e., the gate electrodes of the MOS capacitors Qd1 and Qd2, into floating state. Then, the control gate CG2A of the block selected by the control gate/select gate driving circuit 21 is programmed to 0V, while the control gates CG1A, CG3A and CG4A not selected and the select gates SG1A and SG2A are set at Vcc. If the threshold voltage of the memory cell selected is 0V or less, the bit-line voltage is less than 1.5V. If the threshold voltage is 1V or more, the bit-line voltage will remain at 1.8V.

Thereafter, at time t8RD, the signals BLCA and BLCB rise to "H" level, whereby the data items on the bit lines are transferred to the MOS capacitors Qd1 and Qd2, respectively. Then, the signals BLCA and BLCB fall to "L" level, disconnecting the bit line BLa from the MOS capacitor Qd1 and the bit line BLb from the MOS capacitor Qd2. At time t9RD, the signal VRFYBA1C rises to "H" level. The node N5C in the flip-flop FF2 is at "H" level at this time. This is because the data item being read is "3" or "4" as can be understood from FIG. 71. In this case, the n-channel MOS transistor Qn2C shown in FIG. 57 is turned on. The node N1 from which either "3" or "4" is being read is connected to the ground.

At time t10RD, the signal VRFYBAC falls to "L" level. The node N3C in the flip-flop FF1 is at "H" level at this time. This is because the data being read is "3" as seen from FIG. 71. In this case, the n-channel MOS transistor Qn12C shown in FIG. 57 is turned on. The node N1 from which "4", is being read is programmed to Vcc. The signals SAN1 and SAP1 change to "L" level and "H" level, deactivating the flip-flop FF1. The signal ECH1 rises to "H" level, equalizing the flip-flop FF1. Thereafter, the signals RV1A and RV1B rise to "H" level. At time t11RD, the signals SAN1 and SAP1 again changes to "H" level and "L" level, respectively. The voltage at the node N1 is thereby sensed and latched. The flip-flop FF1 detects the potentials at the nodes N3C and N4C. The data showing this fact is latched. At this time, the nodes N3C and N4C in the flip-flop FF1 and the nodes N5C and N6C in the flip-flop FF2 are set at the potentials shown in FIG. 72.

The data items of the upper page are read to the nodes N3C and N4C of the flip-flop FF1 (see FIG. 72). More specifically, if the data item being read is either "1" or "3," the nodes N3C and N4C are at "L" level and "H" level, respectively, and if the data item being read is either "2" or "4," the nodes N3C and N4C are at "H" level and "L" level, respectively. As described in conjunction with the programming of the upper page, any data item of the upper page is either "1" or "3 ," or either "2" or "4." It is ascertained that the write data item programmed has been reliably read into the flip-flop FF1. The data item now held in the flip-flop FF1 is output from the memory chip when the signal CENB1 is activated.

Reading of Lower Page

The lower page is read from the sixteenth embodiment, by determining whether each memory cell stores either "1" or "2," or either "3" or "4."

How the lower page is read will be explained, with reference to the timing chart of FIG. 103A.

First, at time t1RD, the voltages VA and VB are set at 1.8V and 1.5V, respectively. The bit lines BLa and BLb are thereby set at 1.8V and 1.5V. The signals BLCA and BLCB fall to "L" level, disconnecting the bit line BLa from the MOS capacitor Qd1 and the bit line BLb from the MOS capacitor Qd2. The bit lines BLa and BLb therefore assume floating state. The signals PREB falls to "L" level, setting the nodes N1 and N2, i.e., the gate electrodes of the MOS capacitors Qd1 and Qd2, into floating state.

Then, the control gate CG2A of the block selected by the control gate/select gate driving circuit 21 is programmed to 1.1V, while the control gates CG1A, CG3A and CG4A not selected and the select gates SG1A and SG2A are set at Vcc. If the threshold voltage of the memory cell selected is 1.1V or less, the bit-line voltage is less than 1.5V. If the threshold voltage is 1.1V or more, the bit-line voltage will remain at 1.8V. At time t2RD, the signals BLCA and BLCB rise to "H" level, and the potentials of the bit lines are applied to the MOS capacitors Qd1 and Qd2.

Thereafter, the signals BLCA and BLCB again fall to "L" level, disconnecting the bit line BLa from the MOS capacitor Qd1 and the bit line BLb from the MOS capacitor Qd2. Signals SAN2 and SAP2 change "L" level and "H" level, respectively, deactivating the flip-flop FF2. The signal ECH2 rise to "H" level, whereby the flip-flop FF2 is equalized. Signals RVA2A and RV2B then rise to "H" level. At time t3RD, the signals SAN2 and SAP2 again change to "H" level and "L" level, respectively. The voltage at the node N1 is thereby sensed and latched. The flip-flop FF2 detects that the memory cell stores either "1" or "2," or either "3" or "4." The data showing this fact is latched. At this time, the nodes N5C and N6C in the flip-flop FF2 are set at the potential shown in FIG. 70.

The data items of the lower page are read to the nodes N5C and N6C of the flip-flop FF1 (see FIG. 70). More specifically, if the data item being read is either "1" or "2," the nodes N5C and N6C are at "L" level and "H" level, respectively, and if the data item being read is either "3" or "4," the nodes N5C and N6C are at "H" level and "L" level, respectively. As described in conjunction with the programming of the lower page, any data item of the lower page is either "1" or "2," or either "3" or "4." It is ascertained that the write data item programmed has been reliably read into the flip-flop FF2. The data item now held in the flip-flop FF2 is output from the memory chip when the signal CENB2 is activated.

As can be understood from the above, the reading of the lower page continues until time t3RD when the reading of the upper page is started. Hence, the upper page can be read while the lower page is being output from the memory chip to an external device. That is, the data item of the lower page is latched in the flip-flop FF1 at time t3RD, and the reading of the upper page continues as shown in FIGS. 103A and 103B, beginning at the same time, i.e., time t3RD. Hence, the upper page can be read, virtually at high speed.

A semiconductor memory according to the seventeenth embodiment will be described, with reference to FIGS. 104, 106A, 106B, 107A and 108B. This embodiment is characterized in that the lower page is not programmed in the memory cells before the upper page is completely programmed.

Figure 104:
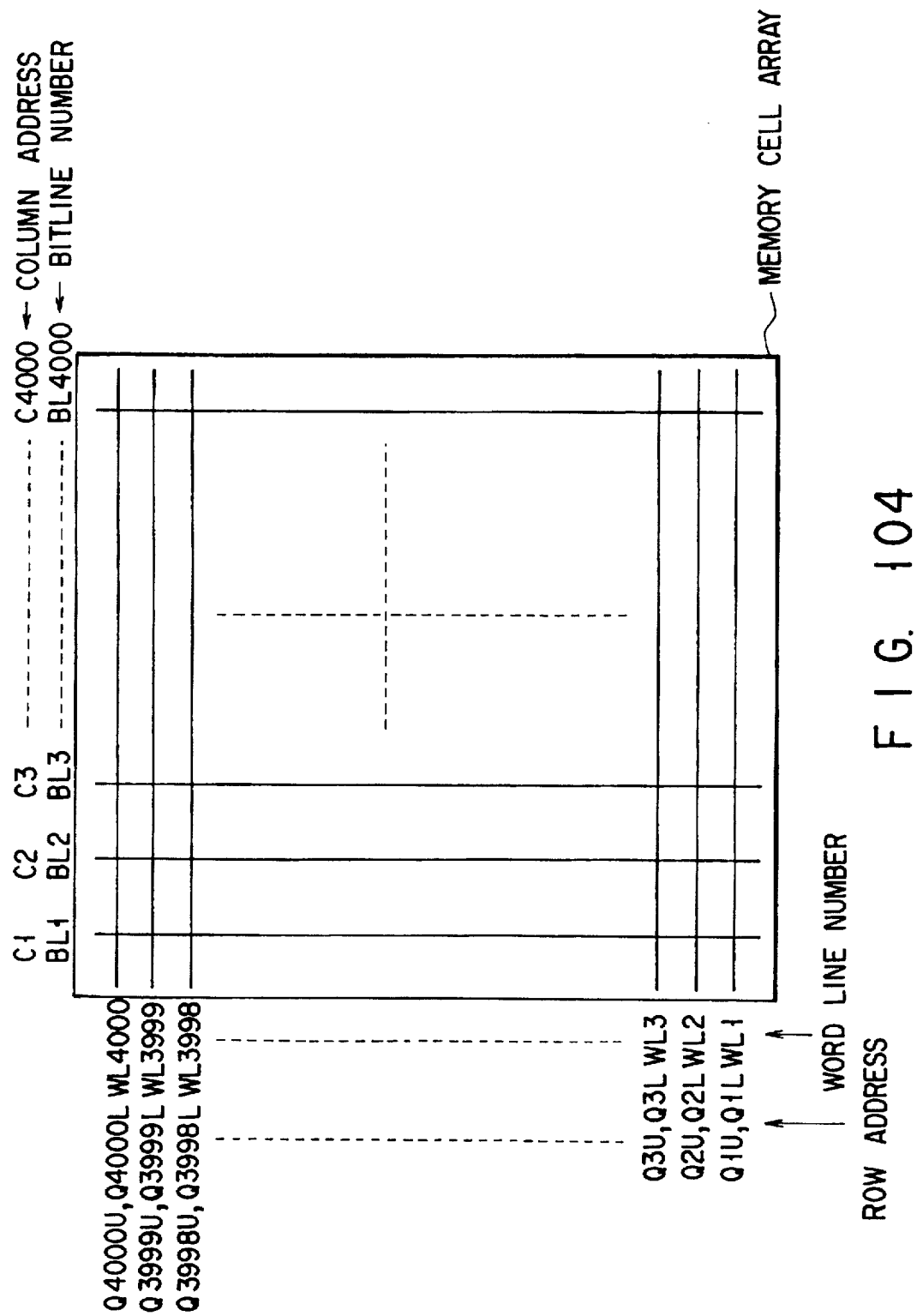
FIG. 104 is a diagram illustrating the memory cell array incorporated in a memory device according to a seventeenth embodiment of the invention.

FIG. 104 illustrates the memory cell array of the seventeenth embodiment. As shown in FIG. 104, the array comprises four-value cells, each capable of storing a 2-bit data item.

More precisely, 16 million ($16 \times 10^6$) memory cells are arranged in 4000 rows and 4000 columns. Since each memory cell can store 2 bits of data, the memory cell array has memory capacity of 32 megabits.

Column addresses are allocated to the bit lines. More correctly, column address C1 is allocated to the bit line BL1, column address C2 to the bit line BL2, and so forth. Two row addresses are allocated to each word line. The first row address is the upper-page address, and the second row address is the lower-page address. To be more specific, row addresses Q1U and Q1L are allocated to the word line WL1, row addresses Q2U and Q2L to the word line WL2, and so forth. Here, "U" denotes an upper-page row address, and "L" a lower-page row address.

Figure 105:
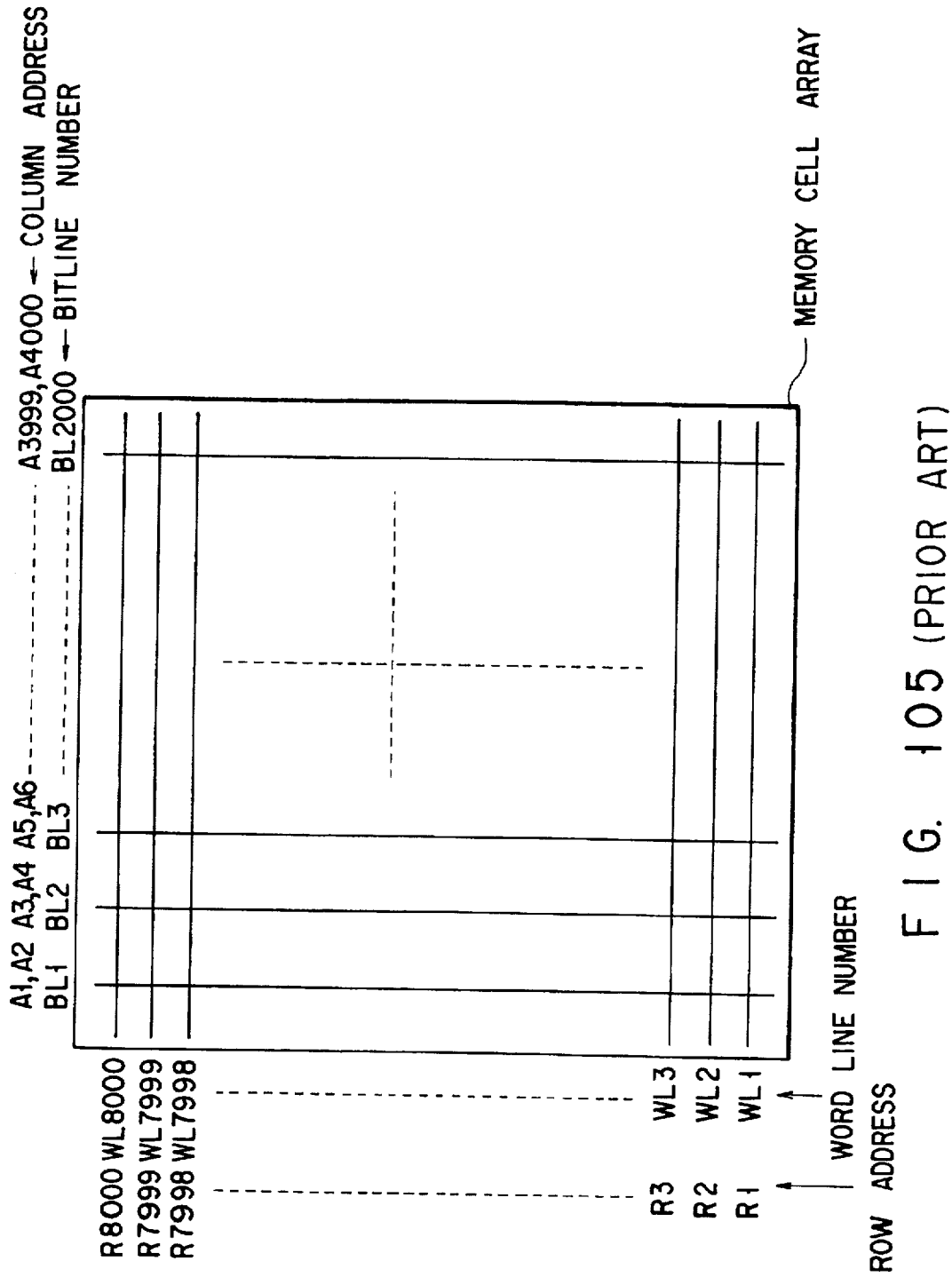
FIG. 105 is a diagram showing a memory cell array comprising conventional four-value cells.

FIG. 105 shows the memory cell array comprising conventional four-value cells which is designed to program one page of the same size as the seventeenth embodiment (FIG. 104). Into this array, 4000 bits are written at the same time. Two bits pertaining to the upper and lower pages, respectively, are simultaneously written into each memory cell simultaneously, not sequentially as in the seventeenth embodiment. The memory cell array has the same memory capacity as the seventeenth embodiment, i.e., the memory capacity of 32 megabits. Hence, 16 million memory cells are arranged in 2000 rows and 8000 columns. The memory cell array therefore has 2000 bit lines.

In the memory cell array of FIG. 105, two column addresses are allocated to each bit line. More precisely, column addresses A1 and A2 are allocated to the bit line BL1, column addresses A3 and A4 to the bit line BL2, and so forth. One row address is allocated to each word line. Namely, row address R1 is allocated to the word line WL1, row address R2 to the word lien WL2, and so forth.

How the memory cell array of the seventeenth embodiment is programmed will be explained. At first, a write operation of the lower page in which data of lower bit is almost simultaneously written into the memory cells corresponding to one page is carried out, after a write operation of the upper page in which in which data of upper bit is almost simultaneously written into the memory cells corresponding to one page is sequentially carried out. That is, 4000 bits constituting an upper page are simultaneously written into the 4000 memory cells connected to the word line WL1 to which the row address Q1U is allocated. Then, next 4000 bits constituting another upper page are simultaneously written into the 4000 memory cells connected to the word line WL2 to which the row address Q2U is allocated. Similarly, 4000 bits constituting an upper page are written into the 4000 memory cells connected to each of the other word lines WL3 to WL4000 to which the row addresses Q3U to Q400U are allocated, respectively.

How the memory cell array shown in FIG. 105 is programmed will be explained. First 2000 2-bit data items constituting an upper page and a lower page are written into the 2000 memory cells connected the word line WL1, whereby the upper and lower pages are written. Next 2000 2-bit data items constituting an upper page and a lower page are written into the 2000 memory cells connected the word line WL2, whereby the upper and lower pages are written in these memory cells.

Figure 106B:
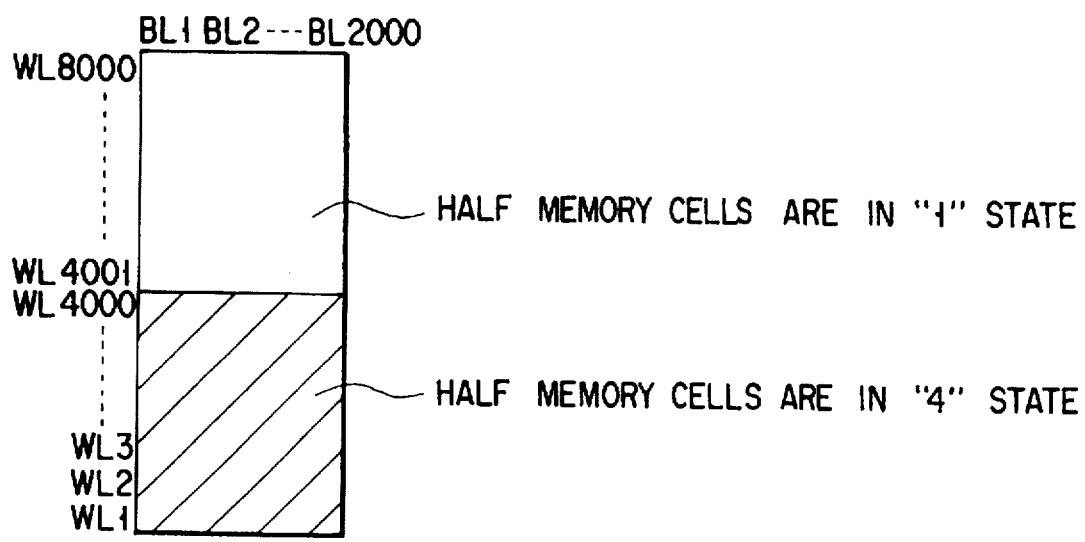

Assume that data items "2" are written into the memory cells, instead of data items "1", thereby programming the upper page, and that data items "4" are then written into the memory cells, thereby programming the lower page. In the seventeen embodiment (FIG. 104), the upper page is completely programmed when 16 megabits are written into the 16 million memory cells, respectively—that is, all memory cells store data items "2" as illustrated in FIG. 106A. When 16 megabits are written into the memory cell array shown in FIG. 105, eight million memory cells store "4," while the remaining eight million memory cells store "1," as is illustrated in FIG. 106B. On the other hand, the memory cells of the seventeenth embodiment never store "4" and never have a high threshold voltage. Therefore, charge is not likely to leak from the floating gate of each memory cell to lose the data item stored in the memory cell. This lengthens the lifetime of the memory cells and ultimately improves the operating reliability of the seventeenth embodiment.

When an EEPROM is used as a memory card, it is usually operated at, for example, 70% of its memory capacity, in order to accomplish garbage collection or the like, and the remaining 30% memory capacity is left unused. How the seventeenth embodiment and the EEPROM having the memory cell array of FIG. 105 operate at 70% of their memory capacity will be explained, with reference to FIGS. 107A and 107B.

Figure 107A:
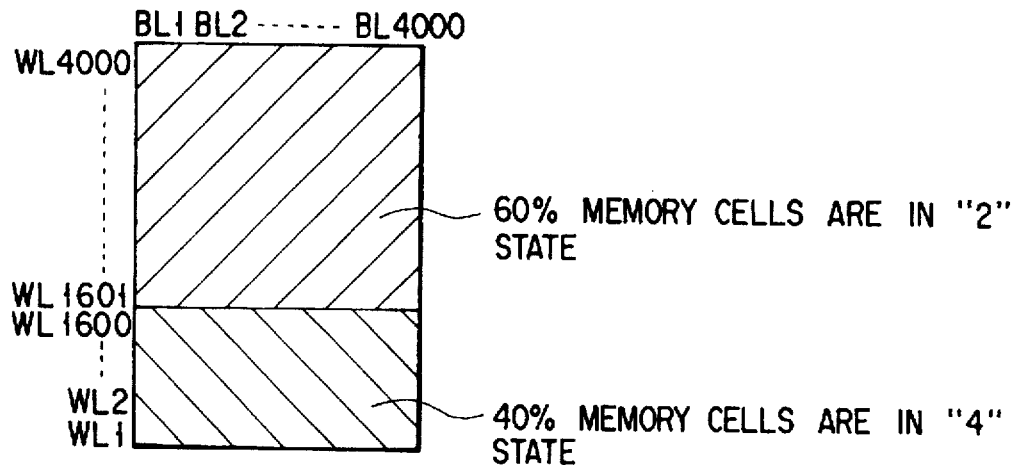
FIGS. 107A and 107B are diagrams showing two memory cell arrays, each programmed to 70% of the memory capacity.
Figure 107B:
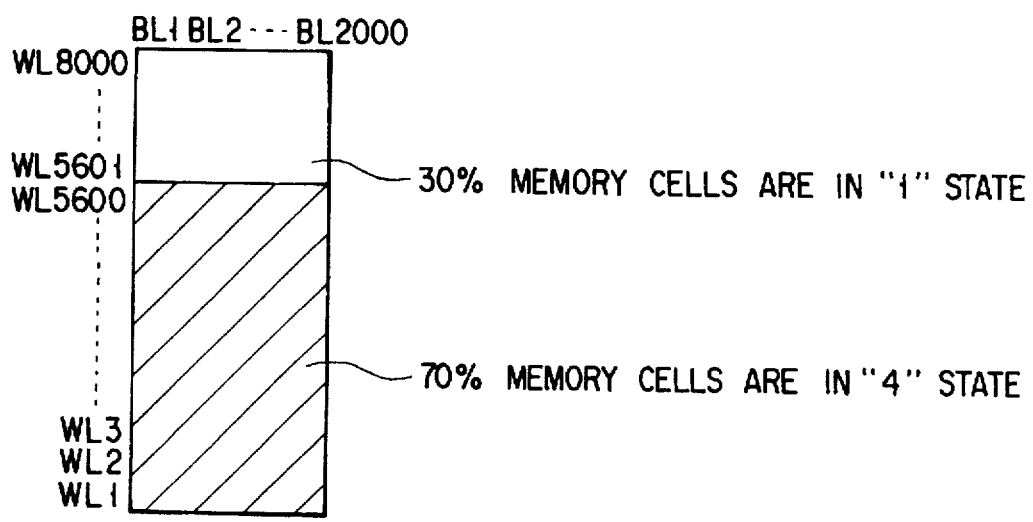

When the seventeenth embodiment is operated at 70% of the memory capacity, 60% of all memory cells will store "2" instead of "1" and 40% thereof will store "4" instead of "2," as is illustrated in FIG. 107A. By contrast, when the memory cell array shown in FIG. 105 is operated at its 70% of the memory capacity, 70% of all memory cells will store "4" and the 30% thereof remain in erased state, namely storing "1," as is illustrated in FIG. 107B. The ratio of the memory cells which store "4" in the seventeenth embodiment to the memory cells which store "4" in the array shown in FIG. 105 is 4/7 in number. Thus, the probability that data is lost in the seventeenth embodiment is about 57% of the probability that data is lost in the memory cell arrays shown in FIG. 105.

The word lines WL1, WL2, WL3, . . . and WL4000 need not be sequentially selected as described above, in order to write data into the memory cell array. For example, the word lines WL1 to WL4000 may be selected by a controller provided outside the memory chip, such that the memory cells store "4" at the same frequency. More specifically, the member of times a lower page is written into the 4000 memory cells connected one word line is recorded, and the order in which the word lines WL1 to WL4000 must be selected is determined from the number of times thus recorded. Hence, with the seventeenth embodiment it is possible to prevent each memory cell from deteriorating due to excessive use. The data representing the number of times a lower page is written may be stored in a memory region other than the data area. For example, the memory cells connected to one word line are used to store 522 bytes. Of these memory cells, those used to store 512 bytes constitute a data area, and those used to store the remaining 10 bytes constitute an area for storing that number of times or an ECC (Error Correcting Code).

FIG. 108 shows a memory system according to the eighteenth embodiment of the invention, which incorporates a semiconductor memory according to the invention. As shown in FIG. 108, the system comprises a plurality of memory chips 101q (q is a natural number) and a controller 100 for controlling the memory chips 101q. Each memory chip has a memory cell array of the type shown in FIG. 104. In FIG. 108, only four of the memory chips $101_1$ to $101_4$ are shown, which are controlled by the controller 100.

Figure 109:
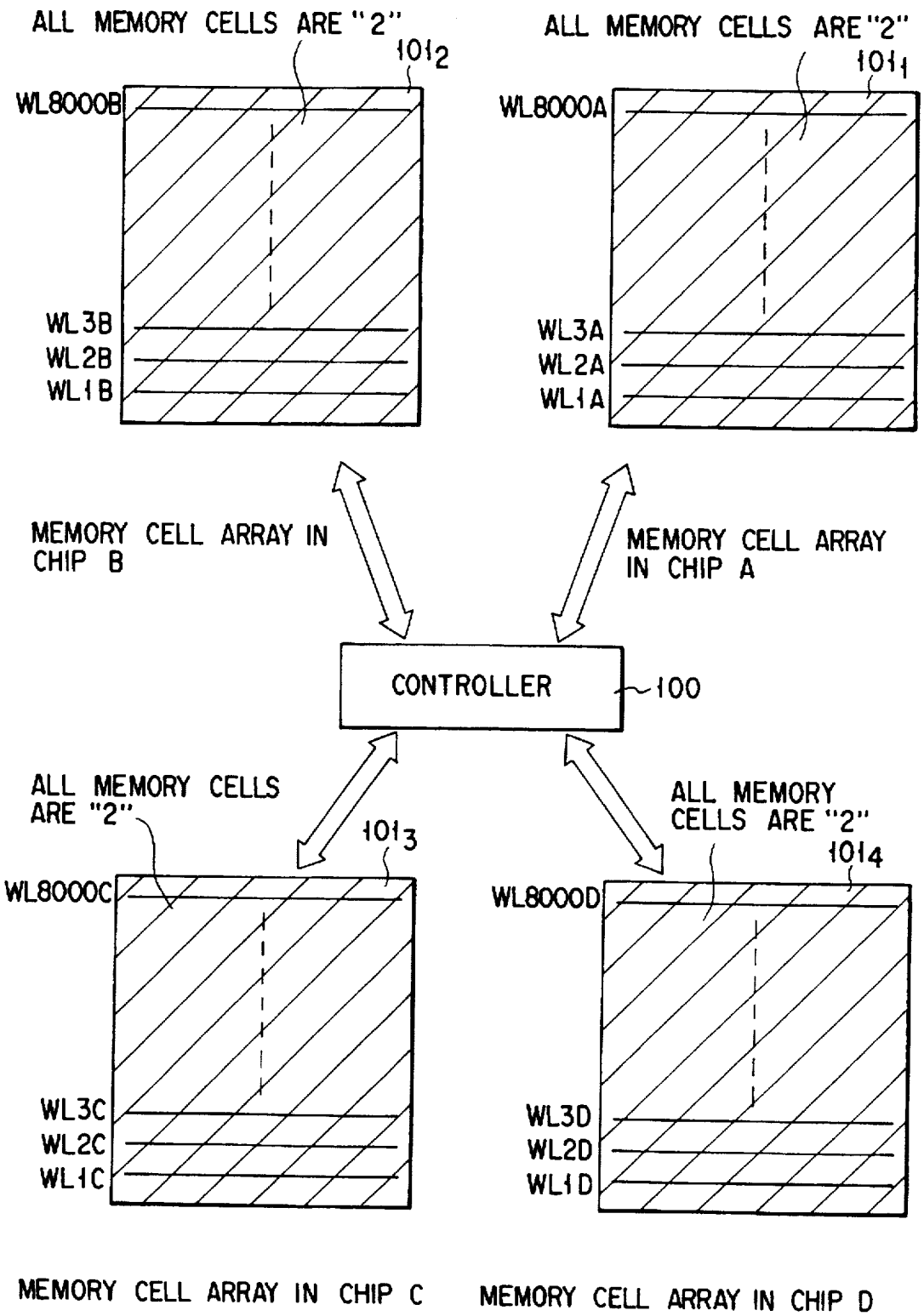
FIG. 109 is a diagram showing the memory system which is programmed to 50% of the memory capacity.

The memory system is characterized in that the lower page is not programmed in the memory cells before the upper page is completely programmed. As in the seventeenth embodiment, "2" is written into those memory cells which have been storing "1," thereby programming the upper page, and "4" is then written into the memory cells, thereby programming the lower page. When the memory system is programmed to 50% of its memory capacity, all memory cells of every memory chip 101q have a threshold voltage which corresponds to data item "2," as is illustrated in FIG. 109.

When the memory system is programmed to 70% of its memory capacity, 60% of all memory cells provided store "2" and 40% thereof store "4," as has been explained in conjunction with the seventeenth embodiment. To be more specific, as seen from FIG. 110, data item "4" is written in all memory cells of the first chip $A101_1$ and in 80% of the memory cells of the second chip $B101_2$, and data item "2" is written in 20% of the memory cells of the second chip $B101_2$ and in all memory cells of the third and fourth chips $C101_3$ and $D101_4$. In the memory system, too, only a small number of memory cells stores data item "4" which corresponds to a high threshold voltage. Hence, the memory system therefore has high operating reliability.

In each memory chip 101q, the word lines WL1A to WL8000A of the first chip $A101_1$, the word lines WL1B to WL8000B of the second chip $B101_2$, the word lines WL1C to WL8000C of the third chip $C101_3$, and the word lines WL1D to WL8000D of the fourth chip $D101_4$ are selected in the order mentioned to program the memory chips $101_1$ to $101_4$. The word lines may be selected in any other order. For example, the word lines may be selected by a controller provided outside the memory chip, so that the memory cells in each memory chip may store "4" at the same frequency. More specifically, as in the seventeenth embodiment, the member of times a lower page is written into the 4000 memory cells connected one word line is recorded, and the order in which the word lines must be selected is determined, in units of pages, from the number of times thus recorded. Alternatively, the number of times the lower page is written into each memory chip may be recorded, and the order in which the memory chips $101_1$ to $101_4$ must be selected is determined from the number of times thus recorded.

Hence, with the eighteenth embodiment it is possible to prevent each memory cell from deteriorating due to exces-sive use, whether it is provided for a specific page or in a specific memory chip. The data representing the number of times a lower page is written may be stored in a memory region other than the data area. For example, the memory cells connected to one word line are used to store 522 bytes. of these memory cells, those used to store 512 bytes constitute a data area, and those used to store the remaining 10 bytes constitute an area for storing that number of times or an ECC (Error Correcting Code).

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A semiconductor memory device comprising:

n-value memory cells (n is 3 or a greater natural number), each having a first threshold voltage to store "1," a second threshold voltage to store "2," a third threshold voltage to store "3," and an i-th threshold voltage to store "i" (i is a natural number equal to or less than n), wherein said memory cells are programmed to "1," "2," ..., "k–1," or "k," (k>m) according to write data items input from an external device and data items held in said memory cells when said memory cells hold "1," "2," ..., "m–1" or "m" (m is 2 or a greater natural number).

2. A semiconductor memory device comprising:

n-value memory cells (n is 3 or a greater natural number), each having a first threshold voltage to store "1," a second threshold voltage to store "2," a third threshold voltage to store "3," and an i-th threshold voltage to store "i" (i is a natural number equal to or less than n);

programming means for applying a bias to each of said memory cells, thereby to change the threshold voltage of the memory cell over a desired range; and verify means for detecting whether said programming means has changed the threshold voltage of each memory to a desired, every time the bias is applied to the memory cell for a predetermined time, and for causing said programming means to repeatedly applying the bias to the memory cell until the threshold voltage of the memory cell is changed to the desired value, said bias increasing stepwise each time said bias is applied to the memory cell, wherein when each memory cell is programmed to a threshold voltage corresponding to "1," the threshold voltage is changed to a threshold voltage corresponding to "1," "2," ..., "m–1" or "m" (m is 2 or a greater natural number) in a first programming operation according to a write data item input from an external device, and when each memory cell is programmed to a threshold voltage corresponding to "1," "2," ... "m–1," or "m," the threshold voltage is changed to a threshold voltage corresponding to "1," "2," ..., "k–1" or "k" (k is a natural number greater than m) in a second programming operation according to a write data item input from an external device and the threshold voltage of the memory cell; and a step-up value $\Delta Vpp1$ by which the bias increases in the first programming operation is less than a step-up value $\Delta Vpp2$ by which the bias increases in the second programming operation ($\Delta Vpp1 < \Delta Vpp2$).

3. A semiconductor memory device according to claim 1 or 2, wherein "1" is an erased state, and the threshold voltage distribution width of "2," "3," . . . , "m−1" or "m" in the memory cell is narrower than the threshold voltage distribution width of "m+1," "m+2,".

4. A semiconductor memory device comprising:

n-value memory cells (n is 4 or a greater natural number), each having a first threshold voltage to store "1," a second threshold voltage to store "2," a third threshold voltage to store "3," and an i-th threshold voltage to store "i" (i is a natural number equal to or less than n), wherein when each memory cell holds "1," "2," . . . , "$2^{m-1}-1$" or "$2^{m-1}$" (m is a natural number satisfying n=$2^m$), the memory cell comes to store "1," "2," . . . , "$2^m-1$" or "$2^m$" according to a write data item input from an external device and a data item held in the memory cell.

5. A semiconductor memory device comprising:

n-value memory cells (n is 4 or a greater natural number), each having a first threshold voltage to store "1," a second threshold voltage to store "2," a third threshold voltage to store "3," and an i-th threshold voltage to store "i" (i is a natural number equal to or less than n);

programming means for applying a bias to each of said memory cells, thereby to change the threshold voltage of the memory cell over a desired range; and verify means for detecting whether said programming means has changed the threshold voltage of each memory to a desired value, every time the bias is applied to the memory cell for a predetermined time, and for causing said programming means to repeatedly applying the bias to the memory cell until the threshold voltage of the memory cell is changed to the desired value, said bias increasing stepwise each time said bias is applied to the memory cell, wherein each memory cell has a threshold voltage changed to store "1" or "2" in a first programming operation according to a write data item input from an external device and the threshold voltage of the memory cell when the memory cell has a threshold voltage corresponding to "1", and has a threshold voltage changed to "1," "2," . . . , "$2^m-1$" or "$2^m$" (m is a natural number satisfying n=$2^m$) in the m-th programming operation according to a write data item input from an external device and the threshold voltage of the memory cell when the memory cell has a threshold voltage corresponding to "1," "2," . . . , "$2^{m-1}-1$" or "$2^{m-1}$,"; and a step-up value $\Delta$Vpp1 by which the bias increases in the first programming operation is less than a step-up value $\Delta$Vppm by which the bias increases in the m-th programming operation ($\Delta$Vpp1<$\Delta$Vppm).

6. A semiconductor memory device according to claim 5, wherein the threshold voltage distribution width of "2" in the memory cell is narrower than the threshold voltage distribution width of "$2^{m-1}+1$," "$2^{m-1}+2$" . . . , "$2^{m-1}$" or "$2^m$" in the memory cell.

7. A semiconductor memory device according to claim 4, or 5, wherein "1" is an erased state, and the threshold voltage distribution width of "2," "3," . . . , "$2^{m-1}-1$" or "$2^{m-1}$" in the memory cell is narrower than the threshold voltage distribution width of "$2^{m-1}+1$," "$2^{m-1}+2$" . . . , "$2^{m-1}$" or "$2^m$" in the memory cell.

8. A semiconductor memory device comprising:

n-value memory cells (n is 4 or a greater natural number), each having a first threshold voltage to store "1," a second threshold voltage to store "2," a third threshold voltage to store "3," and an i-th threshold voltage to store "i" (i is a natural number equal to or greater than n), wherein when each memory cell holds "1" or "2," the memory cell comes to store "1," "2," "3," or "4" according to a write data item input from an external device and a data item held in the memory cell.

9. A semiconductor memory device comprising:

n-value memory cells (n is 3 or a greater natural number), each having a first threshold voltage to store "1," a second threshold voltage to store "2," a third threshold voltage to store "3," and an i-th threshold voltage to store "i" (i is a natural number equal to or less than n);

programming means for applying a bias to each of said memory cells, thereby to change the threshold voltage of the memory cell over a desired range; and verify means for detecting whether said programming means has changed the threshold voltage of each memory to a desired value, every time the bias is applied to the memory cell for a predetermined time, and for causing said programming means to repeatedly applying the bias to the memory cell until the threshold voltage of the memory cell is changed to the desired value, said bias increasing stepwise each time said bias is applied to the memory cell, wherein when each memory cell is programmed to a threshold voltage corresponding to "1," the threshold voltage is changed to a threshold voltage corresponding to "1" or "2" in a first programming operation according to a write data item input from an external device; when each memory cell is programmed to a threshold voltage corresponding to "1" or "2," the threshold voltage is changed to a threshold voltage corresponding to "1," "2," "3," or "4" in the second programming operation according to a write data item input from an external device and the threshold voltage of the memory cell; and a step-up value $\Delta$Vpp1 by which the bias increases in the first programming operation is less than a step-up value $\Delta$Vpp2 by which the bias increases in the second programming operation ($\Delta$Vpp1<$\Delta$Vpp2).

10. A semiconductor memory device according to claim 8, wherein "1" is an erased state, and the threshold voltage distribution width of "2" in the memory cell is narrower than the threshold voltage distribution width of "3" or "4".

11. A semiconductor memory device comprising:

n-value memory cells (n is 4 or a greater natural number), each having a first threshold voltage to store "1," a second threshold voltage to store "2," a third threshold voltage to store "3," and an i-th threshold voltage to store "i" (i is a natural number equal to or less than n), wherein when each memory cell holds "1," "2," . . . , "r−1" or "r" (r is 2 or a greater natural number), the memory cell comes to store "1," "2," . . . , "s−1" or "s" (s is a natural number greater than r) according to a write data item input from an external device and a data item held in the memory cell; and when each memory cell holds "1," "2," . . . , "s−1" or "s," the memory cell comes to store "1," "2," . . . , "t−1" or "t" (t is a natural number greater than s) according to a write data item input from an external device and a data item held in the memory cell.

12. A semiconductor memory device comprising:

n-value memory cells (n is 4 or a greater natural number), each having a first threshold voltage to store "1," a second threshold voltage to store "2," a third threshold voltage to store "3," and an i-th threshold voltage to store "i" (i is a natural number equal to or less than n);

programming means for applying a bias to each of said memory cells, thereby to change the threshold voltage of the memory cell over a desired range; and verify means for detecting whether said programming means has changed the threshold voltage of each memory to a desired value, every time the bias is applied to the memory cell for a predetermined time, and for causing said programming means to repeatedly applying the bias to the memory cell until the threshold voltage of the memory cell is changed to the desired value, said bias increasing stepwise each time said bias is applied to the memory cell, wherein when each memory cell is programmed to a threshold voltage corresponding to "1," "2," . . . , "r−1" or "r" (r is 2 or a greater natural number), the threshold voltage is changed to a threshold voltage corresponding to "1," "2," . . . , "s−1" or "s" (s is a natural number greater than r) in the j-th programming operation (j is 2 or a greater natural number) according to a write data item input from an external device and threshold voltage of the memory cell; when each memory cell is programmed to a threshold voltage corresponding to "1" or "2," . . . , "s−1" or "s," the threshold voltage is changed to a threshold voltage corresponding to "1," "2," . . . , "t−1" or "t" (t is a natural number greater than s) in the (j+1)th programming operation according to a write data item input from an external device and the threshold voltage of the memory cell; and a step-up value $\Delta Vppj$ by which the bias increases in the j-th programming operation is less than a step-up value $\Delta Vpp(j+1)$ by which the bias increases in the (j+1)th programming operation ($\Delta Vppj < \Delta Vpp(j+1)$).

13. A semiconductor memory device according to claim 11, wherein the threshold voltage distribution width of "r+1," "r+2," . . . , "s−1" or "s" in the memory cell is narrower than the threshold voltage distribution width of "s+1," "s+2," . . . , "t−1," "t."

14. A semiconductor memory device according to claim 13, wherein "1" is an erased state, and the threshold voltage distribution width of "2," . . . , "r−1" or "r" in the memory cell is narrower than the threshold voltage distribution width of "r+1," "r+2," . . . , "s−1," "s".

15. A semiconductor memory device comprising:

n-value memory cells (n is 4 or a greater natural number), each having a first threshold voltage to store "1," a second threshold voltage to store "2," a third threshold voltage to store "3," and an i-th threshold voltage to store "i" (i is a natural number equal to or less than n).

wherein when each memory cell holds "1," "2," . . . . "$2^{k-1}1$" or "$2^{k-1}$" (k is 2 or a greater natural number), the memory cell comes to store "1," "2," . . . , "$2^k-1$" or "$2^k$" according to a write data item input from an external device and a data item held in the memory cell; and when each memory cell holds "1," "2," "$2^k-1$" or "$2^k$," the memory cell comes to store "1," "2," . . . . "$2^{k+1}-1$" or "$2^{k+1}$" according to a write data external device and a data item held in the memory cell.

16. A semiconductor memory device comprising:

n-value memory cells (n is 4 or a greater natural number), each having a first threshold voltage to store "1," a second threshold voltage to store "2," a third threshold voltage to store "3," and an i-th threshold voltage to store "i" (i is a natural number equal to or less than n);

programming means for applying a bias to each of said memory cells, thereby to change the threshold voltage of the memory cell over a desired range; and verify means for detecting whether said programming means has changed the threshold voltage of each memory to a desired value, every time the bias is applied to the memory cell for a predetermined time, and for causing said programming means to repeatedly applying the bias to the memory cell until the threshold voltage of the memory cell is changed to the desired value, said bias increasing stepwise each time said bias is applied to the memory cell, wherein when each memory cell is programmed to a threshold voltage corresponding to "1," "2," . . . . "$2^{k-1}-1$" or "$2^{k-1}$" (k is 2 or a greater natural number), the threshold voltage is changed to a threshold voltage corresponding to "1," "2," . . . , "$2^k-1$" or "$2^k$" in the k-th programming operation according to a write data item input from an external device and threshold voltage of the memory cell; when each memory cell is programmed to a threshold voltage corresponding to "1" or "2," . . . , "$2^k-1$" or "$2^k$," the threshold voltage is changed to a threshold voltage corresponding to "1," "2," . . . , "$2^{k+1}-1$," or "$2^{k+1}$" in the (k+1)th programming operation according to a write data item input from an external device and the threshold voltage of the memory cell; and a step-up value $\Delta Vppk$ by which the bias increases in the kth programming operation is less than a step-up value $\Delta Vpp(k+1)$ by which the bias increases in the (k+1)th programming operation ($\Delta Vppk < \Delta Vpp(k+1)$).

17. A semiconductor memory device according to claim 15, wherein the threshold voltage distribution width of "$2^{k-1}+1$" or "$2^{k-1}+2$," . . . , "$2^k-1$" and "$2^k$" in the memory cell is narrower than the threshold voltage distribution width of "$2^k+1$," "$2^k+2$," . . . , "$2^{k+1}-1$" or "$2^{k+1}$."

18. A semiconductor memory device according to claim 15, wherein "1" is an erased state, and the threshold voltage distribution width of "1," "2," . . . , "$2^{k-1}-1$" or "$2^{k-1}$" in the memory cell is narrower than the threshold voltage distribution width of "$2^{k-1}+1$," "$2^{k-1}+2$," . . . , "$2^k-1$" or "$2^k$."

19. A semiconductor memory device according to claim 15, wherein "1" is an erased state, and the threshold voltage distribution width of "2" in the memory cell is narrower than the threshold voltage distribution width of "3," "4," . . . . "$2^{k-1}-1$," or "$2^{k-1}$."

20. A semiconductor memory device comprising:

n-value memory cells (n is 3 or a greater natural number), each having a first threshold voltage to store "1," a second threshold voltage to store "2," a third threshold voltage to store "3," and an i-th threshold voltage to store "i" (i is a natural number equal to or less than n).

wherein during the first programming operation, each memory cell stores "1" if the input data is a first logic level and stores "2" if the input data is a second logic level, and during the kth programming operation, each memory cell stores "A" if the input data is a 2k−1)th logic level and stores "A+$2^{k-1}$" if the input data is a 2kth logic level in the case where the memory cell has been storing "A" during a (k−1)th programming operation (k is 2 or a greater natural number).

21. A semiconductor memory device comprising:

n-value memory cells (n is 3 or a greater natural number), each having a first threshold voltage to store "1," a second threshold voltage to store "2," a third threshold voltage to store "3," and an i-th threshold voltage to store "i" (i is a natural number equal to or less than n);

programming means for applying a bias to each of said memory cells, thereby to change the threshold voltage of the memory cell over a desired range; and verify means for detecting whether said programming means has changed the threshold voltage of each memory to a desired value, every time the bias is applied to the memory cell for a predetermined time, and for causing said programming means to repeatedly apply the bias to the memory cell until the threshold voltage of the memory cell is changed to the desired value, said bias increasing stepwise each time said bias is applied to the memory cell, wherein during the first programming operation, each memory cell stores "1" if the input data is a first logic level and stores "2" if the input data is a second logic level, and during the kth programming operation, each memory cell stores "A" if the input data is a (2k−1)th logic level and stores "A+$2^{k-1}$" if the input data is a 2kth logic level in the case where the memory cell has been storing "A" during a (k−1)th programming operation (k is 2 or a greater natural number); and a step-up value ΔVpp1 by which the bias increases in the first mode for performing the first programming operation is less than a step-up value ΔVppk by which the bias increases in the kth programming operation for performing the k-th programing operation (ΔVpp1<Vppk).

22. A semiconductor memory device according to claim 20 or 21, wherein "1" is an erased state, and the threshold voltage distribution width of "2" in the memory cell is narrower than the threshold voltage distribution width of "A+$2^{k-1}$."

23. A semiconductor memory device according to claim 20 or 21, wherein the threshold voltage distribution width of "A" in the memory cell is narrower than the threshold voltage distribution width of "A+$2^{k-1}$."

24. A semiconductor memory device comprising:

n-value memory cells (n is 4 or a greater natural number), each having a first threshold voltage to store "1," a second threshold voltage to store "2," a third threshold voltage to store "3," and an i-th threshold voltage to "i" (i is a natural number equal to or less than n), wherein during the first programming operation, each memory cell stores "1" if the input data is a first logic level and stores "2" if the input data is a second logic level; during the second programming operation, each memory cell stores "1" if the input data is a third logic level or stores "3" if the input data is a fourth logic level in the case where the memory cell has been storing "1" during the first programming operation; and during the second programming operation, each memory cell stores "2" if the input data is the third logic level or stores "4" if the input data is the fourth logic level in the case where the memory cell has been storing "2" during the first programming operation.

25. A semiconductor memory device comprising:

n-value memory cells (n is 4 or a greater natural number), each having a first threshold voltage to store "1," a second threshold voltage to store "2," a third threshold voltage to store "3," and an i-th threshold voltage to store "i" (i is a natural number equal to or less than n);

programming means for applying a bias to each of said memory cells, thereby to change the threshold voltage of the memory cell over a desired range; and verify means for detecting whether said programming means has changed the threshold voltage of each memory to a desired value, every time the bias is applied to the memory cell for a predetermined time, and for causing said programming means to repeatedly applying the bias to the memory cell until the threshold voltage of the memory cell is changed to the desired value, said bias increasing stepwise each time said bias is applied to the memory cell, wherein during the first programming operation, each memory cell stores "1" if the input data is a first logic level and stores "2" if the input data is a second logic level; during the second programming operation, each memory cell stores "1" if the input data is a third logic level or stores "3" if the input data is a fourth logic level in the case where the memory cell has been storing "1" during the first programming operation; during the second programming operation, each memory cell stores "2" if the input data is the third logic level or stores "4" if the input data is the fourth logic level in the case where the memory cell has been storing "2" during the first programming operation; and a step-up value ΔVpp1 by which the bias increases in the first mode for performing the first programming operation is less than a step-up value ΔVpp2 by which the bias increase in the second programming operation for performing the second programming operation (ΔVpp1<ΔVpp2).

26. A semiconductor memory device according to claim 14, wherein "1" is an erased state, and the threshold voltage distribution width of "2" in the memory cell is narrower than the threshold voltage distribution width of "3" or "4."

27. A semiconductor memory device according to claim 24, wherein the third threshold voltage is higher than the second threshold voltage.

28. A semiconductor memory device according to claim 27, wherein a difference between threshold voltage distributions corresponding to "3" and "4" is equal to a difference between threshold voltage distributions corresponding to "2" and "3."

29. A semiconductor memory device according to claim 27, wherein a difference between threshold voltage distributions corresponding to "3" and "4" is greater than a difference between threshold voltage distributions corresponding to "2" and "3."

30. A semiconductor memory device according to claim 24, wherein the third threshold voltage is lower than the second threshold voltage.

31. A semiconductor memory device according to claim 30, wherein a difference between threshold voltage distributions corresponding to "2" and "4" is equal to a difference between threshold voltage distributions corresponding to "2" and "3."

32. A semiconductor memory device according to claim 30, wherein a difference between threshold voltage distributions corresponding to "2" and "4" is greater than a difference between threshold voltage distributions corresponding to "2" and "3."

33. A semiconductor memory device comprising:

n-value memory cells (n is 4 or a greater natural number), each having a first threshold voltage to store "1," a second threshold voltage to store "2," a third threshold voltage to store "3," and an i-th threshold voltage to store "i" (i is a natural number equal to or less than n), wherein during the first programming operation, each memory cell stores "1" if the input data is a first logic level and stores "2" if the input data is a second logic level; during the second programming operation, each memory cell stores "1" if the input data is a third logic level and according to the data item held in the memory cell, and stores "3" if the input data is a fourth logic level and according to the data item held in the memory cell, in the case where the memory cell has been storing "1" during the first programming operation; and during the second programming operation, each memory cell stores "2" if the input data is the third logic level and according to the data item held in the memory cell, and stores "4" if the input data is the fourth logic level and according to the data item held in the memory cell, in the case where the memory cell has been storing "2" during the first programming operation.

34. A semiconductor memory device comprising:

n-value memory cells (n is 4 or a greater natural number), each having a first threshold voltage to store "1," a second threshold voltage to store "2," a third threshold voltage to store "3," and an i-th threshold voltage to store "i" (i is a natural number equal to or less than n); and a data circuit for holding a write data to be written into said memory cells, wherein each memory cell stores "1" when a first write data item held in said data circuit is at a first logic level and stores "2" when the first write data item is at a second logic level; and after said data circuit holds a second write data item input from an external device and a data item read from each memory cell, the memory comes to store "1" when the memory cell stores "1" and said data circuit holds the second write data item of a third logic level, comes to store "3" when the memory cell stores "1" and said data circuit holds the second write data item of a fourth logic level, comes to store "2" when the memory cell stores "2" and said data circuit holds the second write data item of the third logic level, comes to store "4" when the memory cell stores "2" and said data circuit holds the second write data item of the fourth logic level.

35. A semiconductor memory device according to claim 24, wherein the first logic level is equal to the third logic level, and the second logic level is equal to the fourth logic level.

36. A semiconductor memory device according to claim 25, wherein the first logic level is equal to the third logic level, and the second logic level is equal to the fourth logic level.

37. A semiconductor memory device according to claim 33, wherein the first logic level is equal to the third logic level, and the second logic level is equal to the fourth logic level.

38. A semiconductor memory device according to claim 34, wherein the first logic level is equal to the third logic level, and the second logic level is equal to the fourth logic level.

39. A semiconductor memory device comprising:

n-value memory cells (n is 3 or a greater natural number), each having a first threshold voltage to store "1," a second threshold voltage to store "2," a third threshold voltage to store "3," and an i-th threshold voltage to store "i" (i is a natural number equal to or less than n); and a data circuit for holding a write data to be written into said memory cells, wherein when each memory cell stores "1," "2," . . . , "m−1," or "m" (m is a natural number greater than 2), the memory cell stores "1," "2," . . . , "k−1" or "k" (k is a natural number greater than m) according to a write data item input from an external device and also a data item read from the memory cell and held in the data circuit.

40. A semiconductor memory device comprising:

n-value memory cells (n is 3 or a greater natural number), each having a first threshold voltage to store "1," a second threshold voltage to store "2," a third threshold voltage to store "3," and an i-th threshold voltage to store "i" (i is a natural number equal to or less than n); and a data circuit for holding a write data to be written into said memory cells, programming means for applying a bias to each of said memory cells, thereby to change the threshold voltage of the memory cell over a desired range; and verify means for detecting whether said programming means has changed the threshold voltage of each memory to a desired value, every time the bias is applied to the memory cell for a predetermined time, and for causing said programming means to repeatedly applying the bias to the memory cell until the threshold voltage of the memory cell is changed to the desired value, said bias increasing stepwise each time said bias is applied to the memory cell, wherein when each memory cell is at a threshold voltage to store "1," the memory cell is programmed to a threshold voltage to store "1," "2," . . . , "m−1" or "m" (m is 2 or a greater natural number) in a first programming operation according to a write data item input from an external device and held in the data circuit; when each memory cell is at a threshold voltage to store "1," "2," . . . , "m−1" or "m," the memory cell is programmed to a threshold voltage to store "1," "2," . . . , "k−1" or "k" (k is a natural number greater than m) in a second programming operation according to a write data input from the external device and held in the data circuit and also a data item read from the memory cell; and a step-up value $\Delta Vpp1$ by which the bias increases in the first programming operation is less than a step-up value $\Delta Vpp2$ by which the bias increases in the second programming operation ($\Delta Vpp1 < \Delta Vpp2$).

41. A semiconductor memory device according to claim 39, wherein "1" is an erased state, and the threshold voltage distribution width of "2," "3,", . . . , "m−1" or "m" in the memory cell is narrower than the threshold voltage distribution width of "m+1," "m+2," . . . , "k−1" or "k".

42. A semiconductor memory device comprising:

n-value memory cells (n is 3 or a greater natural number), each having a first threshold voltage to store "1," a second threshold voltage to store "2," a third threshold voltage to store "3," and an i-th threshold voltage to store "i" (i is a natural number equal to or less than n); and a data circuit for holding a write data to be written into said memory cells, wherein when each memory cell stores "1" or "2," the memory cell is programmed to "1," "2," "3" or "4" according to a write data item input from an external device and also a data item read from the memory cell and held in the data circuit.

43. A semiconductor memory device comprising:

n-value memory cells (n is 4 or a greater natural number), each having a first threshold voltage to store "1," a second threshold voltage to store "2," a third threshold voltage to store "3," and an i-th threshold voltage to store "i" (i is a natural number equal to or less than n);

a data circuit for holding a write data to be written into said memory cells;

programming means for applying a bias to each of said memory cells, thereby to change the threshold voltage of the memory cell over a desired range; and verify means for detecting whether said programming means has changed the threshold voltage of each memory to a desired value, every time the bias is applied to the memory cell for a predetermined time, and for causing said programming means to repeatedly applying the bias to the memory cell until the threshold voltage of the memory cell is changed to the desired value, said bias increasing stepwise each time said bias is applied to the memory cell, wherein when each memory cell is at a threshold voltage to store "1," the memory cell is programmed to a threshold voltage to store "1" or "2" in a first programming operation according to a write data item input from an external device and held in the data circuit; when each memory cell is at a threshold voltage to store "1" or "2," the memory cell is programmed to a threshold voltage to store "1," "2," "3" or "4" in a second programming operation according to a write data input from the external device and also a data item read from the memory cell and held in the data circuit; and a step-up value $\Delta Vpp1$ by which the bias increases I the first programming operation is less than a step-up value $\Delta Vpp2$ by which the bias increases in the second programming operation ($\Delta Vpp1 < Vpp2$).

44. A semiconductor memory device according to claim 42, wherein "1" is an erased state, and the threshold voltage distribution width of "2" in the memory cell is narrower than the threshold voltage distribution width of "3" or "4."

* * * * *